US012648257B2

(12) United States Patent
Jariwala et al.

(10) Patent No.: US 12,648,257 B2
(45) Date of Patent: Jun. 2, 2026

(54) SCALABLE VAN DER WAALS SUPERLATTICES FOR ABSORBERS AND EMITTERS

(71) Applicants: The Trustees of the University of Pennsylvania, Philadelphia, PA (US); The Regents of the University of California, Oakland, CA (US)

(72) Inventors: Deep Jariwala, Philadelphia, PA (US); Jason Lynch, Philadelphia, PA (US); Pawan Kumar, Philadelphia, PA (US); Francisco Barrera, Miami, FL (US); Artur Davoyan, Oakland, CA (US)

(73) Assignees: The Trustees of the University of Pennsylvania, Philadelphia, PA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 18/181,302

(22) Filed: Mar. 9, 2023

(65) Prior Publication Data

US 2024/0047592 A1 Feb. 8, 2024

Related U.S. Application Data

(60) Provisional application No. 63/318,154, filed on Mar. 9, 2022.

(51) Int. Cl.
H10F 77/14 (2025.01)
C01B 19/00 (2006.01)
(Continued)

(52) U.S. Cl.
CPC ......... H10F 77/146 (2025.01); C01B 19/007 (2013.01); C01G 39/06 (2013.01);
(Continued)

(58) Field of Classification Search
CPC ........... H01L 31/035236; H01L 31/032; H01L 31/076; H01L 31/075; C01B 19/007;
(Continued)

(56) References Cited

PUBLICATIONS

Withers ("Light-emitting diodes by band-structure engineering in van der Waals heterostructures") (Year: 2015).*
(Continued)

*Primary Examiner* — Angelo Trivisonno
(74) *Attorney, Agent, or Firm* — BakerHostetler

(57) ABSTRACT

Two-dimensional (2D) crystals have renewed opportunities in artificial lattice design and assembly without the constraints of epitaxy. However, the lack of thickness control in exfoliated van der Waals (vdW) layers prevents realization of repeat units with high fidelity. Uniform, wafer-scale samples permits engineering of both electronic and optical dispersions in stacks of disparate 2D layers with multiple repeating units. Systems, methods, and devices present optical dispersion engineering in a superlattice structure including alternating layers of 2D excitonic chalcogenides and dielectric insulators. Examples demonstrate >90% narrowband absorption in <4 nm active layer excitonic absorber medium at room temperature, concurrently with enhanced photoluminescence in $cm^2$ samples. These superlattices show evidence of strong light-matter coupling and exciton-polariton formation with geometry-tunable coupling constants. The results demonstrate proof of concept structures with engineered optical properties and pave the way for a broad class of scalable, designer optical metamaterials from atomically-thin layers.

29 Claims, 85 Drawing Sheets

(51) Int. Cl.

| | |
|---|---|
| *C01G 39/06* | (2006.01) |
| *C01G 41/00* | (2006.01) |
| *G02F 1/015* | (2006.01) |
| *G02F 1/017* | (2006.01) |
| *H10F 10/172* | (2025.01) |
| *H10F 77/12* | (2025.01) |

(52) U.S. Cl.
CPC ........... *C01G 41/00* (2013.01); *G02F 1/0159* (2021.01); *G02F 1/01708* (2013.01); *H10F 10/172* (2025.01); *H10F 77/12* (2025.01); *C01P 2004/04* (2013.01); *C01P 2006/40* (2013.01); *G02F 2203/10* (2013.01)

(58) Field of Classification Search
CPC ....... C01G 39/06; C01G 41/00; G02F 1/0159; G02F 1/01708; G02F 2203/10; C01P 2004/04; C01P 2006/40
See application file for complete search history.

(56) References Cited

PUBLICATIONS

Dufferwiel ("Exciton-polaritons in van der Waals heterostructures embedded in tunable microcavities") (Year: 2015).*

Reithmaier, G. Sk, A. Lffler, C. Hofmann, S. Kuhn, S. Reitzenstein, L. V. Keldysh, V. D. Kulakovskii, T. L. Reinecke, and A. Forchel, "Strong coupling in a single quantum dot-semiconductor microcavity system," Nature 432(7014), 197-200 (2004).

Roy, S.; Bermel, P. Tungsten-Disulfide-Based Ultrathin Solar Cells for Space Applications. IEEE Journal ofPhotovoltaics 2022, 12 (5), 1184-1191. DOI: 10.1109/JPHOTOV.2022.3179986.

Roy, S.; Hu, Z.; Kais, S.; Bermel, P. Enhancement ofPhotovoltaic Current through Dark States in Donor-Acceptor Pairs of Tungsten-Based Transition Metal Di-Chalcogenides. Advanced Functional Materials 2021, 31 (23), 2100387. DOI: https://doi.org/10.1002/adfm.202100387.

Ruhstaller, B.; Beierlein, T.; Riel, H.; Karg, S.; Scott, J. C.; Riess, W. Simulating electronic and optical processes in multilayer organic light-emitting devices. IEEE Journal of Selected Topics in Quantum Electronics 2003, 9 (3), 723-731. DOI: 10.1109/JSTQE.2003. 818852.

Ruhstaller, B.; Carter, S. A.; Barth, S.; Riel, H.; Riess, W.; Scott, J. C. Transient and steady-state behavior ofspace charges in multilayer organic light-emitting diodes. Journal of Applied Physics 2001, 89 (8), 4575-4586. DOI: 10.1063/1.1352027.

S. Luryi, "Quantum capacitance devices," Appl. Phys. Lett. 52(6), 501-503 (1988).

Saigal, N.; Sugunakar, V.; Ghosh, S. Exciton binding energy in bulk MoS2: A reassessment. Applied Physics Letters 2016, 108 (13), 132105. DOI: 10.1063/1.4945047.

Salehzadeh, O.; Tran, N. H.; Liu, X.; Shih, L; Mi, Z. Exciton kinetics, quantum efficiency, and efficiency droop of monolayer MoS(2) light-emitting devices. Nano Lett 2014, 14(7), 4125-4130. DOI: 10.1021/nl5017283 From NLM PubMed-notMedline.

Sampaio, P. G. V.; Gonzalez, M. O. A. A review on organic photovoltaic cell. International Journal of Energy Research 2022, 46 (13), 17813-17828. DOI: https://doi.org/10.1002/er.8456.

Savoie, B. M.; Rao, A.; Bakulin, A. A.; Gelinas, S.; Movaghar, B.; Friend, R. H.; Marks, T. J.; Ratner, M. A. Unequal Partnership: Asymmetric Roles of Polymeric Donor and Fullerene Acceptor in Generating Free Charge. Journal ofthe American Chemical Society 2014, 136 (7), 2876-2884. DOI: 10.1021/ja411859m.

Shanmugam, M.; Durcan, C. A.; Yu, B. Layered semiconductor molybdenum disulfide nanomembrane based Schottky-barrier solar cells. Nanoscale 2012, 4 (23), 7399-7405, 10.1039/C2NR32394J. DOI: 10.1039/C2NR32394J.

Sun et al., Observation of the interlayer exciton gases in WSe2-p:WSe2 Heterostructures, ACS Photonics, 2020, 7, 1622-1627.

Svatek, S. A.; Bueno-Blanco, C.; Lin, D.-Y.; Kerfoot, J.; Macias, C.; Zehender, M. H.; Tobias, L; Garcia-Linares, P.; Taniguchi, T.; Watanabe, K.; et al. High open-circuit voltage in transition metal dichalcogenide solar cells. Nano Energy 2021, 79, 105427. DOI: https://doi.Org/10.1016/j.nanoen.2020.105427.

Tahersima, Z. Ma, Y. Gui, S. Sun, H. Wang, R. Amin, H. Dalir, R. Chen, M. Misculio, and V. J. Sorger, "Coupling-enhanced dual ITO layer electroabsorption modulator in silicon photonics," Nanophotonics 8(9), 1559-1566 (2019).

Tredicucci et al., Superlattice quantum cascade lasers., SPIE, 1999, vol. 3628.

Tsai, M.-L.; Li, M.-Y.; Retamal, J. R. D.; Lam, K.-T.; Lin, Y.-C.; Suenaga, K.; Chen, L.-J.; Liang, G.; Li, L.-J.; He, J.-H. Single Atomically Sharp Lateral Monolayer p-n Heterojunction Solar Cells with Extraordinarily High Power Conversion Efficiency. Advanced Materials 2017, 29 (32), 1701168. DOI: https://doi.org/10.1002/adma.201701168.

Uddin, S. Z.; Kim, H.; Lorenzon, M.; Yeh, M.; Lien, D. H.; Barnard, E. S.; Htoon, H.; Weber-Bargioni, A.; Javey, A. Neutral Exciton Diffusion in Monolayer.

Ugeda, M. M.; Bradley, A. J.; Shi, S.-F.; da Jornada, F. H.; Zhang, Y.; Qiu, D. Y.; Ruan, W.; Mo, S.-K.; Hussain, Z.; Shen, Z.-X.; et al. Giant bandgap renormalization and excitonic effects in a monolayer transition metal dichalcogenide semiconductor. Nature Materials 2014, 13 (12), 1091-1095. DOI: 10.1038/nmat4061.

Ulaganathan, R. K.; Yadav, K.; Sankar, R.; Chou, F. C.; Chen, Y.-T. Hybrid InSe Nanosheets and MoS2 Quantum Dots for High-Performance Broadband Photodetectors and Photovoltaic Cells. Advanced Materials Interfaces 2019, 6 (2), 1801336. DOI: https://doi.org/10.1002/admi.201801336.

Villegas, C. E. P.; Rocha, A. R. Elucidating the Optical Properties of Novel Heterolayered Materials Based on MoTe2—InN for Photovoltaic Applications. The Journal of Physical Chemistry C 2015, 119 (21), 11886-11895. DOI: 10.1021/jp5122596.

Wang et al., Electronics and optoelectronics of two-dimensional transition metal dichalcogenides, Nature Nanotechnology, 2012, 7, 699-712.

Wang, H.; Wang, W.; Zhong, Y.; Li, D.; Li, Z.; Xu, X.; Song, X.; Chen, Y.; Huang, P.; Mei, A.; et al. Approaching the External Quantum Efficiency Limit in 2D Photovoltaic Devices. Advanced Materials 2022, 34 (39), 2206122. DOI: https://doi.org/10.1002/adma.202206122.

Wang, H.; Zhang, C.; Chan, W.; Manolatou, C.; Tiwari, S.; Rana, F. Radiative lifetimes of excitons and trions in monolayers ofthe metal dichalcogenideMoS2. Physical Review B 2016, 93 (4). DOI: 10.1103/PhysRevB.93.045407.

Wang, K.; Paulus, B. Tuning the binding energy of excitons in the MoS2 monolayer by molecular functionalization and defective engineering. Phys Chem Chern Phys 2020, 22 (21), 11936-11942. DOI: 10.1039/d0cp01239d FromNLM PubMednot-Medline.

Wang, L.; Huang, L.; Tan, W. C.; Feng, X.; Chen, L.; Huang, X.; Ang, K-W. 2D Photovoltaic Devices: Progress and Prospects. Small Methods 2018, 2 (3), 1700294. DOI: https://doi.org/10.1002/smtd. 201700294.

Went, C. M.; Wong, J.; Jahelka, P. R.; Kelzenberg, M.; Biswas, S.; Hunt, M. S.; Carbone, A.; Atwater, H. A. A new metal transfer process for van der Waals contacts to vertical Schottky-junction transition metal dichalcogenide photovoltaics. Science Advances 2019, 5 (12), eaax6061. DOI: doi:10.1126/sciadv.aax6061.

Wi, S.; Kim, H.; Chen, M.; Nam, H.; Guo, L. J.; Meyhofer, E.; Liang, X. Enhancement of Photovoltaic Response in Multilayer MoS2 Induced by Plasma Doping. ACS Nano 2014, 8 (5), 5270-5281. DOI: 10.1021/nn5013429.

Withers et al., Light-emitting diodes by band-structure engineering in van der Waals heterostructures, Nature Materials., 2015, 14, 301-306.

Wong, J.; Jariwala, D.; Tagliabue, G.; Tat, K.; Davoyan, A. R.; Sherrott, M. C.; Atwater, H. A. High Photovoltaic Quantum Efficiency in Ultrathin van der Waals Heterostructures. ACS Nano 2017, 11 (7), 7230-7240. DOI: 10.1021/acsnano.7b03148.

Xiong, S.; Fukuda, K.; Lee, S.; Nakano, K.; Dong, X.; Yokota, T.; Tajima, K.; Zhou, Y.; Someya, T. Ultrathin and Efficient Organic Photovoltaics with Enhanced Air Stability by Suppression ofZinc

(56) References Cited

PUBLICATIONS

Element Diffusion. Advanced Science 2022, 9 (8), 2105288. DOI: https://doi.org/10.1002/advs.202105288.

Xu et al., Graphene-Like Two-Dimensional Materials., Chemical Reviews, 2013, 113, 3766-3798.

Xue, M.; Nazif, K. N.; Lyu, Z.; Jiang, J.; Lu, C.-Y.; Lee, N.; Zang, K.; Chen, Y.; Zheng, T.; Kamins, T. L; et al. Free-standing 2.7 pm thick ultrathin crystalline silicon solar cell with efficiency above 12.0%. Nano Energy 2020, 70, 104466. DOI: https://doi.org/10.1016/j .nanoen.2020.104466.

Yamada, T.; Yamada, Y.; Nakaike, Y.; Wakamiya, A.; Kanemitsu, Y. Photon Emission and Reabsorption Processes in $\mathrm{CH}_{3}\mathrm{NH}_{3}\mathrm{PbBr}_{3}$ Single Crystals Revealed by Time-Resolved Two-Photon-Excitation Photoluminescence Microscopy. Physical Review Applied 2017, 7 (1), 014001. DOI: 10.1103/PhysRevApplied.7.014001.

Yang, S.; Cha, J.; Kim, J. C.; Lee, D.; Huh, W.; Kim, Y.; Lee, S. W.; Park, H.-G.; Jeong, H. Y.; Hong, S.; et al. Monolithic Interface Contact Engineering to Boost Optoelectronic Performances of 2D Semiconductor Photovoltaic Heterojunctions. Nano Letters 2020, 20 (4), 2443-2451. DOI: 10.1021/acs.nanolett.9b05162.

Yu, Y. Yu, L. Huang, H. Peng, L. Xiong, L. Cao, Giant Gating Tunability of Optical Refractive Index in Transition Metal Dichalcogenide Monolayers, Nano Lett. 17(6), 3613-3618 (2017.

Zhang, B. Abhiraman, Q. Zhang, J. Miao, K. Jo, S. Roccasecca, M. W. Knight, A. R. Davoyan, and D. Jariwala, "Hybrid exciton-plasmon-polaritons in van der Waals semiconductor gratings," Nat. Commun. 11(1), 3552 (2020).

Zhang, L. Cheng, and Y. Liu, "Understanding high-field electron transport properties and strain effects of monolayer transition metal dichalcogenides," Phys. Rev. B 102(11), 115405 (2020).

Zhao et al., Evolution of Electronics Structure in Atomically thin Sheets of WS2 and WSe2, ACS Nano, 2013, 7, 791-797.

Zhong et al., Wafer-scale synthesis of monolayer two-dimensional porphyrin polymers for hybrid superlattices, Science, 2019, 366, 1379-1384.

Zhu, G. Q. Lo, and D. L. Kwong, "Design of an ultra-compact electro-absorption modulator comprised of a deposited TIN/HfO2/ITO/Cu stack for CMOS backend integration," Opt. Express 22(15), 17930-17947 (2014).

Joshi and B. K. Kaushik, "Transition metal dichalcogenides integrated waveguide modulator and attenuator in silicon nitride platform," Nanotechnology 31(43), 435202 (2020).

Kaltenbrunner, M.; Adam, G.; Glowacki, E. D.; Drack, M.; Schwodiauer, R.; Leonat, L.; Apaydin, D. H.; Groiss, H.; Scharber, M. C.; White, M. S.; et al. Flexible high power-per-weight perovskite solar cells with chromium oxide-metal contacts for improved stability in air. Nature Materials 2015, 14 (10), 1032-1039. DOI: 10.103 8/nmat4388.

Kang, K; Lee, K.-H.; Han, Y.; Gao, H.; Xie, S.; Muller, D. A.; Park, J. Layer-by-layer assembly of two-dimensional materials into wafer-scale heterostructures. Nature 2017, 550 (7675), 229-233. DOI: 10.1038/nature23905.

Khan, M. A. U.; Adesina, N. O.; Xu, J. Near Unity Absorbance and Photovoltaic Properties of TMDC/Gold Heterojunction for Solar Cell Application. Key Engineering Materials 2022, 918, 97-105. DOI: 10.4028/p-uz62m4.

Khurgin, "Expanding the Photonic Palette: Exploring High Index Materials," ACS Photonics 9(3), 743-751 (2022.

Kim and M.-S. Kwon, "Electroabsorption modulator based on inverted-rib-type silicon waveguide including double graphene layers," J. Opt. 19(4), 045804 (2017).

Kim, H.; Lien, D.-H.; Amani, M.; Ager, J. W.; Javey, A. Highly Stable Near-Unity Photoluminescence Yield in Monolayer MoS2 by Fluoropolymer Encapsulation and Superacid Treatment. ACS Nano 2017, 11 (5), 5179-5185. DOI: 10.1021/acsnano.7b02521.

Kim, K. H.; Andreev, M.; Choi, S.; Shim, J.; Ahn, H.; Lynch, J.; Lee, T.; Lee, J.; Nazif, K. N.; Kumar, A.; et al. High-Efficiency WSe2 Photovoltaic Devices with Electron-Selective Contacts. ACS Nano 2022. DOI: 10.1021/acsnano.Icl0054 From NLM Publisher.

Kim, T.; Fan, S.; Lee, S.; Joo, M. K.; Lee, Y. H. High-mobility junction field-effect transistor via graphene/MoS2 heterointerface. Sci Rep 2020, 10 (1), 13101. DOL 10.1038/s41598-020-70038-6 From NLM PubMed-not-Medline.

Kirchartz, T.; Mattheis, J.; Rau, U. Detailed balance theory of excitonic and bulk heterojunction solar cells. Physical Review B 2008, 78 (23), 235320. DOI: 10.1103/PhysRevB.78.235320.

Kirchartz, T.; Rau, U. Charge separation in excitonic and bipolar solar cells—A detailed balance approach. Thin Solid Films 2008, 516 (20), 7144-7148. DOI: https://doi.Org/10.1016/j.tsf.2007.12.084.

Kumar, N.; Cui, Q.; Ceballos, F.; He, D.; Wang, Y.; Zhao, H. Exciton diffusion in monolayer and bulk MoSe2. Nanoscale 2014, 6 (9), 4915-4919, 10.1039/C3NR06863C. DOI: 10.1039/C3NR06863C.

Kwak, D.-H.; Ra, H.-S.; Jeong, M.-H.; Lee, A.-Y.; Lee, J.-S. HighPerformance Photovoltaic Effect with Electrically Balanced Charge Carriers in Black Phosphorus and WS2 Heterojunction. Advanced Materials Interfaces 2018, 5 (18), 1800671. DOI: https://doi.org/10.1002/admi.201800671.

Lackner, M. Dusel, O. A. Egorov, B. Han, H. Knopf, F. Eilenberger, S. Schroder, K. Watanabe, T. Taniguchi, S. Tongay, C. Anton-Solanas, S. Hofling, and C. Schneider, "Tunable exciton-polaritons emerging from WS2 monolayer excitons in a photonic lattice at room temperature," Nat. Commun. 12(1), 4933 (2021).

Laturia, A.; Van de Put, M. L.; Vandenberghe, W. G. Dielectric properties of hexagonal boron nitride and transition metal dichalcogenides: from monolayer to bulk, npj 2D Materials and Applications 2018, 2 (1), 6. DOI: 10.1038/s41699-018-0050-x.

Lee et al., Anomalous lattice vibrations of single- and Few-layer MoS2, ACS Nano, 2010, 4, 2695-2700.

Li et al., Infrared hyperbolic metasurface based on nanostructured van der Waals materials, Science, 2018, 359, 892-896.

Li, H. M.; Lee, D.; Qu, D.; Liu, X.; Ryu, J.; Seabaugh, A.; Yoo, W. J. Ultimate thin vertical p-n junction composed of two-dimensional layered molybdenum disulfide. Nat Commun 2015, 6, 6564. DOL 10.1038/ncomms7564 From NLM PubMednot-Medline.

Li, Y.; Wang, L.; Qiao, Y.; Gan, Y.; Singh, D. J. Prediction of ternary alkaline-earth metal Sn(II) and Pb(II) chalcogenide semiconductors. Physical Review Materials 2020, 4 (5), 055004. DOI: 10.1103/PhysRevMaterials.4.055004.

Li, Z.; Xiao, Y.; Gong, Y.; Wang, Z.; Kang, Y.; Zu, S.; Ajayan, P. M.; Nordlander, P.; Fang, Z. Active Light Control of the MoS2 Monolayer Exciton Binding Energy. ACS Nano 2015, 9 (10), 10158-10164. DOI: 10.1021/acsnano.5b03764.

Lien, D.-H.; Uddin, S. Z.; Yeh, M.; Amani, M.; Kim, H.; Ager, J. W.; Yablonovitch, E.; Javey, A. Electrical suppression of all nonradiative recombination pathways in monolayer semiconductors. Science 2019, 364 (6439), 468-471. DOI: doi: 10.1126/science. aaw8053.

Lin et al., 2D materials advances; from large scale synthesis and controlled heterostructures to improved characterization techniques, defects and applications, 2D Materials, 2016, 3, 1583-2053.

Lin, S Nazif, K.; Daus, A.; Hong, J.; Lee, N.; Vaziri, S.; Kumar, A.; Nitta, F.; Chen, M. E.; Kananian, S.; Islam, R.; et al. High-specific-power flexible transition metal dichalcogenide solar cells. Nat Commun 2021, 12 (1), 7034. DOI: 10.1038/s41467-021-27195-7 From NLM PubMed-not-Medline.

Lin, S.; Li, X.; Wang, P.; Xu, Z.; Zhang, S.; Zhong, H.; Wu, Z.; Xu, W.; Chen, H. Interface designed MoS2/GaAs heterostructure solar cell with sandwich stacked hexagonal boron nitride. Scientific Reports 2015, 5 (1), 15103. DOL 10.1038/srepl5103.

Ling, J. B. Khurgin, and A. R. Davoyan, "Atomic-Void van der Waals Channel Waveguides," Nano Lett. 22(15), 6254-6261 (2022).

Ling, R. Li, and A. R. Davoyan, "All van der Waals Integrated Nanophotonics with Bulk Transition Metal Dichalcogenides," ACS Photonics 8(3), 721-730 (2021).

Liu et al., Strong light-matter coupling in two-dimensional atomic crystals, Nature Photonics, 2015, 9, 30-34.

Liu, H.; Neal, A. T.; Ye, P. D. Channel Length Scaling of MoS2 MOSFETs. ACS Nano 2012, 6 (10), 8563-8569. DOI: 10.1021/nn303513c.

Luhman, W. A.; Holmes, R. J. Investigation of Energy Transfer in Organic Photovoltaic Cells and Impact on Exciton Diffusion Length

(56) References Cited

PUBLICATIONS

Measurements. Advanced Functional Materials 2011, 21 (4), 764-771. DOI: https://doi.org/10.1002/adfm.201001928.

Ma, M. H. Tahersima, S. Khan, and V. J. Sorger, Two Dimensional Material-Based Mode Confinement Engineering in Electro-Optic Modulators, IEEE J. Sel. Top. Quantum Electron. 23(1), 81-88 (2017).

Mak et al., Atomically Thin MoS2: A new direct-gap semiconductor, Physical Review Letters, 2010, 105.

Mathews, I.; Kantareddy, S. N.; Buonassisi, T.; Peters, I. M. Technology and Market Perspective for Indoor Photovoltaic Cells. Joule 2019, 3 (6), 1415-1426. DOI: https://doi.Org/10.1016/j.joule.2019.03.026.

McPeak, K. M.; Jayanti, S. V.; Kress, S. J. P.; Meyer, S.; Iotti, S.; Rossinelli, A.; Norris, D. J. Plasmonic Films Can Easily Be Better: Rules and Recipes. ACS Photonics 2015, 2 (3), 326-333. DOI: 10.1021/ph5004237.

Meng, T. Wang, C. Jin, Z. Li, S. Miao, Z. Lian, T. Taniguchi, K. Watanabe, F. Song, and S.-F. Shi, "Electrical switching between exciton dissociation to exciton funneling in MoSe2/WS2 heterostructure," Nat. Commun. 11(1), 2640 (2020).

Miller, "Attojoule Optoelectronics for Low-Energy Information Processing and Communications," J. Light. Technol. 35(3), 346-396 (2017).

Miller, "Device Requirements for Optical Interconnects to Silicon Chips," Proc. IEEE 97(7), 1166-1185 (2009).

Moore et al., Unconvering topographically hidden features in 2D MoSe2 with correlated potential and optical nanoprobes, npj 2D Materials and Applications, 2020, 4, 44.

Nassiri Nazif, K.; Kumar, A.; Hong, J.; Lee, N.; Islam, R.; McClellan, C. J.; Kami, O.; van de Groep, J.; Heinz, T. F.; Pop, E.; et al. High-Performance p-n Junction Transition Metal Dichalcogenide Photovoltaic Cells Enabled by MoOx Doping and Passivation. Nano Lett 2021, 21 (8), 3443-3450. DOI: 10.1021/acs.nanolett.Ic00015 From NLM PubMed-not-Medline.

National Renewable Energy Laboratory. Reference Air Mass 1.5 Spectra. 1962. https://www.nrel.gov/grid/solar-resource/spectra-amL5.html (accessed Dec. 2, 2022).

Ngo, S. F. Yoon, W. K. Loke, Q. Cao, D. R. Lim, V. Wong, Y. K. Sim, and S. J. Chua, "Investigation of Semiconductor Quantum Dots for Waveguide Electroabsorption Modulator," Nanoscale Res. Lett. 3(12), 486-490 (2008).

Ovchinnikov, A. Allain, Y. S. Huang, D. Dumcenco, and A. Kis, Electrical Transport Properties of Single-Layer WS2, ACS Nano 8(8), 8174-8181 (2014).

Palummo, M.; Bernardi, M.; Grossman, J. C. Exciton radiative lifetimes in two-dimensional transition metal dichalcogenides. Nano Lett 2015, 15 (5), 2794-2800. DOI: 10.1021/nl503799t From NLM Medline.

Park, S.; Mutz, N.; Schultz, T.; Blumstengel, S.; Han, A.; Aljarb, A.; Li, L.-J.; List-Kratochvil, E. J. W.; Amsalem, P.; Koch, N. Direct determination ofmonolayer MoS2 and WSe2 exciton binding energies on insulating and metallic substrates. 2D Materials 2018, 5 (2), 025003. DOI: 10.1088/2053-1583/aaa4ca.

Pettersson, L. A. A.; Roman, L. S.; Inganas, O. Modeling photocurrent action spectra of photovoltaic devices based on organic thin films. Journal of Applied Physics 1999, 86 (1), 487-496. DOI: 10.1063/1.370757.

Ploog, Molecular beam epitaxy of semiconductor interfaces and quantum wells for advanced optoelectronic devices., Surface and Interface Analysis, 1988, 12, 279-287.

Rai, A.; Valsaraj, A.; Movva, H. C. P.; Roy, A.; Tutuc, E.; Register, L. F.; Banerjee, S. K. Interfacial-oxygen-vacancy mediated doping ofMoS2 by high-K dielectrics. In 2015 73rd Annual Device Research Conference (DRC), Jun. 21-24, 2015, 2015; pp. 189-190. DOI: 10.1109/DRC.2015.7175626.

Raja, A.; Chaves, A.; Yu, J.; Arefe, G.; Hill, H. M.; Rigosi, A. F.; Berkelbach, T. C.; Nagler, P.; Schller, C.; Kom, T.; et al. Coulomb engineering ofthe bandgap and excitons in two-dimensional materials. Nature Communications 2017, 8 (1), 15251. DOI: 10.1038/ncomms15251.

Ratan, A.; Kunchakara, S.; Dutt, M.; Tripathi, A.; Singh, V. 100 MeV Silicon9+ swift heavy ion irradiation—Strategic defect annealing approach to enhance the electrical conductivity offew-layered MoS2 sheets—PVA nanocomposite film. Vacuum 2019, 169, 108939. DOI: https://doi.Org/10.1016/j.vacuum.2019.108939.

Rawat, A.; Jena, N.; Dimple; De Sarkar, A. A comprehensive study on carrier mobility and artificial photosynthetic properties in group VI B transition metal dichalcogenide monolayers. Journal of Materials Chemistry A 2018, 6 (18), 8693-8704, 10.1039/C8TA01943F. DOI: 10.1039/C8TA01943F.

Reese, M. O.; Glynn, S.; Kempe, M. D.; McGott, D. L.; Dabney, M. S.; Barnes, T. M.; Booth, S.; Feldman, D.; Haegel, N. M. Increasing markets and decreasing package weight for high-specific-power photovoltaics. Nature Energy 2018, 3 (11), 1002-1012. DOI: 10.1038/s41560-018-0258-1.

Calculating absorbed optical power—Simple method,!! https://optics.ansys.com/hc/en-us/articles/360034915673-Calculating-absorbed-opticalpower-Simple-method; Retrieved on Apr. 5, 2023.

Surface plasmon resonance in a glass/silver/air slab,!! https://optics.ansys.com/hc/en-us/articles/360042160673-Surface-plasmon-resonance-in-aglass-silver-air-slab; Retreived on Apr. 5, 2023.

Akama, T.; Okita, W.; Nagai, R.; Li, C.; Kaneko, T.; Kato, T. Schottky solar cell using few-layered transition metal dichalcogenides toward large-scale fabrication of semitransparent and flexible power generator. Sci Rep 2017, 7 (1), 11967. DOL 10.1038/s41598-017-12287-6 From NLM PubMed-not-Medline.

Alaloul, J. B. Khurgin, I. Al-Ani, K. As'ham, L. Huang, H. T. Hattori, and A. E. Miroshnichenko, "On-chip low-loss all-optical MoSe2 modulator," Opt. Lett. 47(15), 3640-3643 (2022).

Alvertis et al., "First principles modeling of exciton-polaritons in polydiacetylene chains", The journal of chemical physics, 2020, 153.

Amani, M.; Lien, D.-H.; Kiriya, D.; Xiao, J.; Azcatl, A.; Noh, J.; Madhvapathy, S. R.; Addou, R.; Ke, S.; Dubey, M.; et al. Near-unity photoluminescence quantum yield in MOS2. Science 2015, 350 (6264), 1065-1068. DOI: 10.1126/science.aad2114 PubMed.

Amin, J. K. George, S. Sun, T. Ferreira de Lima, A. N. Tait, J. B. Khurgin, M. Miscuglio, B. J. Shastri, P. R. Prucnal, T. El-Ghazawi, and V. J. Sorger, "ITObased electro-absorption modulator for photonic neural activation function," APL Mater. 7(8), 081112(2019).

Andreani, G. Panzarini, and J.-M. Gerard, "Strong-coupling regime for quantum boxes in pillar microcavities: Theory," Phys. Rev. B 60(19), 13276-13279 (1999).

Armitage, M. S. Skolnick, A. V. Kavokin, D. M. Whittaker, V. N. Astratov, G. A. Gehring, and J. S. Roberts, "Polariton-induced optical asymmetry in semiconductor microcavities," Phys. Rev. B 58(23), 15367-15370 (1998).

Atwater et al., Materials challenges for the starshot lightsail., Nature Materials, 2018, 17, 861-867.

Bisquert, J. The physics ofsolar cells: perovskites, organics, and photovoltaic fundamentals; CRC press, 2017.

Bisquert, J.; Garcia-Belmonte, G. On Voltage, Photovoltage, and Photocurrent in Bulk Heterojunction Organic Solar Cells. The Journal of Physical Chemistry Letters 2011, 2 (15), 1950-1964. DOI: 10.1021/jz2004864.

Briggs et al., A roadmap for electronic grade 2D materials., 2D Materials, 2019, 6.

Bryant, G. W. Excitons in quantum boxes: Correlation effects and quantum confinement. Physical Review B 1988, 37 (15), 8763-8772. DOI: 10.1103/PhysRevB.37.8763.

Burkhard et al., Transfer Matrix Optical Modeling, McGehee Group (Stanford Univ), 2011.

Cai, L.; McClellan, C. J.; Koh, A. L.; Li, H.; Yalon, E.; Pop, E.; Zheng, X. Rapid Flame Synthesis ofAtomically Thin MoO3 down to Monolayer Thickness for Effective Hole Doping ofWSe2. Nano Letters 2017, 17 (6), 3854-3861. DOI: 10.1021/acs.nanolett.7b01322.

Castellanos-Gomez, A.; Barkelid, M.; Goossens, A. M.; Calado, V. E.; van der Zant, H. S.; Steele, G. A. Laser-thinning of MoS(2): on

(56)　　　　　References Cited

PUBLICATIONS demand generation of a single-layer semiconductor. Nano Lett 2012, 12 (6), 3187-3192. DOI: 10.1021/nl301164v From NLM Medline.

Chaisakul, D. Marris-Morini, M.-S. Rouifed, G. Isella, D. Chrastina, J. Frigerio, X. L. Roux, S. Edmond, J.-R. Coudevylle, and L. Vivien, "23 GHz Ge/SiGe multiple quantum well electro-absorption modulator," Opt. Express 20(3), 3219-3224 (2012).

Chen et al., Room temperature continuous-wave excited biexciton emission in perovskite nanoplatelets via plasmonic nonlinear fano resonance, Communications Physics, 2019, 2, 80.

Chen, H.-L.; Cattoni, A.; De Lepinau, R.; Walker, A. W.; Hohn, O.; Lackner, D.; Siefer, G.; Faustini, M.; Vandamme, N.; Goffard, J.; et al. A 19.9%-efficient ultrathin solar cell based on a 205-nm-thick GaAs absorber and a silver nanostructured back mirror. Nature Energy 2019, 4 (9), 761-767. DOI: 10.1038/s41560-019-0434-y.

Chen, Z.; Liu, H.; Chen, X.; Chu, G.; Chu, S.; Zhang, H. Wafer-Size and Single-Crystal MoSe2 Atomically Thin Films Grown on GaN Substrate for Light Emission and Harvesting. ACS Applied Materials & Interfaces 2016, 8 (31), 20267-20273. DOI: 10.1021/acsami. 6b04768.

Cheng, G.; Li, B.; Zhao, C.; Jin, Z .; Li, H.; Lau, K. M.; Wang, J. Exciton aggregation induced photoluminescence enhancement ofmonolayer WS2. Applied Physics Letters 2019, 114 (23), 232101. DOI: 10.1063/1.5096206.

Chernikov, A. M. van der Zande, H. M. Hill, A. F. Rigosi, A. Velauthapillai, J. Hone, and T. F. Heinz, "Electrical Tuning ofExciton Binding Energies in Monolayer WS 2," Phys. Rev. Lett. 115(12), 126802 (2015).

Choi, Y.; Kim, H.; Yang, J.; Shin, S. W.; Um, S. H.; Lee, S.; Kang, M. S.; Cho, J. H. Proton-Conductor-Gated MoS2 Transistors with Room Temperature Electron Mobility of>100 cm2 V-I s-1. Chemistry ofMaterials 2018, 30 (14), 4527-4535. DOI: 10.1021/acs. chemmater. 86005 68.

Chubarov et al., Wafer-Scale Epitaxial growth of unidirectional WS2 Monolayers on sapphire, ACS Nano, 2021, 15, 2532-2541.

Classen, A.; Chochos, C. L.; Liter, L.; Gregoriou, V. G.; Wortmann, J.; Osvet, A.; Forberich, K.; McCulloch, L; Heumtiller, T.; Brabec, C. J. The role of exciton lifetime for charge generation in organic solar cells at negligible energy-level offsets. Nature Energy 2020, 5 (9), 711-719. DOI: 10.1038/s41560-020-00684-7.

Cui, Q.; Ceballos, F.; Kumar, N.; Zhao, H. Transient Absorption Microscopy of Monolayer and Bulk WSe2. ACS Nano 2014, 8 (3), 2970-2976. DOI: 10.1021/nn500277y.

Doiron, J. B. Khurgin, and G. V. Naik, "Super-Mossian Dielectrics for Nanophotonics," Adv. Opt. Mater. 10(22), 2201084 (2022).

Dufferwiel, S. Schwarz, F. Withers, A. a P. Trichet, F. Li, M. Sich, O. Del Pozo-Zamudio, C. Clark, A. Nalitov, D. D. Solnyshkov, G. Malpuech, K. S. Novoselov, J. M. Smith, M. S. Skolnick, D. N. Krizhanovskii, and A. I. Tartakovskii, !! Exciton-polaritons in van der Waals heterostructures embedded in tunable microcavities,!! Nat. Commun. 6(1), 8579 (2015).

Efaz, E. T.; Rhaman, M. M.; Imam, S. A.; Bashar, K. L.; Kabir, F.; Mourtaza, M. D. E.; Sakib, S. N.; Mozahid, F. A. A review of primary technologies of thinfilm solar cells. Engineering Research Express 2021, 3 (3), 032001. DOI: 10.1088/2631-8695/ac2353.

Fang et al., Strong interlayer coupling in van der Waals heterostructures built from single-layer chalcogenides, Proceedings of the National Academy of Sciences, 2014, 6198-6202, 111.

Fontana, M.; Deppe, T.; Boyd, A. K.; Rinzan, M.; Liu, A. Y.; Paranjape, M.; Barbara, P. Electron-hole transport and photovoltaic effect in gated MoS2 Schottky junctions. Scientific Reports 2013, 3 (1), 1634. DOI: 10.1038/srep01634.

Fox et al., Springer Handbook of Electronic and Photonic Materials, eds Safa Kasap & Peter Capper), 1-1, Springer International Publishing, 2017.

Fox, Quantum Optics: An Introduction, Oxford Master Series in Physics No. 15 (Oxford University Press, 2006).

Gupta, A.; Parikh, V.; Compaan, A. D. High efficiency ultra-thin sputtered CdTe solar cells. Solar Energy Materials and Solar Cells 2006, 90 (15), 2263-2271. DOI: https://doi.org/10.1016/j.solmat. 2006.02.029.

Han et al., Photoluminescence enhancement and structure repairing of monolayer MoSe2 by Hydrohalic Acid Treatment, ACS Nano, 2016, 10, 1454-1461.

Hao, W. Du, H. Chen, X. Jin, L. Yang, and E. Li, "Ultra-compact optical modulator by graphene induced electro-refraction effect," Appl. Phys. Lett. 103(6), 061116 (2013).

He et al., "Tightly Bound Excitons in MonolayerWSe2", Physical Review Letters, 2014, vol. 113, No. 2, pp. 1-5.

He, J.; Fang, W. H.; Long, R.; Prezhdo, O. V. Superoxide/Peroxide Chemistry Extends Charge Carriers' Lifetime but Undermines Chemical Stability of CH3NH3Pbl3 Exposed to Oxygen: Time-Domain ab Initio Analysis. J Am Chem Soc 2019, 141 (14), 5798-5807. DOL 10.1021/jacs.8bl3392 From NLM PubMed-not-Medline.

He, J.; He, D.; Wang, Y.; Cui, Q.; Ceballos, F.; Zhao, H. Spatiotemporal dynamics of excitons in monolayer and bulk WS2. Nanoscale 2015, 7 (21), 9526-9531, 10.1039/C5NR00188A. DOI: 10.1039/ C5NR00188A.

Hill, H. M.; Rigosi, A. F.; Roquelet, C.; Chernikov, A.; Berkelbach, T. C.; Reichman, D. R.; Hybertsen, M. S.; Brus, L. E.; Heinz, T. F. Observation of Excitonic Rydberg States in Monolayer MoS2 and WS2 by Photoluminescence Excitation Spectroscopy. Nano Letters 2015, 15 (5), 2992-2997. DOI: 10.1021/nl504868p.

Hong, H.; Cheng, Y.; Wu, C.; Huang, C.; Liu, C.; Yu, W.; Zhou, X.; Ma, C.; Wang, J.; Zhang, Z.; et al. Modulation of carrier lifetime in MoS2 monolayer by uniaxial strain. Chinese Physics B 2020, 29 (7). DOL 10.1088/1674-1056/ab99ba.

Hou, Y.; Wu, C.; Yang, D.; Ye, T.; Honavar, V. G.; Duin, A. C. T. v.; Wang, K.; Priya, S. Two-dimensional hybrid organic-inorganic perovskites as emergent ferroelectric materials. Journal of Applied Physics 2020, 128 (6), 060906. DOI: 10.1063/5.0016010.

Hsu, C.; Frisenda, R.; Schmidt, R.; Arora, A.; de Vasconcellos, S. M.; Bratschitsch, R.; van der Zant, H. S. J.; Castellanos-Gomez, A. Thickness-Dependent Refractive Index of II, 2L, and 3L MoS2, MoSe2, WS2, and WSe2. Advanced Optical Materials 2019, 7 (13), 1900239. DOI: https://doi.org/10.1002/adom.201900239.

Hu et al. Imaging propagative exciton polaritons in atomically thin S waveguides, Physical Review B, 2019, 100.

Huo, N.; Yang, Y.; Wu, Y. N.; Zhang, X. G.; Pantelides, S. T.; Konstantatos, G. High carrier mobility in monolayer CVD-grown MoS2 through phonon suppression. Nanoscale 2018, 10(31), 15071-15077. DOI: 10.1039/c8nr04416c From NLM PubMed-not-Medline.

Hussain, S.; Shaikh, S. F.; Vikraman, D.; Mane, R. S.; Joo, O.-S.; Naushad, M.; Jung, J. Sputtering and sulfurization-combined synthesis of a transparent WS2 counter electrode and its application to dye-sensitized solar cells. RSC Advances 2015, 5 (125), 103567-103572, 10.1039/C5RA18613G. DOL 10.1039/C5RA18613G.

Imamoto et al., AlGaAs/GaAs superlattice multi-quantum-well laser diode, Superlattices and microstructures, 1989, 5, 167-170.

Jariwala, D.; Davoyan, A. R.; Wong, J.; Atwater, H. A. Van der Waals Materials for Atomically-Thin Photovoltaics: Promise and Outlook. ACS Photonics 2017, 4 (12), 2962-2970. DOI: 10.1021/ acsphotonics.7b01103.

Jeong, K. Kim, K. Lee, and J. H. Park, "A compact and lowdriving-voltage silicon electro-absorption modulator utilizing a Schottky diode operating up to 13.2 GHz in C-band," Jpn. J. Appl. Phys. 59(12), 122001 (2020.

* cited by examiner

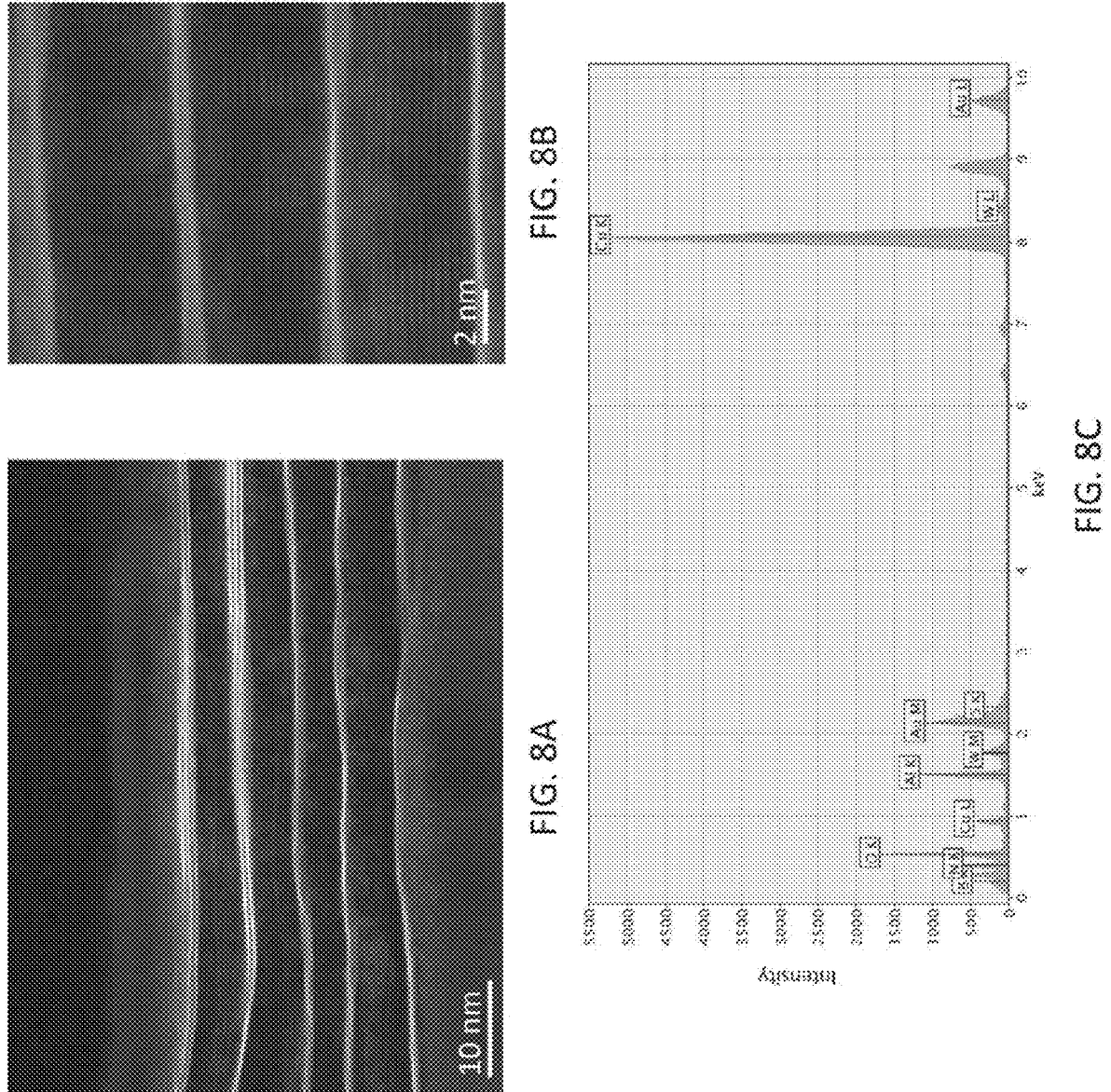

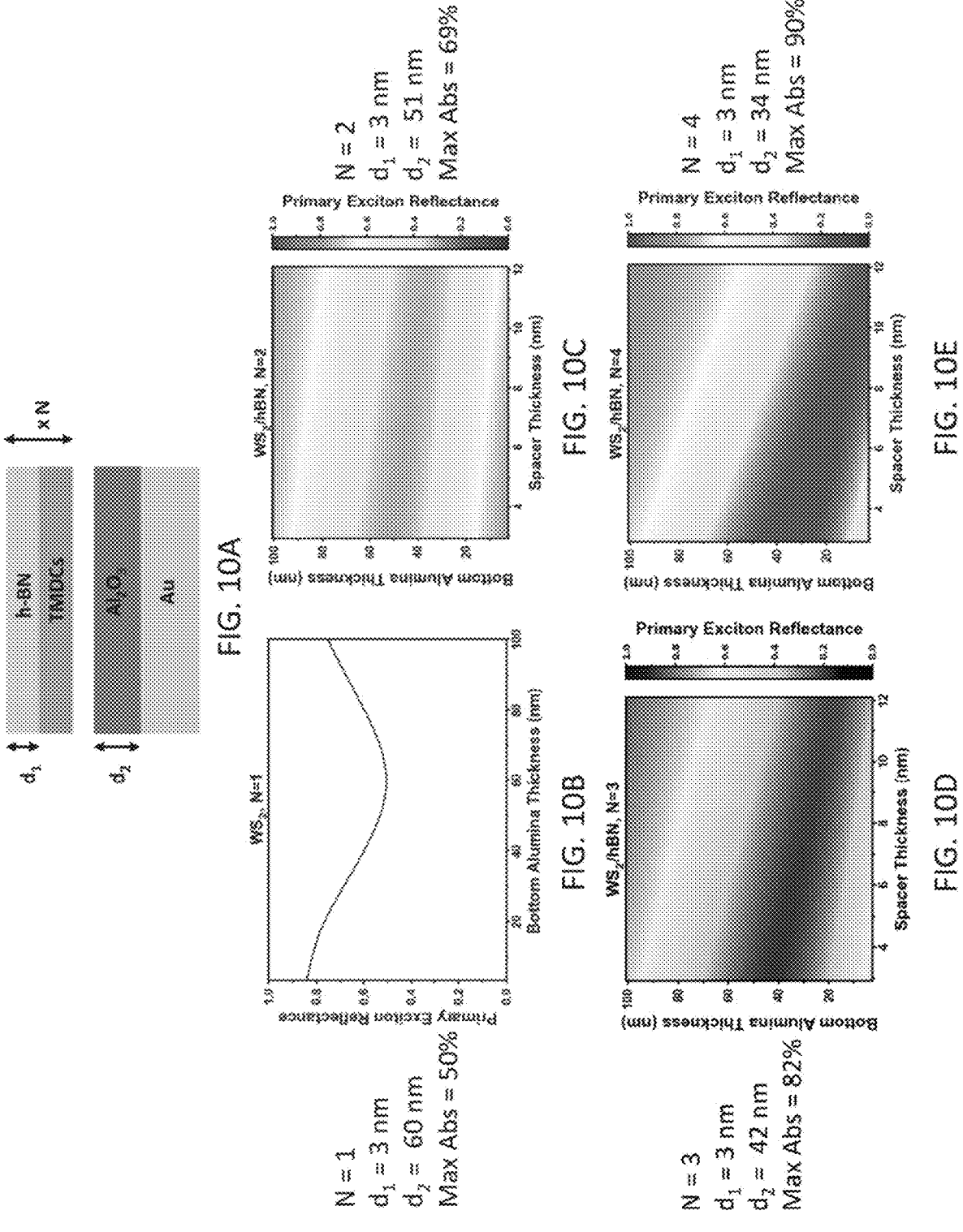

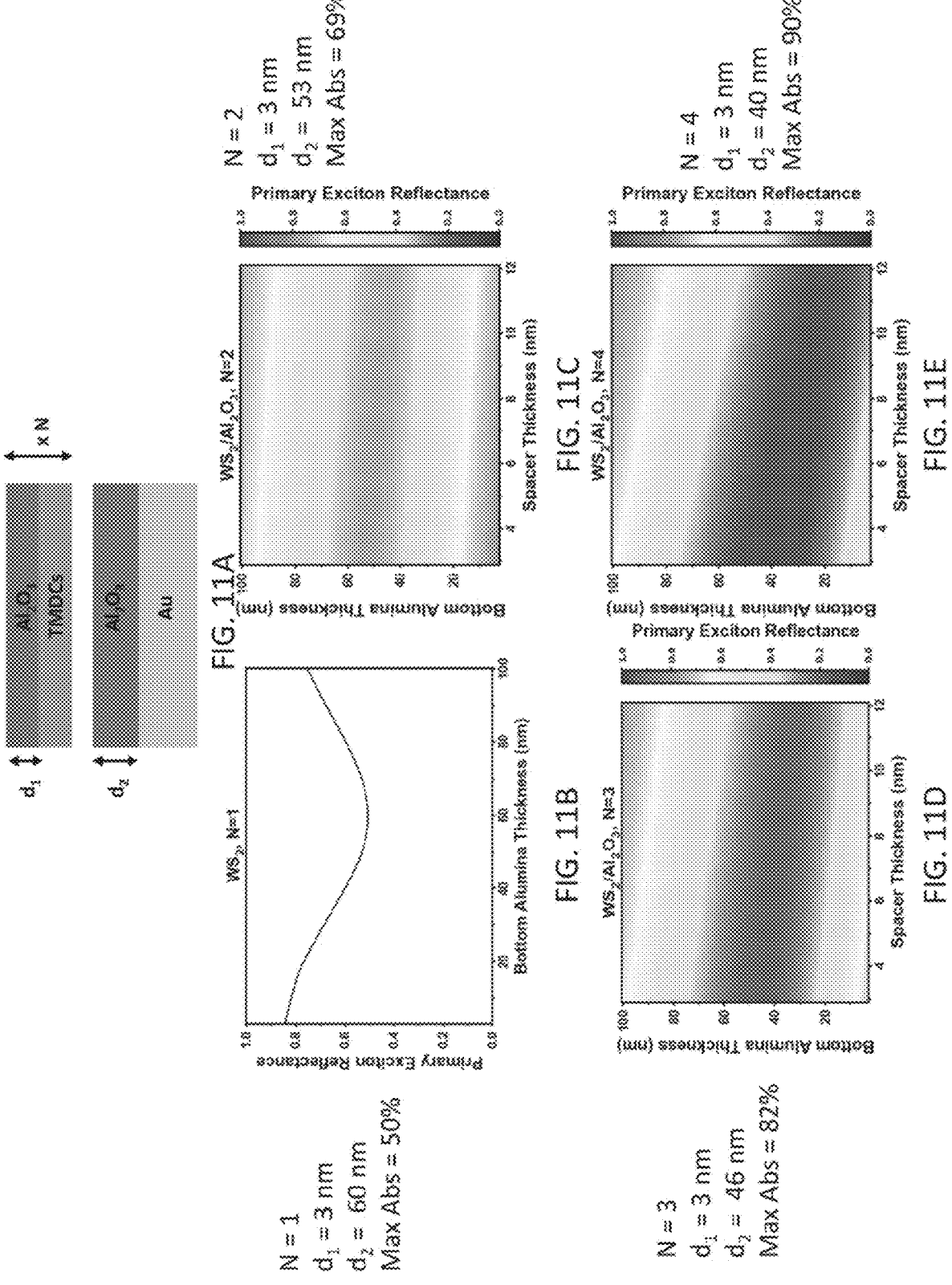

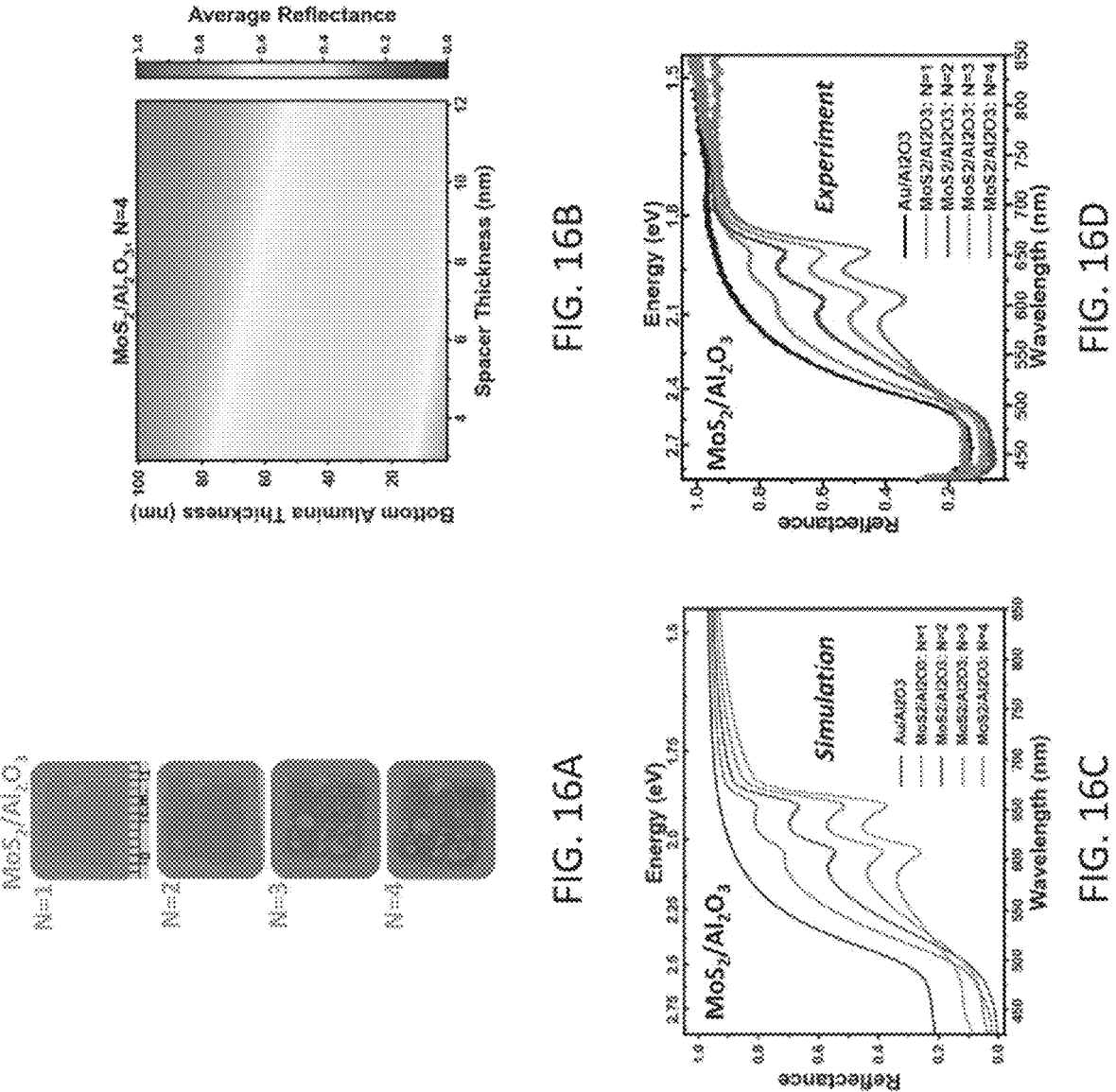

*Comparison of WS₂/hBN (N=5) with exfoliated bulk WS₂*

☐ Layer resolved absorptance (WS₂/h-BN: N=5) and E-field profile

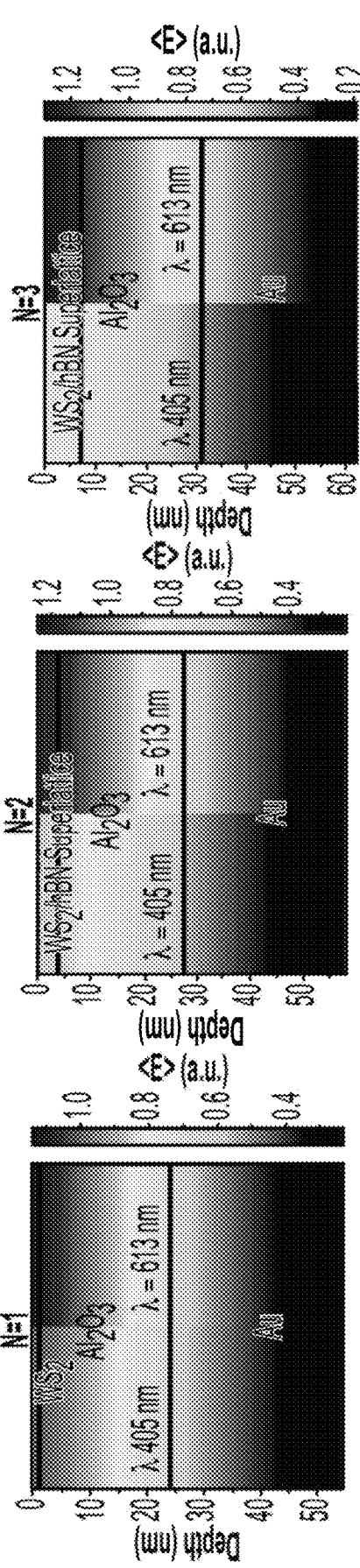
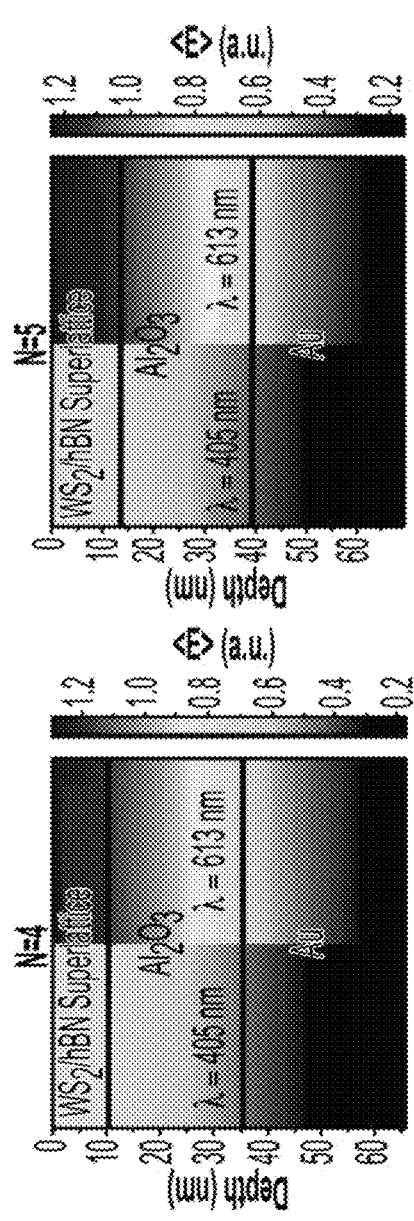
FIG. 20C

Power dependent PL analysis: WS₂/h-BN (532 nm excitation)

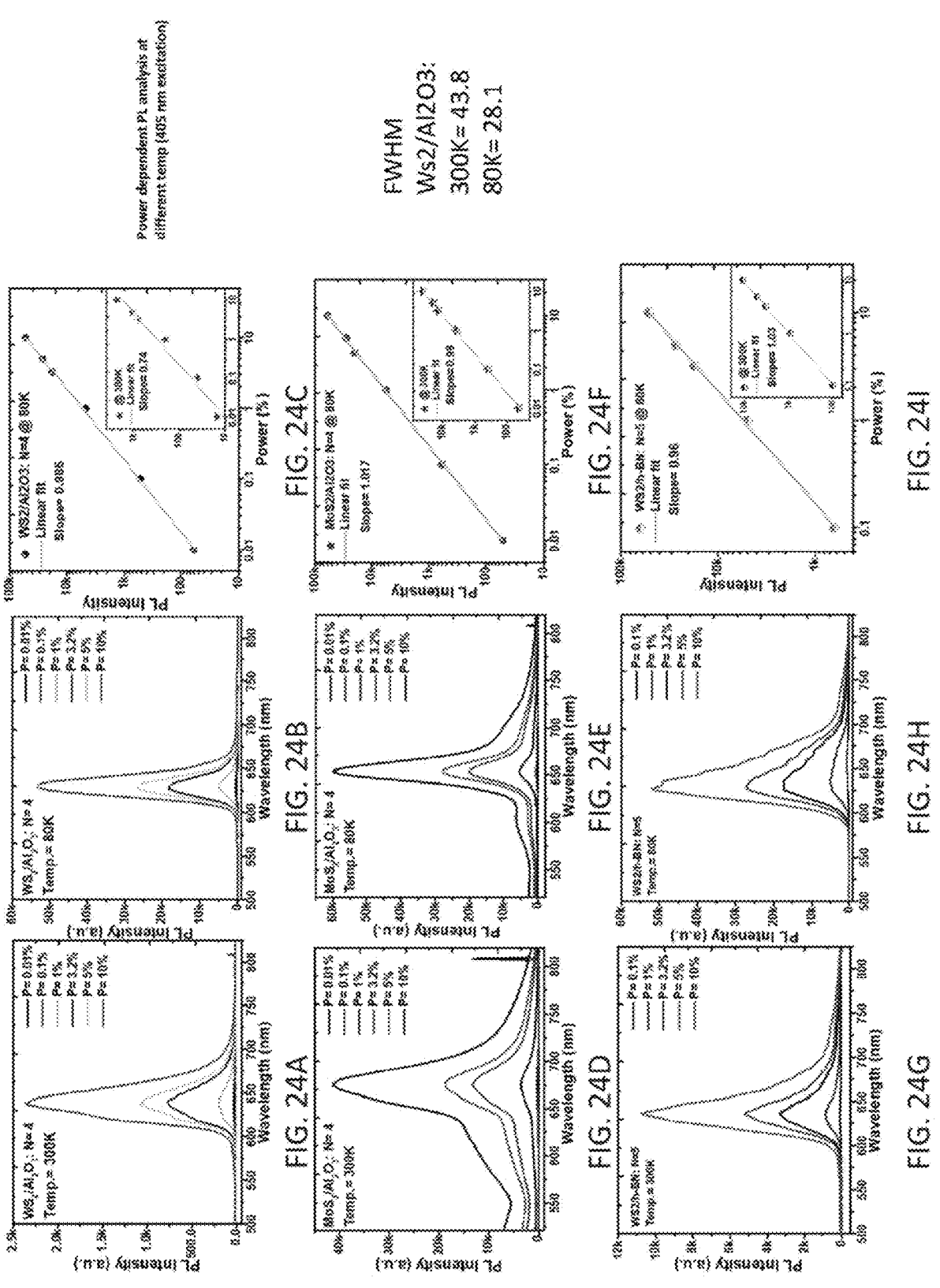

Angle dependent
Reflectance across
Au/Al₂O₃ (34 nm)

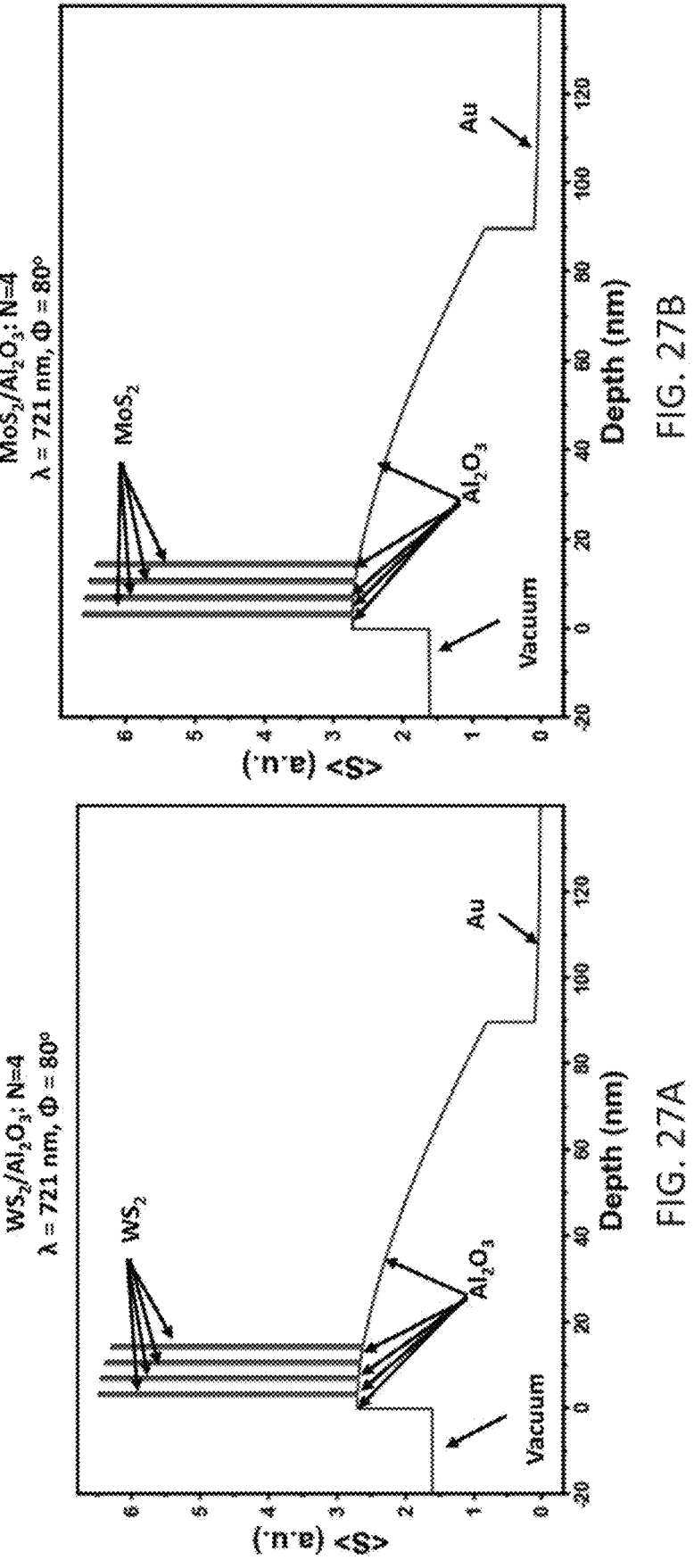

3-Coupled Oscillator Model $$E \begin{pmatrix} \alpha \\ \beta \\ \gamma \end{pmatrix} = \begin{pmatrix} E_{cav}(\lambda) & g_A & g_B \\ g_A & E^A_{exc} & 0 \\ g_B & 0 & E^B_{exc} \end{pmatrix} \begin{pmatrix} \alpha \\ \beta \\ \gamma \end{pmatrix}$$

Coupled Oscillator: WS₂/Dielectric Superlattice Optimized for Coupling

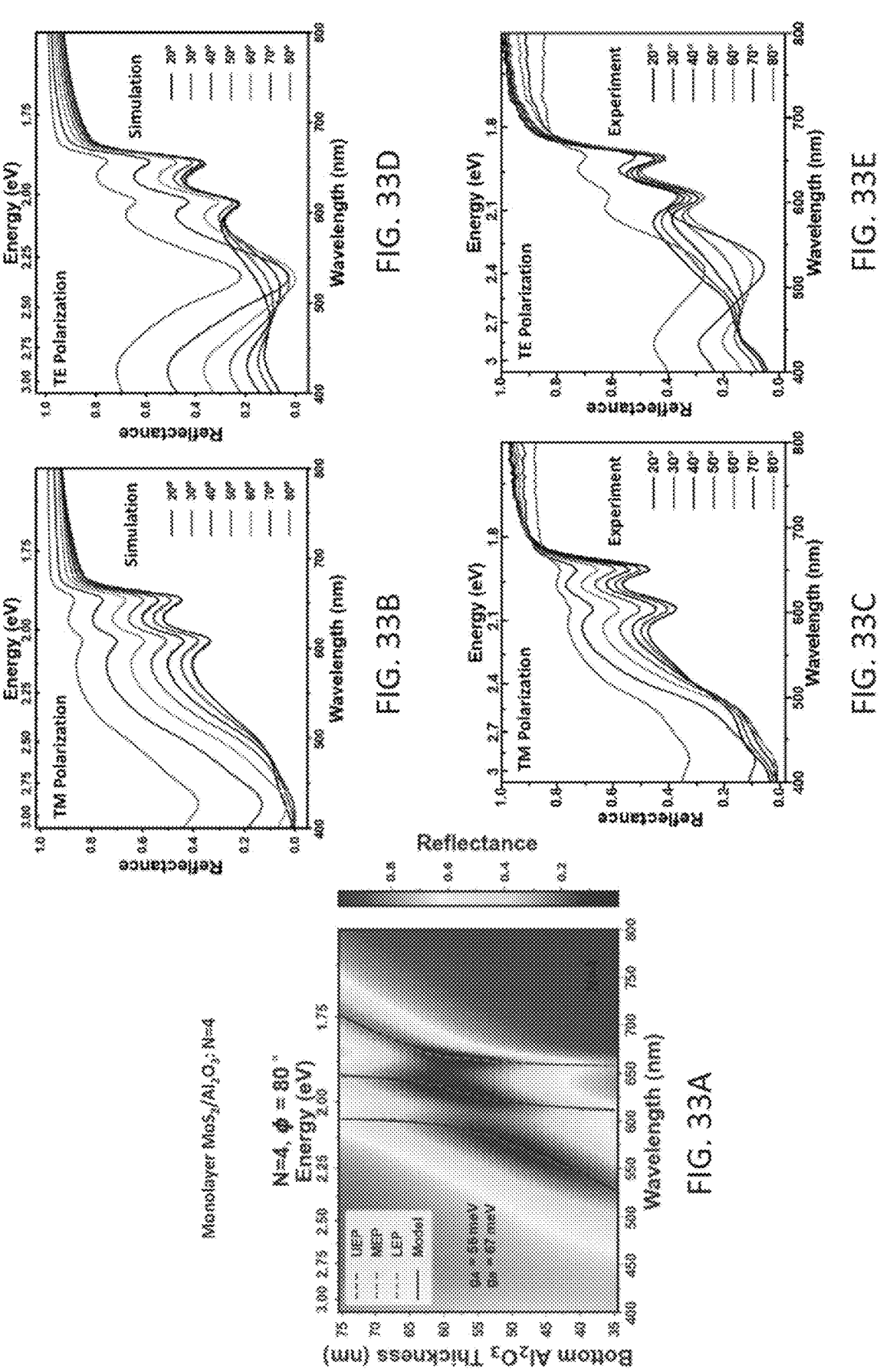

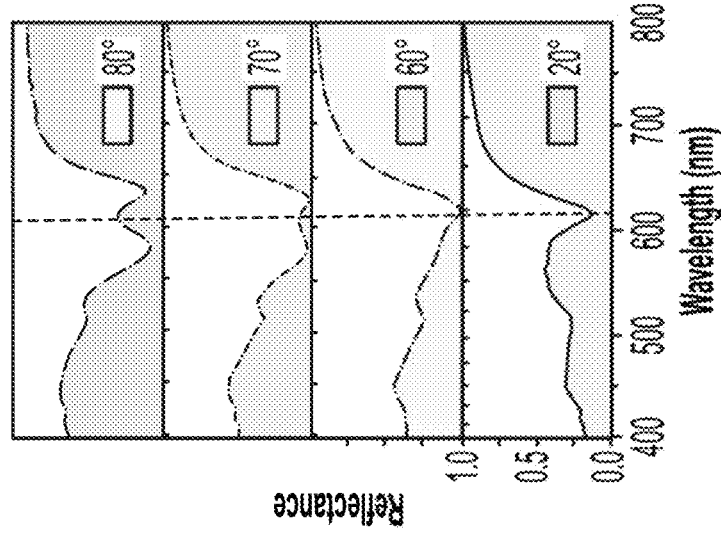
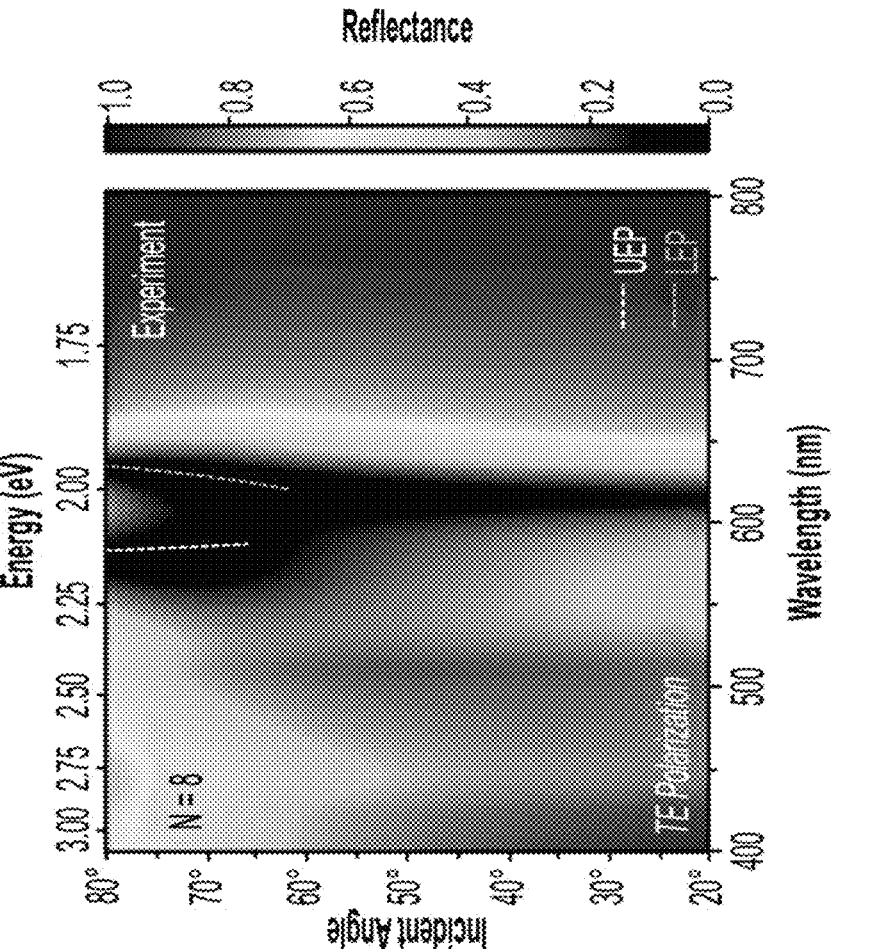
FIG. 34E

Structure of TMDCs based Excitonic Superlattices

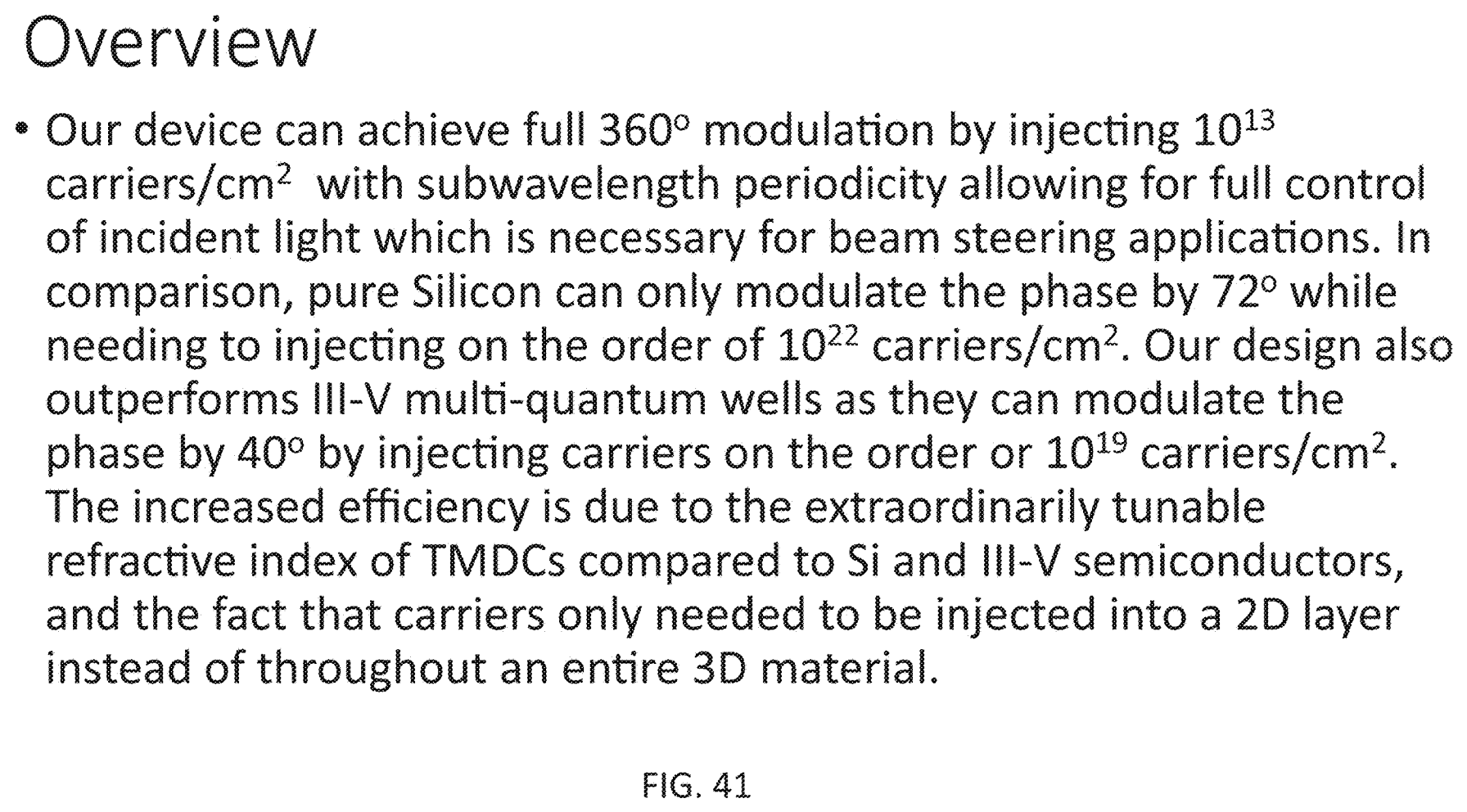

Overview

- Our device can achieve full 360° modulation by injecting $10^{13}$ carriers/cm$^2$ with subwavelength periodicity allowing for full control of incident light which is necessary for beam steering applications. In comparison, pure Silicon can only modulate the phase by 72° while needing to injecting on the order of $10^{22}$ carriers/cm$^2$. Our design also outperforms III-V multi-quantum wells as they can modulate the phase by 40° by injecting carriers on the order or $10^{19}$ carriers/cm$^2$. The increased efficiency is due to the extraordinarily tunable refractive index of TMDCs compared to Si and III-V semiconductors, and the fact that carriers only needed to be injected into a 2D layer instead of throughout an entire 3D material.

FIG. 41

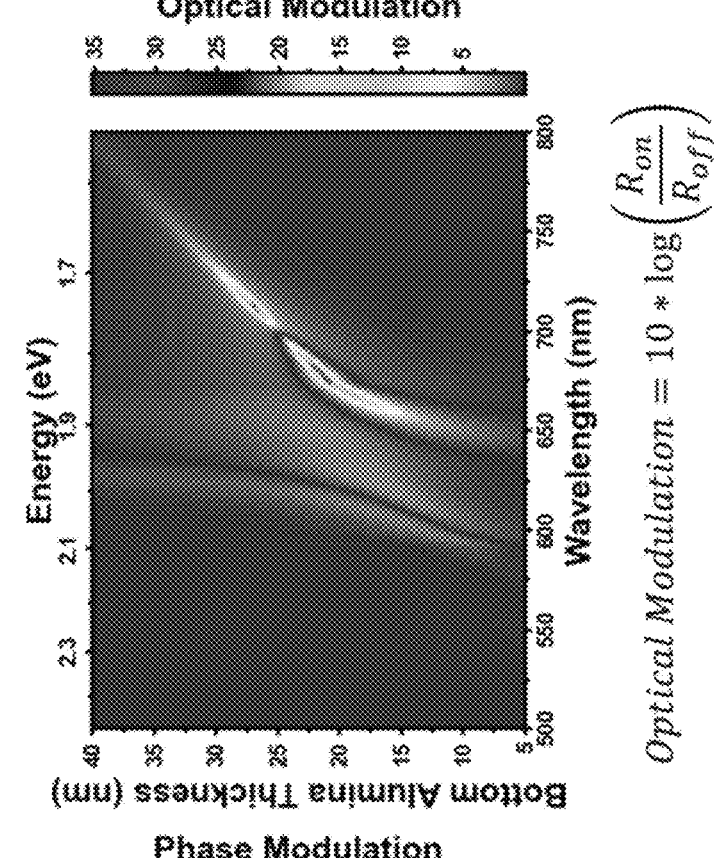
FIG. 42

Patterned Beam Steering (N=8) Normal Incident Light

Maximum azimuthal angle ($\Psi_{max}$) of reflected wave given by [Source]:

$$\Psi_{max} = \arcsin\left(\frac{\Delta\phi\lambda}{2\pi P}\right)$$

Where P is the period of the structure

Different excitonic positions and corresponding FWHM in case of $WS_2$/h-BN: N= 5 superlattice.

| Factors | Power (%) | Exciton | Trion | Biexciton | Localised State | Defect-bound |
|---|---|---|---|---|---|---|
| FWHM | 10 | 10.267 | 22.746 | 38.661 | 12.743 | 52.667 |
| Position | | 613.13 | 625.09 | 635.63 | 674.84 | 674.85 |
| FWHM | 5 | 11.478 | 21.036 | 38.12 | 12.42 | 51.54 |
| Position | | 613.45 | 623.4 | 633.62 | 674.04 | 674.04 |
| FWHM | 2.5 | 10.143 | 21.8 | 32.62 | 11.66 | 75.54 |
| Position | | 613.04 | 622.33 | 634.26 | 674.11 | 653.88 |
| FWHM | 1.25 | 11.515 | 19.548 | 39.08 | 14 | 57.65 |
| Position | | 613.44 | 623 | 631.85 | 673.69 | 673.69 |
| FWHM | 0.62 | 8.79 | 20.51 | 34.568 | 75.44 | 5.35 |
| Position | | 612.8 | 621.77 | 631.53 | 656.05 | 674.24 |
| FWHM | 0.31 | 9.24 | 19.23 | 35.42 | 9.86 | 80.1 |
| Position | | 612.29 | 621.78 | 630.8 | 674.15 | 657.85 |

Example data

| Medium | Primary Emission Wavelength (nm) | θ | t | Carrier Density (cm⁻²) |
|---|---|---|---|---|
| Monolayer MoS2 [Bulk] | 654 (670)[ref 2] | 4.85 (5.9)[ref 6] | 1 (1.4)[ref 6] | ~4 x $10^{12}$[ref 5] |
| Monolayer WSe2 [Bulk] | 613 (640)[ref 8] | 5.2 (5.2)[ref 8] | 1.83 (1.3)[ref 8] | ~7 x $10^{12}$[ref 9] |
| Monolayer MoSe2 [Bulk] | 780 (795)[ref 8] | 5.8 (5.25)[ref 8] | 0.85 (1.4)[ref 8] | ~1 x $10^{13}$[ref 10] |
| Monolayer WS2 [Bulk] | 735 (770)[ref 8] | 5.1 (4.9)[ref 8] | 2.8 (1.3)[ref 8] | 1.4 x $10^{13}$[ref 11] |
| Titanium film GaAs (7.8 nm) | 80[ref 12] | 4.55[ref 12] | 1.87[ref 12] | 1 x $10^{13}$[ref 13] |
| GaN | 570[ref 14] | 2.96[ref 14] | 0.42[ref 14] | ~1.75 x $10^{12}$[ref 15] |

Example data

| Material | n (710 nm) | Bandgap (eV) |
|---|---|---|
| Al2O3 | 1.68 | 7.0[ref 16] |
| BaF2 | 2.19 | 4.02[ref 17] |
| TiO2 | 2.11[ref 18] | 3.2[ref 19] |
| HfO2 | 1.9[ref 20] | 5.3[ref] |
| Si3N4 | 2.03[ref 21] | 5[ref 22] |
| SiO2 | 1.45 | 10.5[ref 23] |

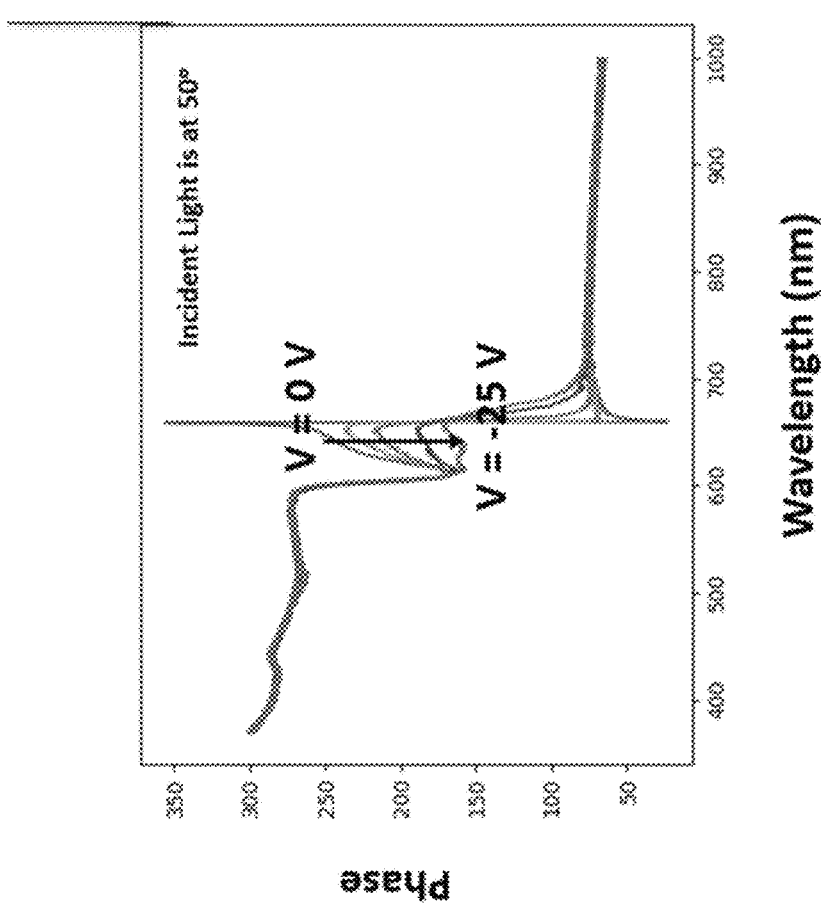
FIG. 47
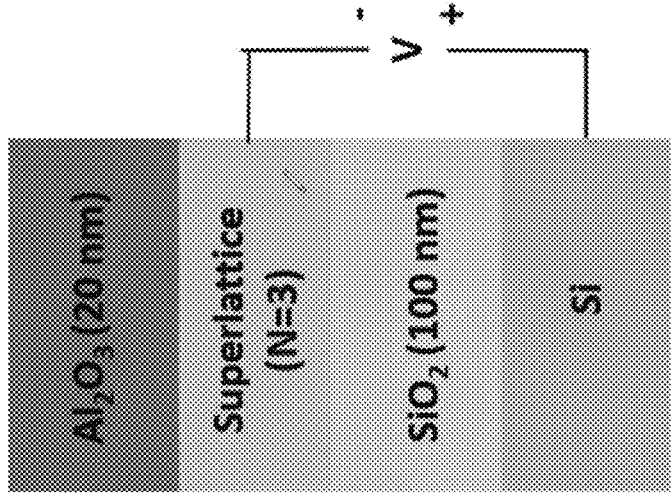

Device Structure

Optical Dispersion and Mode Characteristics

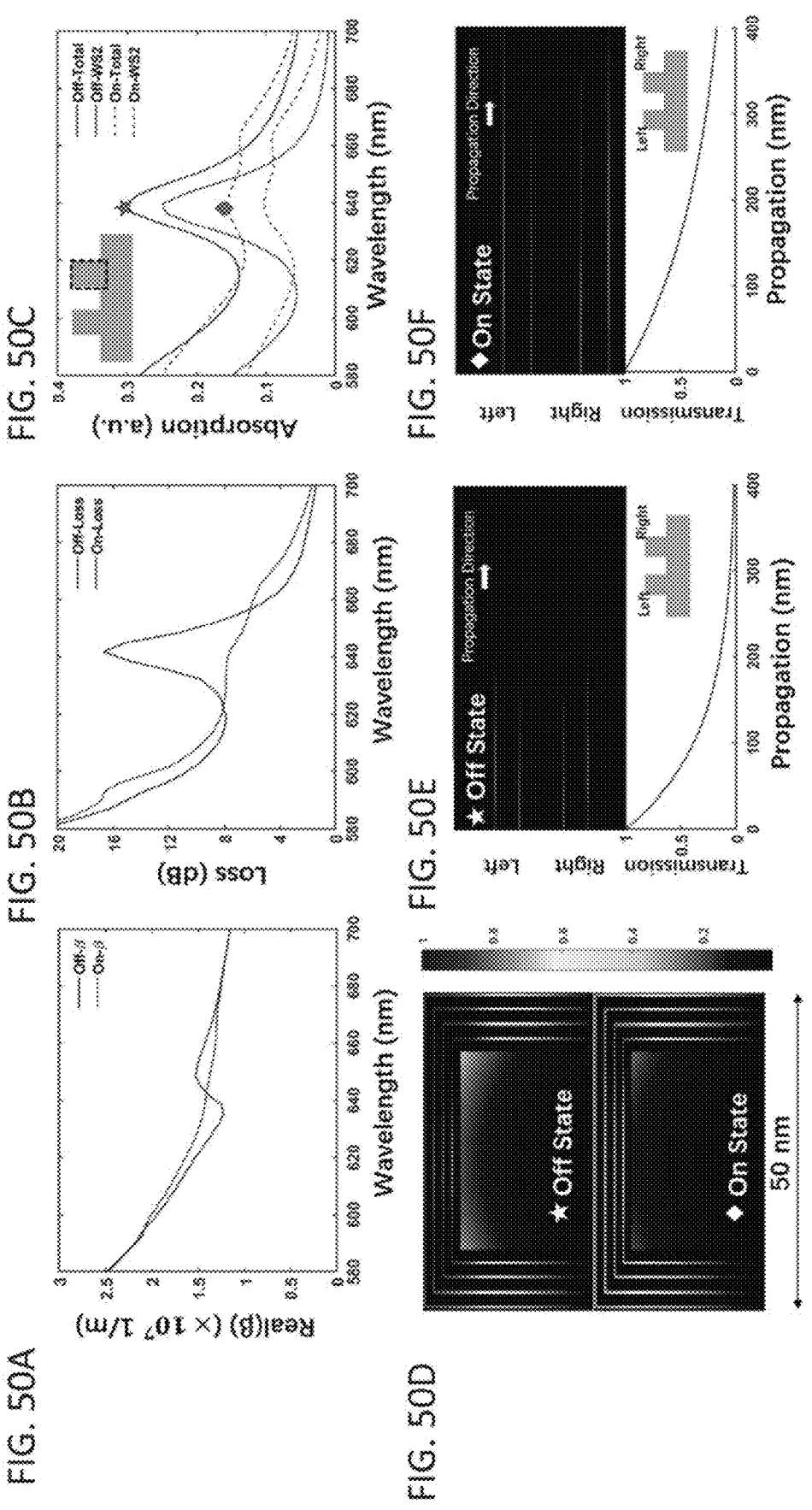

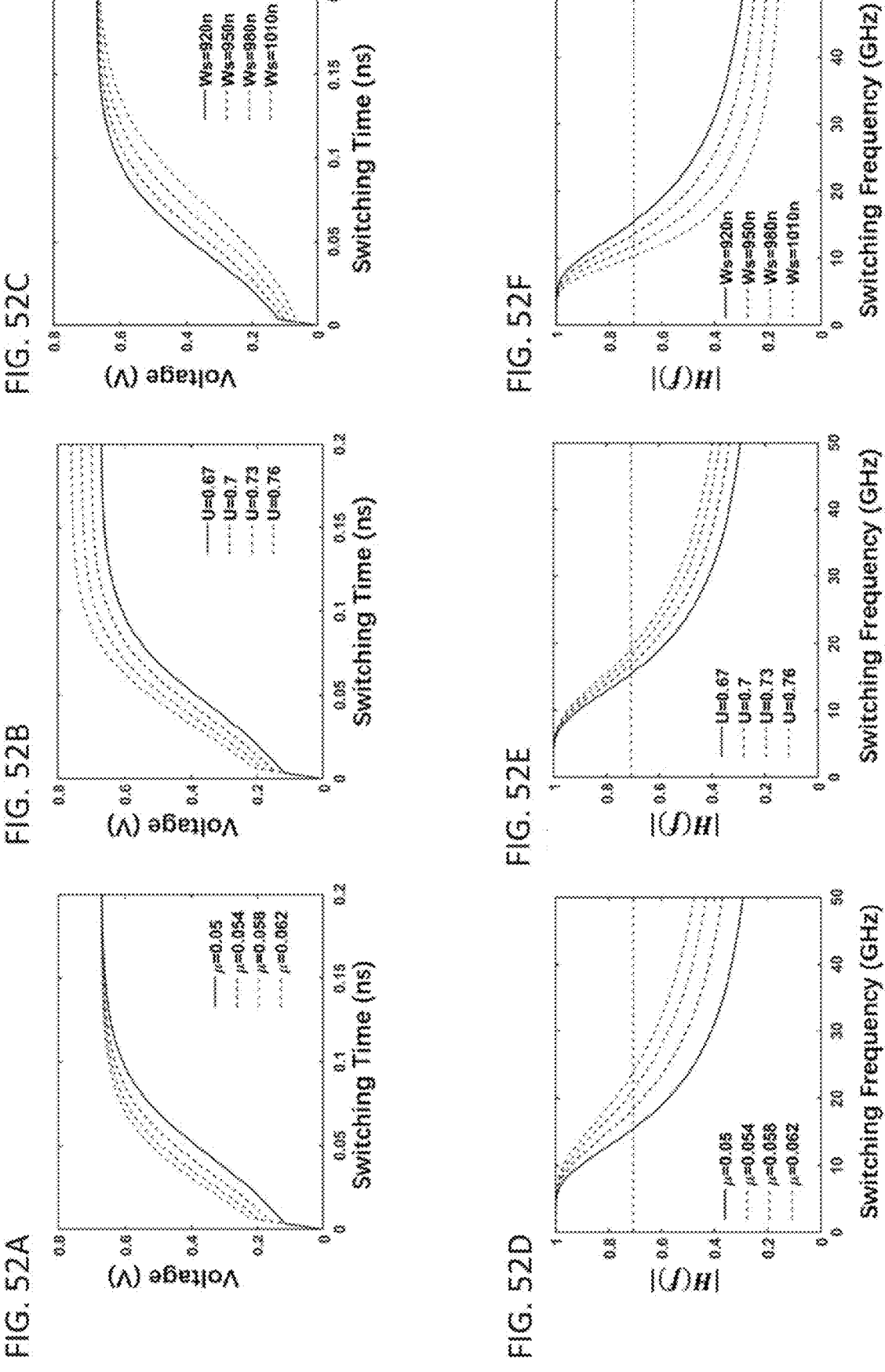

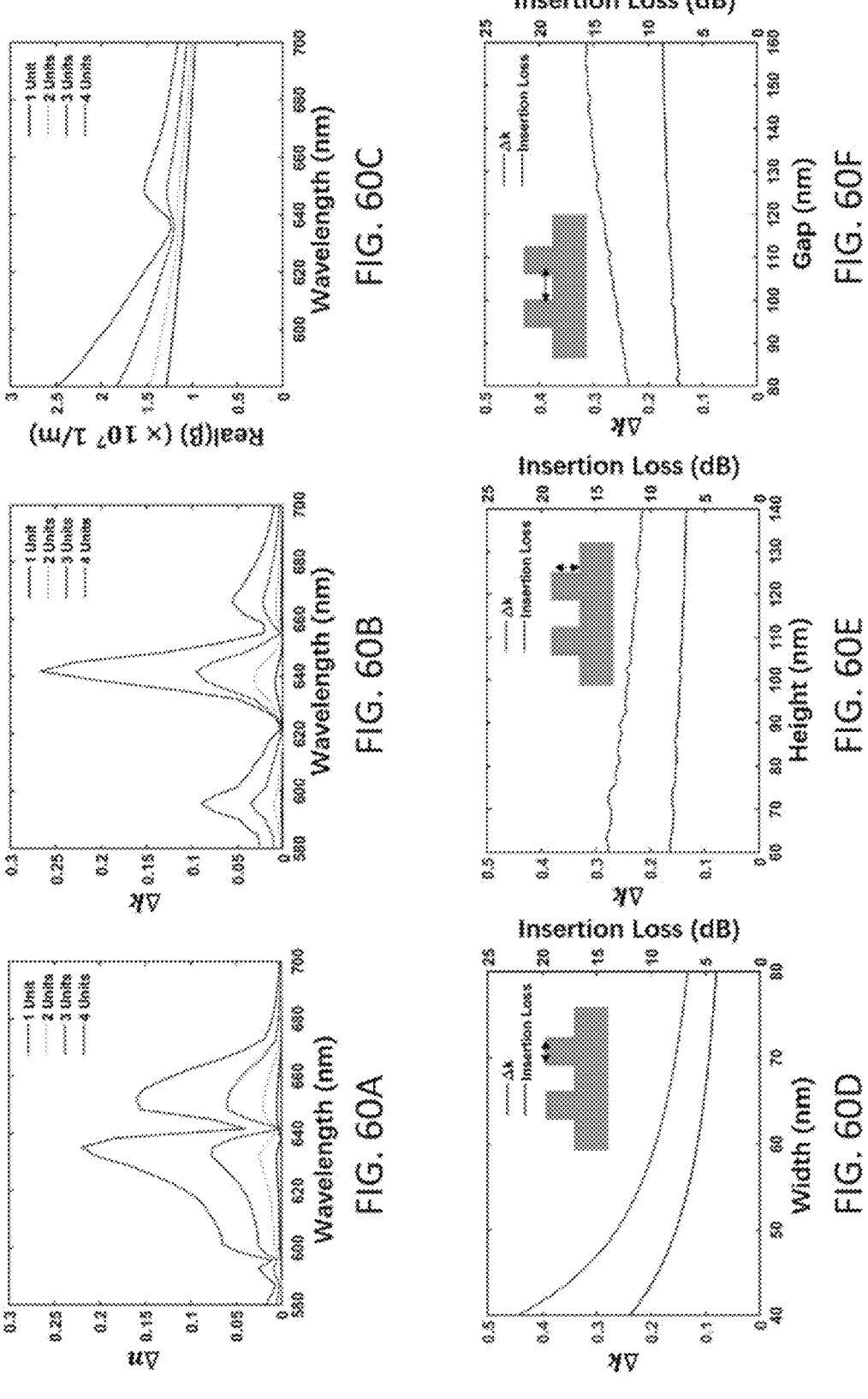

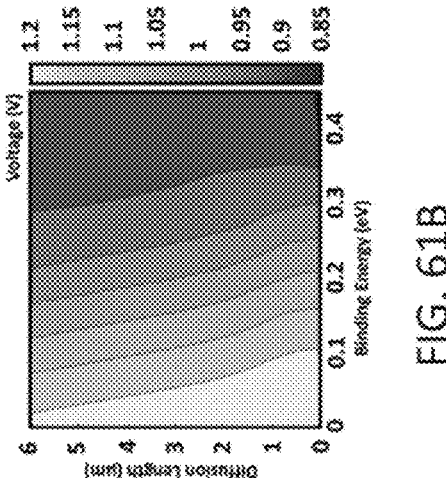
FIG. 61B
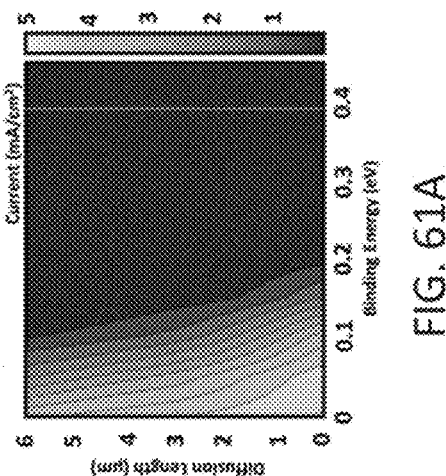
FIG. 61A
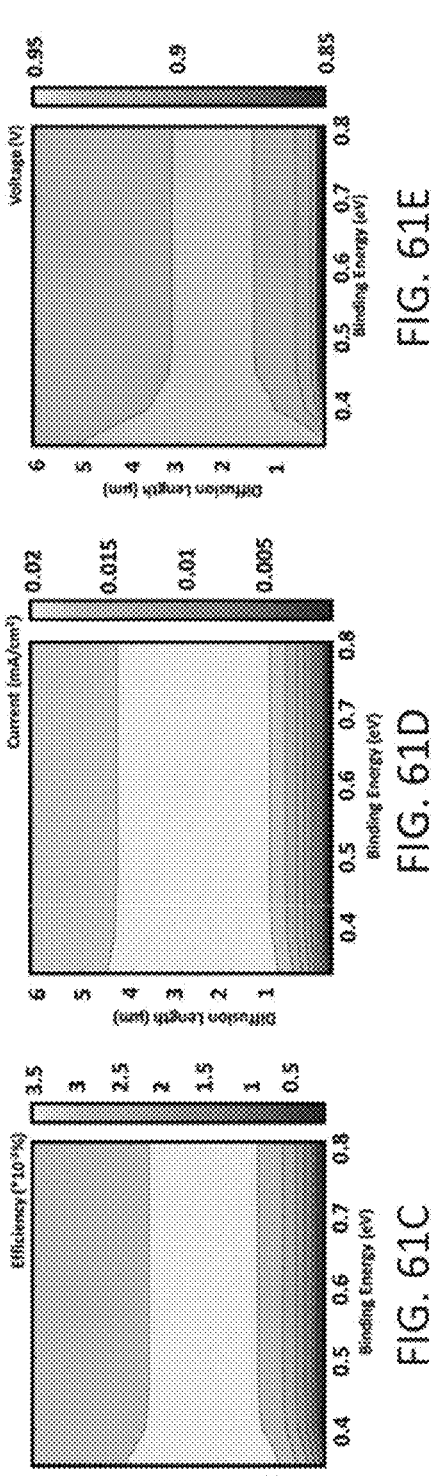
FIG. 61E
FIG. 61D
FIG. 61C

SCALABLE VAN DER WAALS SUPERLATTICES FOR ABSORBERS AND EMITTERS

CROSS-REFERENCE TO RELATED APPLICATIONS

This application claims benefit under 35 U.S.C. § 119(e) of Provisional U.S. Patent Application No. 63/318,154, filed Mar. 9, 2022, the contents of which are incorporated herein by reference in their entirety.

GOVERNMENT RIGHTS

This invention was made with government support under W911NF-19-1-0109 awarded by the Army, FA9550-21-1-0035 and FA2386-20-1-4074 awarded by the Air Force. The government has certain rights in the invention.

TECHNICAL FIELD

The present disclosure relates to the field of nanotechnology and to the field of superlattice materials.

BACKGROUND

Two-dimensional (2D) vdW materials are a broad and growing family of materials with a diverse range of electronic properties, encompassing metals, semiconductors, ferromagnets, superconductors and insulators. This diversity allows for vdW materials to be combined with one another, or with other thin materials, into heterostructures with new or enhanced properties and improved performance in a variety of applications. Most of the previous research has focused on heterostructures that are made using mechanically exfoliated layers that are a few $\mu m^2$ in lateral size with uneven thickness. This presents significant challenges in making MQW or superlattice structures with sufficient reproducibility across the number of periods necessary to enable the desired photonic or electronic dispersions. Accordingly, there is a long-felt need in the field for improved vdW materials and related methods.

SUMMARY

In meeting the described long-felt needs, the present disclosure provides a component, comprising: a first region that has a thickness and comprises one or more repeat units, a repeat unit comprising a portion of a van der Waals material (vdW or vdW material) superposed on a portion of dielectric spacer, the vdW being a monolayer or being few-layer (e.g. from 2 to 10 layers) in nature, the vdW and dielectric spacer of a repeat unit being arranged to define a superlattice. The vdW material can be, e.g., a transition metal dichalcogenide.

Also provided is a method, comprising assembling a component according the present disclosure, e.g., according to any one of Aspects 1-18.

Further disclosed is a method, comprising operating a component according to the present disclosure, e.g., according to any one of Aspects 1-18.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document. In the drawings:

FIG. 8: (a) High magnification annular dark field (ADF) scanning transmission electron microscope (STEM) imaging of the $WS_2$/h-BN superlattice (N=5) and magnified (b) HAADF-STEM imaging of an atomic thin hBN spacer. (c) EDS spectral feature identifying all the elements present in the $WS_2$/h-BN: N=5 superlattice.

FIG. 10: The results for optimizing the $WS_2/Al_2O_3$ super-lattice for N=1 through N=4 for maximum primary exciton (613 nm) absorptance which corresponds to a minimum in the reflectance. (a) Schematic of a device with the optimized parameters marked. $d_1$ is called the spacer thickness, and $d_2$ is the bottom alumina thickness. (b-e) The optimization results for varying spacer and bottom alumina thickness with the optimal parameters listed for N=1 through 4.

FIG. 11: The results for optimizing the $MoS_2/Al_2O_3$ superlattice for N=1 through N=4 for maximum average absorptance of the A and B excitons (575 to 675 nm). (a-d) The optimization results for varying spacer and bottom alumina thickness with the optimal parameters listed for N=1 through 4. $d_1$ is the spacer thickness, and $d_2$ is the bottom alumina thickness.

FIG. 16: (a) Show the deposition of different number of unit cells of the $MoS_2/Al_2O_3$ superlattice. (b) The optimization process for the $MoS_2/Al_2O_3$N=4 superlattice. (c) The simulated reflectance of the $Al_2O_3$/Au substrate and varying number of unit cells, and (d) the experimentally measured reflectance of the $Al_2O_3$/Au substrate and varying number of unit cells.

FIG. 24: The dependent PL spectra for $WS_2$/$Al_2O_3$ superlattice at temperatures of (a) 300 K and (b) 80 K. The PL intensity increased by a factor of ~23 when cooling the sample from 300 K to 80 K. (c) Shows the linear dependent of the maximum PL intensity on laser power for the $WS_2$/$Al_2O_3$N=4 superlattice at 80 K. The dependent PL spectra for $MoS_2$/$Al_2O_3$ superlattice at temperatures of (d) 300 K and (e) 80 K. (f) Shows the linear dependent of the maximum PL intensity on laser power for the $MoS_2$/$Al_2O_3$N=4 superlattice at 80 K. The dependent PL spectra for $WS_2$/h-BN superlattice at temperatures of (g) 300 K and (h) 80 K. The PL intensity increased by a factor of ~5 when cooling the sample from 300 K to 80 K. (i) shows the linear dependent of the maximum PL intensity on laser power for $WS_2$/h-BN superlattice. Inset of figure c, f, i consist linear dependencies of laser power upon the PL peak intensities measured at room temperature.

FIG. 27: The Poynting vector distributions in (a) $WS_2$/$Al_2O_3$: N=4 and (b) $MoS_2$/$Al_2O_3$: N=4 superlattices. Both are for incident angles of 800 with bottom $Al_2O_3$ thicknesses of 75 nm. The arrows indicate the material in each region.

for $WS_2$/$Al_2O_3$ N=5 and (b) $WS_2$/h-BN N=5 superlattices.

Figures 31A, 31B, 31C, 31D:
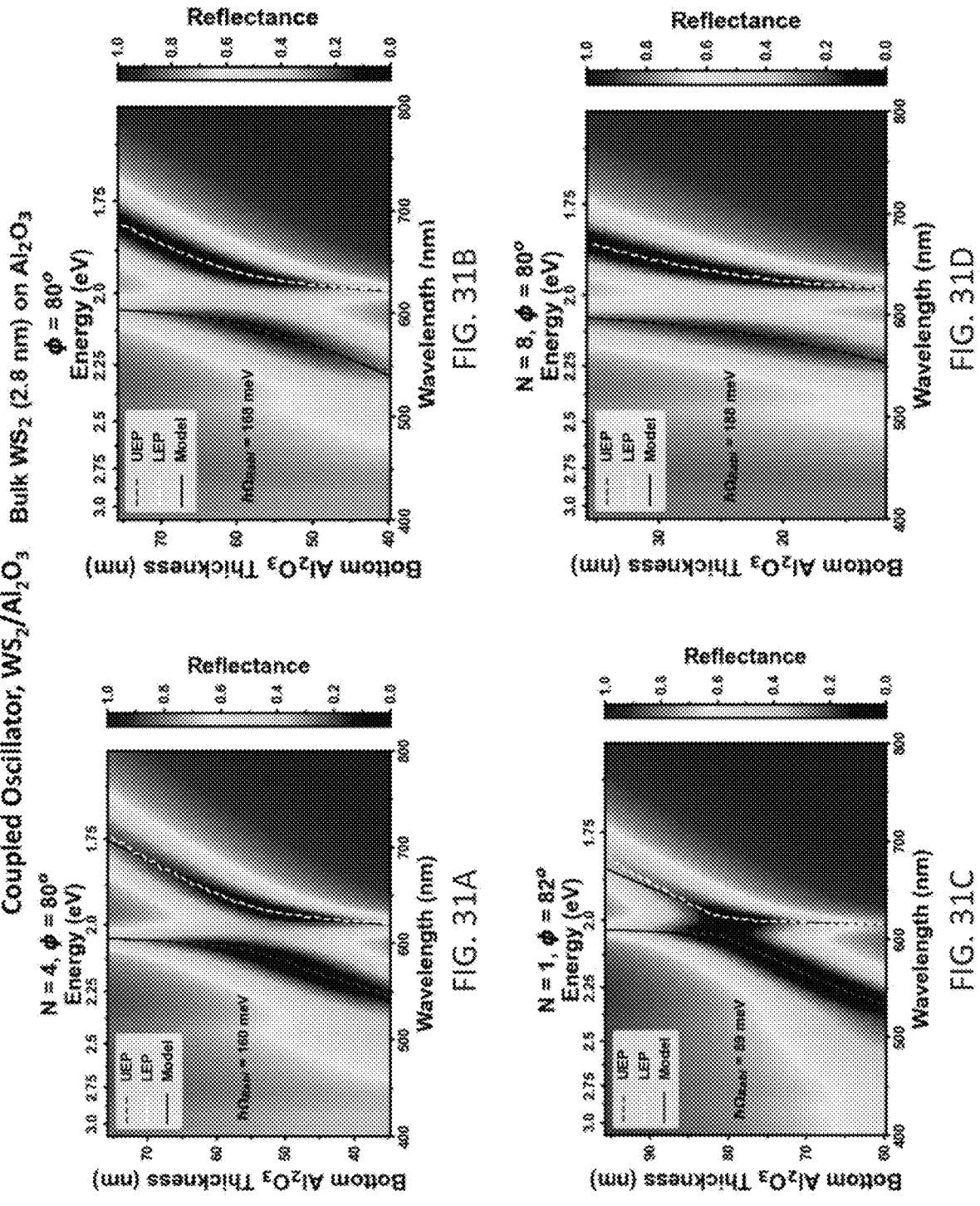

FIG. 31: The simulated anti-crossing behavior of (a) $WS_2$/$Al_2O_3$N=4, (b) bulk $WS_2$ (2.8 nm) on $Al_2O_3$ (34 nm) and Au, (c) $WS_2$/$Al_2O_3$N=1, and (d) $WS_2$/$Al_2O_3$N=8.

Figures 32A, 32B, 32C, 32D, 32E, 32F:
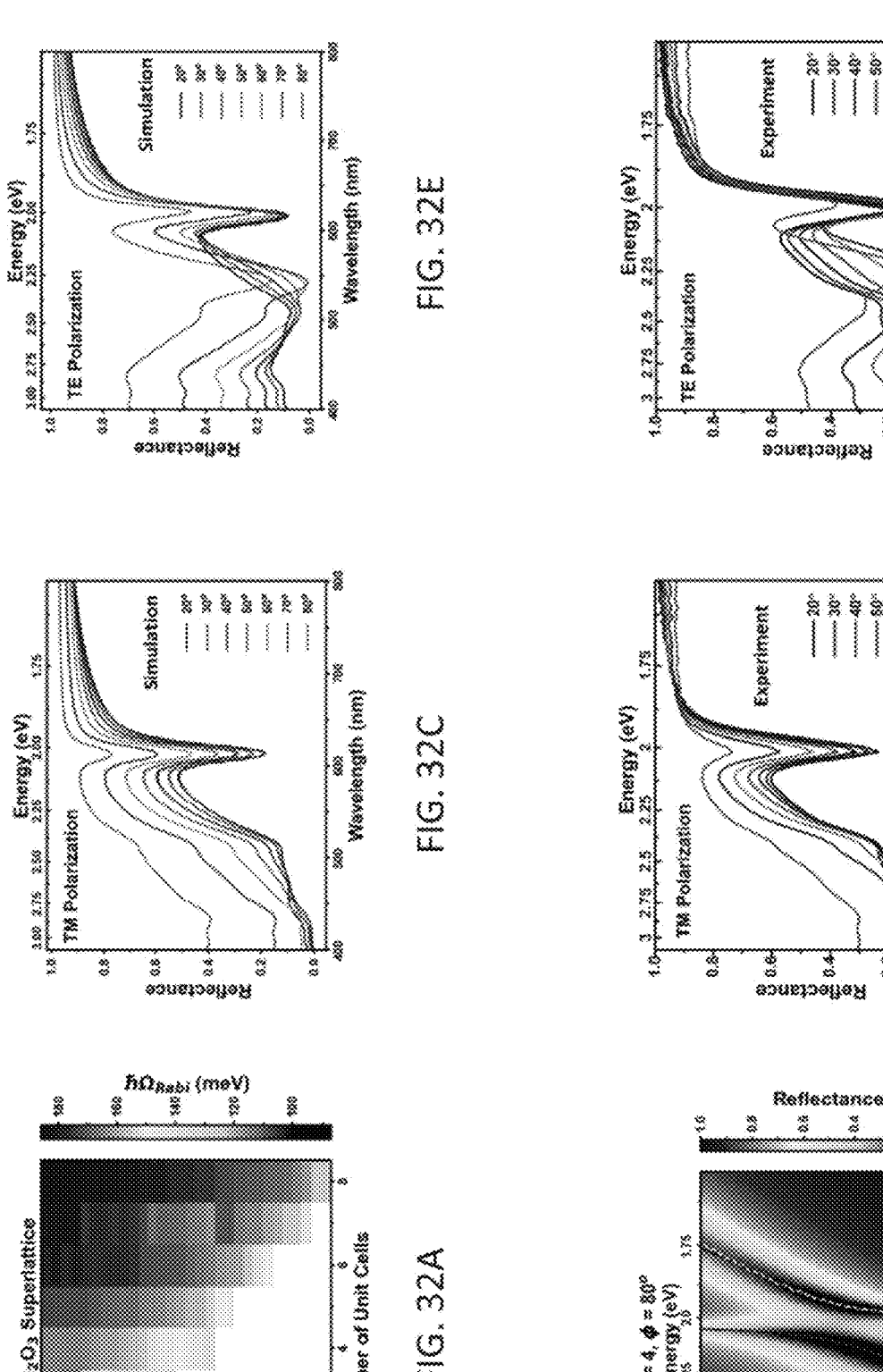
Figure 34B:
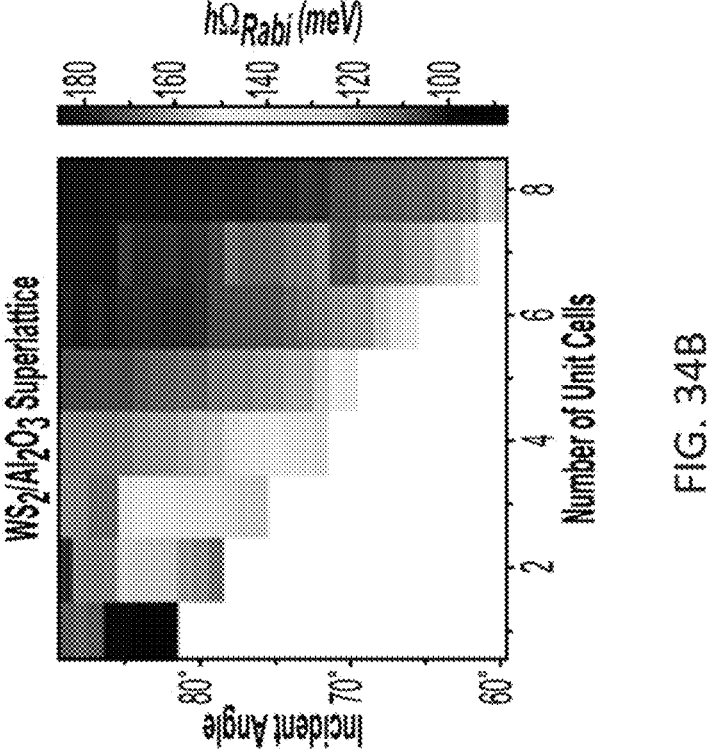
Figure 34A:
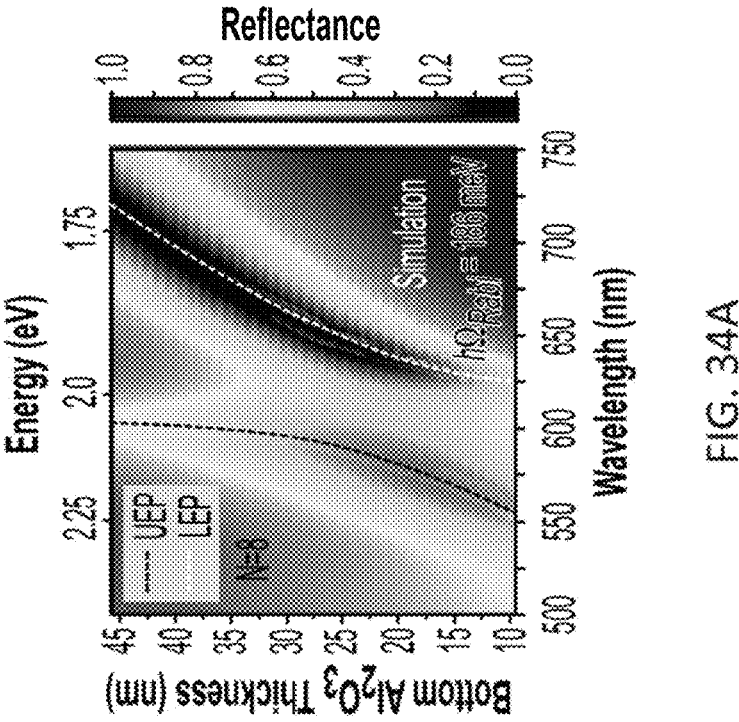
Figures 34C, 34D:
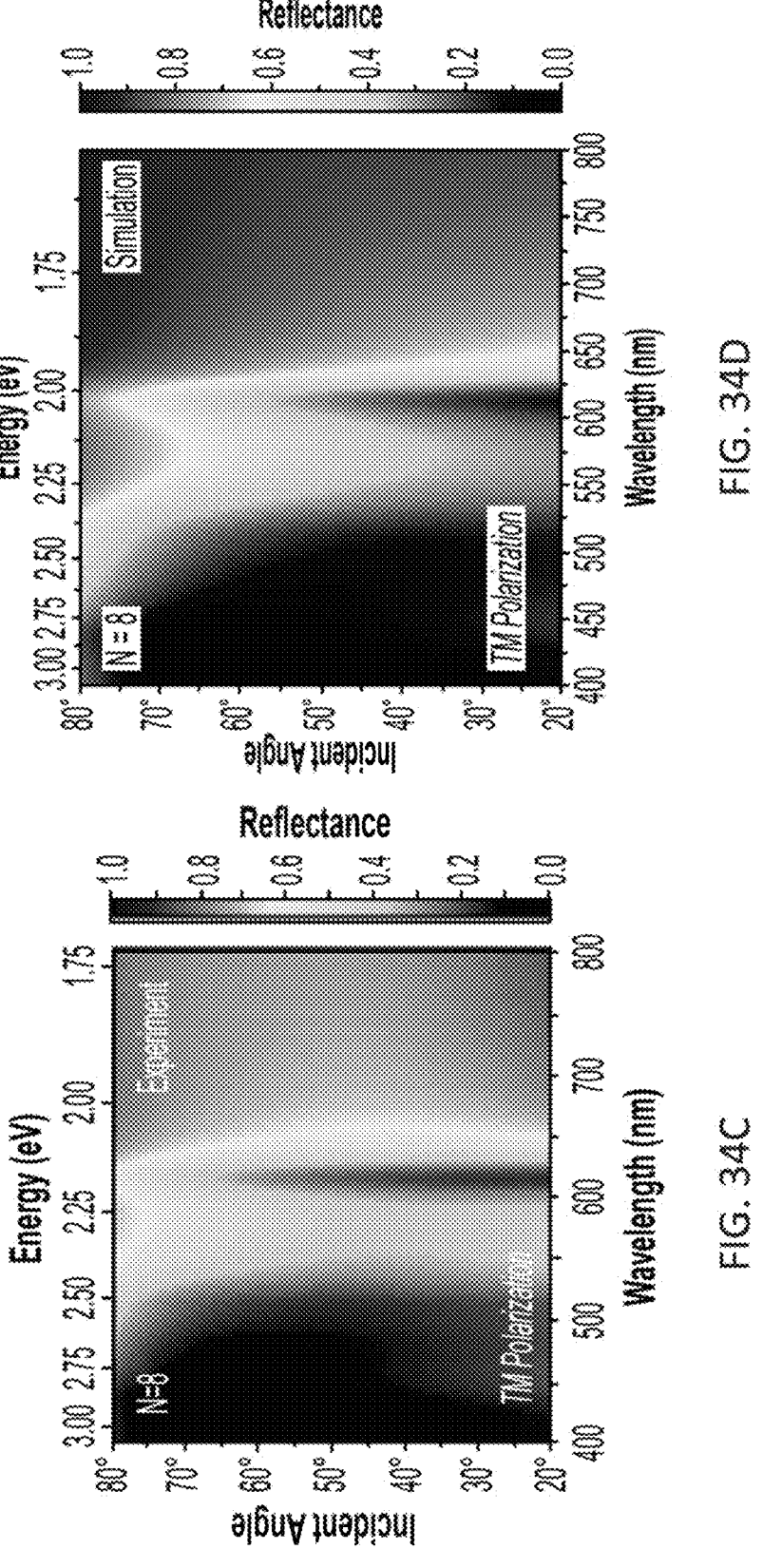
Figure 34F:
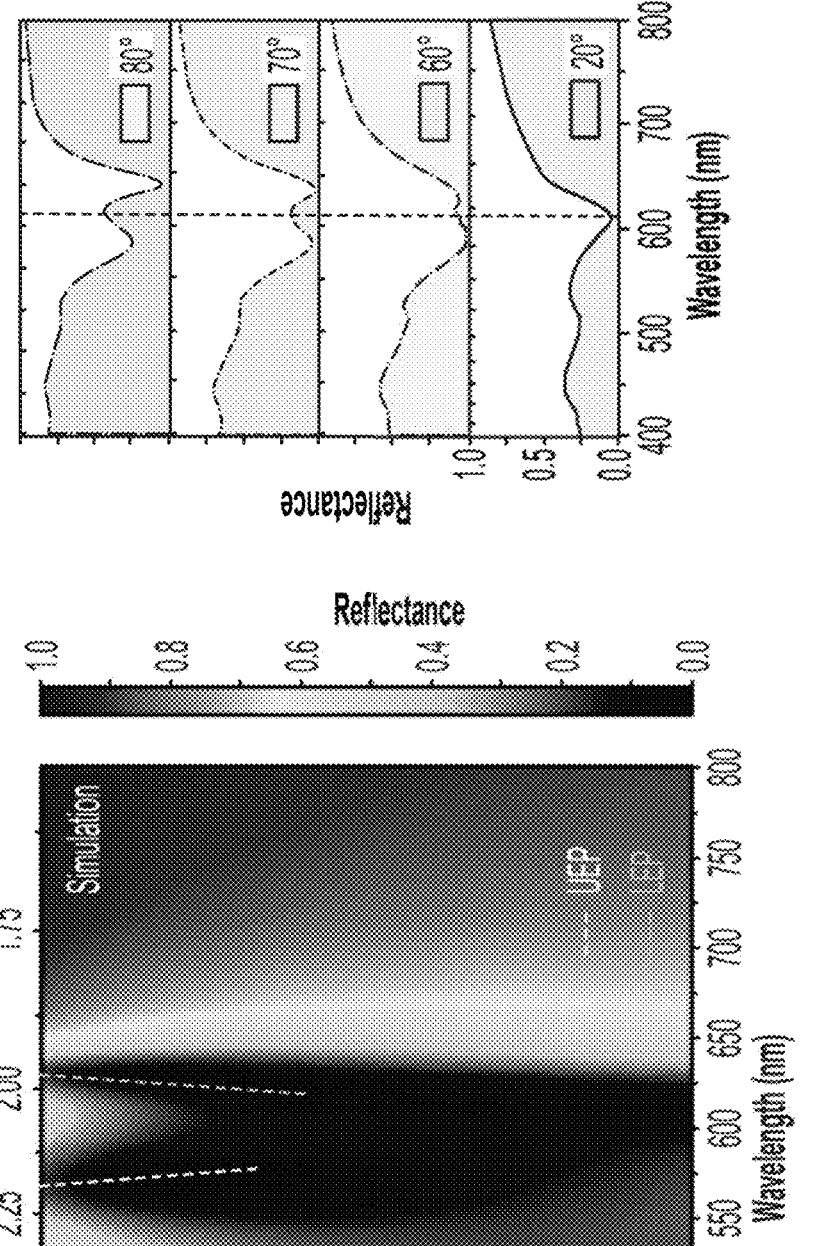

FIG. 32: Spectra of the $WS_2$/$Al_2O_3$N=4 superlattice. (a) The incident angle and number of unit cell dependence of the Rabi splitting under TE polarized light. (b) The anti-crossing behavior. The (c) simulated and (d) experimental reflectance spectra of TM polarized light. The (e) simulated and (f) experimental reflectance spectra of TE polarized light.

FIG. 33: Spectra of the $MoS_2$/$Al_2O_3$N=4 superlattice. (a) The anti-crossing behavior. The (b) simulated and (c) experimental reflectance spectra of TM polarized light. The (d) simulated and (e) experimental reflectance spectra of TE polarized light.

FIG. 34: (a) Anticrossing behavior of a simulated $WS_2$/$Al_2O_3$: N=8 device under TE polarized incident light with a coupled-oscillator model yielding a Rabi splitting value of 186 meV. (b) Number of unit cell and incident angle dependence of the Rabi splitting for $WS_2$/$Al_2O_3$ devices under TE polarized incident light. (c) Experimental and (d) Simulated reflectance spectra of a $WS_2$/$Al_2O_3$: N=8 device with a bottom alumina thickness of 22 nm under TM polarized light. Similarly, (e) Experimental and (f) Simulated reflectance spectra of a $WS_2$/$Al_2O_3$: N=8 device with a bottom alumina thickness of 22 nm under TE polarized light plotted in two different ways which clearly depicts the emergence of exciton-polariton emission starting at 60° incident angle.

Figures 35A, 35B, 35C, 35D, 35E:
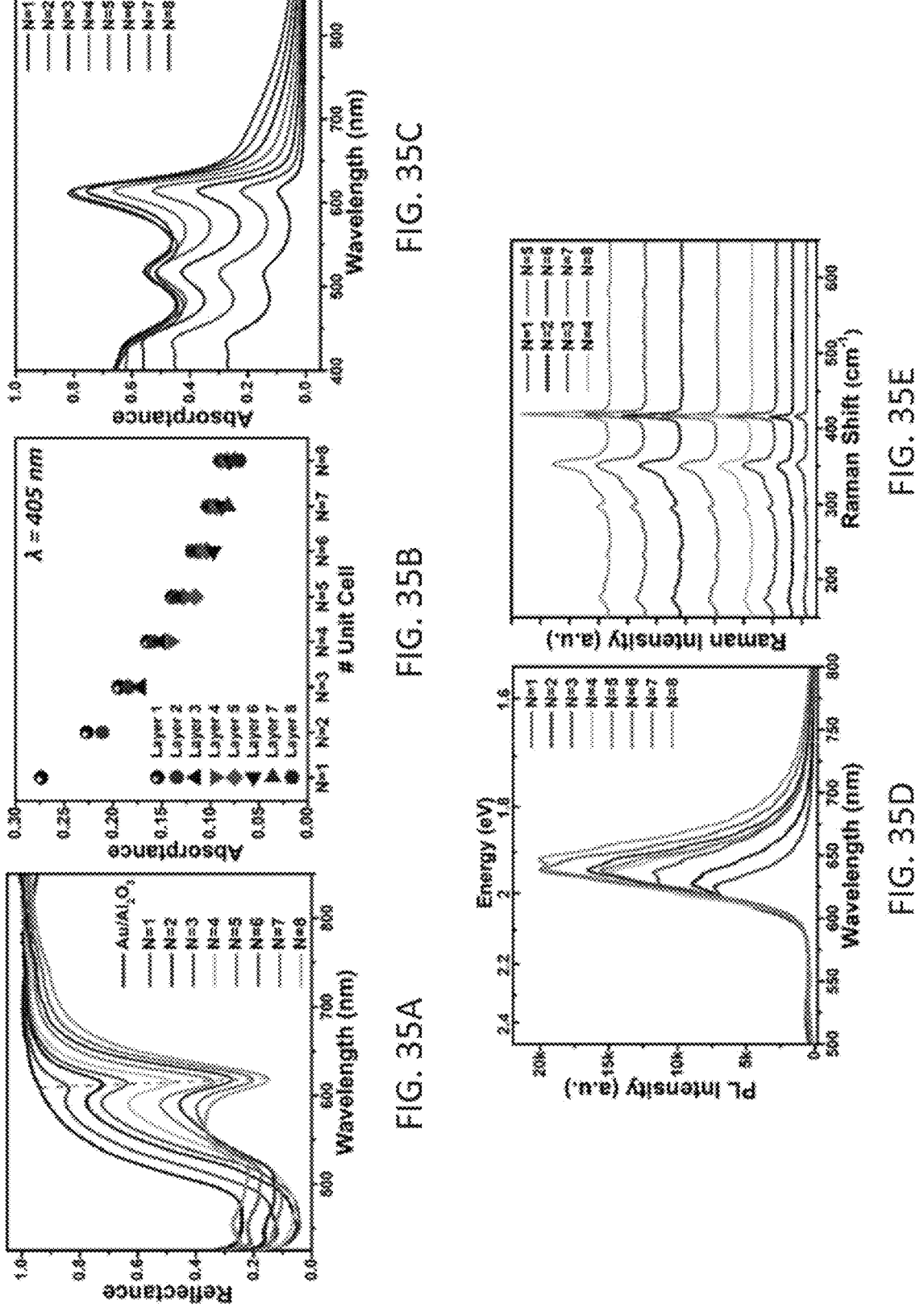

FIG. 35: Characterization of the $WS_2$/$Al_2O_3$N=8 device with a bottom alumina thickness of 22 nm. Experimental (a) reflectance, (d) PL, and (e) Raman spectra of the $WS_2$/$Al_2O_3$ device from N=1 to 8. Simulated (b) layer resolved absorptance at the PL incident wavelength (405 nm) and (c) total $WS_2$ absorptance spectra.

Figure 36:
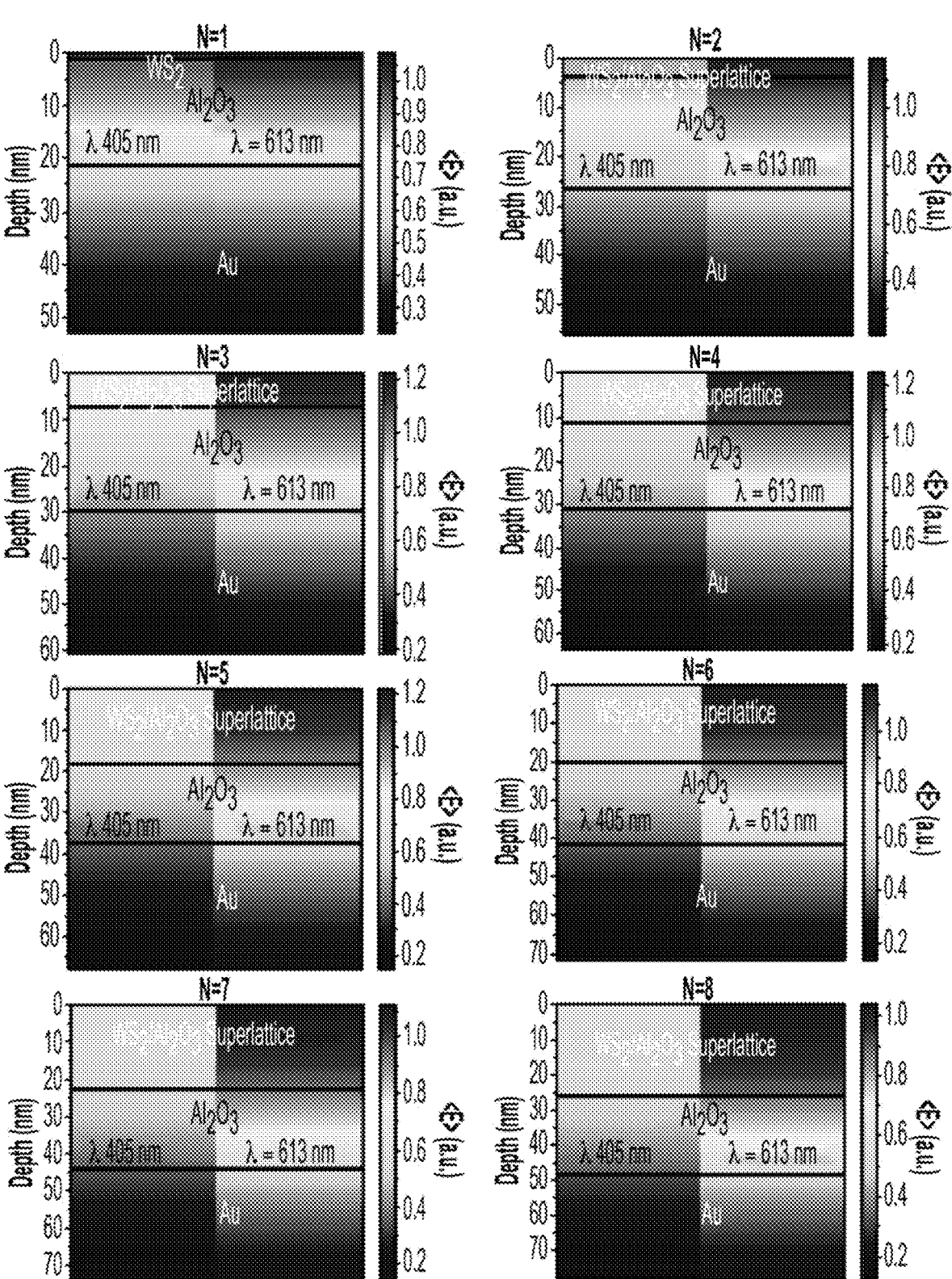

FIG. 36: Electric field profiles of the $WS_2$/$Al_2O_3$: N=8 device at both the PL normal incident wavelength (405 nm) and emission wavelength (613 nm) for varying number of unit cells from N=1 to 8.

Figures 37A, 37B, 37C, 37D, 37E, 37F:
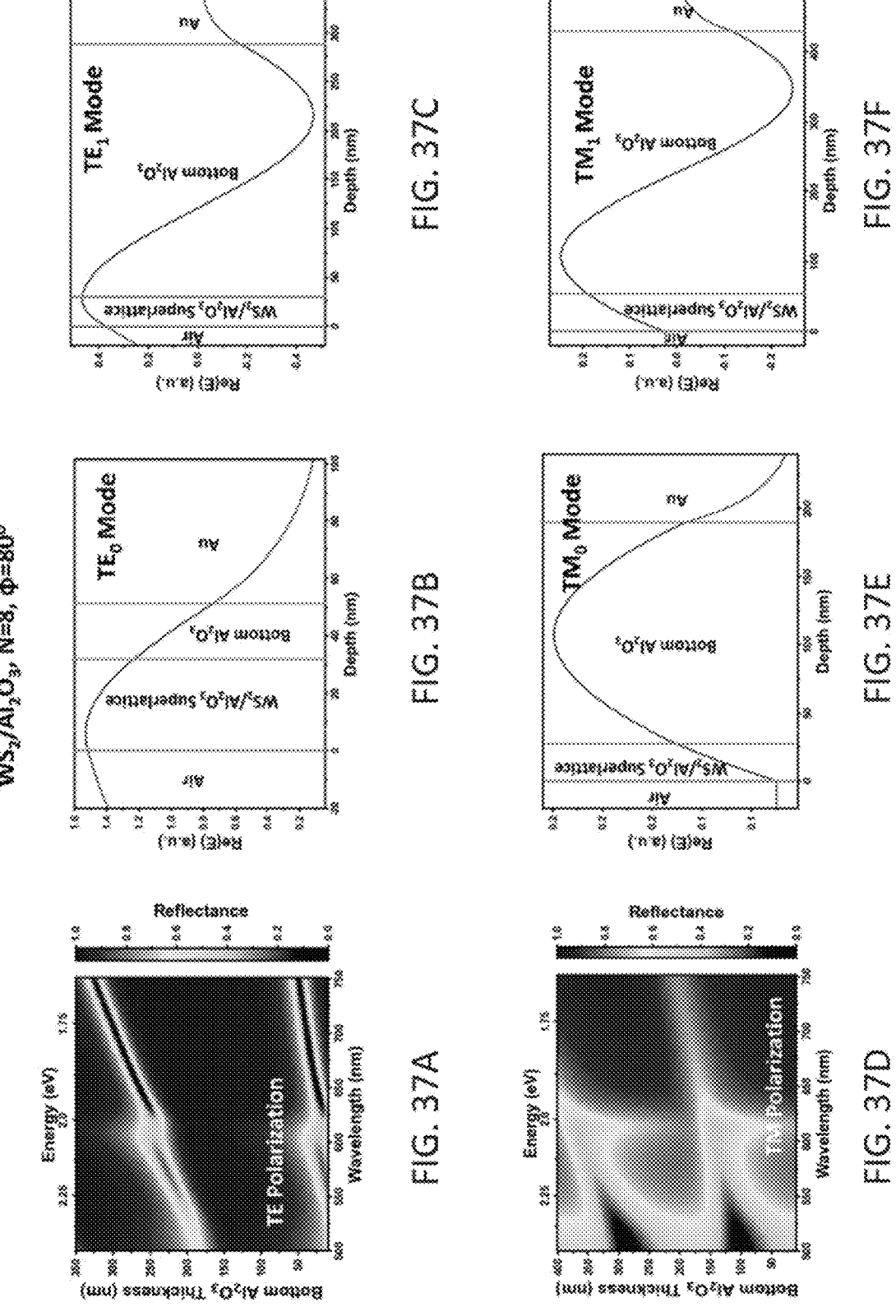

FIG. 37: TE and TM polarized waveguide modes in simulated $WS_2$/$Al_2O_3$ devices. The anticrossing behaviour of the devices under (a) TE and (d) TM polarized light showing the two lowest order waveguide modes. The electric field profiles of the (b) $TE_0$ and (c) $TE_1$ modes at the LEP wavelength (642 nm) with bottom alumina thicknesses of 22 and 246 nm, respectively. The electric field profiles of the (e) $TM_0$ and (f) $TM_1$ modes at the LEP wavelength (642 nm) with bottom alumina thicknesses of 148 and 401 nm, respectively.

Figure 38:
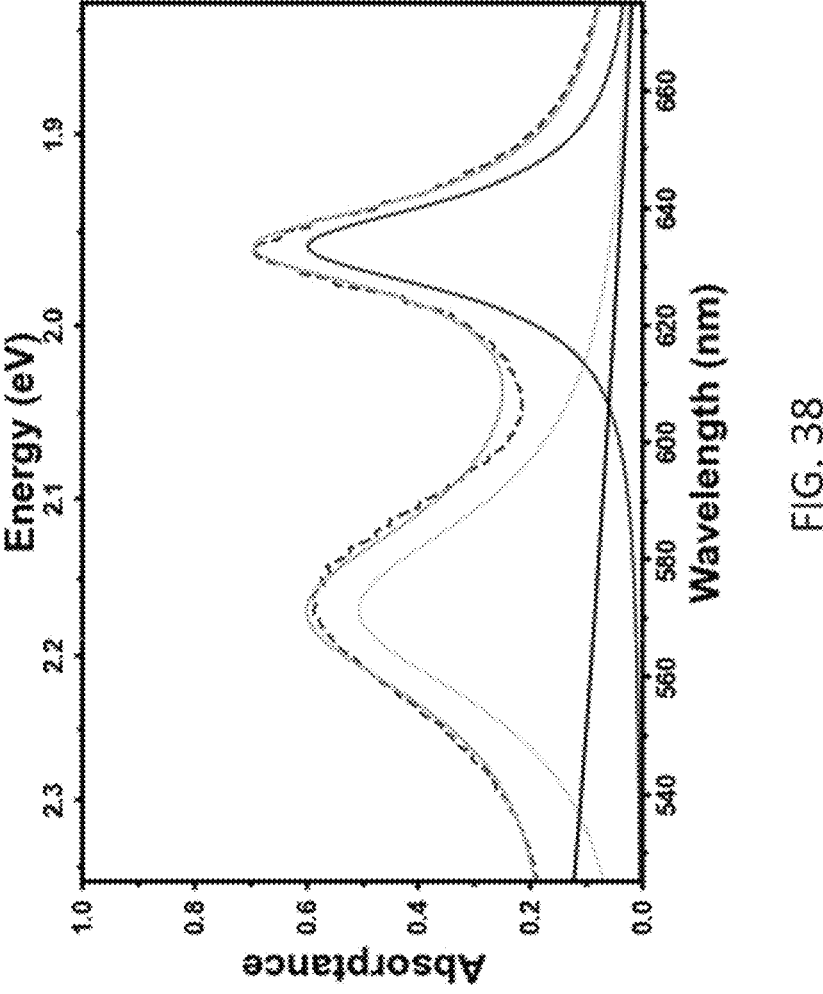

FIG. 38: Fitted absorptance spectrum (dashed red) of a $WS_2$—$Al_2O_3$: N=8 device fitted with the UEP (green) and LEP (pink) are fitted to a Lorentzian curve with a linear background noise (blue).

Figures 39A, 39B:
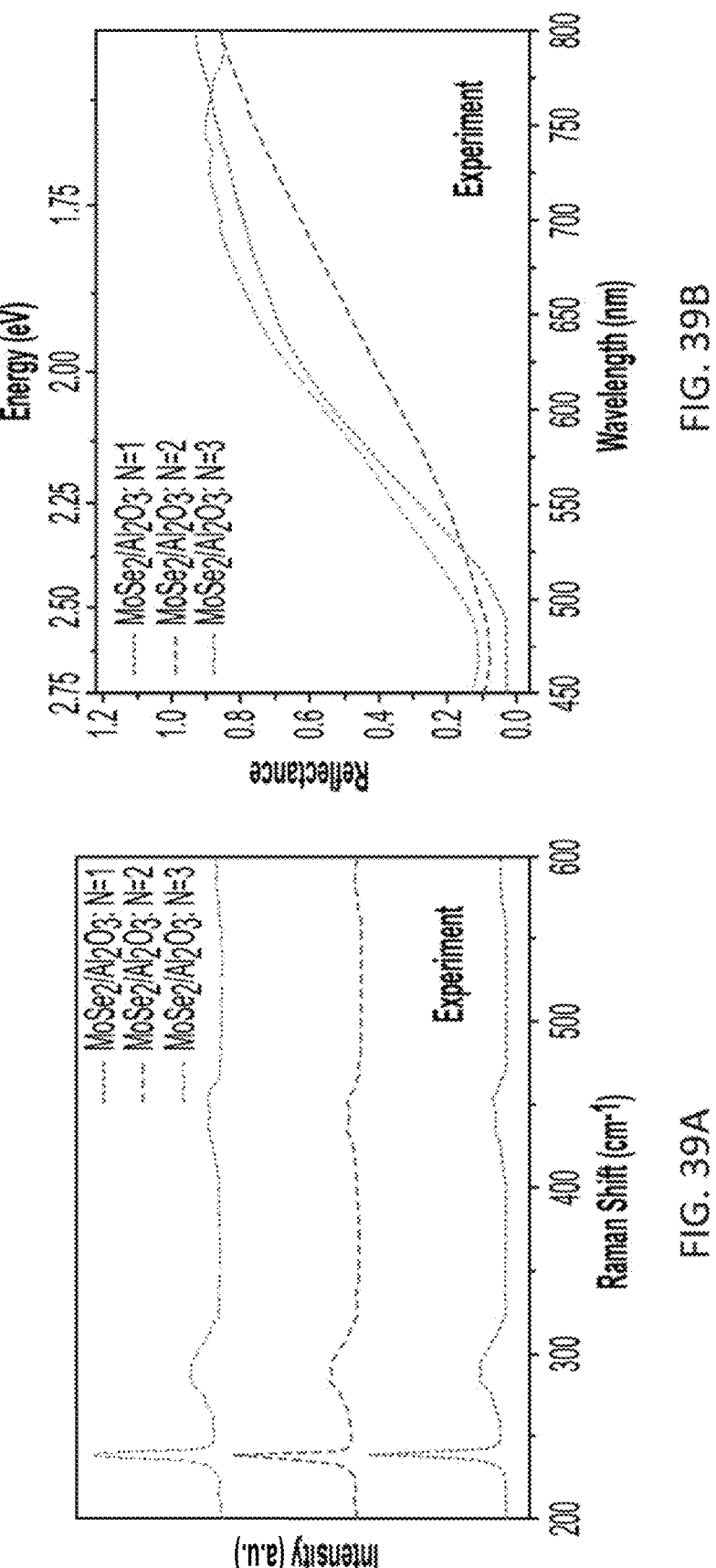
Figures 39C, 39D:
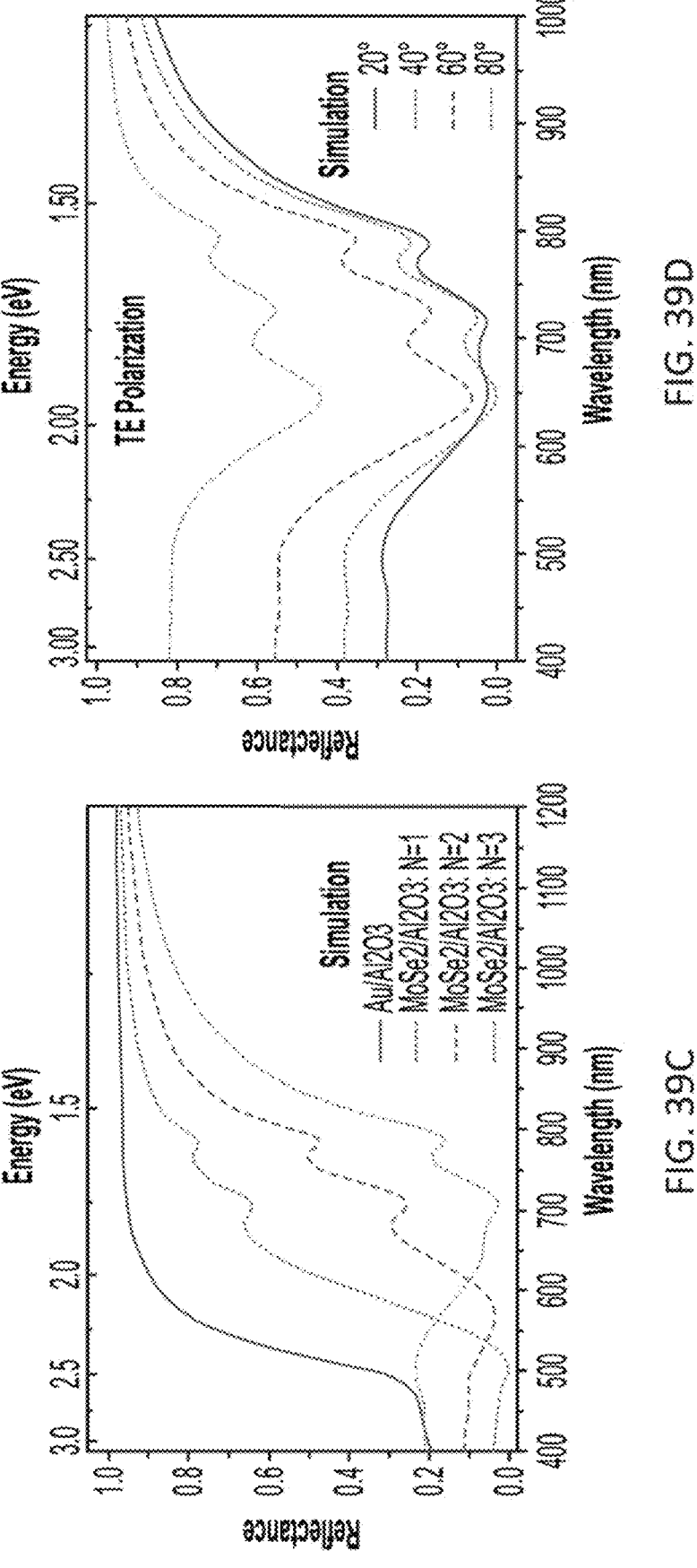
Figure 39E:
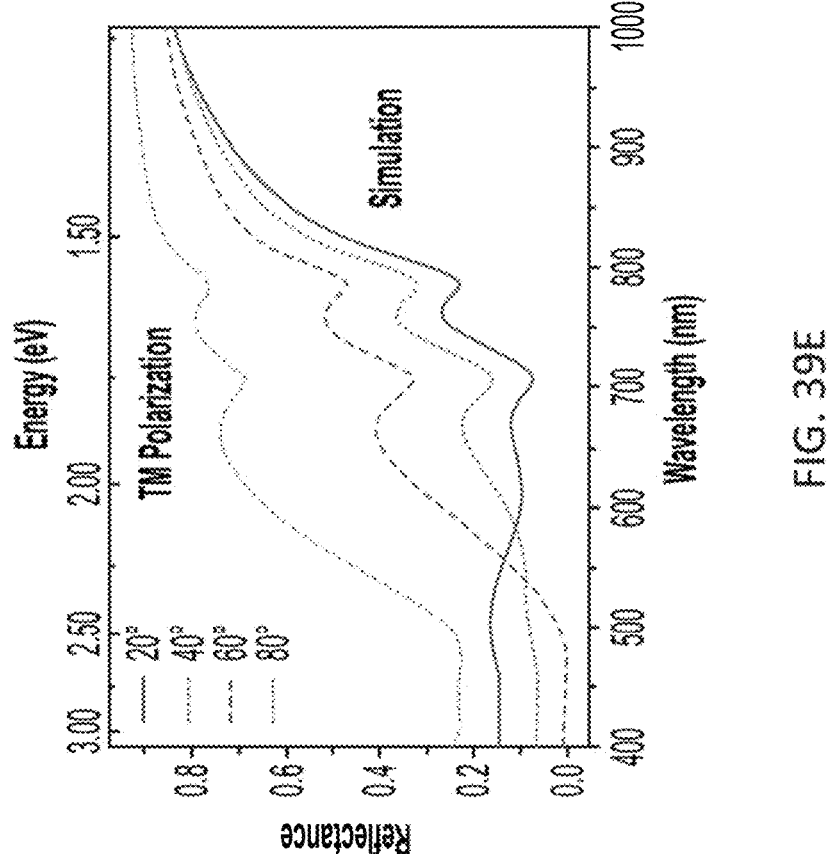

FIG. 39: The fabrication of $MoSe_2/Al_2O_3$ superlattice. (a, b) The layer dependent (unit cell N) Raman and reflectance spectra and the corresponding (c) simulated layer dependent reflectance spectrum. (d, e) The angle dependent reflectance spectra for the N=3 superlattice for TE and TM polarized incident light.

Figure 40:
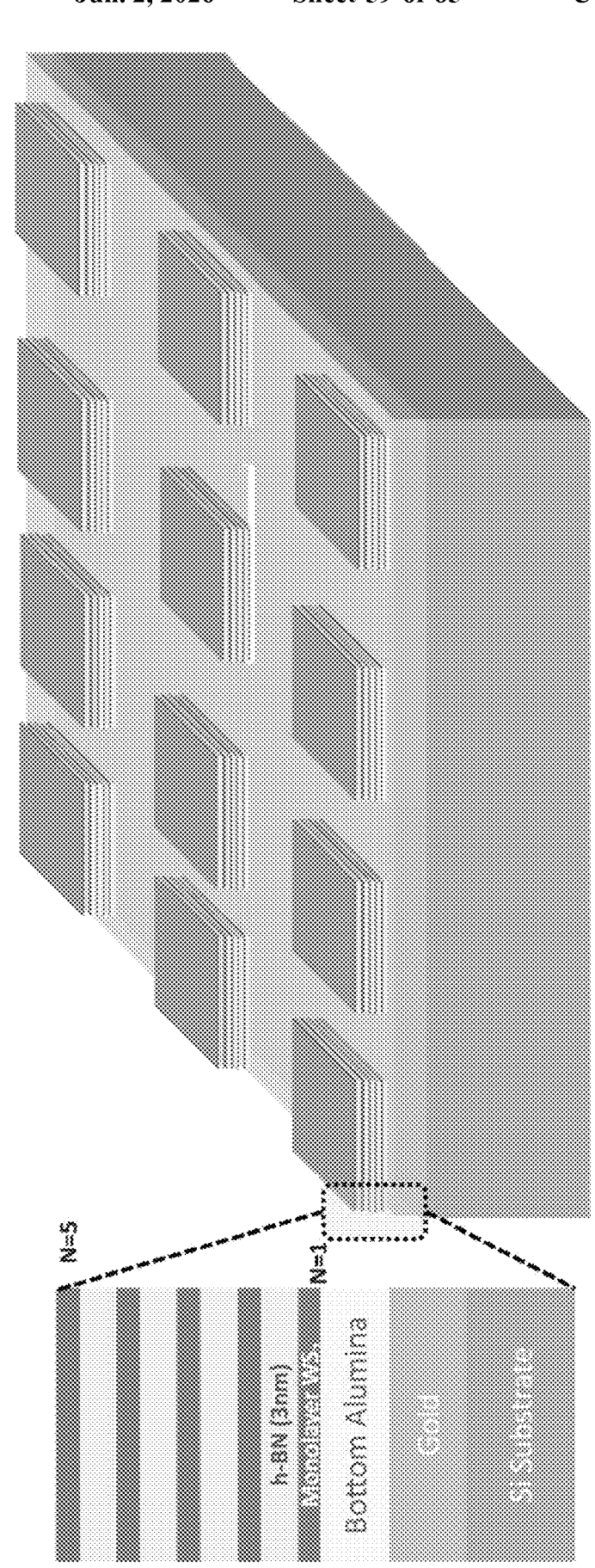

FIG. 40: Example structure according to the present disclosure, showing patterned stacks of alternating $WS_2$ and h-BN layers. As shown, a stack can be present atop a portion of alumina, which can in turn be present atop a portion of gold (which can serve as a reflector), and a silicon substrate. A stack can include 5 sets of alternating layers.

FIG. 41: Illustrates certain non-limiting points of novelty for the present disclosure. As shown, a device according to the present disclosure can achieve 360° modulation, and can achieve this at a lower carrier injection than existing materials.

FIG. 42 provides example, non-limiting phase modulation performance and optical modulation performance for an example device according to the present disclosure.

Figure 43:
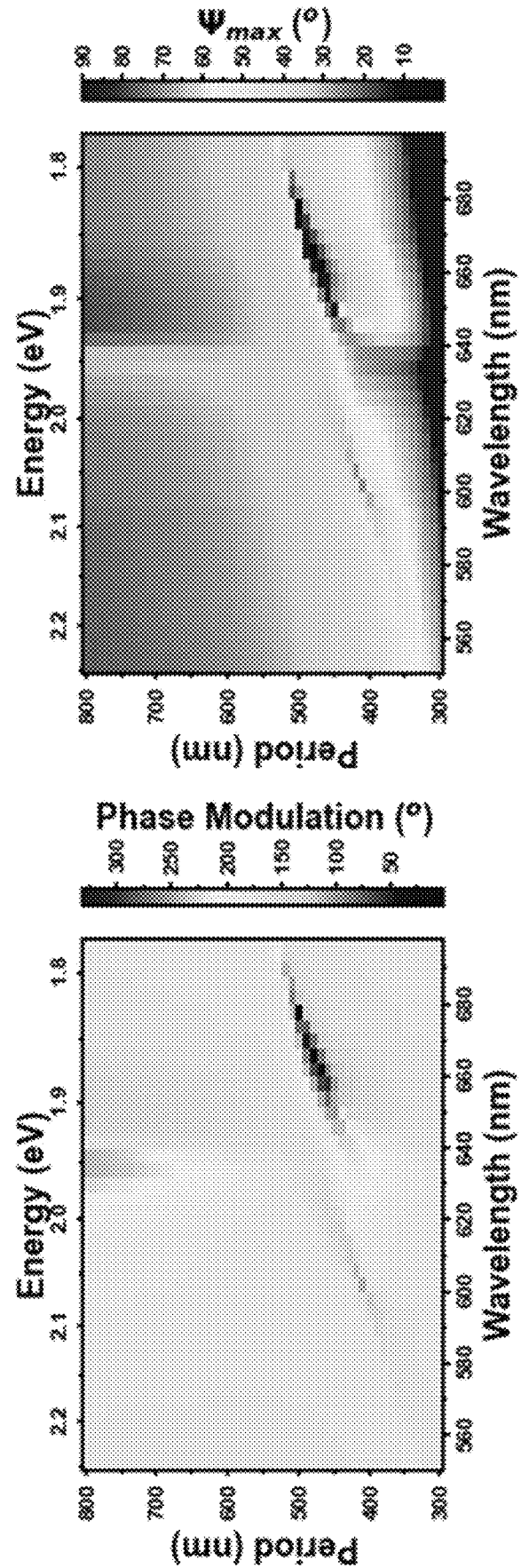

FIG. 43 provides illustrative, non-limiting phase modulation and azimuthal angle performance for an example device according to the present disclosure.

Figure 44:
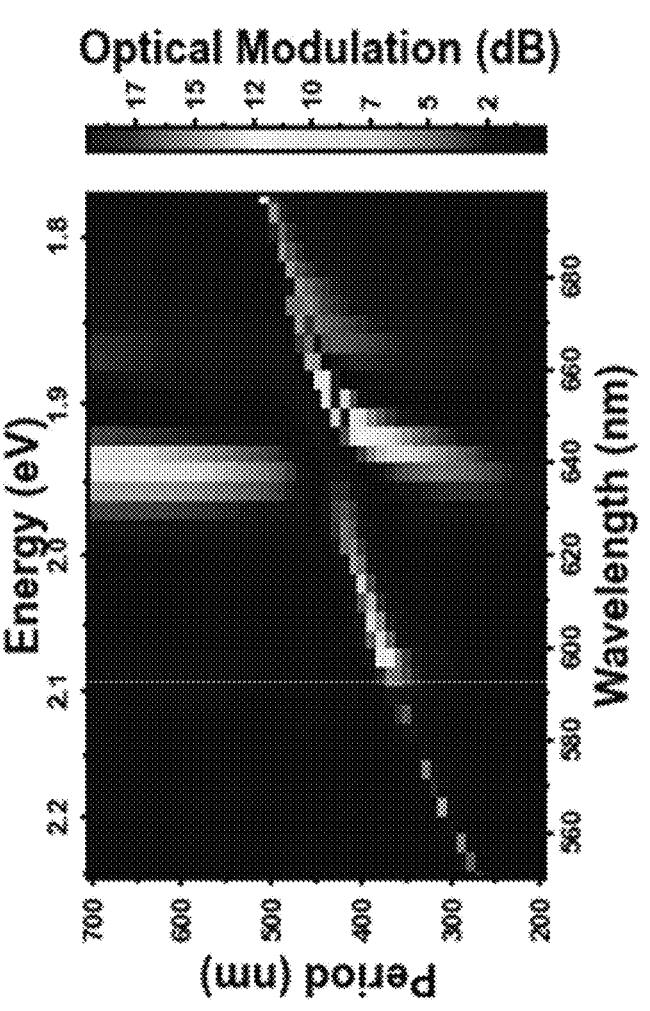

FIG. 44 provides example, non-limiting optical modulation performance for a patterned device according to the present disclosure.

FIG. 45 provides exemplary data.

FIG. 46 provides exemplary data.

FIG. 47 provides an example superlattice structure and corresponding phase versus wavelength data.

Figures 48A, 48B, 48C:
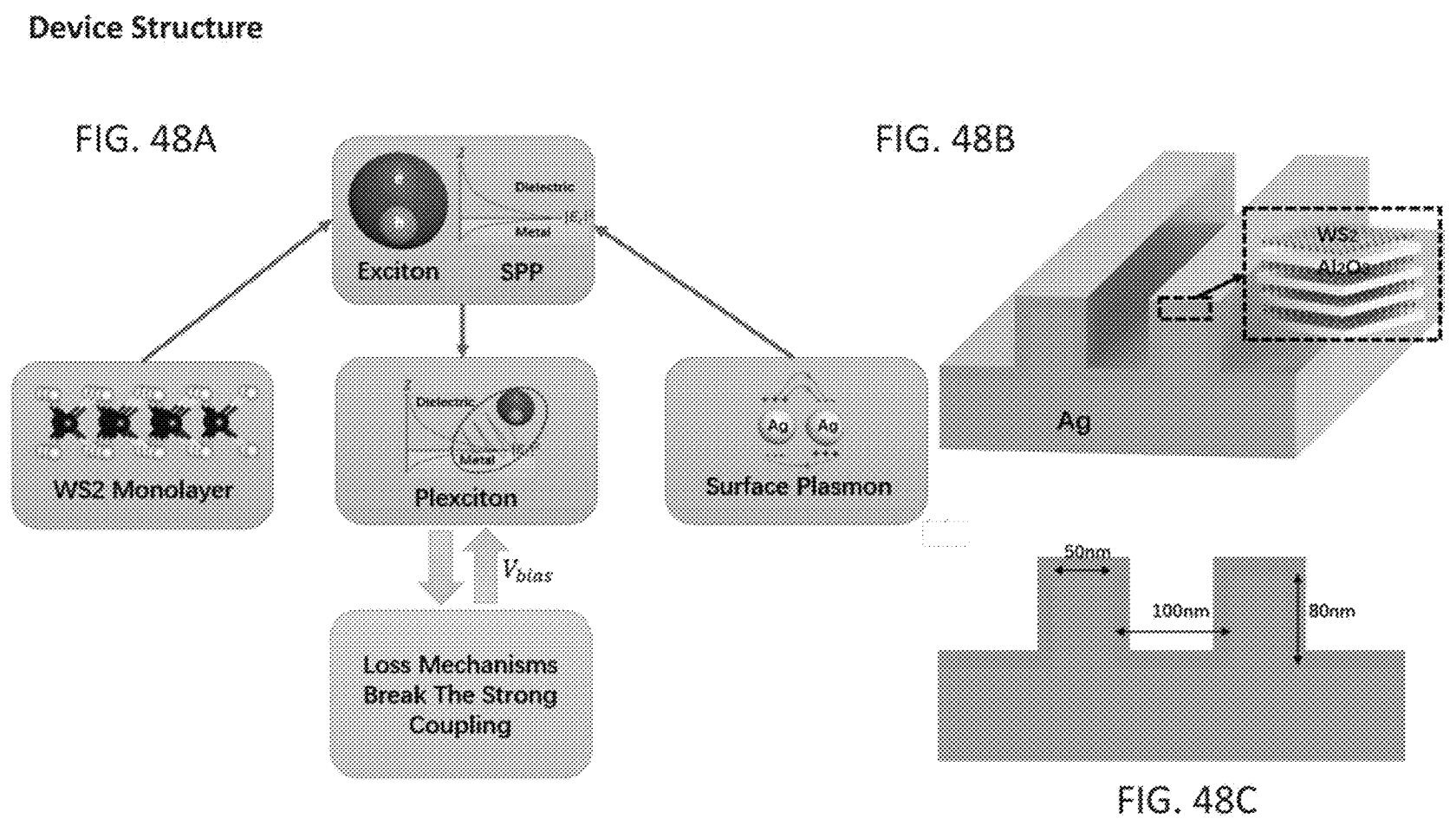

FIG. 48A provides mechanisms of the EAM. The strong coupling of excitons and surface plasmon polaritons (SPP) form quasi-particles named plexcitons. Injecting carriers through the biased voltage will turn the strong coupling into the weak coupling.

FIG. 48B provides a 3D view of the EAM. The slot-shaped plasmonic structure is made of silver with a four-unit superlattice patterned on top (the blue part represents the superlattice).

FIG. 48C provides a cross-section view of the EAM with optimized sizes.

FIG. 49: Dispersion relations of the plasmonic structure through FDTD simulation after logarithmic and normalized processing. Red curves show the SPP modes and the plasmonic mode that are supported by the structure. See Ref. [28] for the method of dispersion calculation. (b) The distribution of the electric field component along the propagation direction for the symmetric mode (S mode) and antisymmetric mode (A mode). (c) Refractive index changes for the S mode and A mode. (d) The figure of merit to describe the performance of the EMA for both modes.

FIG. 50: (a) The dispersion relations of the S mode for the on-state and off-state. (b) The S-mode loss for on-state transmission and off-state transmission of the EAM (400 nm linear footprint). (c) The total absorption and the absorption of $WS_2$ layers for on-state transmission and off-state transmission of the EAM. The absorption is calculated within the region of the black-dotted rectangular. (d) Cross-section view of the absorption distribution for the on-state and off-state corresponding to the rectangular part of FIG. 3(c). The absorption is normalized. (e) Top-down view of the electric field intensity for off-state transmission. (f) Top-down view of the electric field intensity for on-state transmission.

FIG. 51: (a) The Method of applying the voltage to the 4-unit superlattice structures. From the lowest layer to the top layer, the first and the third $WS_2$ monolayer are injected holes, while the second and the fourth are injected electrons. The 'V' in this panel represents the voltage source. (b) The equivalent parasitic capacitance circuit schematic. Both geometric capacitance and quantum capacitance are taken into consideration for a capacitor with semiconductor plates. The voltage across the capacitors has the value V, which has the same meaning with the equation (7). (c) The contacts for the second and the fourth $WS_2$ monolayer. The shallow blue part represents the whole superlattice. (d) The contacts for the first and the third $WS_2$ monolayer. Each $WS_2$ monolayer has different width for separately depositing the gold electrode.

FIG. 52: (a) The voltage between a geometric capacitor vs the switching time of an electric bit under $WS_2$ monolayers with different mobilities. The results with the black correspond to the device. (b) The voltage between a geometric capacitor vs the switching time of an electric bit under $WS_2$ monolayers with different applied voltages. (c) The voltage between a geometric capacitor vs the switching time of an electric bit under $WS_2$ monolayers with different contour widths. (d) The magnitude of the transfer function under different mobilities. (e) The magnitude of the transfer function under different voltages. (f) The magnitude of the transfer function under different contour widths.

FIG. 53. (a) Schematic model of the superlattice structure. (b) Side view of the model with labeled p-i-n regions and layers. (c) Simulated absorptance spectra and absorbed photon density for $MoS_2/Al_2O_3$ (N=1,5,10). (d) Energy band diagram of the monolayer $MoS_2$ for p-i-n junction.

FIG. 54. (a) The PCE for the variation of exciton binding energy (0-0.5 eV) and diffusion length (0.015-6 μm). (b) The PCE for the variation of exciton diffusion length for BE=0.2 eV, 0.4 eV. (c) The PCE for the variation of eτex-r and τex-nr (0.0001-10 ns). (d) The current density for the variation of eτex-r (0.0001-0.01 ns) and τex-nr (0.0001-10 ns).

FIG. 55. (a) The PCE for the variation of length of device (0.4-10 μm) and free carrier mobility (0.1-200 cm2/(Vs) under exciton lifetime of 10 ns). (b) The PCE for the variation of free carrier mobility for length of device=0.4 μm, 0.6 μm, 1 μm, 2 μm, 3 μm. (c) The PCE for the variation of length of device (0.2-10 μm) and exciton lifetime (0.01-6 ns) under free carrier mobility of 60 cm2/(Vs)). (d) The PCE for the variation of free carrier lifetime under free carrier mobility of 60 cm2/(Vs).

FIG. 56. (a) The absorbed photon density for the different incident angle (0-90°) and different layers (N=1-10). (b) The PCE for the variation of the incident angle (0-90°) for binding energy=0 eV, 0.24 eV. (c) The absorbed photon density and PCE for $MoS_2$, $MoSe_2$, $WS_2$, and WSe2. (d) The I-V curve for $MoS_2$, $MoSe_2$, $WS_2$, and WSe2.

Figure 57:
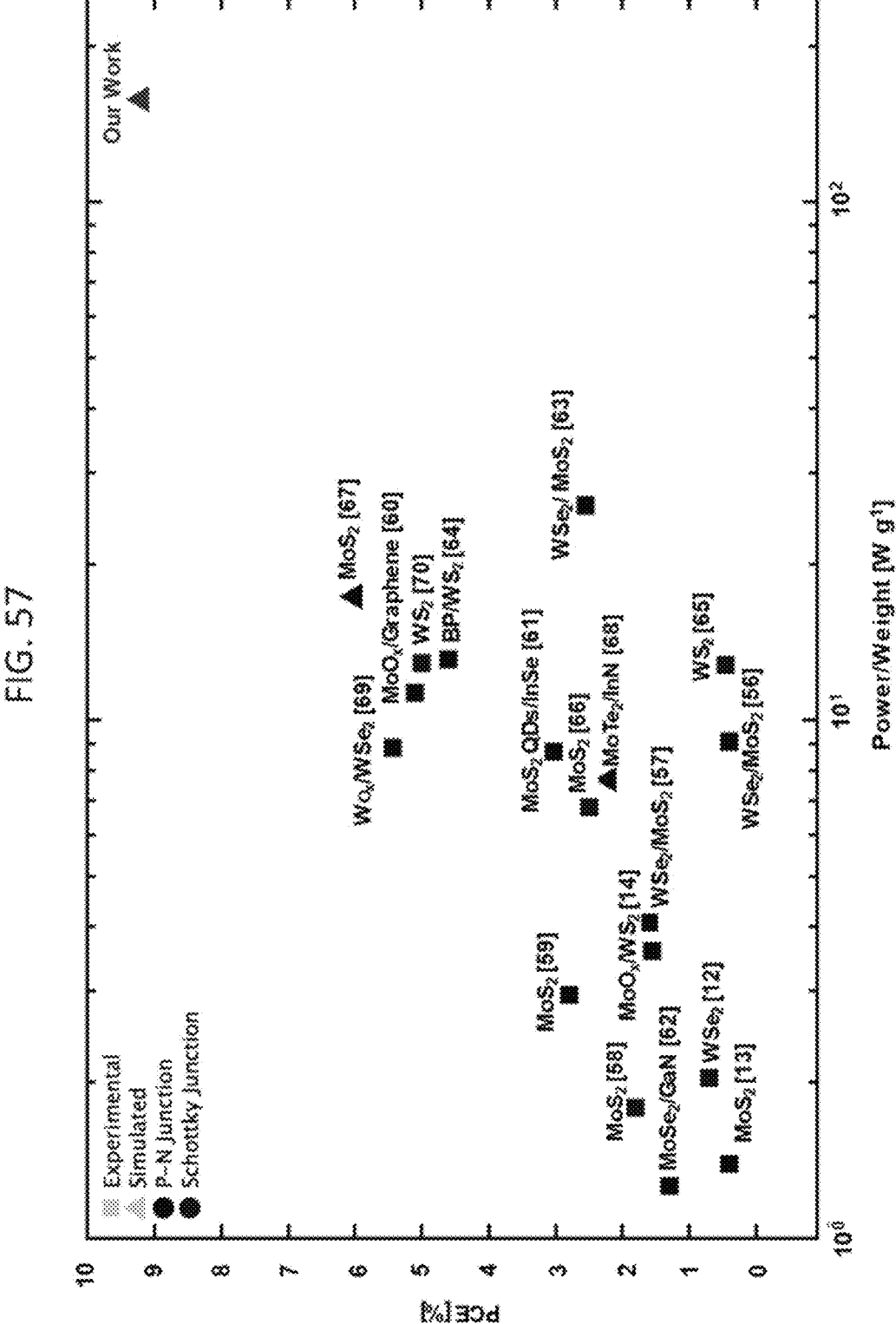

FIG. 57. Efficiency chart of vdW material-based photovoltaic with their power/weight ratio in unit of W g$^{-1}$.

Figure 58:
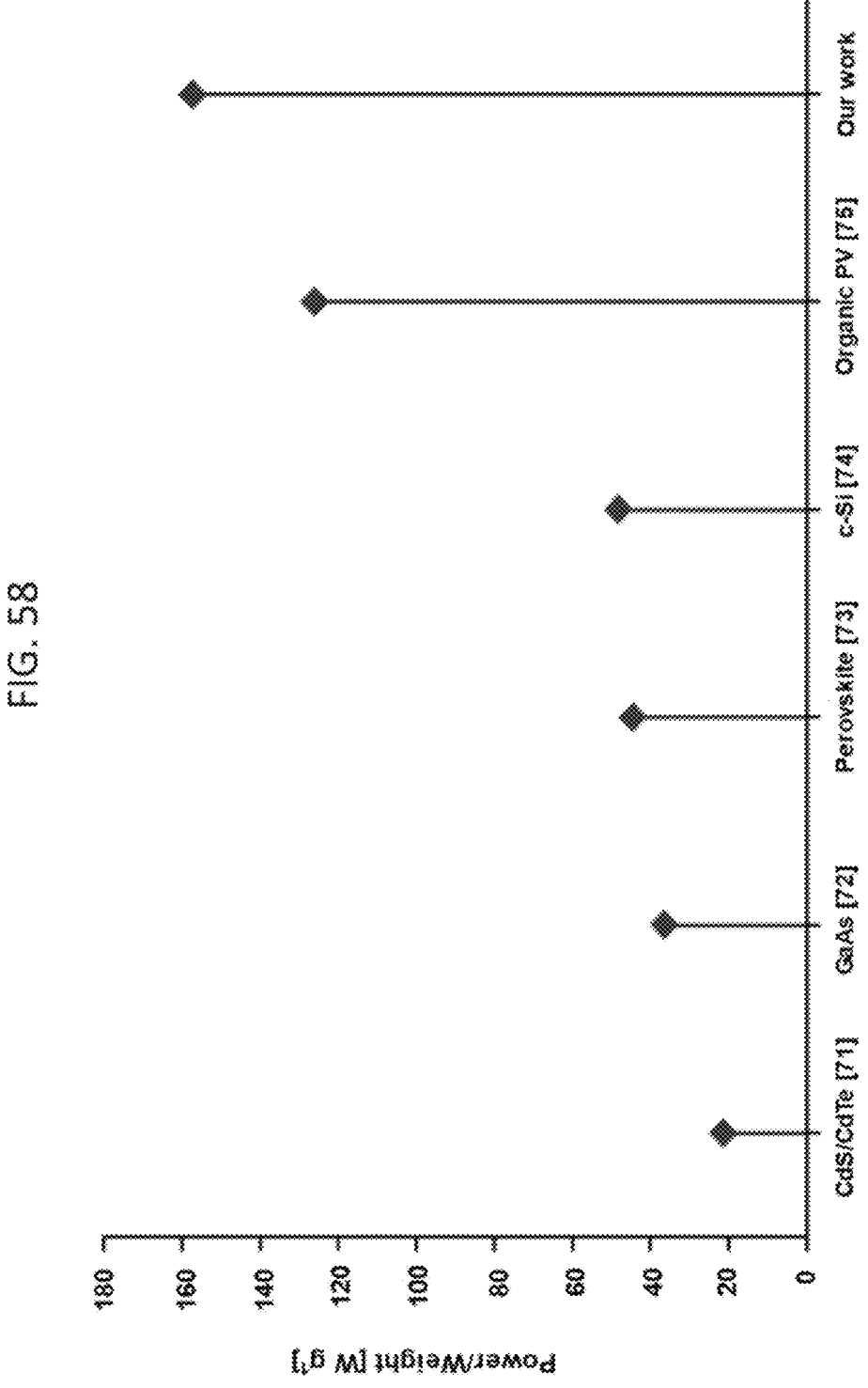

FIG. 58. Power/weight ratio chart of different lightweight PV technologies in unit of W g$^{-1}$.

Figure 59:
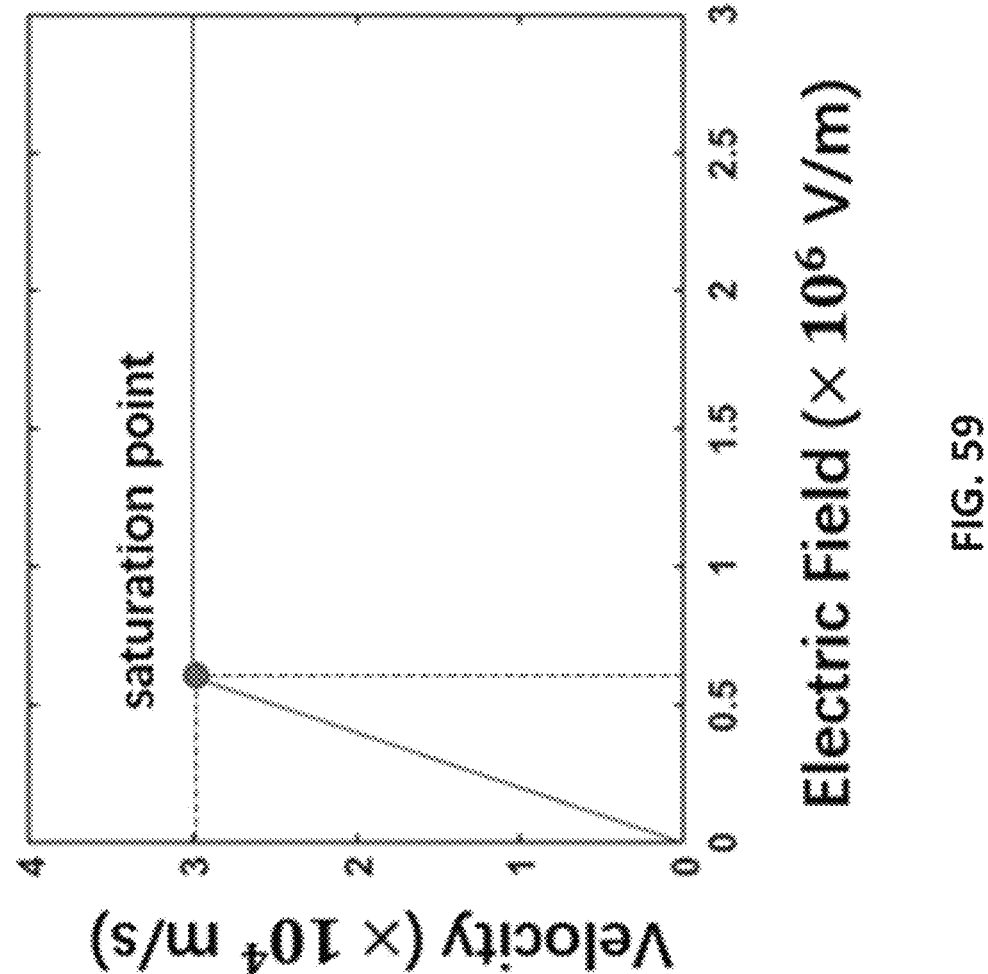
Figure 62B:
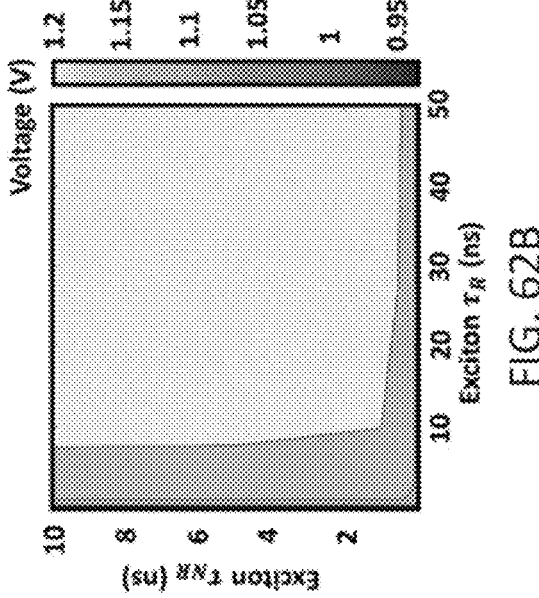
Figure 62D:
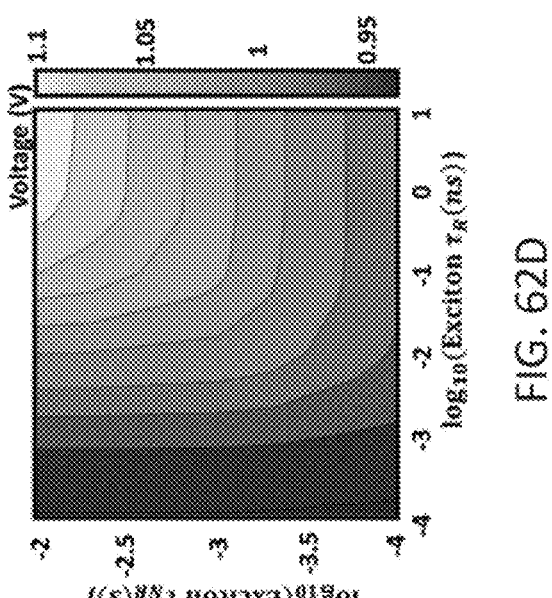
Figure 62A:
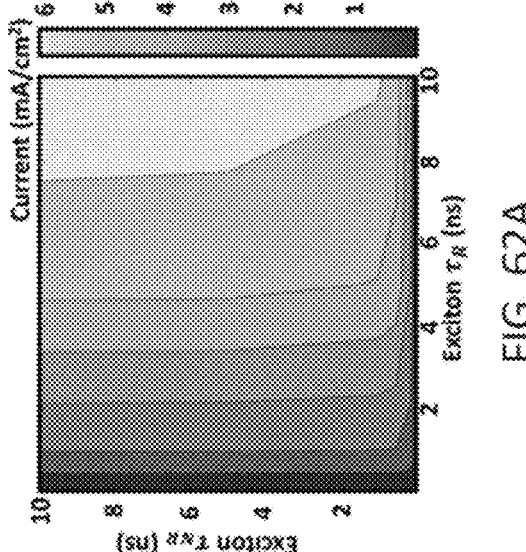
Figure 62C:
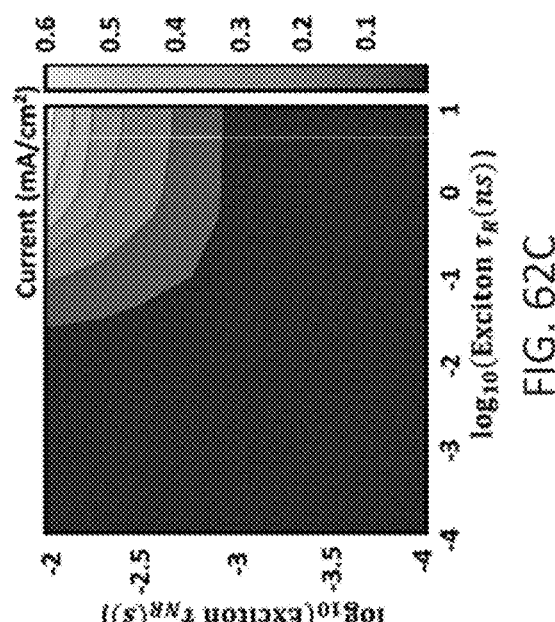

FIG. 59. Linear model describes the relationship between the velocity of an electron and the electric field applied to it. Saturation comes from damping mechanisms when carriers are injected.

FIG. 60. (a) The n value (real part of the refractive index) vs wavelength under different units of the superlattice structure. (b) The k value (imaginary part of the refractive index) vs wavelength under different units of the superlattice structure. (c) The real part of the propagation constant vs wavelength under different units of the superlattice structure. (d) The k value and the corresponding insertion loss vs width. (e) The k value and the corresponding insertion loss vs height. (f) The k value and the corresponding insertion loss vs gap.

FIG. 61. (a) The short-circuit current for the variation of exciton binding energy (0-0.5 eV) and diffusion length (0.015-6 μm). (b) The open-circuit voltage for the variation of exciton binding energy (0-0.5 eV) and diffusion length (0.015-6 μm). (c) The PCE for the variation of exciton binding energy (0.3-0.8 eV) and diffusion length (0.015-6 μm). (d) The short-circuit current for the variation of exciton binding energy (0.3-0.8 eV) and diffusion length (0.015-6 μm). (e) The open-circuit voltage for the variation of exciton binding energy (0.3-0.8 eV) and diffusion length (0.015-6 μm). (f) The open-circuit voltage for the variation of exciton radiative lifetime (0.1 ps-50 ns) and exciton non-radiative lifetime (0.1 ps-50 ns).

FIG. 62. (a) The short-circuit current for the variation of exciton radiative lifetime (0.1 ps-10 ns) and exciton non-radiative lifetime (0.1 ps-10 ns). (b) The open-circuit voltage for the variation of exciton radiative lifetime (0.1 ps-50 ns) and exciton non-radiative lifetime (0.1 ps-10 ns). (c) The short-circuit current for the variation of exciton radiative lifetime (0.1 ps-10 ns) and exciton non-radiative lifetime (0.1 ps-10 ps). (d) The open-circuit voltage for the variation of exciton radiative lifetime (0.1 ps-10 ns) and exciton non-radiative lifetime (0.1 ps-10 ps).

FIG. 63. (a) The short-circuit current for the variation of length of device (0.4-10 μm) and free carrier mobility (0.1-200 cm²/(Vs)) under exciton lifetime of 10 ns). (b) The open-circuit voltage for the variation of length of device (0.4-10 μm) and free carrier mobility (0.1-200 cm²/(Vs)) under exciton lifetime of 10 ns). (c) The short-circuit current for the variation of length of device (0.2-10 μm) and exciton lifetime (0.01-6 ns) under free carrier mobility of 60 cm²/(Vs)). (d) The open-circuit voltage for the variation of length of device (0.2-10 μm) and exciton lifetime (0.01-6 ns) under free carrier mobility of 60 cm²/(Vs)).

Figure 64:
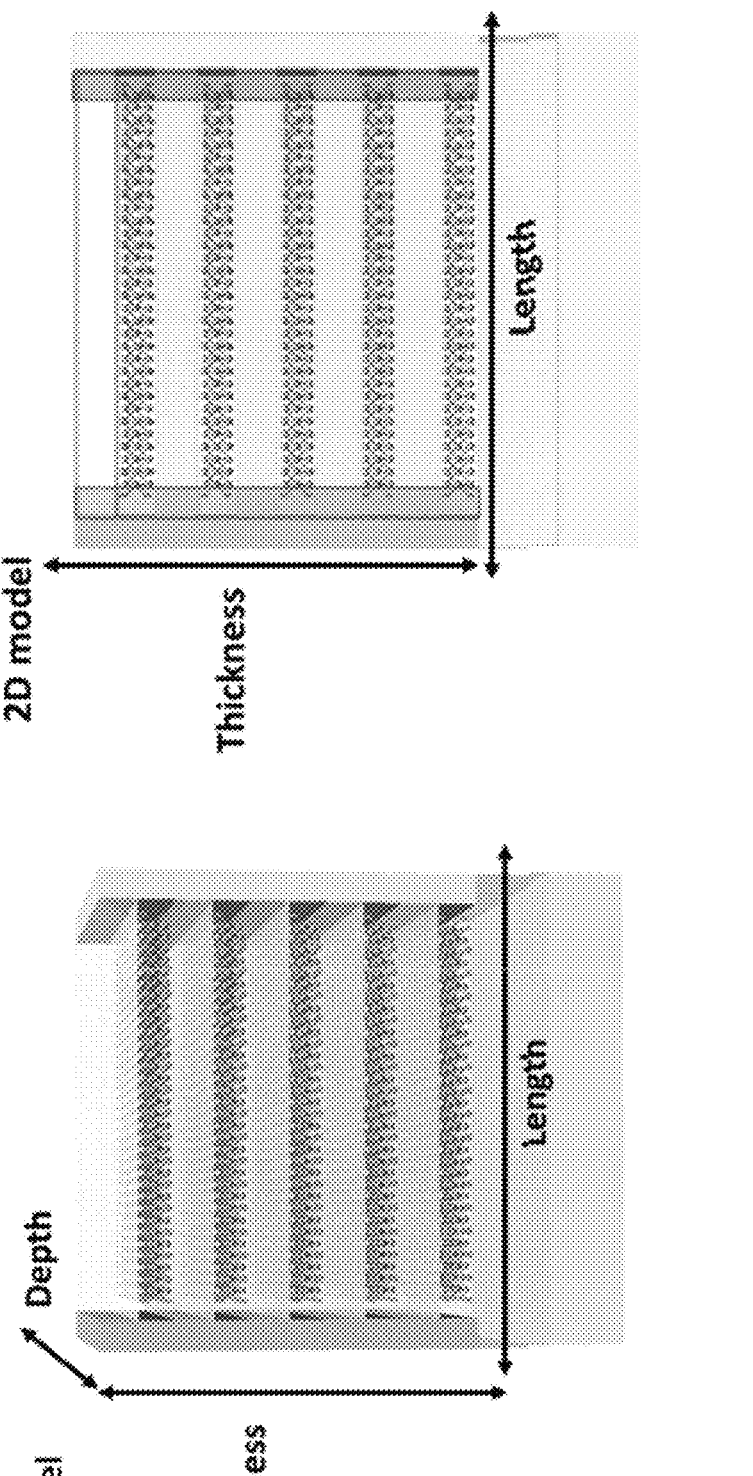

FIG. 64. 3D model and 2D model with labelled dimensions.

Figure 65:
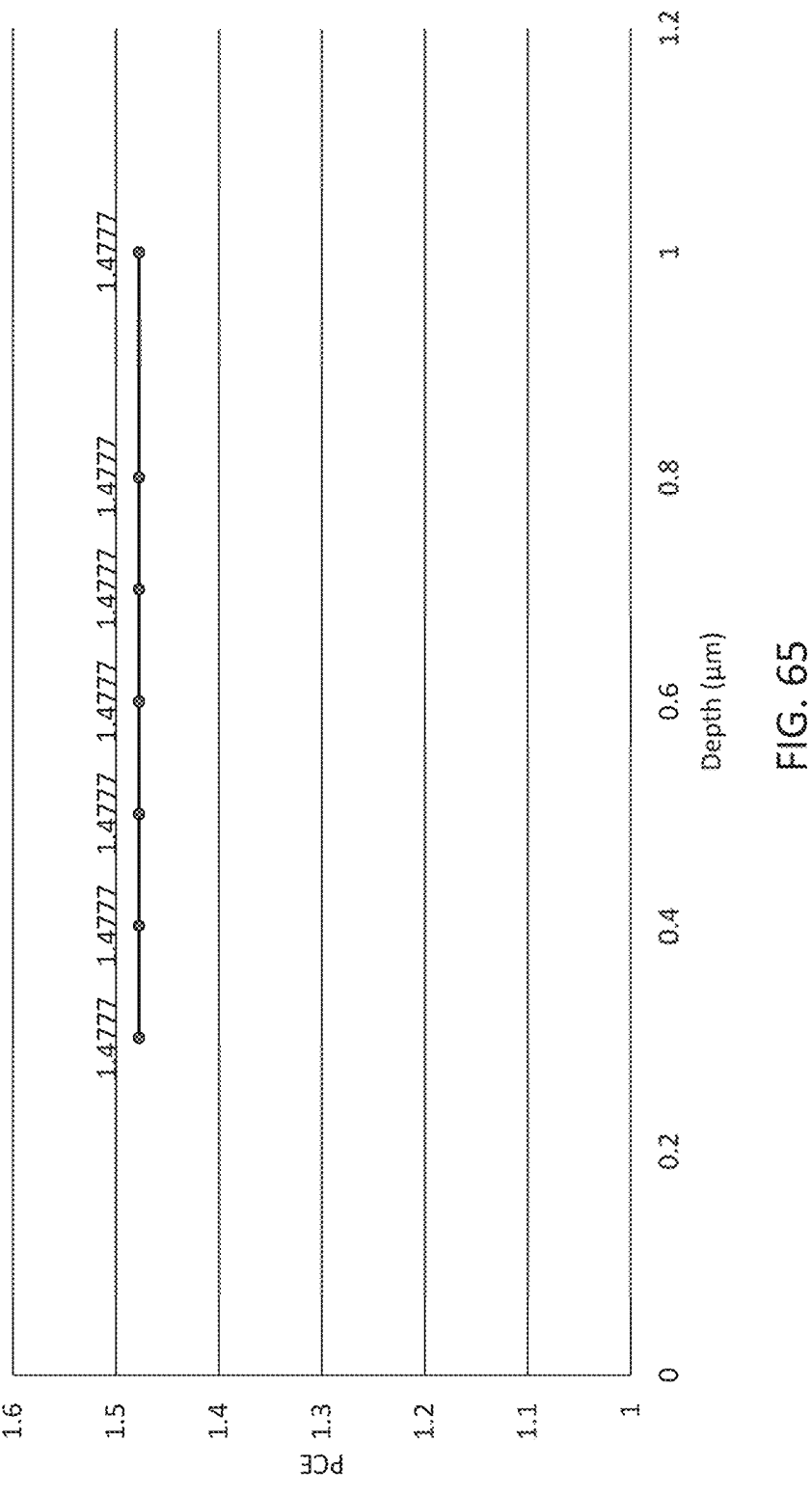

FIG. 65. Power conversion efficiency for different depths of the structure in 3D simulations.

Figure 66:
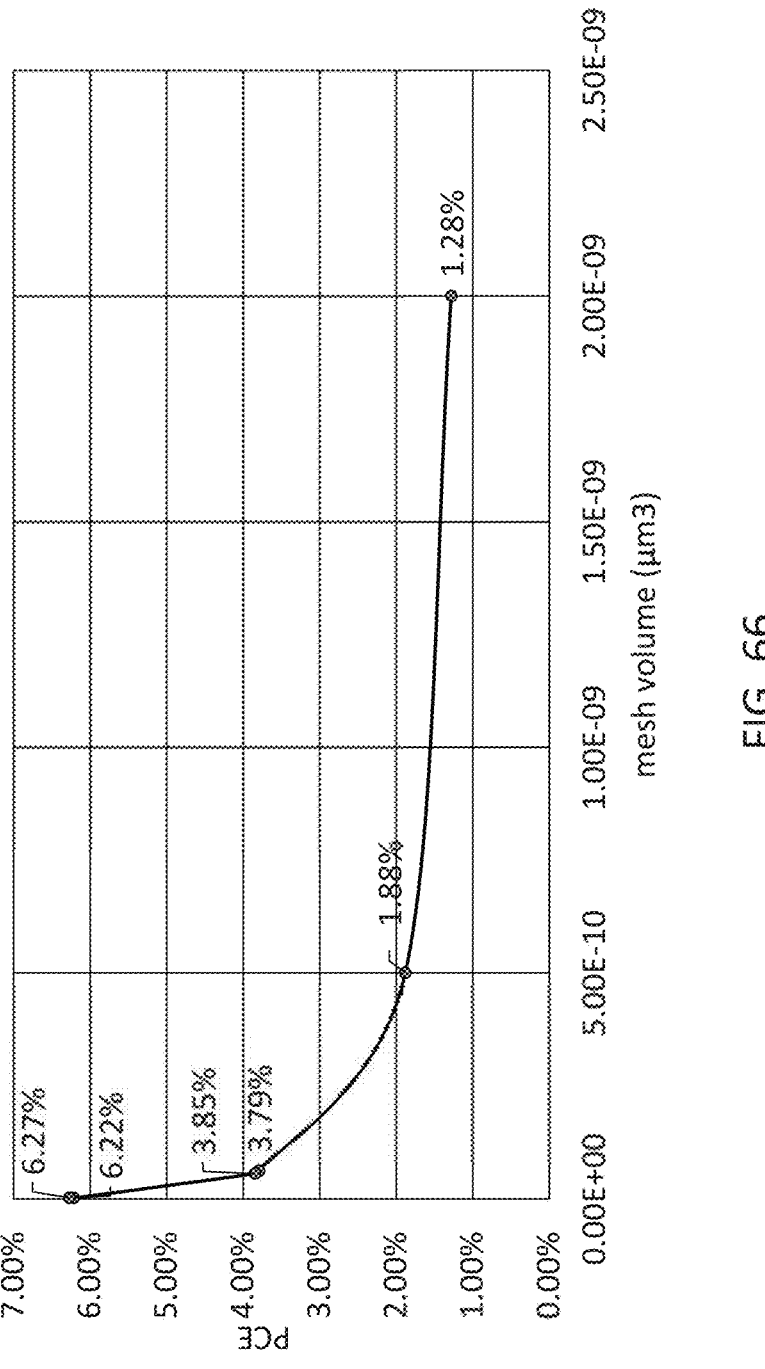

FIG. 66. Power conversion efficiency for different mesh volume in 3D simulations.

DETAILED DESCRIPTION OF ILLUSTRATIVE EMBODIMENTS

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints (e.g., "between 2 grams and 10 grams, and all the intermediate values includes 2 grams, 10 grams, and all intermediate values"). The endpoints of the ranges and any values disclosed herein are not limited to the precise range or value; they are sufficiently imprecise to include values approximating these ranges and/or values. All ranges are combinable.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4. Further, the term "comprising" should be understood as having its open-ended meaning of "including," but the term also includes the closed meaning of the term "consisting." For example, a composition that comprises components A and B may be a composition that includes A, B, and other components, but may also be a composition made of A and B only. Any documents cited herein are incorporated by reference in their entireties for any and all purposes.

Semiconducting Multi-quantum Wells (MQWs) and superlattices form the basis of all modern high performance opto-electronic and photonic components, ranging from modulators to lasers and photodetectors. However, most known and scalable MQWs and superlattice structures are epitaxially grown III-V, II-VI or oxide perovskites. While significant progress has been made over the last three decades in the commercialization of II-VI and III-V MQWs and superlattices, the inherent difficulties of their integration onto arbitrary substrates have limited their adoption and applicability. The advent of van der Waals (vdW) semiconductors, the ability to grow them uniformly over wafer scales, and to transfer them with high fidelity onto arbitrary substrates opens new avenues towards rational design of both electronic and photonic dispersions in artificially stacked superlattices and MQW structures.

Two-dimensional (2D) vdW materials are a broad and growing family of materials with a diverse range of electronic properties, encompassing metals, semiconductors, ferromagnets, superconductors and insulators. This diversity allows for vdW materials to be combined with one another, or with other thin materials, into heterostructures with new or enhanced properties and improved performance in a variety of applications. Most of the previous research has focused on heterostructures that are made using mechanically exfoliated layers that are a few $\mu m^2$ in lateral size with uneven thickness. This presents significant challenges in making MQW or superlattice structures with sufficient reproducibility across the number of periods necessary to enable the desired photonic or electronic dispersions. Further, with every increasing layer, stacking mechanically exfoliated flakes reduces the size of the region that has the desired overall stacking sequence, a problem that is exacerbated with each additional layer that is added. This fact prohibits the scalability of this approach.

For photonic and optoelectronic applications, there is another major challenge with regards to atomically-thin active layers: the nature of light-matter interaction. Monolayer thickness of 2D materials results in a reduced cross section of light-material interaction implying weak couplings, despite naturally resonant optical responses.

Semiconducting transition-metal dichalcogenides (TMDCs) that consist of Mo, W, Re etc. are a sub-class of vdW materials that have large, complex refractive indices due to the strong in-plane bonding of the transition metals to the chalcogenides, leading to strong light-matter interactions. The low dielectric screening and highly-confined exciton wavefunctions present in TMDCs result in excitonic binding energies of ~500 meV, creating strong excitonic resonances at room temperature. As the thickness of TMDCs decreases from the bulk to the monolayer limit, they transition from indirect to direct bandgap semiconductors. This reduces the non-radiative energy loss of exciton relaxation and leads to an enhancement in photoluminescent (PL) emission. However, reducing the thickness to monolayer dimensions adversely impacts the net interaction with light. Therefore, to engineer strong interaction with light and still maintain the key advantages to monolayer scaling it is necessary to make either a metamaterial or superlattice structure with monolayer repeat units in one dimension.

Figure 1B:
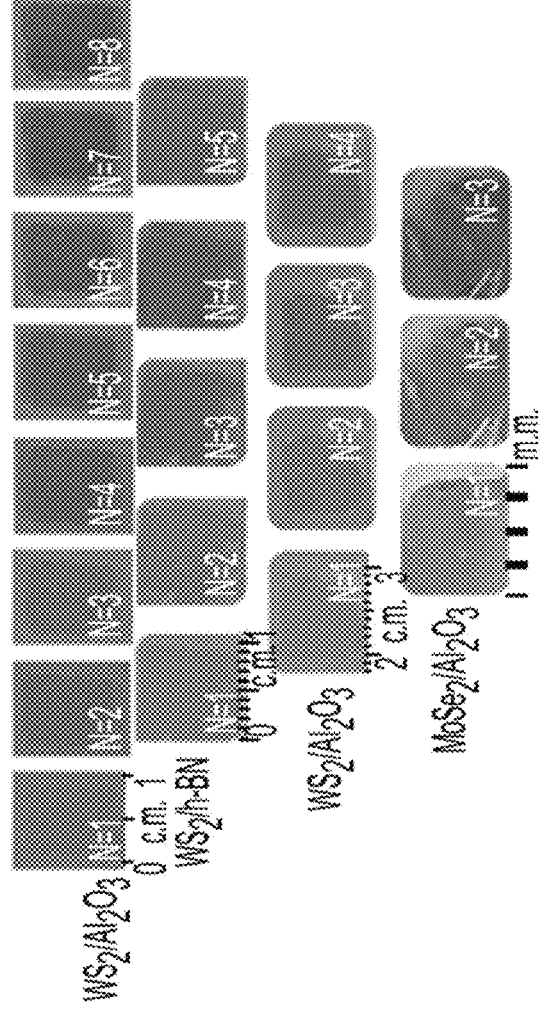
FIG. 1: Structure and Composition of Multilayer Excitonic Quantum Well Superlattices (a) Schematic structure of the multilayer superlattice structure, N=1 and N=4 respectively indicates unit cell number. (b) Optical camera images of ~ 1×1 $cm^2$ samples of the superlattice with progressively increasing number of unit cells, for monolayer $WS_2$/3 nm $Al_2O_3$ (N=8), monolayer $WS_2$/3 nm h-BN (N=5), monolayer $WS_2$/3 nm $Al_2O_3$ (N=4) and few layer $MoSe_2$/3 nm $Al_2O_3$. The sample color contrast evidently improves with increasing N. (c) Experimentally measured absorptance spectra for $WS_2$/h-BN (N=1 to 5) (top) as well as $WS_2$/$Al_2O_3$ (N=1 to 4) (bottom) superlattice samples where >80% absorption at the $WS_2$ excitonic peak (~620 nm) is observed. (d) Cross-sectional low magnification view of the high-angle annular dark field-scanning transmission electron micrographs (HAADF-STEM), (e) high magnification HAADF-STEM of the indicated region (rectangular marked region in d) used for elemental mapping and corresponding energy dispersive x-ray spectroscopy (EDS) maps of the $WS_2$/h-BN: N=5 superlattice showing the exact spatial position of the elements Au, Al, $O_2$, W, S, B, N along-with overlayer images respectively. (f) High resolution phase contrast TEM lattice image of the superlattice region clearly showing the monolayer $WS_2$ layer (darker) as well as crystalline h-BN spacer layer (lighter).
Figure 1A:
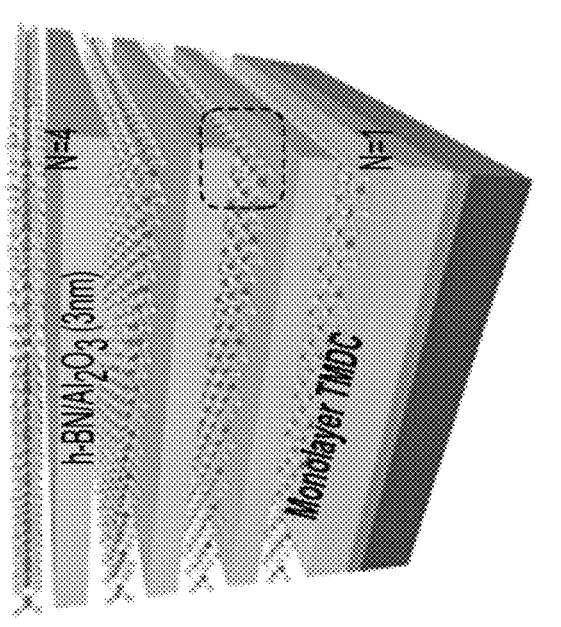

Here, results report the experimental realization of superlattices that are specifically designed to achieve near-unity absorption while concurrently maintaining the enhanced PL emission and optoelectronic properties of monolayer TMDCs. In examples, superlattices are $cm^2$ in scale and comprise of repeating unit cells of metal organic chemical vapor deposition (MOCVD) grown TMDCs ($MoS_2$ and $WS_2$)+insulating spacers (h-BN and $Al_2O_3$) stacked on an Au back reflector (FIG. 1A). Various examples observe the emergence of strongly coupled exciton-polaritons in the superlattices when light is coupled into the superlattices at incident angles >45°. Further, both the exciton-polariton dispersion and coupling strength are observed to be tunable by altering geometric parameters of the superlattice and its unit cells. This assembly process is both general and simple and allows extreme flexibility regarding materials choice due to the lack of microfabrication constraints. Thus, it can be expanded to allow the integration of several different 2D chalcogenides and spacer layers, as demonstrated here. The resulting approach opens up a broad field of artificially engineered, scalable vdW superlattices for electronic, optoelectronic, and photonic applications.

Results and Discussion

Various aspects and examples adopt a highly scalable approach to the fabrication of vdW MQWs and superlattice structures. Wafer-scale samples of $WS_2$ and $MoS_2$ monolayers grown using the MOCVD technique and h-BN grown by CVD with a borazine precursor were used for sample fabrication (see methods). Examples have adopted and demonstrated two different types of structures in this work, as shown in FIG. 1a: 1) An all-vdW superlattices are comprised of alternating layers of TMDC and h-BN, and 2) a mixed dimensional superlattice with alternating layers of TMDC and 3D insulating oxides grown via atomic layer deposition (ALD). The all-vdW superlattice predominantly studied in this work is comprised of a unit cell of monolayer $WS_2$ as the excitonic layer with insulating h-BN (3 nm) as a spacer layer which was repeated on top of an $Al_2O_3$/Au substrate. In the TMDC-oxide superlattice, the h-BN layers are replaced by $Al_2O_3$ layers. The proposed concept and fabrication scheme is quite general and has been extended to monolayers of $WS_2$, $MoS_2$, and few-layer $MoSe_2$ as the excitonic media in this study.

Figures 12A, 12B, 12C, 12D:
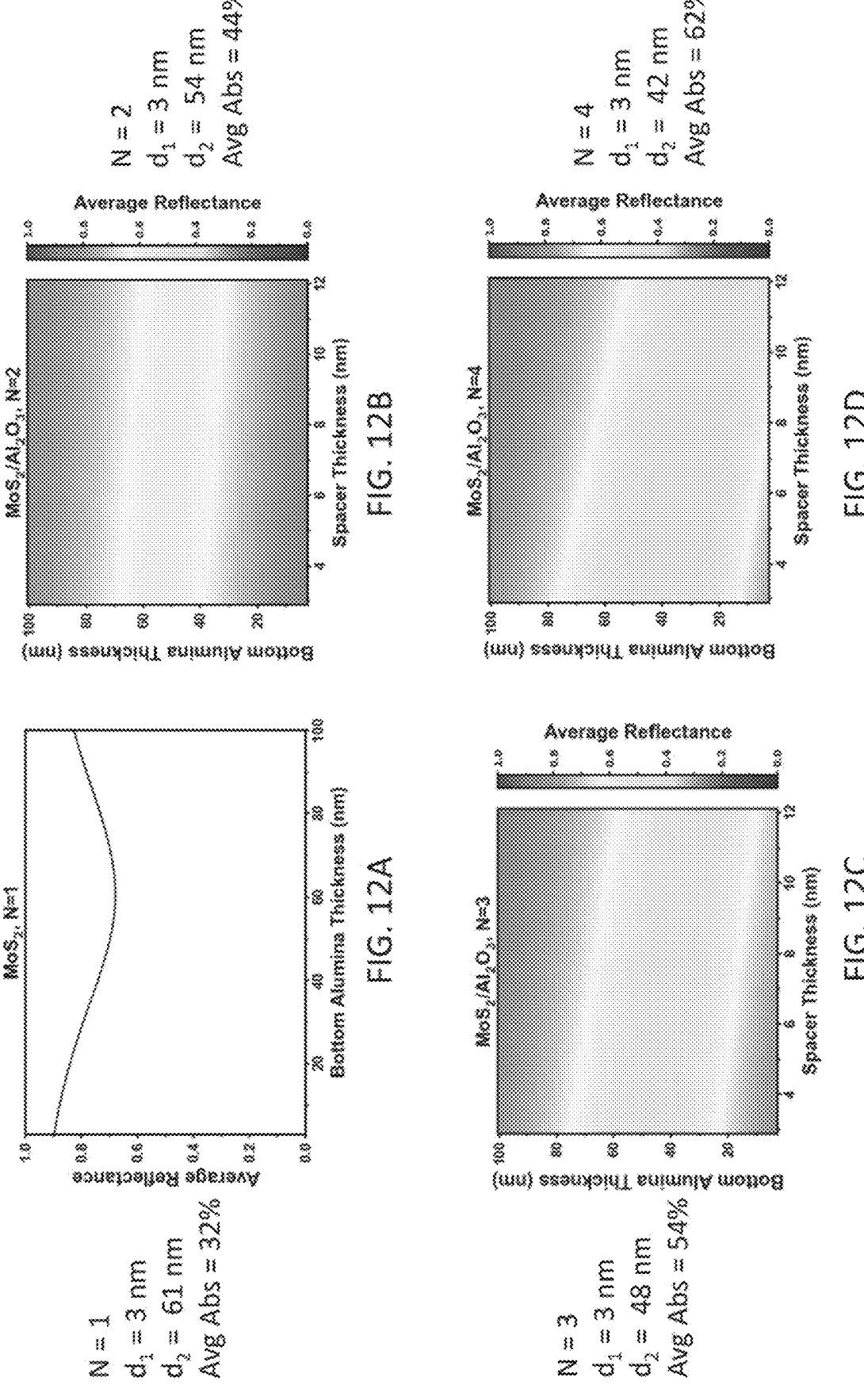
FIG. 12: The results for optimizing the $WS_2$/hBN super-lattice for N=1 through N=4 for maximum primary exciton (613 nm) absorptance which corresponds to a minimum in the reflectance. (a) Schematic of a device with the optimized parameters marked. $d_1$ is called the spacer thickness, and $d_2$ is the bottom alumina thickness. (b-e) The optimization results for varying spacer and bottom alumina thickness with the optimal parameters listed for N=1 through 4.
Figures 13A, 13B, 13C, 13D, 13E, 13F:
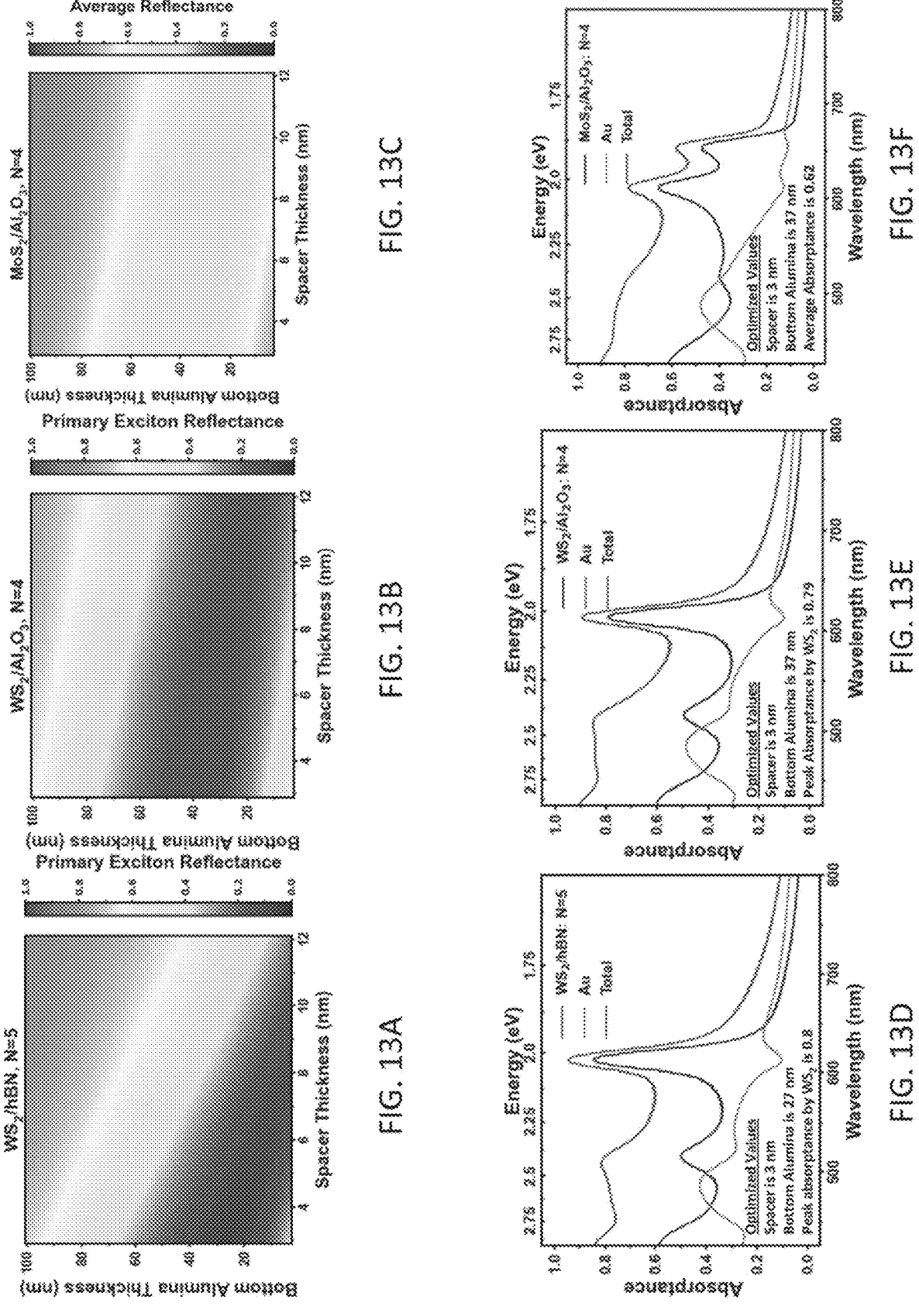
FIG. 13: The optimization for the fabricated superlattices of (a) $WS_2$/h-BN (N=5), (b) $WS_2/Al_2O_3$ (N=4), and (c) $MoS_2/Al_2O_3$ (N=4) for varying bottom alumina and spacer thicknesses. The layer resolved absorptances of the optimized superlattices are shown in (d-f) for $WS_2$/h-BN (N=5), $WS_2/Al_2O_3$ (N=4), $MoS_2/Al_2O_3$ (N=4), respectively. The optimized parameters and absorptance values are indicated in the graphs.
Figures 14A, 14B, 14C, 14D, 14E, 14F:
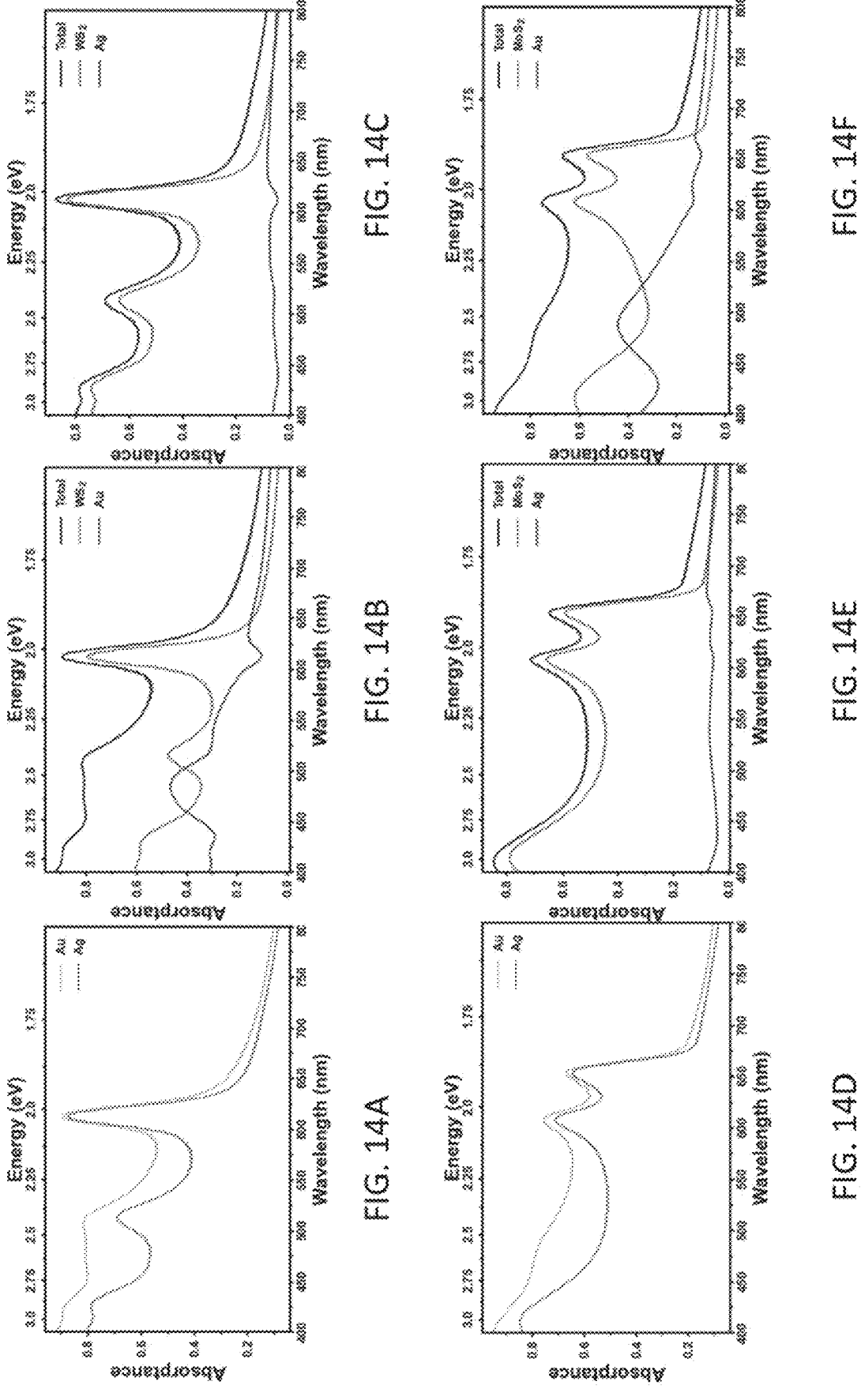
FIG. 14: The absorptance dependence for superlattices with Au and Ag reflectors. (a, d) Comparison of the optimized spectra for $WS_2/Al_2O_3$: N=4 and $MoS_2/Al_2O_3$: N=4 superlattices, respectively. (b, c) The layer resolved absorptance for a $WS_2/Al_2O_3$: N=4 superlattice with Au and Ag reflectors. The Au has an absorptance of 0.10 at the primary exciton wavelength (613 nm) while the Ag reflector has an absorptance of 0.04 at the same wavelength. (e, f) The layer resolved absorptance for a $MoS_2/Al_2O_3$: N=4 superlattice with Au and Ag reflectors. The Au reflector has absorptances of 0.1 and 0.14 at the A (655 nm) and B (608 nm) exciton wavelengths, respectively, while the Ag reflector has absorptances of 0.06 and 0.06 as the same wavelengths.

In various examples, the superlattice structures were prepared via wet transfer of the 2D chalcogenide and h-BN layers. In addition, atomic layer deposition growth of aluminum oxide were used for the base spacer layer as well as a component of unit cells, in some cases. These large area superlattice samples require wafer-scale grown TMDCs and h-BN with uniform thicknesses. The $MoS_2$, $WS_2$ and h-BN samples were grown via MOCVD while the $MoSe_2$ samples were grown via selenization of Mo thin films in $H_2Se$ gas at elevated temperatures (see FIGS. 11-12). The increased absorption of the superlattices as the number of unit cells increases can be seen by the naked eye, as shown in FIG. 1b. $WS_2$-based superlattices transition from a near transparent film at N=1 to a deep green color at N=5. The large area ($cm^2$) realization of these superlattices (FIG. 1b) is a particularly important demonstration of this study, given that any practical application of 2D TMDCs in photonics/optoelectronics will require large area, uniform material. In principle, all materials and processes presented are wafer scalable. While direct growth of TMDCs on h-BN has been reported[22], scalable growth of such multilayer nitride/chalcogenide van der Waals superlattices has not be achieved. Experimentally measured absorptance spectra for two-different superlattices have been shown in FIG. 1c. A detailed discussion on the absorption properties is in following section.

Figure 1D:
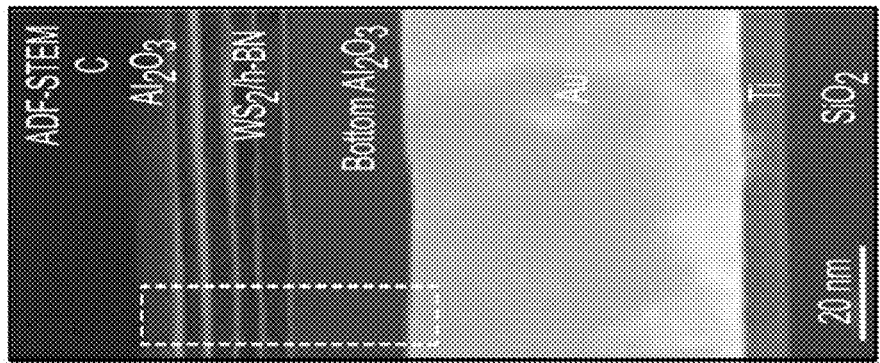
Figure 1C:
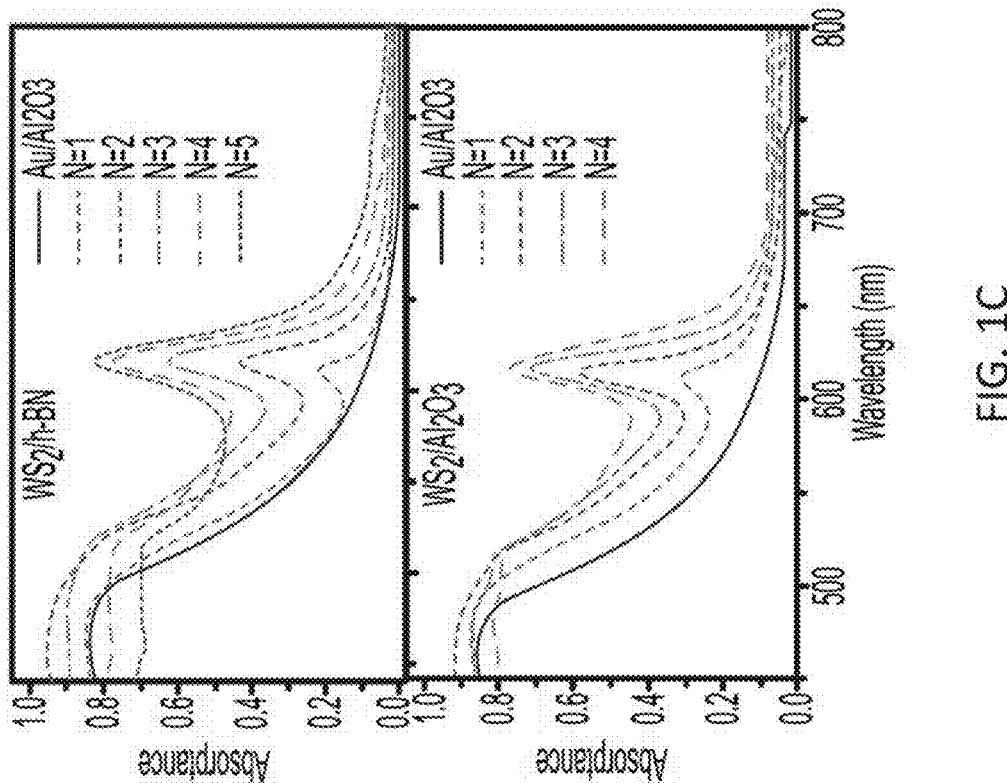
Figures 1E, 1F:
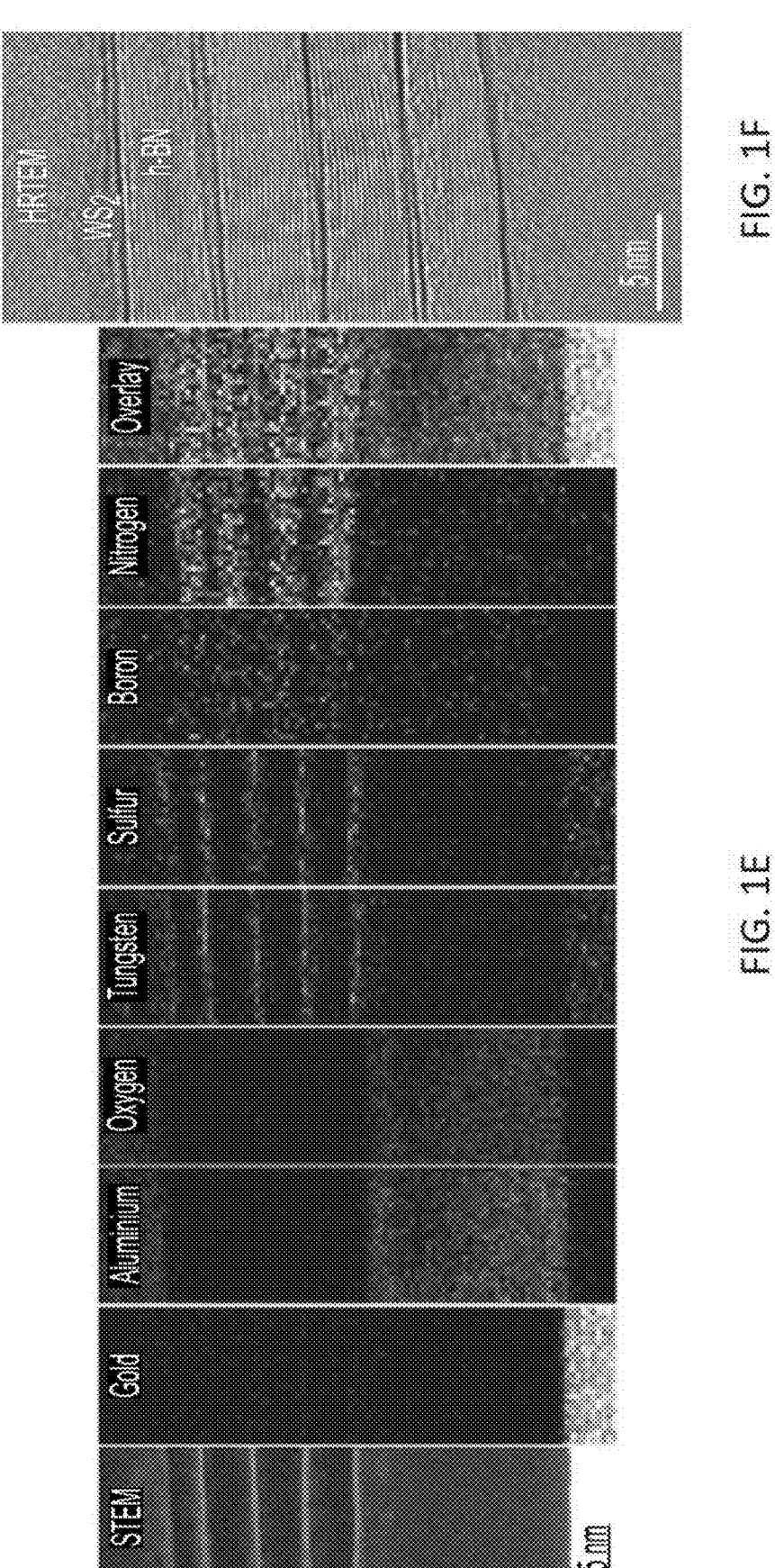

To examine the spatial uniformity of this multilayer superlattice structure, example experiments performed cross-sectional transmission electron microscopy of a representative sample ($WS_2$/h-BN: N=5 superlattice) (FIG. 1d). An aberration corrected (probe correction) high-angle annular dark field (HAADF)-STEM image of the cross section of one of the superlattice samples clearly shows the multilayer structure. There are five bright lines (top portion of FIG. 1d) running horizontally in the image contrast, corresponding to the high atomic number layer ($WS_2$) separated by lower atomic number spacer layers (h-BN). Corresponding energy dispersive X-ray spectroscopic (EDS) elemental maps show the stacked layers clearly (FIGS. 1e and 8). Layers of W, S and N signals are quite distinct and coincide exactly with the Z-contrast in STEM image (first section of FIG. 1e). Au, Al, and O signals are from the substrate and base $Al_2O_3$ layer (FIG. 1e). The high-resolution phase contrast TEM image (FIG. 1f) clearly shows the monolayer $WS_2$ (dark contrast) and h-BN layers (light contrast).

A two-variable optimization scheme using a Transfer Matrix Method (TMM)-based modelling combined with a genetic algorithm-based optimization approach was used to determine the desired thickness of the superlattice samples. The objective of the optimization was to maximize (minimize) narrow band absorptance (reflectance) at the excitonic resonance. The unit cell spacer and bottom spacer thicknesses were optimized to maximize the excitonic absorptance (see FIGS. 14-17). TMM modelling and optimization were prepared for four different superlattices ($WS_2$/h-BN, $WS_2$/$Al_2O_3$, $MoS_2$/$Al_2O_3$ and $MoSe_2$/$Al_2O_3$) where the number of unit cells varied from N=1 to 8. Distinct absorptance enhancement up to N=4 and N=5 for $Al_2O_3$ and h-BN based superlattices, respectively, were observed, as experimentally demonstrated in FIG. 2.

Figure 2B:
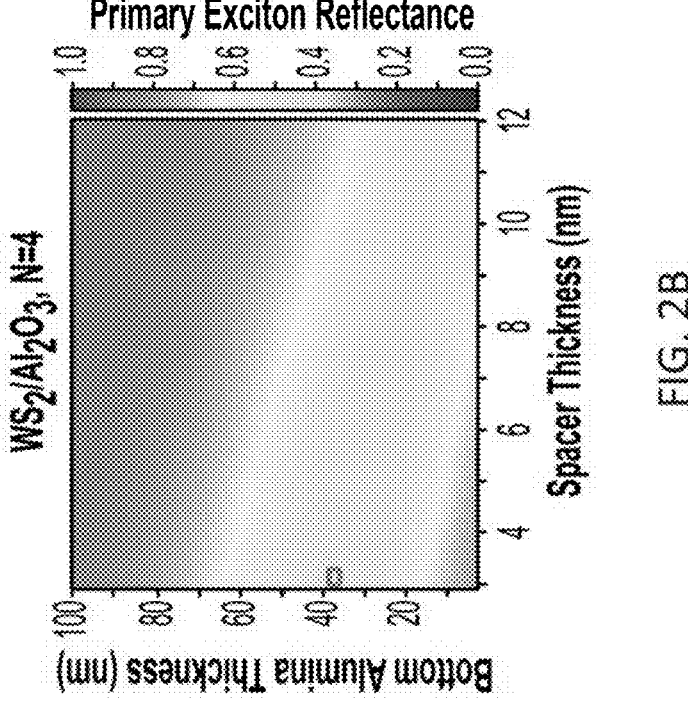
FIG. 2: Thickness and Optical Property Optimization. 3D color map of the excitonic reflectance (~620 nm) as a function of thickness parameters for the bottom alumina layer and spacer layer, for (a) $WS_2$/h-BN and (b) $WS_2$/$Al_2O_3$ samples. (c) The layer dependent, optimized absorptance for $WS_2$/h-BN (N=5), and $WS_2$/$Al_2O_3$ (N=4) follows a trend of increasing rapidly before asymptotically approaching a limit. (d, g) Simulated and (e, h) Experimental normal incidence reflectance spectra for a function of increasing number of unit cells in the stack for $WS_2$/h-BN and $WS_2$/$Al_2O_3$ superlattices, respectively. The decreasing reflectance with increasing N is evident and shows excellent qualitative and quantitative agreement between simulations and experiments. (f, i) Simulated total absorptance decomposed into absorptance of individual component layers for the corresponding superlattice stacks.
Figure 2A:
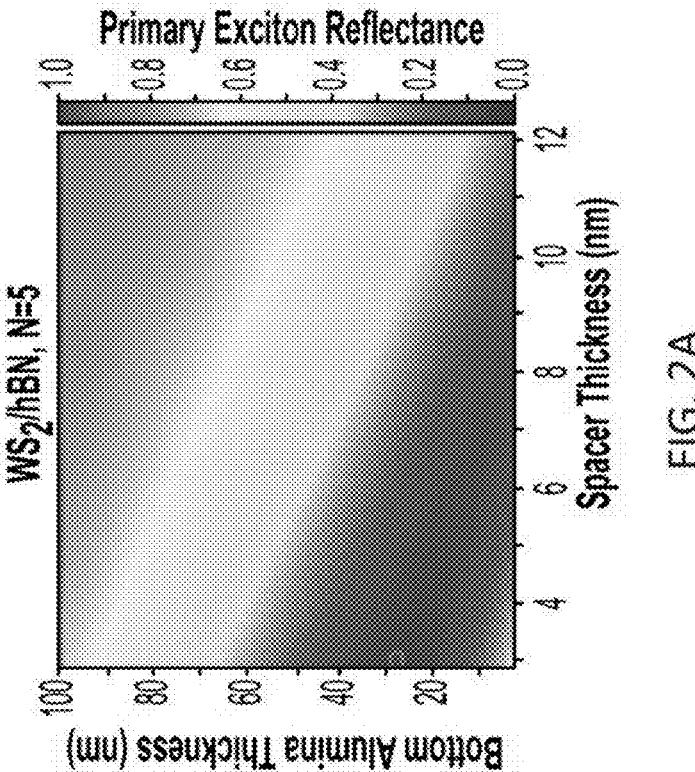
Figures 2C, 2D:
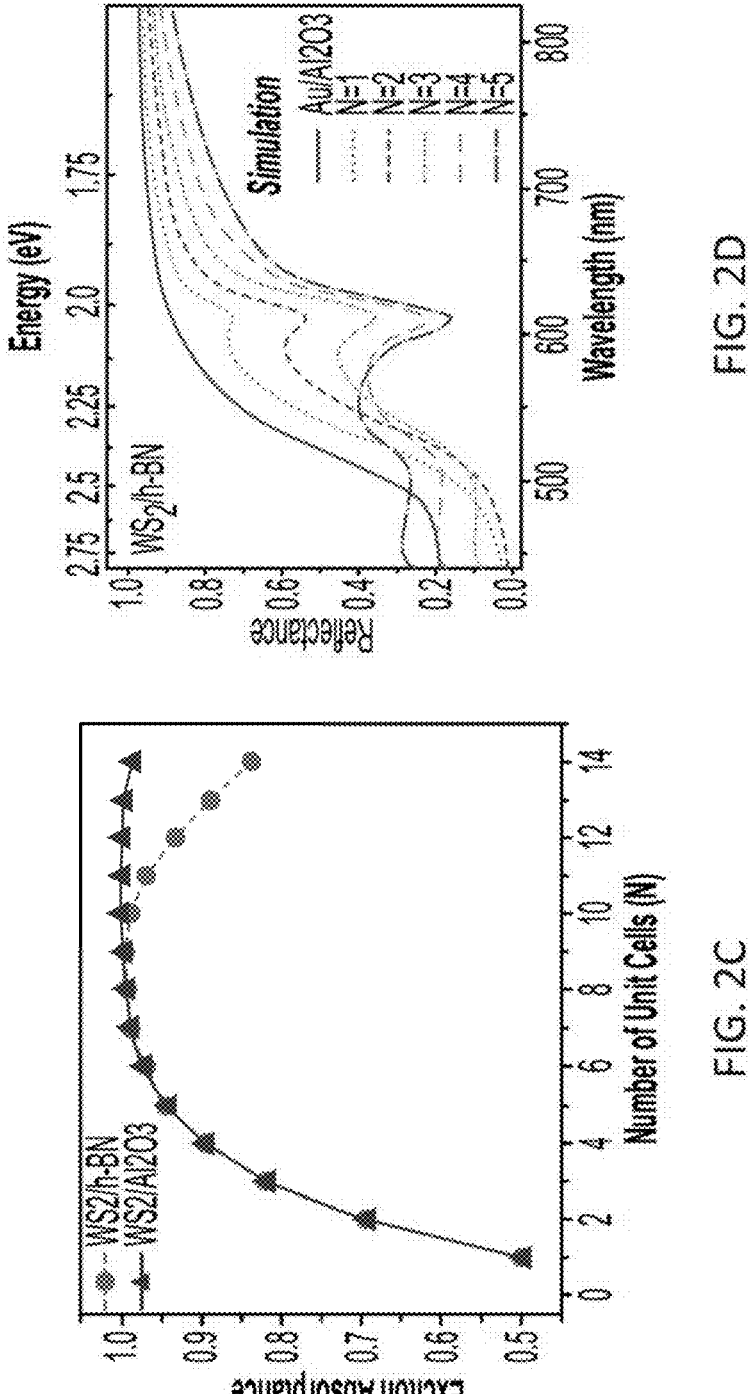
Figures 2E, 2F:
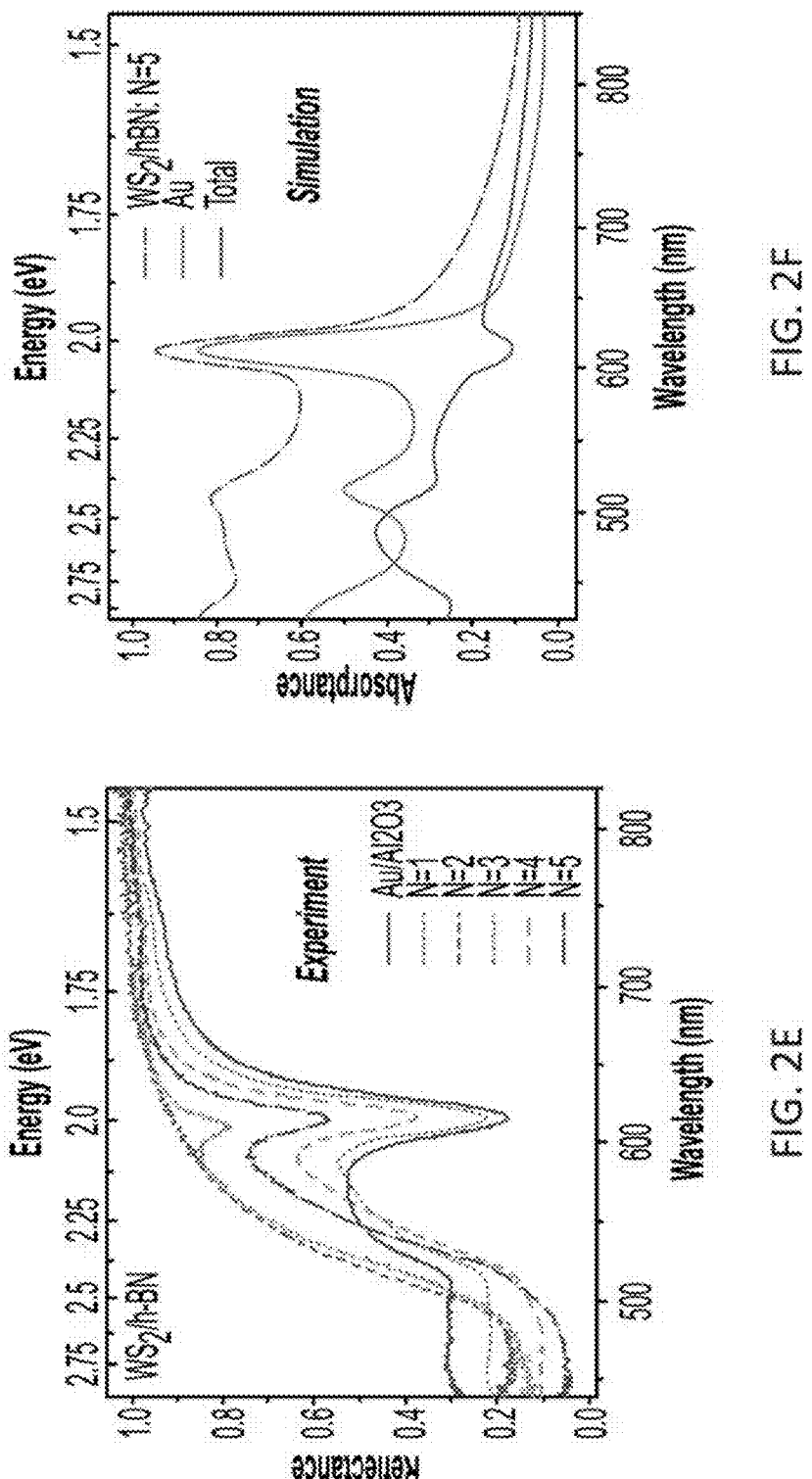
Figures 2G, 2H:
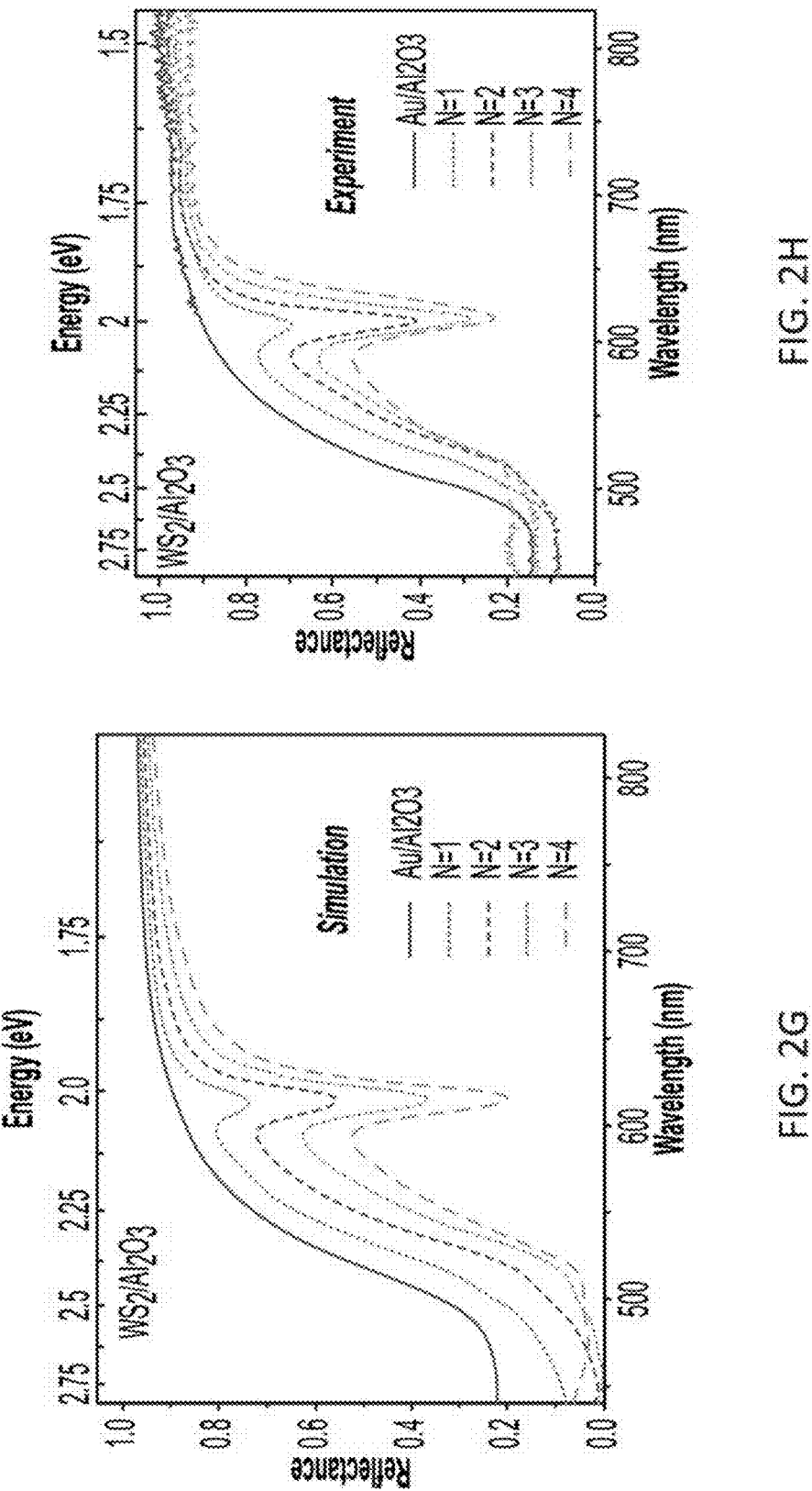

The modelling and optimization identifies three key features in terms of designing superlattice geometric parameters for maximizing (minimizing) absorption (reflection) at the excitonic resonance. They are: 1) the thickness of the spacer layer in the unit cells must be as low as possible (FIGS. 2a and b); 2) the bottom alumina thickness should be reduced as the number of unit cells (N) increases (see FIGS. 15-18); and 3) the peak absorptance (at exciton resonance) approaches near unity with increasing N and then dips again, suggesting that there is an optimal unit cell number (N) for perfect absorption (FIG. 2 d-i). It should be noted that this optimal N can vary with spacer index and thickness. Given that electronic interactions between two TMDC layers are non-negligible at spacer thicknesses of 1-1.5 nm, there is little room for further improvement in light trapping while maintaining electronic isolation. It is further noted that electronic isolation between two TMDC layers at ~3 nm h-BN spacer layers has been demonstrated in the past. This precludes any quantum mechanical interactions between layers that can modulate the electronic band structure and therefore example systems can be simulated via a purely electromagnetic wave TMM simulations. The complex refractive index values used in the TMM simulations were obtained through spectroscopic ellipsometry measurements of the samples that were used for the fabrication of the superlattices. The simulated reflectance of the stack decreases with each successive unit cell deposition at the $WS_2$ excitonic resonance (FIG. 2d, g), for both $WS_2$/h-BN and $WS_2$/$Al_2O_3$ superlattice samples. This is in strong agreement with the experimentally measured spectra (FIG. 2e, h).

Figures 18A, 18B:
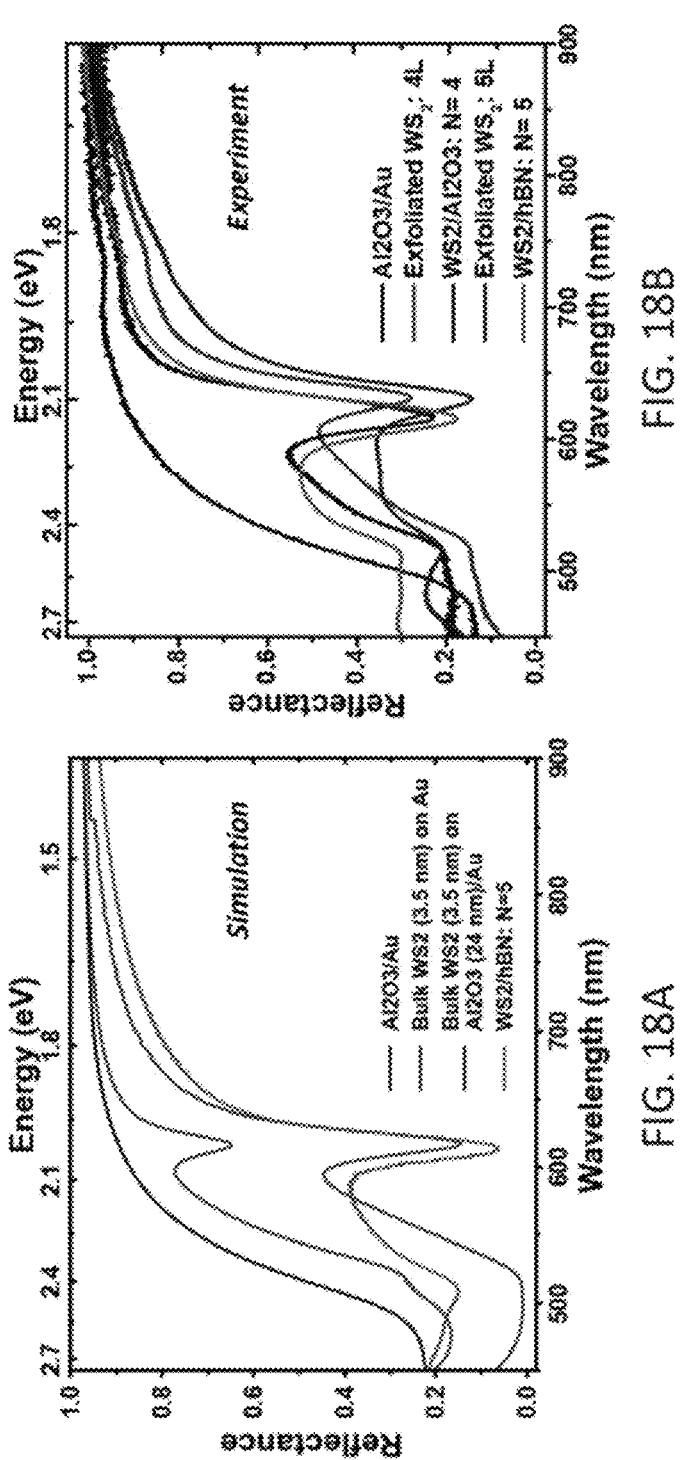
FIG. 18: (a) The simulated reflectance of the $WS_2$/h-BN N=5 superlattice compared to architectures with similar thicknesses of bulk $WS_2$. (b) The experimental reflectance of the N=4 and N=5 superlattice $WS_2$/h-BN superlattices compared to the exfoliated sample of similar $WS_2$ thicknesses. Blue shift of superlattice peak showing the monolayer confined structure as opposed to bulk exfoliated $WS_2$. For 4 L it is pretty clear that monolayer superlattice is superior compared to 4 L thick $WS_2$, even for 5 L case, superlattice is superior to exfoliated $WS_2$ as is evident from the simulations.

This agreement between simulated and experimentally measured spectra suggests that the dielectric function of $WS_2$ is unperturbed from it's as-grown state on sapphire, when integrated into this multilayer superlattice stack. It also suggests that there is no electronic interaction between neighbouring the $WS_2$ layers when they are separated by h-BN or $Al_2O_3$. Therefore, they maintain their monolayer electronic character when integrated into this superlattice stack. However, the h-BN encapsulation does result in narrowing of exciton line-width as seen in FIG. 2e due to the lower charge inhomogeneity induced by the h-BN on $WS_2$ excitons which is not captured by the simulation. The insulating layers serve two primary purposes: 1) they act as spacer layers between TMDCs to reduce the electronic coupling between individual TMDCs layers, allowing them to maintain monolayer properties and 2) they act as light trapping agents, because the refractive index difference between the TMDCs and insulating layers also results in enhanced reflection. Given the low reflectance (high absorption) at the excitonic resonance, an important parameter to consider is the extent of useful absorption in the semiconductor vs parasitic absorption in the underlying Au. This absorption into individual components of the superlattice was extracted through the TMM simulations (FIG. 2 f, i), where a negligible contribution from the bottom Au layer is observed around the primary exciton wavelength (613 nm for $WS_2$) (FIG. 18).

Figure 21:
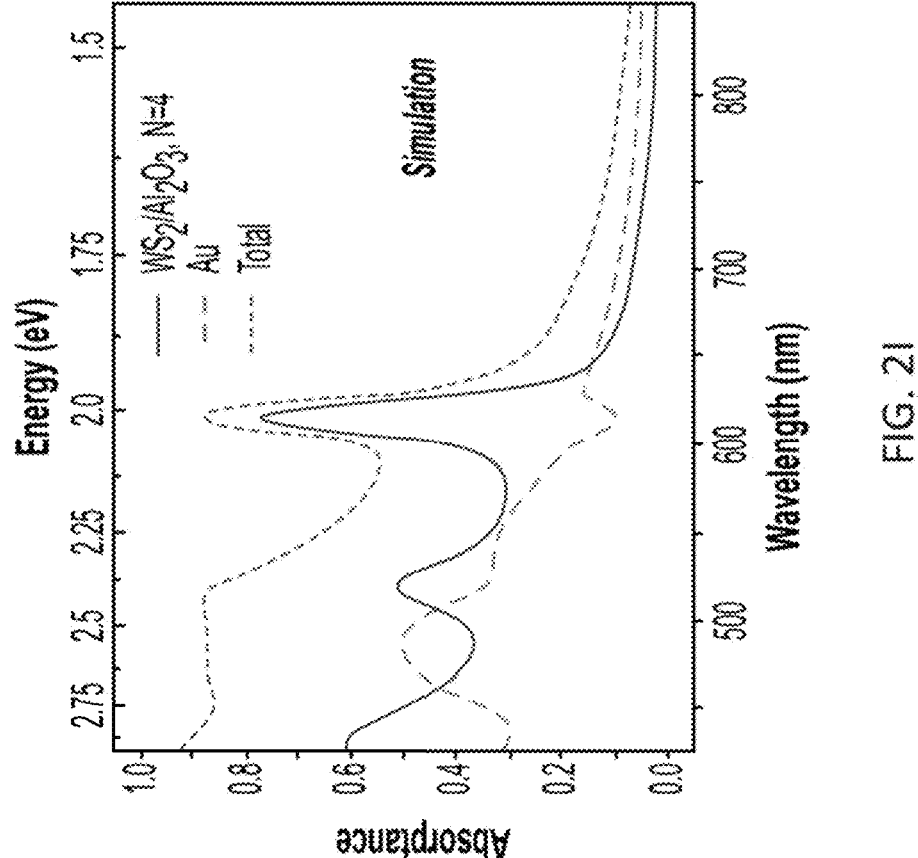
FIG. 21: (a) The number of unit cells dependent PL of the $WS_2$/$Al_2O_3$ superlattice. The exciton and trion peaks merge with increasing N, and the main peak blue shifts. (b) The number of unit cells dependent Raman spectra of the $WS_2$/$Al_2O_3$ superlattice. The monolayer Raman spectra characteristics are maintained throughout the stacking process. The blue circle shows the emergence of a defect state with increased stacking. (c) The number of unit cells dependent PL of the $MoS_2$/$Al_2O_3$ superlattice. (d) The number of unit cells dependent Raman spectra of the $MoS_2$/$Al_2O_3$ superlattice. The monolayer Raman spectra characteristics are maintained throughout the stacking process.
Figure 19A:
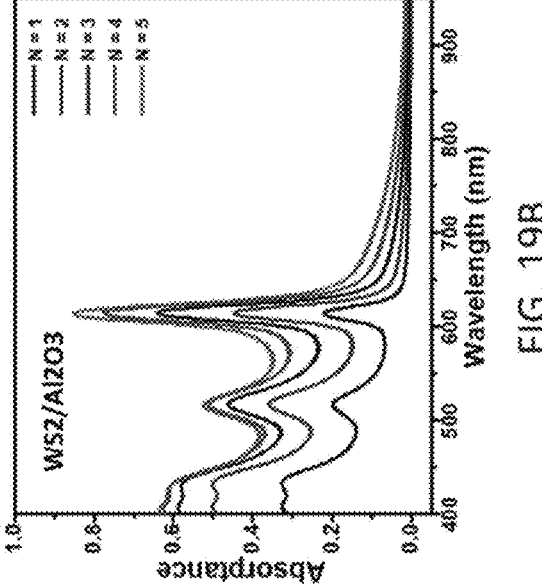
FIG. 19: (a-c) Layer resolved absolute absorptance of the vdW layers ($WS_2$ and $MoS_2$) in three different superlattice structures, simulated using TMM model for varying number of unit cells from N=1 to 5.
Figure 19B:
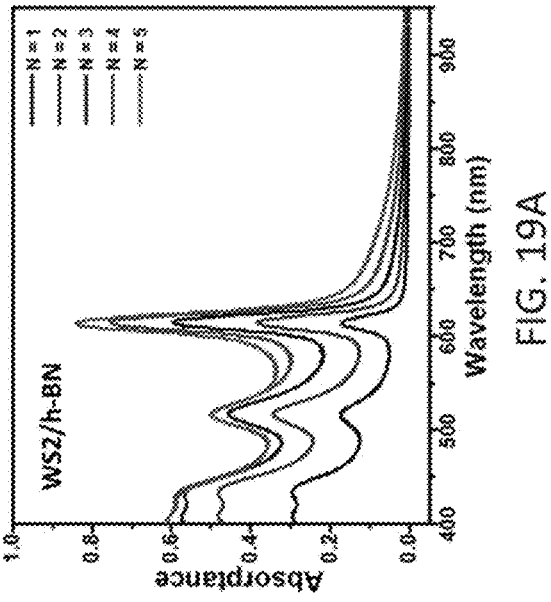
Figure 19C:
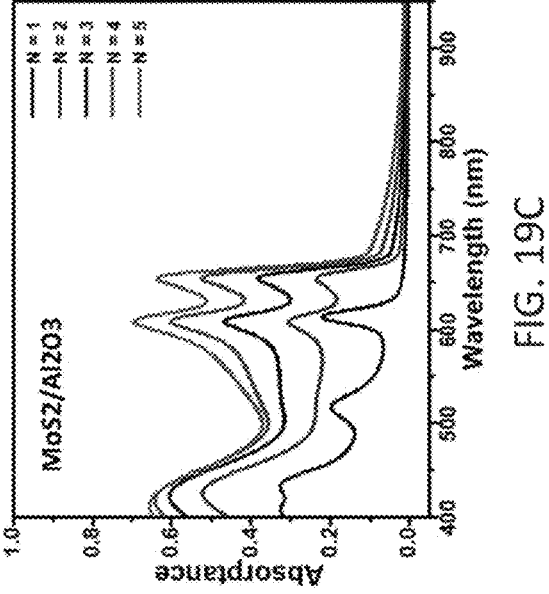
Figure 20B:
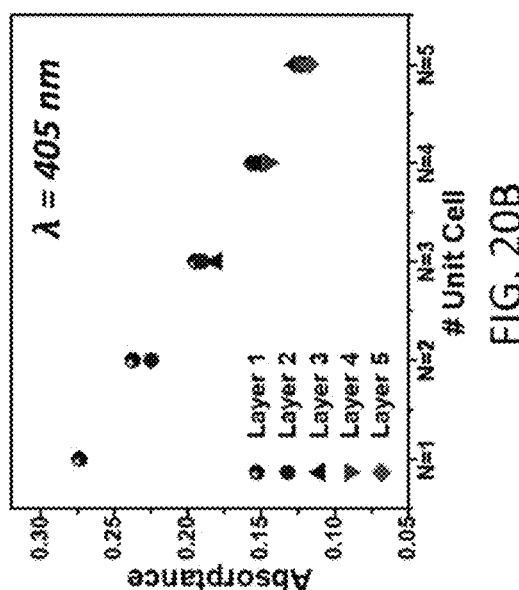
FIG. 20: (a) The total $WS_2$ absorptance and (b) individual layer absorptance within the $WS_2$/h-BN device for varying number of unit cells from N=1 to 5. (c) Electric field profiles at both the PL normal incident light wavelength (405 nm) and emission wavelength (613 nm) for the $WS_2$/h-BN device from N=1 to 5.
Figure 20A:
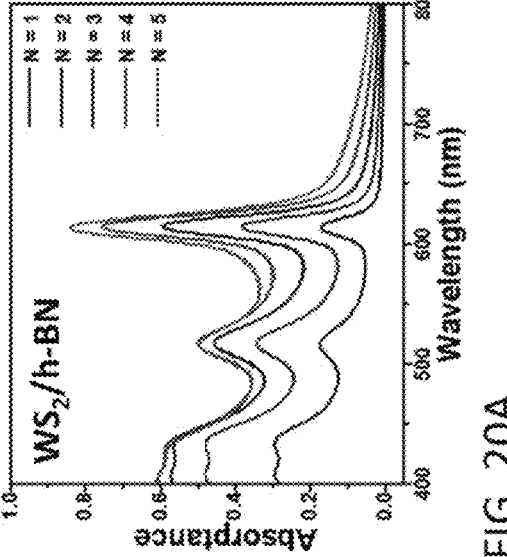
Figure 21B:
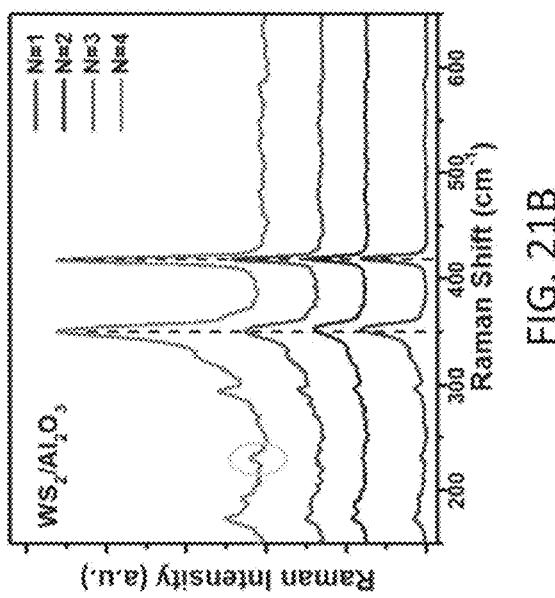
Figure 21D:
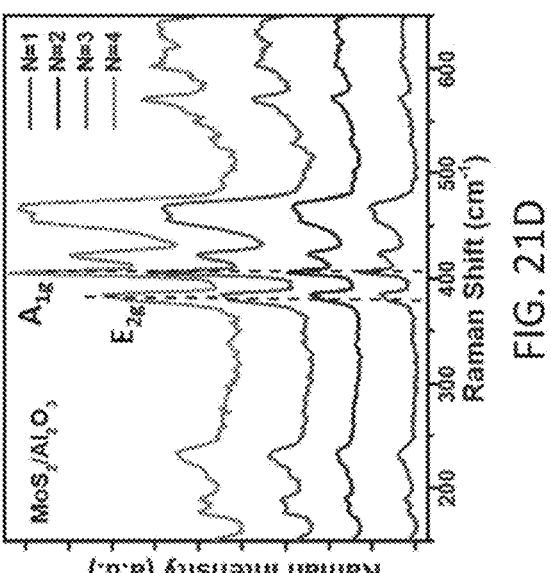
Figure 21A:
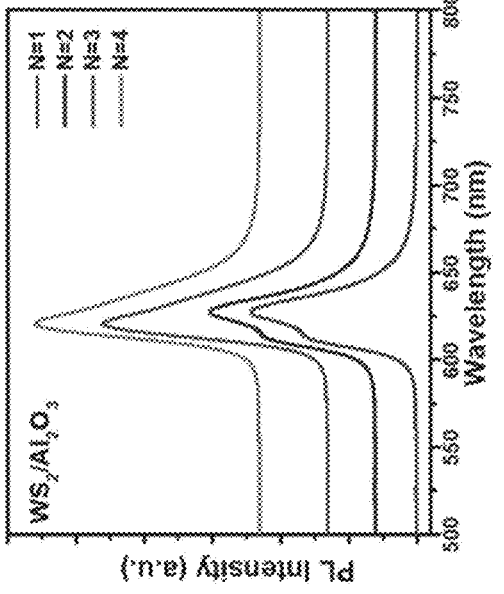
Figure 21C:
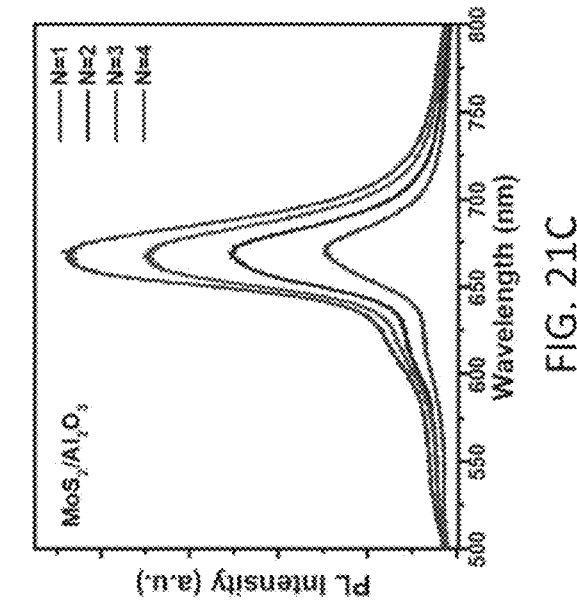

It is further worth noting that there is a pronounced dip in reflectance in the bottom Au at the excitonic resonance. This is a peculiar observation and is attributed to lack of sufficient incident light intensity reaching the Au surface because of multiple reflections and trapping in the layers above. This observation can be generalized to other bottom metals such as Ag, where the parasitic absorptance is further diminished, yet the reflectance dip remains (see FIGS. 19-20). Likewise, $MoS_2$/$Al_2O_3$ superlattices also show similar behavior (see FIG. 21). The reflectance behaviour of a multilayer, mechanically exfoliated $WS_2$ control sample were analysed and compared with similar thickness to that of the $WS_2$ present in the superlattices ($WS_2$/$Al_2O_3$: N=4 and $WS_2$/h-BN: N=5) (see FIGS. 22-23). The comparative analysis confirms that while a similar degree of absorbance can be achieved with equivalent thickness of $WS_2$ on an alumina spacer, there is loss of the direct band gap nature of the TMDC. Additionally, the superlattice exciton peaks remain unshifted, as opposed to the red-shift seen in few-layer $WS_2$ of equivalent absorber thickness. This lack of energy shift further confirms that the $WS_2$ is electronically isolated in the multilayer. Finally, it is worth nothing that the oscillator strength of the exciton is higher in monolayers. This is because of the reduced dielectric screening and quantum confinement, which also results in larger absorption per unit thickness (see FIG. 23).

The ability of these multilayer superlattices to both trap light and retain their monolayer electronic and optical character is a defining feature of an example approach. In contrast to their bulk counterparts, the presence of strong quantum confinement in monolayer $WS_2$ and $MoS_2$ leads to a direct band gap, which in turn leads to high intensity PL due to low, non-radiative energy loss during electron-hole recombination. This extraordinary feature of monolayer TMDCs makes them strong candidates for light emitting devices. The superlattice structures demonstrated herein—which combine insulating spacer layers—between monolayer TMDCs allows the monolayers to maintain their direct-gap electronic structure. This was verified using a series of vibrational and luminescence spectroscopy measurements shown in FIG. 3.

Figure 3A:
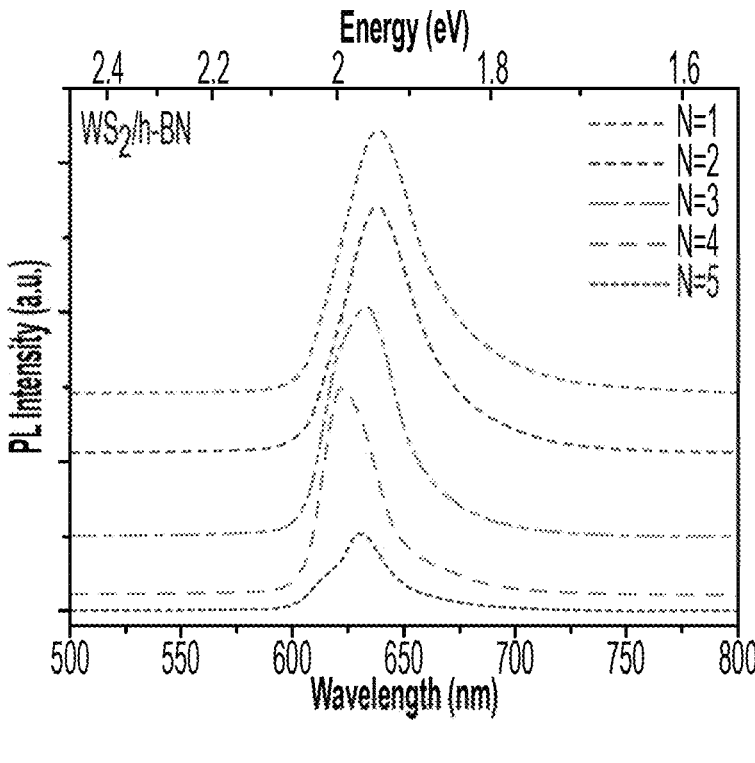
FIG. 3: Maintenance of monolayer properties. (a) Room temperature photoluminescence (PL) spectra of the multilayer superlattice as a function of increasing number of unit cells for the $WS_2$/h-BN superlattice. (b) Corresponding PL peak intensity and absorption normalized PL vs. number of unit cells, showing increasing PL intensity with increasing number of unit cells The net PL intensity saturates when the total absorption saturates, while the increase in normalized absorption (at pump wavelength of 405 nm) suggests enhanced light outcoupling by the multilayer superlattice structure. (c) Power-dependent PL spectra for the $WS_2$/h-BN: N=5 superlattice and (d) PL peak intensities (plotted on a log-log scale) emerging from various excitonic components of the power dependent spectra in (c), extracted using Lorentzian fits. The sharp increase in bi-exciton intensity is evident. (e) Raman spectra of the same multilayer superlattice with increasing number of unit cells showing the same peak positions. The peak intensity sharpens and rises with enhanced light interaction for the samples with larger N. (f) Unchanged characteristic Raman peak positions with increasing N.
Figure 3B:
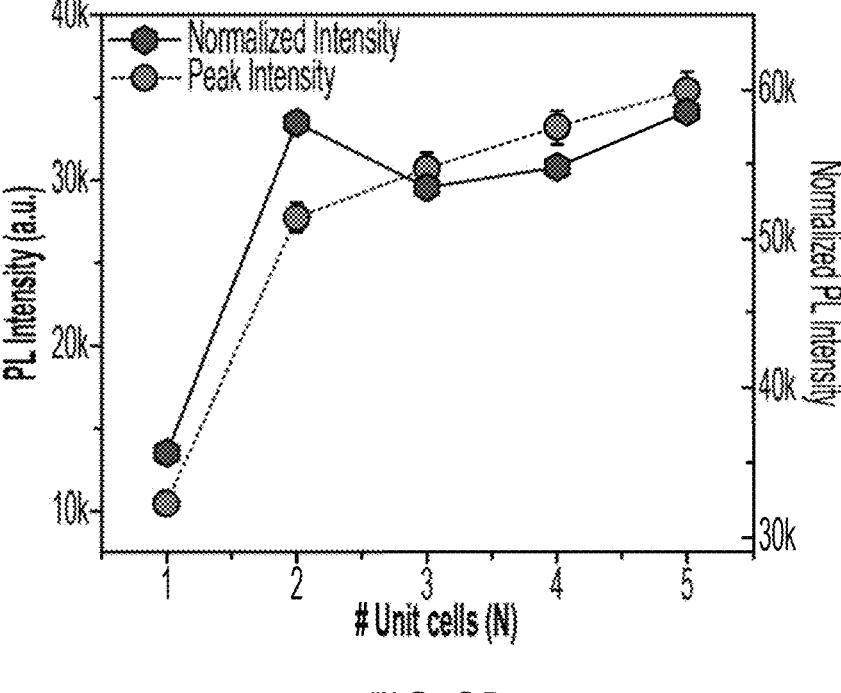
Figures 3C, 3D:
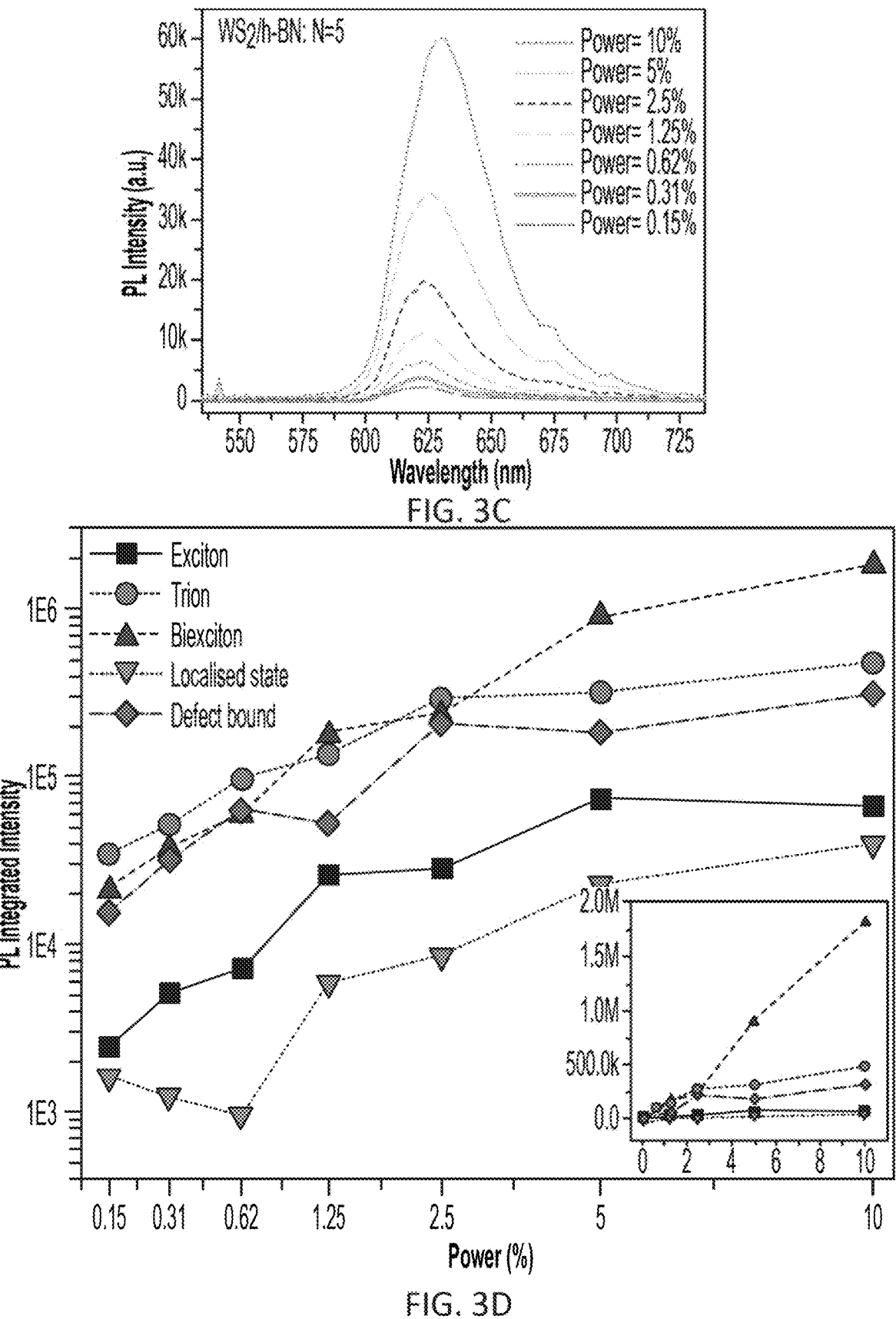
Figures 25A, 25B, 25C, 25D:
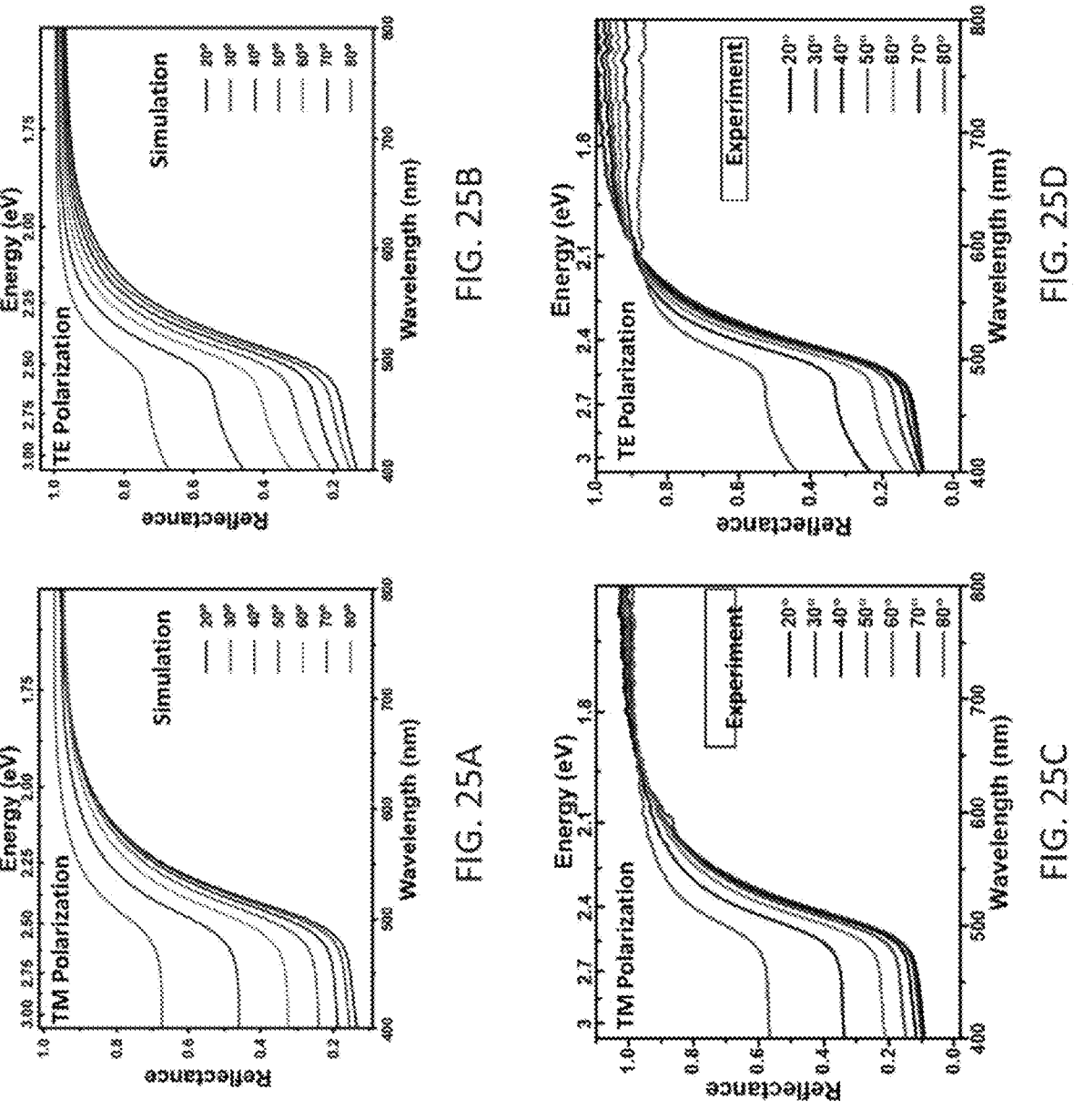
FIG. 25: The simulated angle-resolved reflectance of 34 nm of $Al_2O_3$ on Au for (a) TM and (b) TE polarized light. The corresponding experimental spectra for (c) TM and (d) TE polarized light.
Figure 26B:
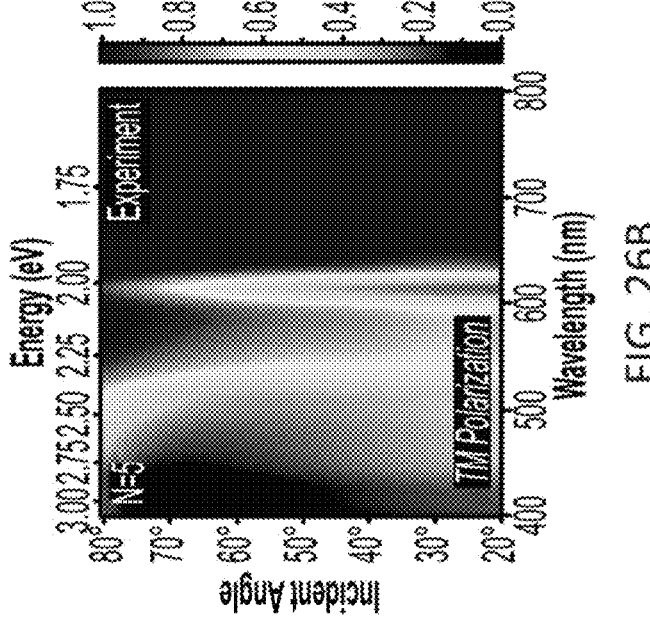
FIG. 26: (a) Illustration of the two polarizations of incident light on the superlattice. For TE polarized light, the incident magnetic field tilts out of plane, and for TM polarized light, the incident electric field tilts out of plane. The (b, c) experimental angle-resolved reflectance spectra of the $WS_2$/h-BN N=5 superlattice with TM polarized incident light plotted in 2-different mode for better visualization. Similarly, the (d, e) simulated angle-resolved reflectance spectra of the $WS_2$/h-BN N=5 superlattice has been presented.
Figure 26A:
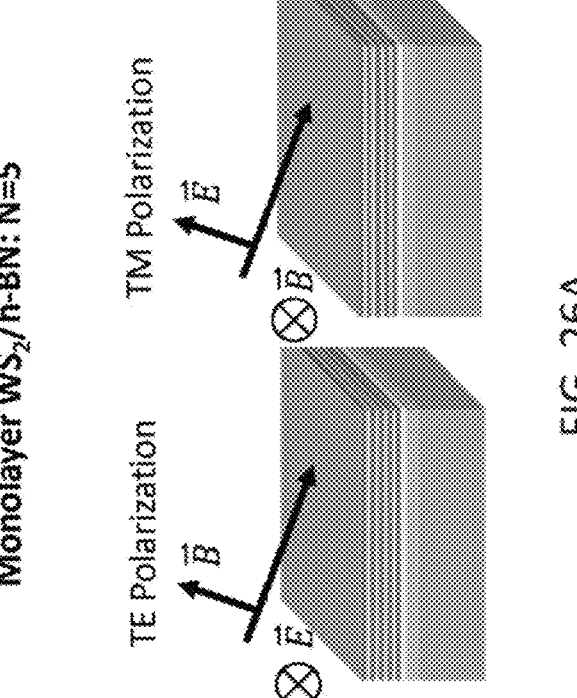
Figure 26D:
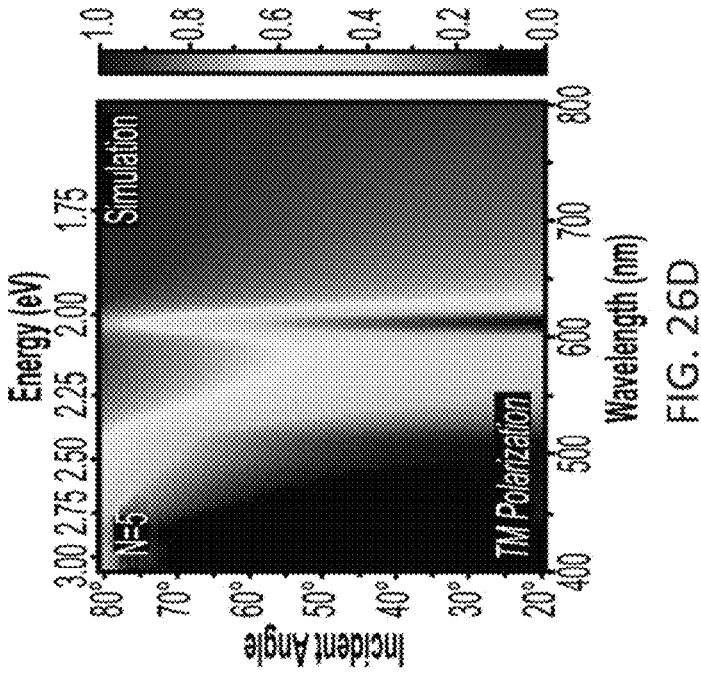
Figure 26C:
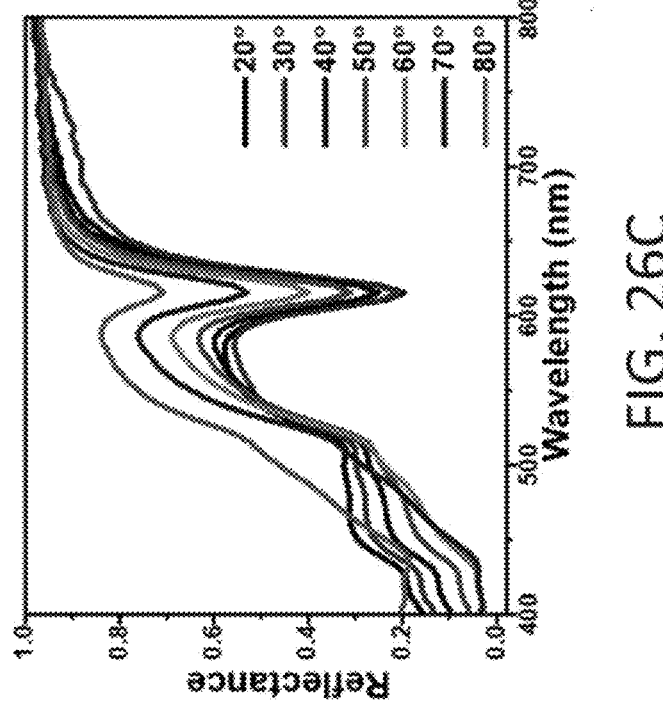
Figure 26E:
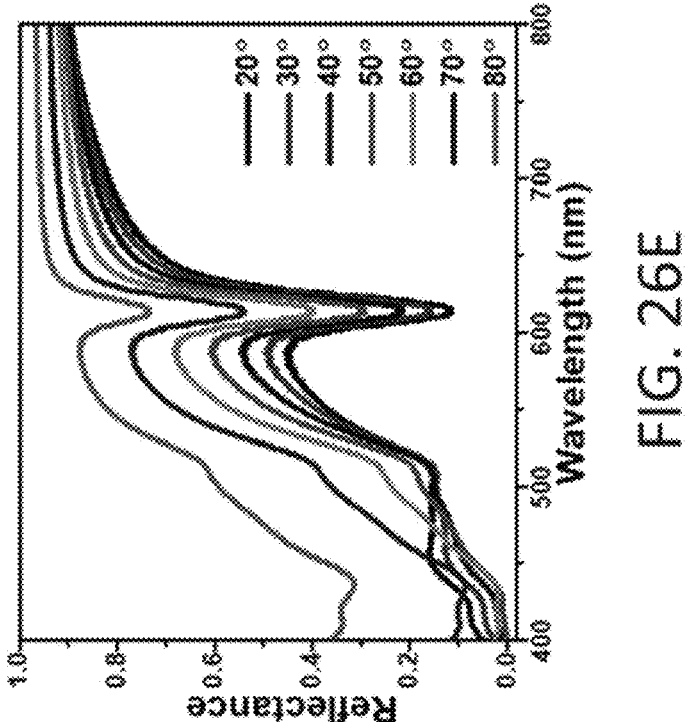

It was observed that the multilayer superlattices remain highly luminescent with an increasing number of unit cells (FIG. 3a). Not only are the luminescent properties maintained, but the luminescence intensity is enhanced with increasing N due to the increased light-material interactions (FIG. 3b, see also FIGS. 24-25). It was observed that the luminescence intensity increases drastically for N=1 to 2, when normalized to total useful light absorption with increasing N, using layer resolved absorption calculations. This is expected due to the stronger light-material interaction. However, this then flattens off for higher N (3 and above) due to reduced light penetration deeper into the stack (see FIG. 25). A small red shift in PL peak positions with increasing number of unit cells (from N=1 to 5) were also observed, and can be attributed to the increasing density of defect emission or doping arising from trapped contaminants such as PMMA, organic solvents and water that are used in the wet chemical transfer process (see FIG. 12). Similar PL behavior was observed in other monolayer TMDC based superlattices, namely $WS_2/Al_2O_3$ and $MoS_2/Al_2O_3$ (see FIG. 26). To further understand any possible effects of enhanced absorption and light trapping on the luminescence characteristics, examples also performed PL characterization as a function of incident pump power.

Figures 22A, 22B:
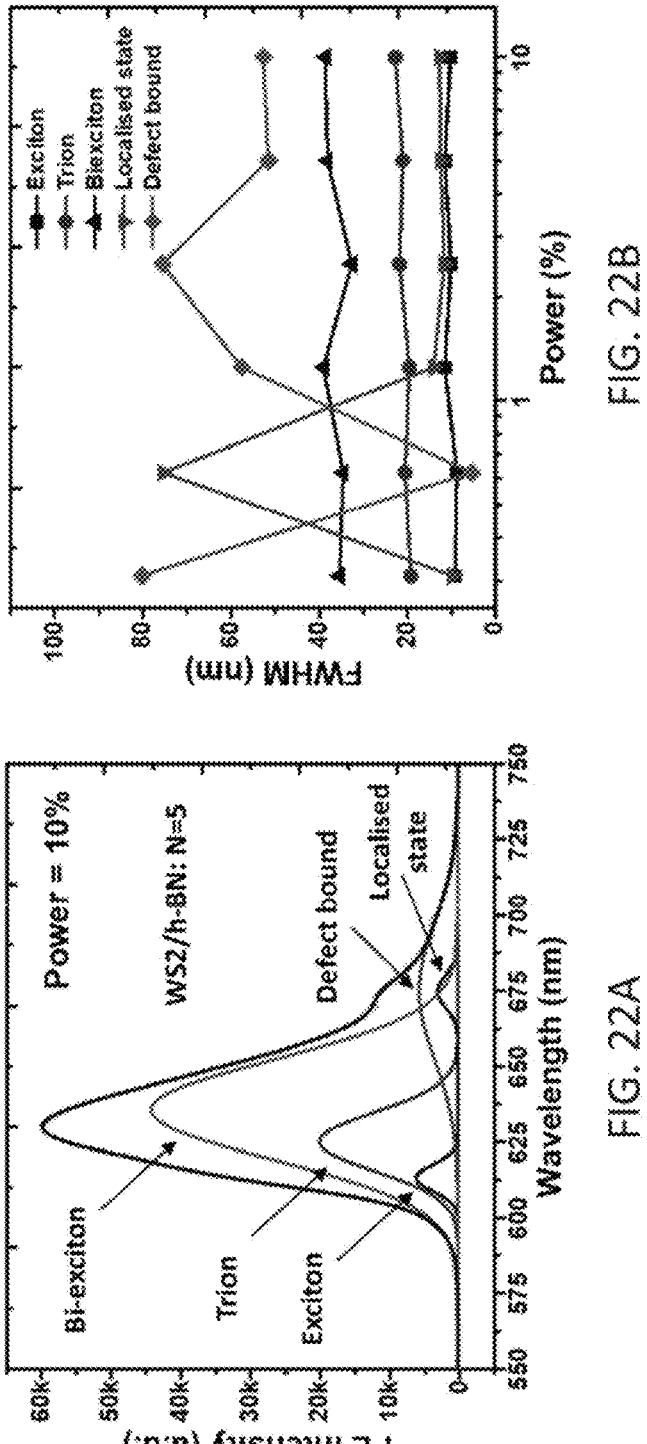
FIG. 22: (a) The highest power (10%) PL spectrum for $WS_2$/h-BN decomposed into its constituent peaks using a series of Lorentzian multipeak fittings. (b) The line-width dependence on varying power density for the $WS_2$/h-BN: N=5 superlattice.
Figures 23A, 23B, 23C:
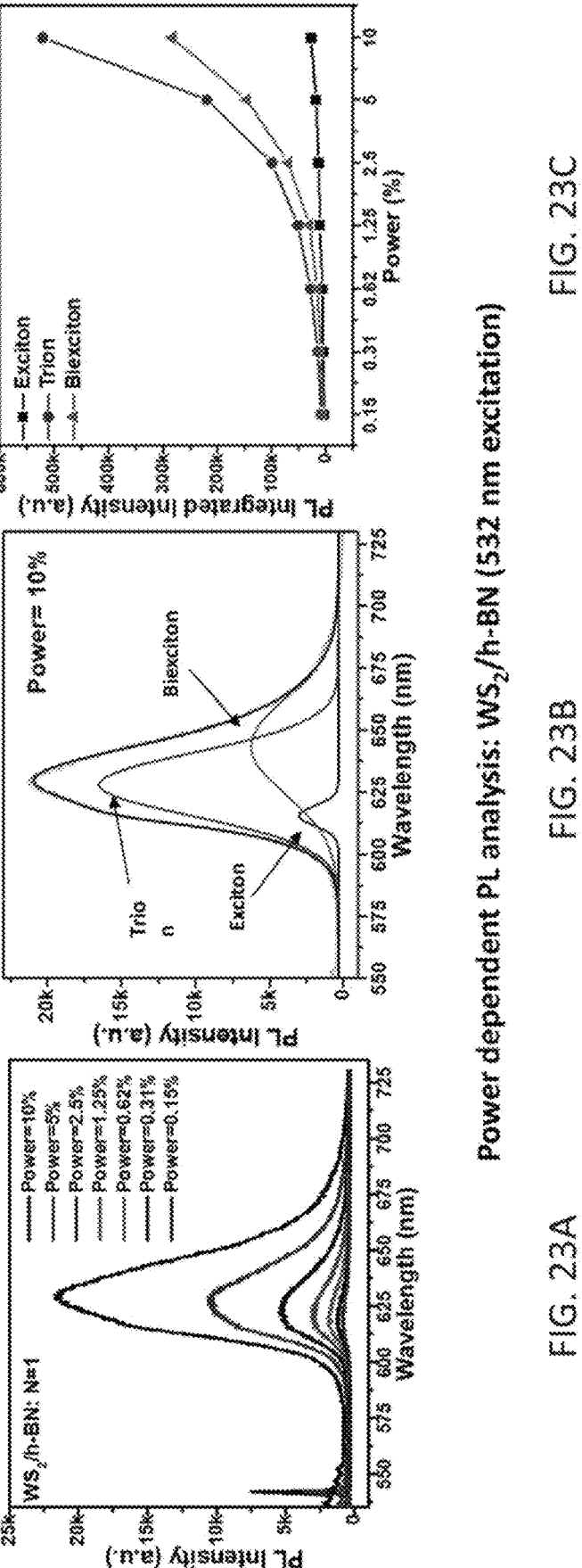
FIG. 23: (a) The power dependent PL spectra for the $WS_2$/h-BN N=1 superlattice. (b) The highest power PL spectrum for $WS_2$/h-BN decomposed into its constituent peaks using a series of Lorentzian fits. (c) The intensities of the constituent PL excitonic peaks and their dependence on laser power.

At high powers, emission from various higher order and charged excitonic species are observed. Individual excitonic components (neutral exciton, trion, dark exciton, biexciton, defect bound exciton, or localized state exciton) can be identified by analyzing the power-dependent PL emission of the $WS_2/h$-BN superlattice (N=5) and decomposing the spectra into individual Lorentzian peaks (FIG. 3 c, d and FIG. 22). A notable observation in a power-dependent PL analysis is the sharp rise in emission contribution from biexcitons with increasing power. Biexcitons consist of two-electrons and two-holes and are known to recombine by either decomposing into two excitons or emitting two photons in sequence or by creating a pair of entangled photons.

Figures 28A, 28B:
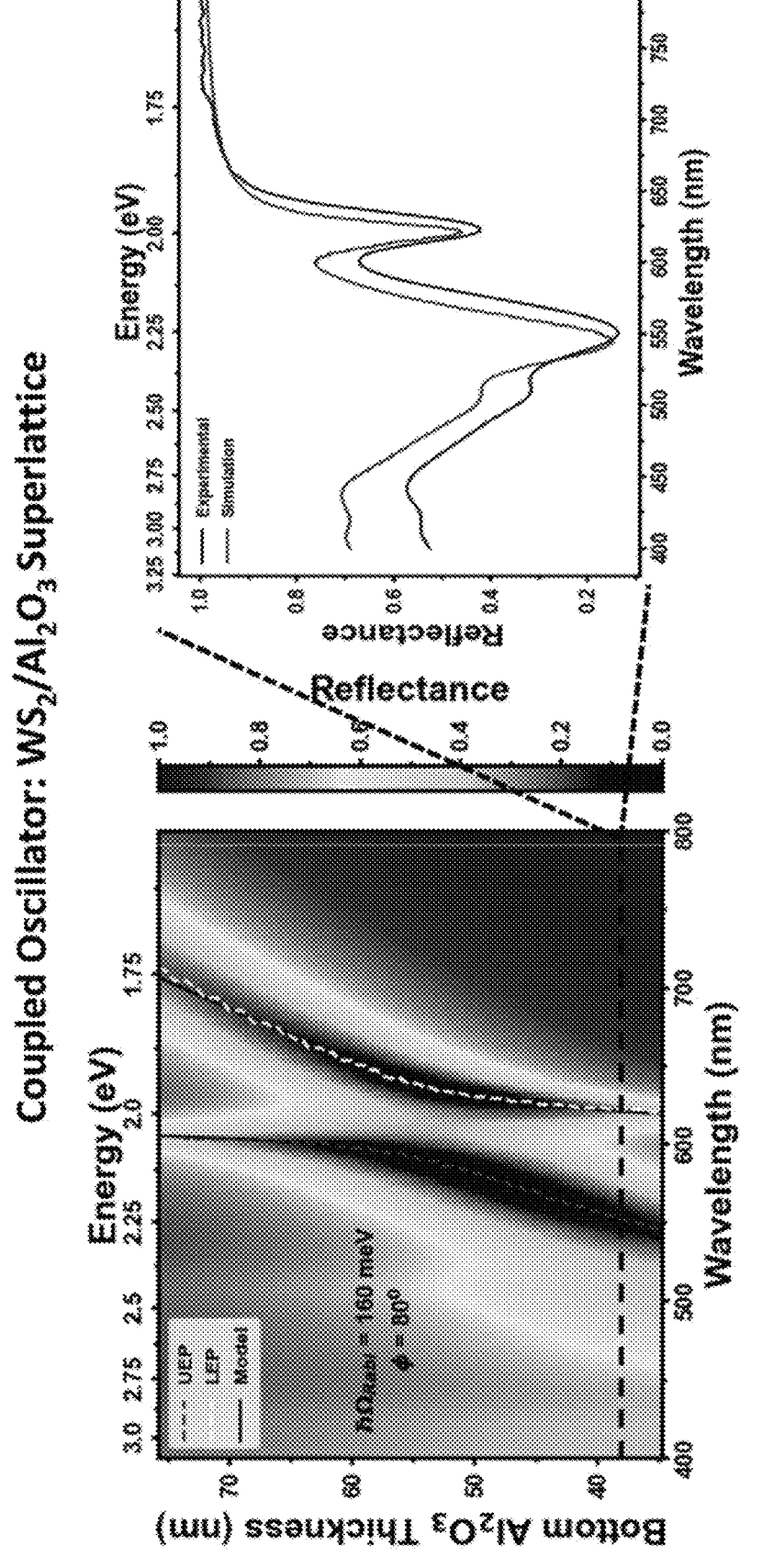
FIG. 28: Depicts the coupled-oscillator model used on the $WS_2$ based superlattices. (a) Shows the simulated anti-crossing behavior of the $WS_2$/$Al_2O_3$N=4. (b) Compared the simulated and experiment reflectance spectra of the $WS_2$/$Al_2O_3$N=4 superlattice with a bottom alumina thickness of 34 nm.
Figures 29A, 29B, 29C:
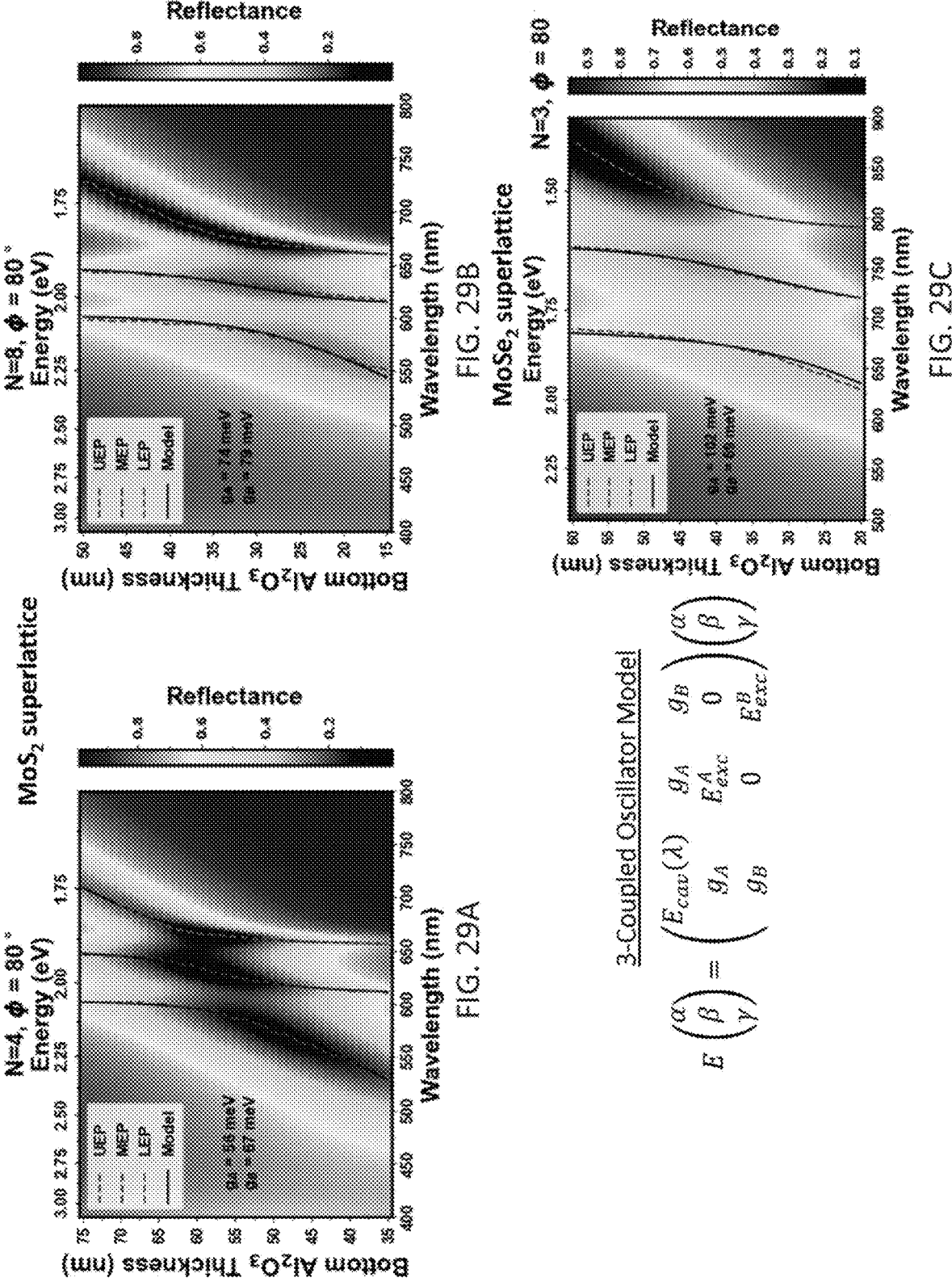
FIG. 29: The three-coupled oscillator model used for $MoS_2$/$Al_2O_3$ superlattices. The simulated strong coupling behavior for $MoS_2$/$Al_2O_3$ superlattices with (a) N=4 and (b) N=8 unit cells. (c) Similar three coupled oscillator used in case of $MoSe_2$/$Al_2O_3$ superlattice with N=3.

Biexcitons tend to form at high excitation levels. According to various examples, the high excitation not only occurs due to increased incident power but also due to enhanced light trapping (□2×). Such cavity-induced enhancement of biexcitons have been reported earlier in perovskite quantum dots and $MoSe_2$ layers. The N=1 case (single monolayer) does not show a similar power dependence (see FIG. 28), further suggesting the that light trapping causes the enhanced excitation in multilayers. Along with increasing biexciton emission, luminescence contributions from defect bound and localized state excitons also appear to increase in the N=5 superlattice. This can again be attributed to defect accumulation during the repeated transfers and thermal cycles of ALD with each increasing N of the superlattice. However, the overall relation between emission intensity vs. excitation stays linear at both room and low temperatures (80 K) within the range of excitation powers probed, thereby suggesting an absence of any non-linear phenomena in this range. While significant enhancement of emission peak intensity and full width half maxima (FWHM) sharpening of the emission spectra (FIG. 24) were observed, there are no obvious signatures of new states or presence of non-linear phenomena.

Figure 3E:
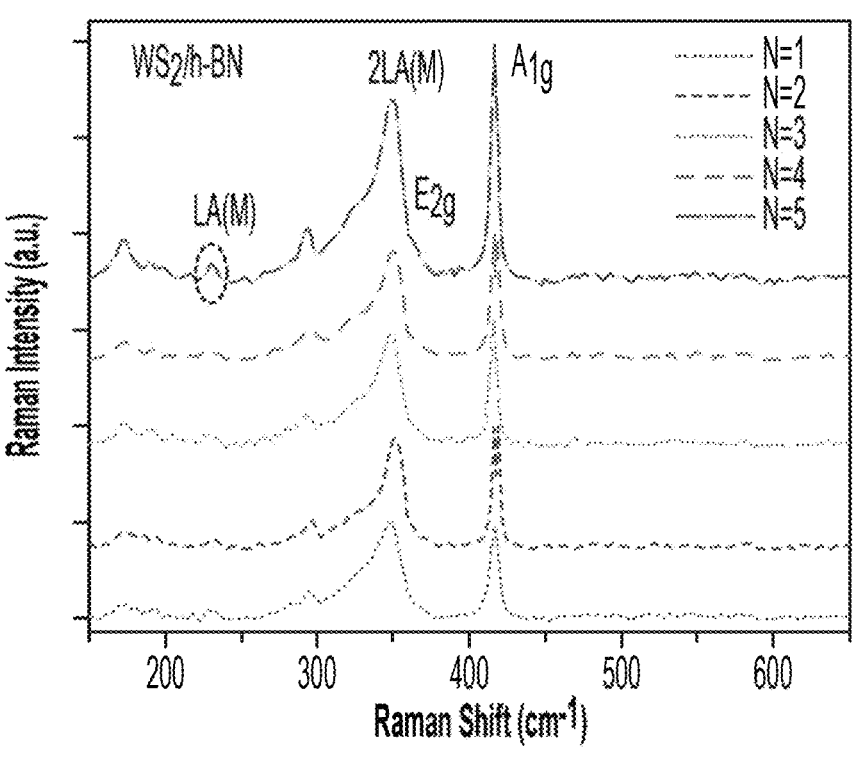
Figure 3F:
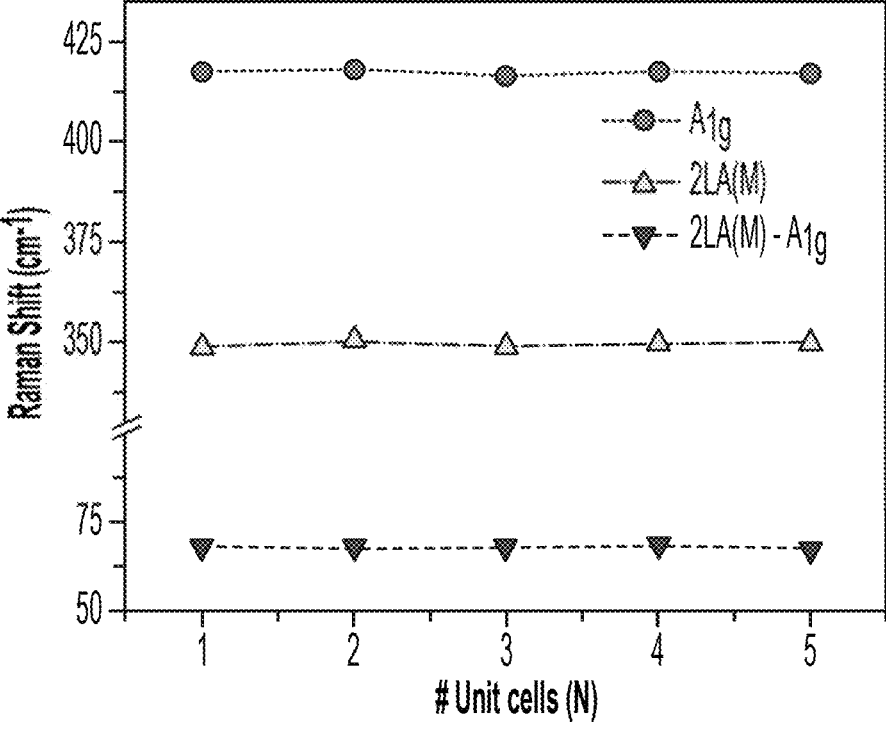

In addition to PL, Raman spectra provide a strong signature of interlayer interactions and hybridization (or lack thereof). Specifically, the out-of-plane vibration mode ($A_{1g}$: 418 $cm^{-1}$) stiffens with increasing number of layers and therefore the separation between 2LA(M) and $A_{1g}$ modes reduces with increasing layer thickness[33]. No noticeable peak shifts in the Raman spectra of $WS_2$ were observed in the superlattices with increasing N. Once again this suggests no interaction between layers and no detectable strain within the layers. The only noticeable difference with increasing N is the rising peak intensity and narrowing FWHM of the peaks (FIG. 3e). This is likely due to increased Raman scattering signal due to strong interaction of the medium with pump laser, again caused by the light trapping geometry in addition to the increased total volume of $WS_2$. In addition, a defect-bound Raman mode (LA(M): 176 $cm^{-1}$) was observed, appearing for the N=5 structure of the $WS_2/h$-BN superlattice (FIG. 3e). This is likely due to increased defect accumulation as the number of layer transfers and thermal cycles of ALD increases. Despite this, the characteristic Raman modes, such as 2LA(M) and $A_{1g}$, maintain constant positions and separations as a function of N, as plotted in FIG. 3f.

Figures 4A, 4B:
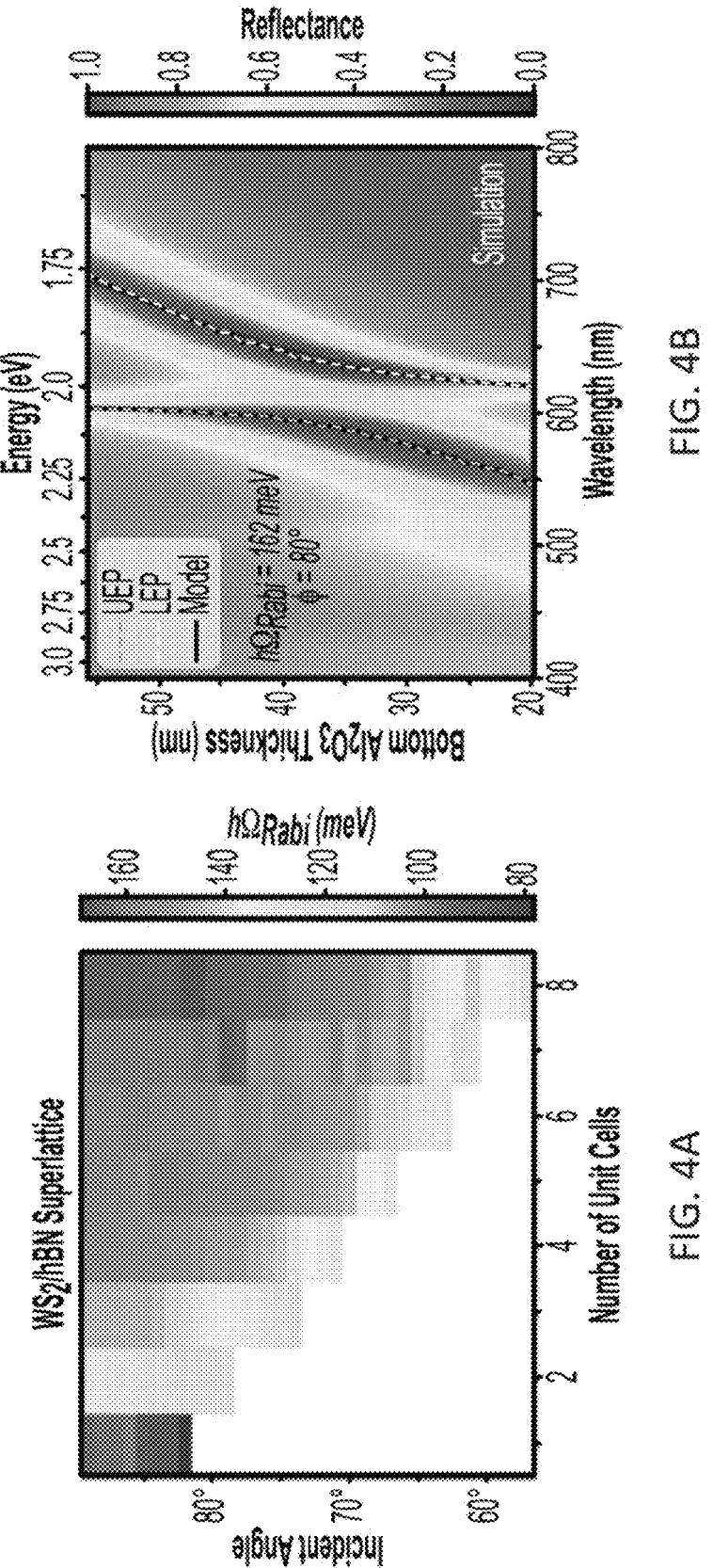
FIG. 4: Observation of exciton-polaritons in un-patterned multilayer superlattices. (a) The simulated Rabi splitting dependence on the incident angle and number of unit cells (b) shows reflectance spectrum dependence on the bottom alumina layer thickness at an incident angle of 80°, which shows the characteristic anti-crossing behaviour of exciton-polaritons. (c-d) The experimental and simulated reflectance spectra, respectively, plotted in 3D colour graph for various angles of incidence of transverse electric (TE) polarized light. The upper (UEP) and lower (LEP) exciton-polariton peaks are indicated with dashed lines. Similarly, (e-f) Experimental and simulated reflectance spectra, respectively, for various angles of incidence of transverse electric (TE) polarized light showing the exciton-polariton splitting starting at an angle of 60°.
Figures 4C, 4D:
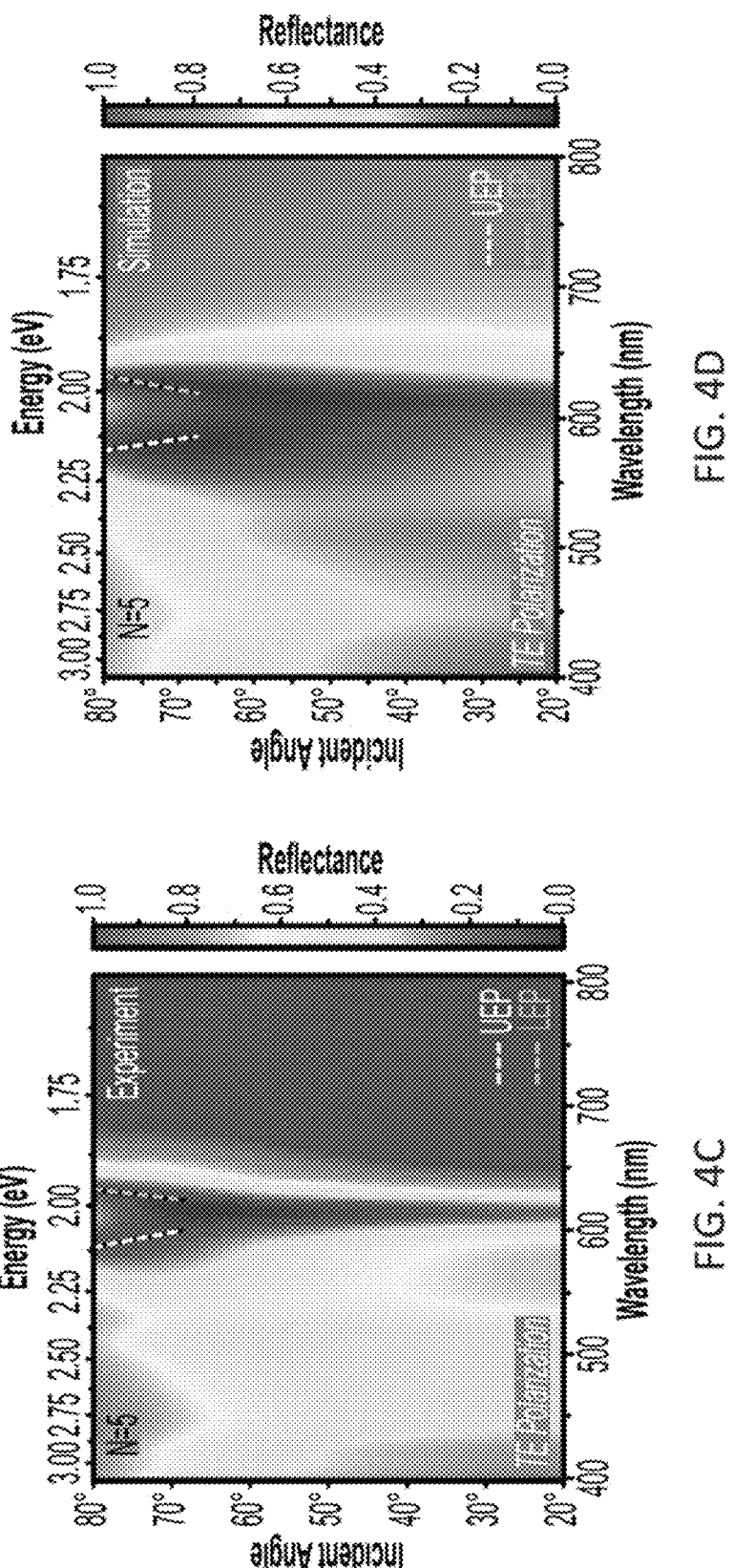
Figure 4E:
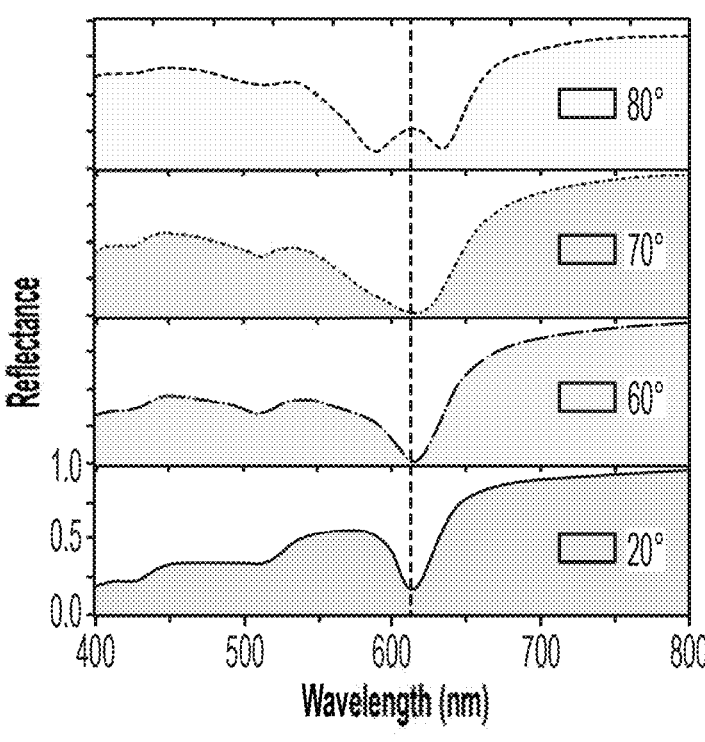
Figure 4F:
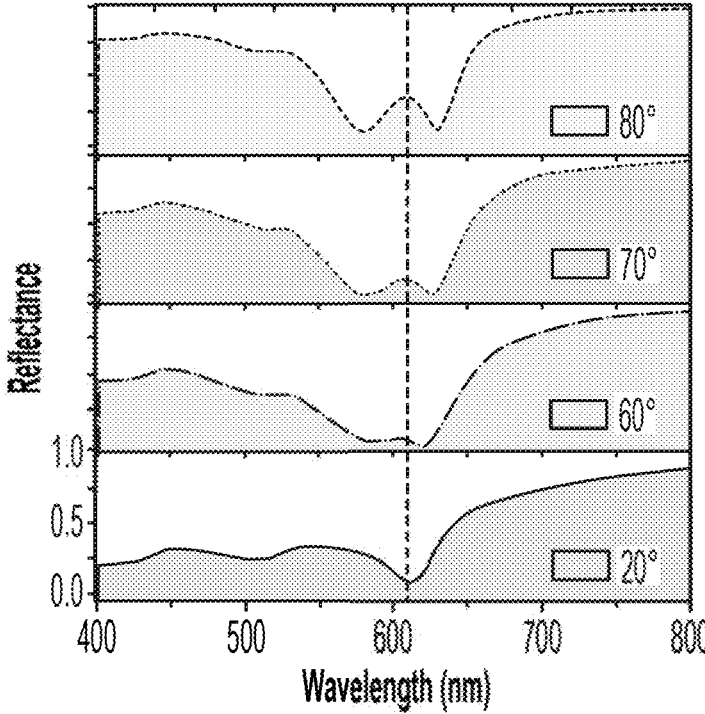

Thus far, the present discussion concerning the light trapping and optical properties of these multilayer superlattices has been focused on normal incidence illumination. Various examples explore angle dependent coupling of light into this multilayer superlattice structure. Standard TMM simulations show that the excitons in the superlattice hybridize with cavity modes to form exciton-polaritons, with their Rabi splitting energy depending on the incident angle and number of unit cells (FIG. 4a). With a fixed number of unit cells and angle of incidence, a characteristic anti-crossing behavior, signifying exciton coupling with cavity photons to form polaritons, can also be seen when the cavity resonance is tuned by varying bottom alumina layer thickness.

A coupled oscillator model was used to fit to the simulation data and calculate the Rabi splitting of the system. The analytical model was based on the Jaynes-Cummings Model Hamiltonian is in good agreement with the simulated UEP and LEP energies (see FIGS. 25-31). The Rabi splitting can be increased to 186 meV for a stack of N=8 at >80° incident angles. The Rabi splitting can also be achieved at lower incident angles as the number of unit cells is increased, due to a sharpening in the cavity mode peak, which indicates a lower mode volume, $V_m$ (based on the pathlength of the light inside the superlattice for N layers).

The lower mode volume for increased unit cells also results in higher Rabi splitting since the Rabi splitting is inversely proportional to the $V_m$. The increased Rabi splitting with increased incident angles is due to sharpening in the cavity mode peak, which can be observed in the increased Q-factor (FIG. 30). This model is further generalizable to a wide range of quantum well and spacer materials systems with appropriate parameters. This Rabi splitting is also observed in superlattice samples and matches well with the simulations (FIG. 4c-f and FIG. 32, 33). Furthermore, this splitting appears only under TE polarized light (FIG. 4 c-d) and not under TM polarized illumination (see FIG. 26). This is because various studies investigated stacks that were too thin to support the $TM_0$ mode. The emergence of the cavity mode at slightly higher incident angles in experiments (FIG. 4e), when compared to the simulated values (FIG. 4f) can be attributed to the presence of polymer and other contamination between the layers, which reduces the quality of the cavity. As the reflection spectra are acquired away from normal incidence the exciton mode stays unperturbed up until an incident angle of 50° in the simulation. Thereafter, the cavity-induced splitting of the exciton mode emerges with increased incident angles.

Figure 5B:
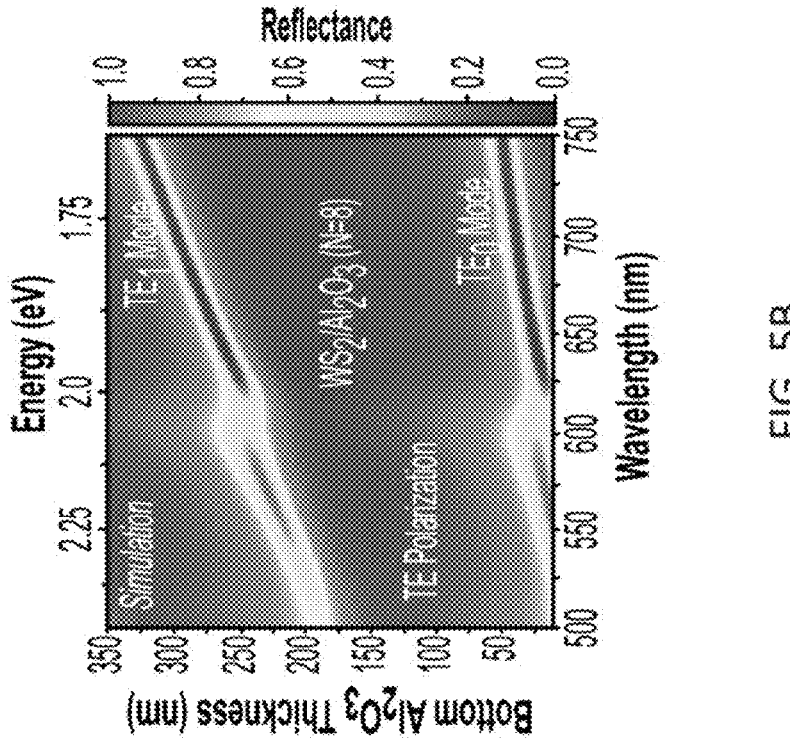
FIG. 5: (a) Electric field profile of the $TE_0$ mode when the bottom alumina thickness is 22 nm (k=642 nm) where the blue line indicates the $WS_2/Al_2O_3$ region while the red line indicates the air and Au regions. (b) Reflectance dependence on the bottom alumina thickness and wavelength in a $WS_2/Al_2O_3$: N=8 stack with the $TE_0$ and $TE_1$ modes labelled. (c) Time-averaged Poynting vector distribution of the $WS_2/Al_2O_3$: N=8 at the LEP wavelength (642 nm) showing that the energy of the incident light is concentrated within the absorbing $WS_2$ layers (d) Experimental reflectance spectra at 80° and 20° incidence under TE polarized light for the $WS_2/Al_2O_3$: N=8 stack.
Figure 5A:
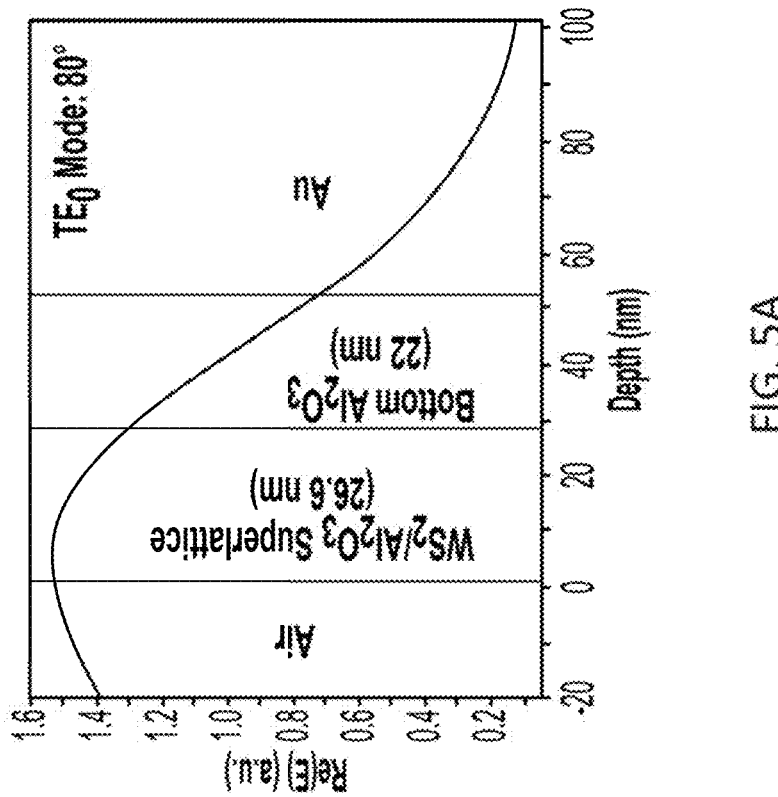
Figures 5C, 5D:
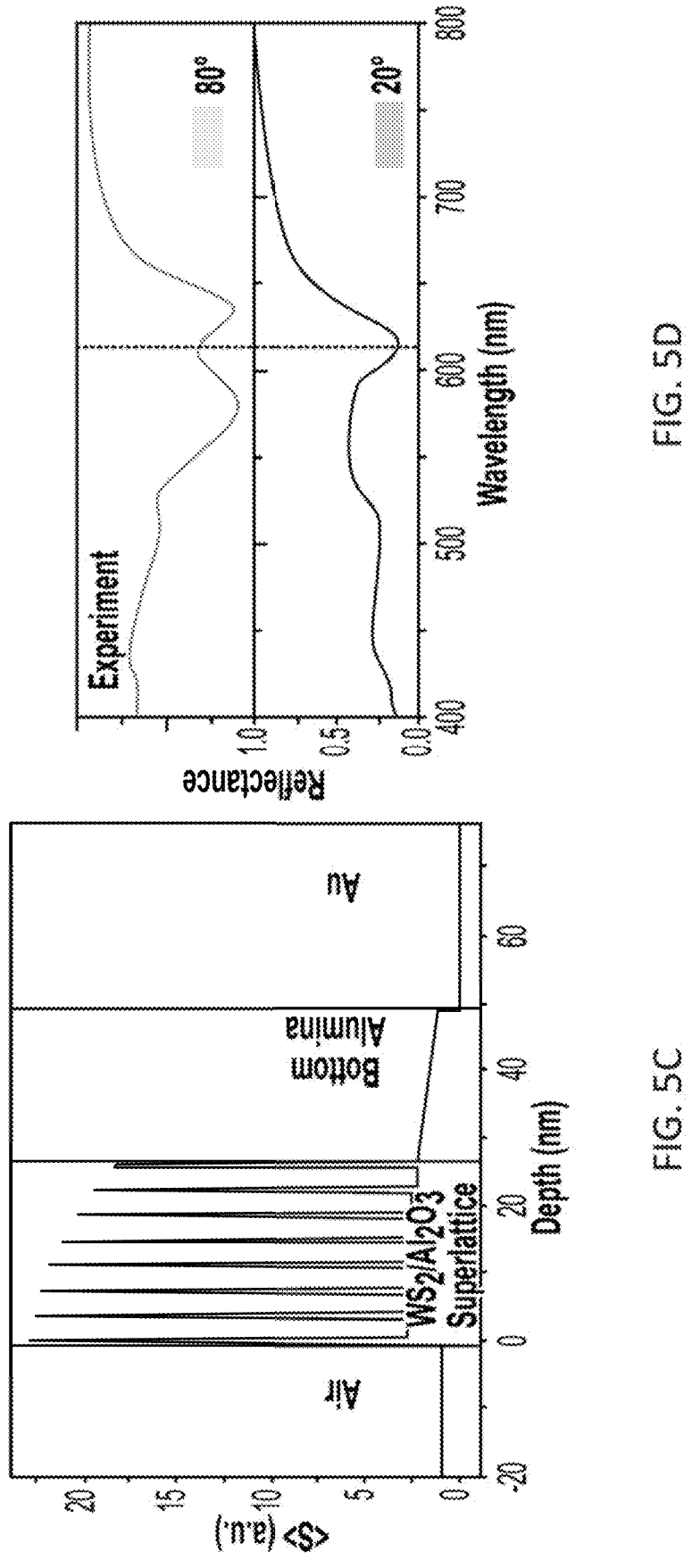
Figures 6A, 6B, 6C, 6D, 6E, 6F:
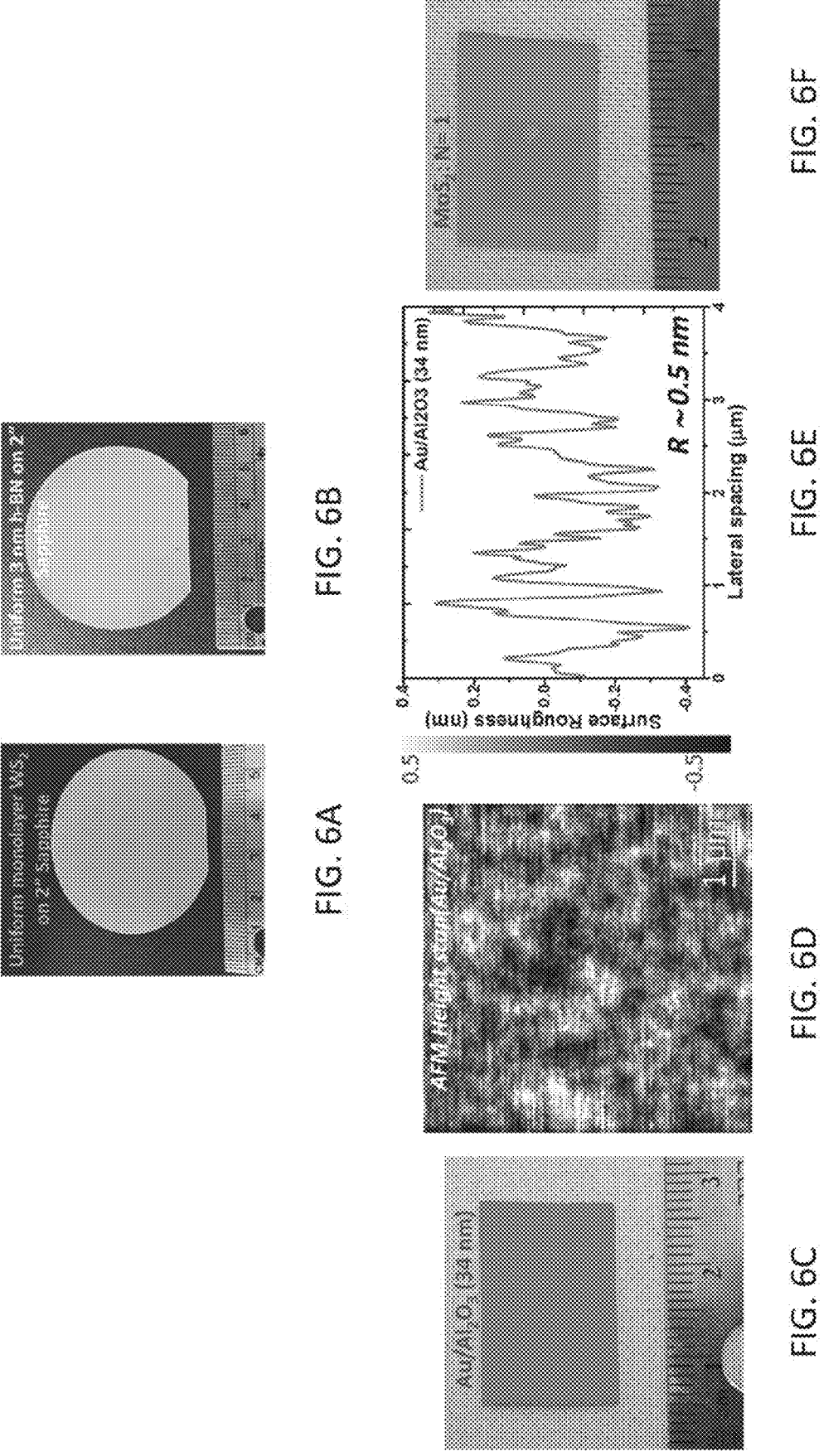
FIG. 6: Camera clicked optical images of the 2" wafers of (a) monolayer $WS_2$ and (b) 3 nm thick h-BN. (c) Picture of 34 nm of atomic layer deposited $Al_2O_3$ on top of e-beam evaporated Au. (d) The atomic force microscopic (AFM) height image of the $Al_2O_3$/Au substrate and corresponding (e) Surface profile with measured surface roughness of ~0.5 nm. (e) Picture of monolayer $MoS_2$ transferred on to $Al_2O_3$/Au surface.
Figure 7:
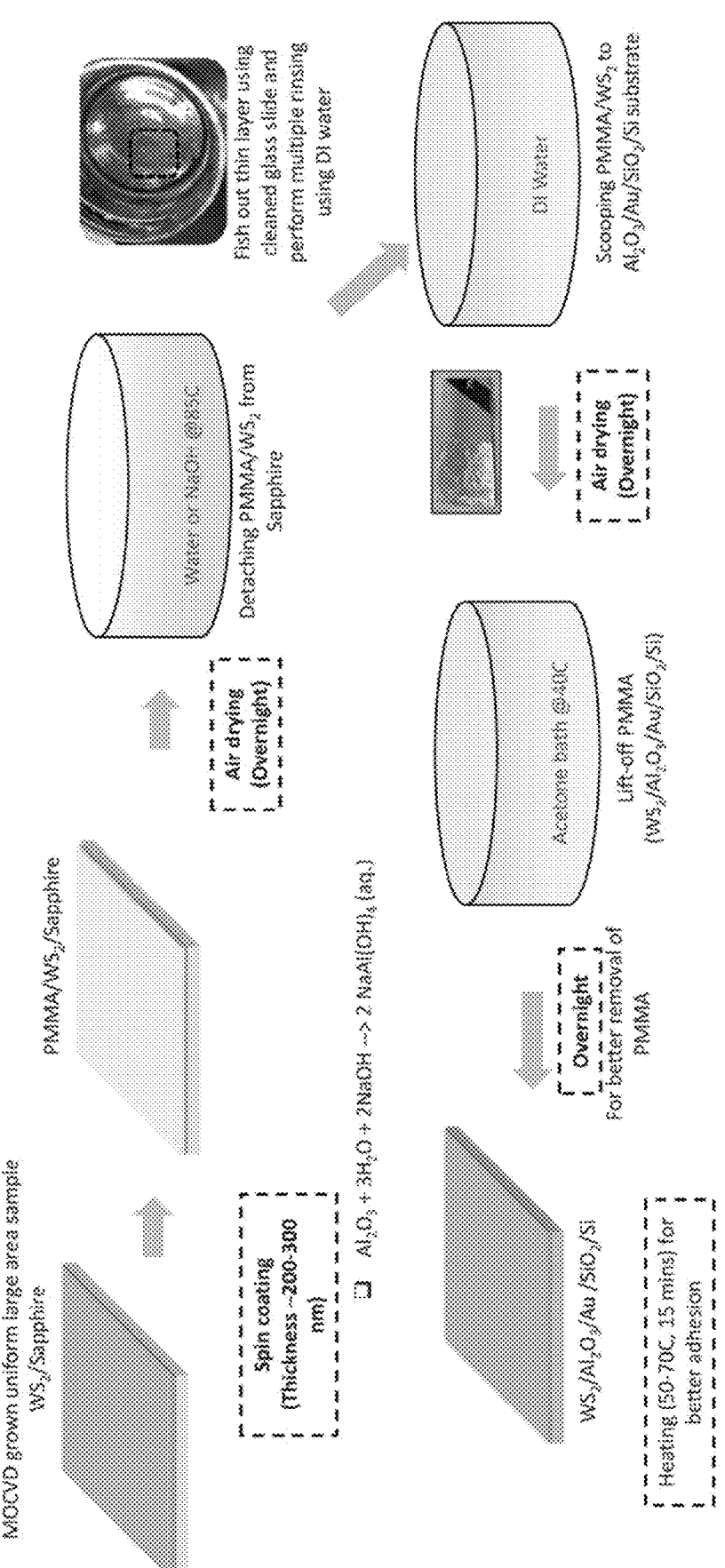
FIG. 7: Wet chemical transfer technique shown with sequential steps needed with the appropriate time accounted for best result. Monolayer $WS_2$ as grown on c-plane sapphire substrate by MOCVD has been shown to transfer to new substrate ($Al_2O_3$/Au/$SiO_2$/Si).
Figures 9A, 9B, 9C, 9D, 9E, 9F, 9G:
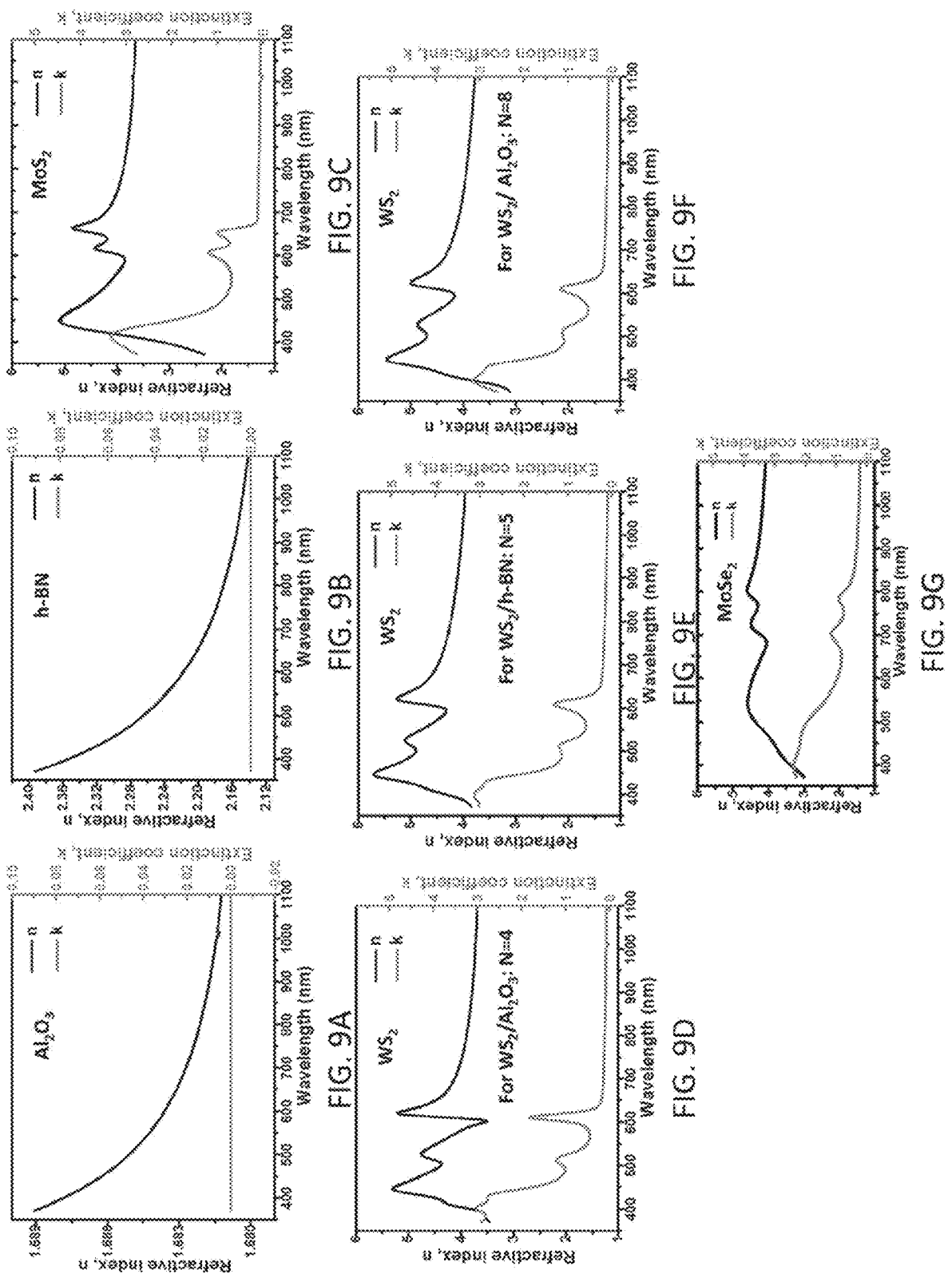
FIG. 9: The measured complex refractive index of (a) $Al_2O_3$, (b) h-BN, (c) $MoS_2$, (d-f) $WS_2$ and (g) $MoSe_2$. All were obtained using angle-resolved ellipsometry on single side polished sapphire substrates. Samples that were grown on double side polished substrates were transferred on single side polished sapphire substrates before ellipsometry measurements and analysis. $Al_2O_3$ and h-BN were fitted using a Cauchy model, and $WS_2$ and $MoS_2$ were fitted using a series of Tauc-Lorentz oscillators.

The effects of contamination can be overcome experimentally by increasing the number of unit cells in the superlattice as shown in the $WS_2$—$Al_2O_3$: N=8 stack where the cavity mode appears at only slightly larger angles than predicted by the simulations (FIG. 5 and FIG. 39). The electric field profile in FIG. 5a shows that the cavity mode emerges as the $TE_0$ mode is excited within the stack (FIG. 5b). As the TMDC layers are located near the electric field maximum, and TMDCs have relatively large permittivity, the majority of the energy of the electric field is localized in the TMDC layers (FIG. 5c) allowing for near-unity absorptance to occur at large angles (FIG. 5d).

Finally, the Q factors of these polariton modes were quantified by fitting the absorptance peaks to a Lorentzian line shape and was found to follow similar trends to incident angle and number of unit cells as the Rabi splitting. TMM simulations show that the Q-factor of 100 nm thick N=5 $WS_2/Al_2O_3$ superlattices can reach 40 at a moderate incident angle of 70° at room temperature (see FIG. 38). However, the Q factor can be further increased compared to this un-patterned case by either hBN encapsulation as discussed previously or by patterning high-Q structures into the stack. The observation of high Q factors in multilayer films over square centimetre length scales is potentially valuable for colorimetric sensing applications.

Conclusions:

In summary, various aspects have demonstrated a square centimetre scale, multilayer superlattice structure based on atomically-thin 2D chalcogenide monolayers acting as excitonic quantum wells. The structure of the superlattice was deterministically designed to maximize light trapping at the exciton (appx. 90%) in <4 nm thickness of active layer absorber. These superlattices not only maintain a monolayer structure but also support exciton-polaritons at room temperature, with Rabi splitting of up to 170 meV. Results show optical dispersion engineering using atomically thin layers over scalable and arbitrary substrates with broad applications ranging from lasing, sensing as well as optical-modulation and non-linear photonic devices and provide a platform for substrate-agnostic, integrated nanophotonics.

Experimental Details:

Materials and Method: Uniform and wafer scale TMDCs (monolayer $WS_2$ and $MoS_2$) were grown on c-plane sapphire substrates by MOCVD. Details of the monolayer $WS_2$ and $MoS_2$ used for $WS_2/Al_2O_3$ and $MoS_2/Al_2O_3$ superlattice samples have been published earlier. The monolayer $WS_2$ and h-BN (3 nm thick) samples for $WS_2$/h-BN: N=5 & $WS_2/Al_2O_3$: N=8 superlattices were grown by Aixtron Ltd. (UK) using a Close Coupled Showerhead® metal organic chemical vapor deposition (MOCVD) reactor using tungsten hexacarbonyl and ditertiarybutylsulfide, and CVD reactor using borazine respectively. Atomic layer deposition (ALD) of $Al_2O_3$ layer was performed with Cambridge Nanotech (USA) where metal organic precursor of TMA was used with water vapor in each cycle. PVD of Au/Ti (100/10 nm) films were done with the e-beam evaporation technique utilizing an instrument manufactured by K. J. Lasker, USA. Mechanically exfoliated samples were prepared using the scotch tape method and placed onto reflective substrates with the help of PDMS stamp using a dry transfer technique. Bulk $WS_2$ crystal purchased from hq-Graphene (Netherlands) was used for the exfoliation of the few layered sample. Wafer-scale few-layer $MoSe_2$ thin films were synthesized by first sputtering of Molybdenum (Mo) via an asymmetric bi-polar pulsed direct current magnetron sputtering system at 65 KHz (0.4 sec reverse time) from a Mo target. A sputtering time of 4 seconds resulted in a uniform atomically smooth Mo film with thicknesses of 0.6 nm. Following the Mo deposition, the thin metal films were then transferred into a hot wall CVD reactor evacuated and purged with a flow of $H_2$. The films were heated to 650° C. under a flow of $N_2/H_2$ (95%:5%). After reaching 650° C., films were selenized under a flow of $H_2Se$ for 30 min then cooled to 400° C. before turning off the flow of $H_2Se$ and cooled to room temperature under $N_2/H_2$.

Characterization: The surface roughness of the $Au/Al_2O_3$ layer on the $Si/SiO_2$ substrates were analyzed with atomic force microscopy (AFM; AIST, USA). As received MOCVD grown monolayer TMDCs as well as 3 nm thick h-BN samples were analyzed with Raman, photoluminescence (PL) and Reflectance spectroscopy, performed at integrated system available in Horiba Scientific Confocal Microscope (LabRAM HR Evolution). This instrument is equipped with an Olympus objective lens (up to 100×) and three different grating (100, 600 and 1800) based spectrometers, which are coupled to a Si focal plane array (FPA) detector. A continuous-wave excitation source with excitation wavelength at 405 nm and 633 nm was used to perform PL and Raman spectroscopy studies, respectively. 10% laser power of 405 nm wavelength corresponds to 22 micro Watt while utilizing 100× objective lens for power dependent study. Visible white light incident through the fibre probe was utilized for reflectance spectral analysis, using the Horiba Scientific confocal microscope. Temperature-dependent spectroscopic analysis was performed on the same Horiba instrument utilizing Linkam heating/cooling stage where temperature was precisely calibrated by the equilibration time. Spectral spectroscopic ellipsometry analysis of all the samples was performed using a J. A. Woollam Ellipsometer (Model: M-2000-detector spectral range of 371-1687 nm) to obtain optical constants. Similarly, multi-incidence, angle-dependent reflectance spectral behaviour was also analyzed with Spectroscopic Ellipsometry (SE). HAADF-STEM and EDS measurements were performed at 200 keV using an aberration-corrected JEOL NEOARM STEM. Images were captured by a Gatan annular detector using Gatan's GMS Software. While acquiring the images, the convergence angle was 25-29 mrad and condenser lens aperture was 40 μm. Cross-sectional samples were prepared with a $Ga^+$ based focused ion beam system (Helios G5 UX, Thermofisher). The lamella (length D 5 μm) was prepared by first coating the sample with a thin carbonaceous protection layer by utilizing a Sharpie marker, followed by Carbon e-beam and ion-beam deposition was used which were used to prevent damage and heating effects during FIB milling. At the final thinning and cleaning stage, a very low-energy $Ga^+$ ion beam (2 keV) was used to minimize the FIB-induced damage.

Theoretical Modelling:

A 2×2 transfer matrix method simulated the reflectance of the superlattice structure/heterostructures. The open-source TMM code was adopted and further developed in MATLAB™. The TMM was used to simulate the Rabi splitting, and a coupled oscillator model fit was performed to calculate the Rabi energy. The coupled oscillator models the system using a 2×2 Hamiltonian where the diagonal terms are the undisturbed microcavity and exciton energies while the off-diagonal terms are the Rabi energy and characterize the strength of the interaction between the excitonic and optical states. A three-body coupled oscillator model was used for $MoS_2$ and $MoSe_2$ (see FIG. 34).

Superlattice Fabrication Details:

Wet-chemical transfer and stacking of van der Waals TMDCs layers: The wet chemical transfer technique (see FIG. 12) was utilized throughout the stacking process of large area (~1×1 cm²) atomically thin TMDCs layers grown under MOCVD. As received wafer scale uniformly grown 2-dimensional monolayer of $MoS_2$, $WS_2$ and 3 nm thin h-BN on 2" sapphire (single side polished) was first cut into several pieces of dimension 1×1 cm2. Poly Methyl Metha Acrylate (PMMA) 950k A4 was used to spin coat on these 1×1 cm2 based TMDCs samples and kept in air to dry overnight to prepare for wet chemical delamination process of atomic thin layers. PMMA thin film was deposited with a controlled thickness of ~200 nm. PMMA coated samples were dipped in de-ionized (DI) water heated to 85° C. on a hot plate, for 20-30 minutes until air-bubbles began to form at the outer edges of the sapphire substrate. Following the formation of air bubbles, samples were taken out of the hot water and placed on the top of 3M KOH solution which was maintained at 85° C. Crucial delamination of PMMA-supported TMDC layers from sapphire substrate occurred at this step where sapphire substrate was held manually with 45° inclination and slowly dipped inside the KOH solution with extremely slow movement. This allowed the delamination of the PMMA-supported TMDCs layers which finally floated to the top of the KOH solution. Using a cleaned glass slide, the floating PMMA-supported TMDCs layers were transferred to the fresh DI water, and this step was repeated multiple times to remove any residual contamination from the delamination steps. Finally, floating PMMA supported TMDCs were scooped on desired Si substrate covered with Au ($Si/SiO_2/Au/Al_2O_3$) and left to air-dry overnight. The final lift-off process (to remove the PMMA film) was done with the help of acetone for 6 hours at moderate temperature (45° C.). To allow for better adhesion of the wet-chemical transferred TMDCs layers to their new substrate, they were heated for 1-2 hours at 70° C. on a hot plate. The processes described above for producing the multilayer stacks including precise manual alignment at each scooping step were followed for the synthetization of each heterostructure. Alumina-based superlattices were fabricated with additional steps of depositing a $Al_2O_3$ layer by ALD after each wet-chemical transfer of the TMDC layer. The topmost TMDCs layer in all superlattices were not coated with either $Al_2O_3$ or h-BN.

TMM Modeling and Genetic Algorithm Optimization:

Initial Transfer Matrix Method (TMM) modelling was carried out using a MATLAB script adapted to incorporate the repeating unit cell scheme. The standard script allows for the simulation of a multilayer superlattice in which the material, thickness, and relative order of each layer may be specified. Additionally, the script reads real and complex refractive index values for each properly referenced material from an external excel file. The script was converted to python and modified to allow for quicker simulations and angled incidence of both TE and TM polarized light.

A genetic-algorithm-based optimization was implemented with the figure of merit being the primary excitonic absorptance for $WS_2$-based superlattices and the average absorptance of the primary and secondary excitons for $MoS_2$ and $MoSe_2$-based superlattices. Holding all other inputs constant, inputs controlling the number of unit cells, the thickness of the unit cell spacers, and the thickness of the bottom spacer were allowed to vary in this optimization.

Figure 15B:
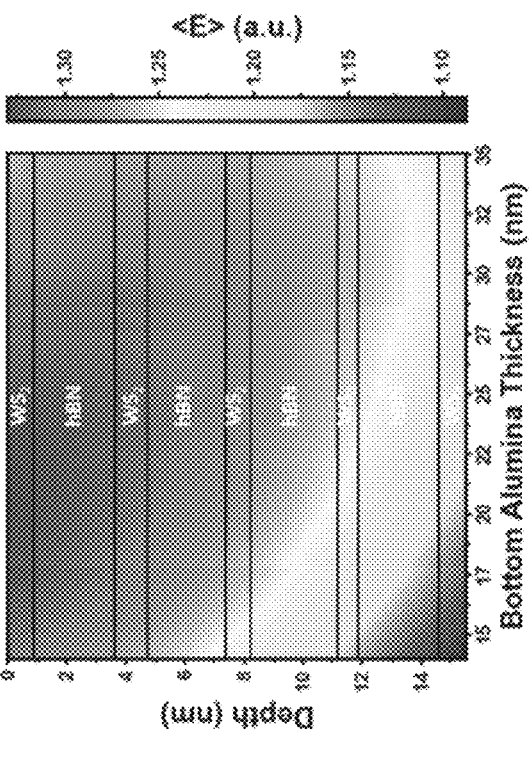
FIG. 15: (a) The bottom alumina thickness dependence of the excitonic absorptance in the $WS_2$/h-BN: N=5 structure. (b) The time averaged electric field profile within the super-lattice for varying bottom alumina thickness.
Figure 15A:
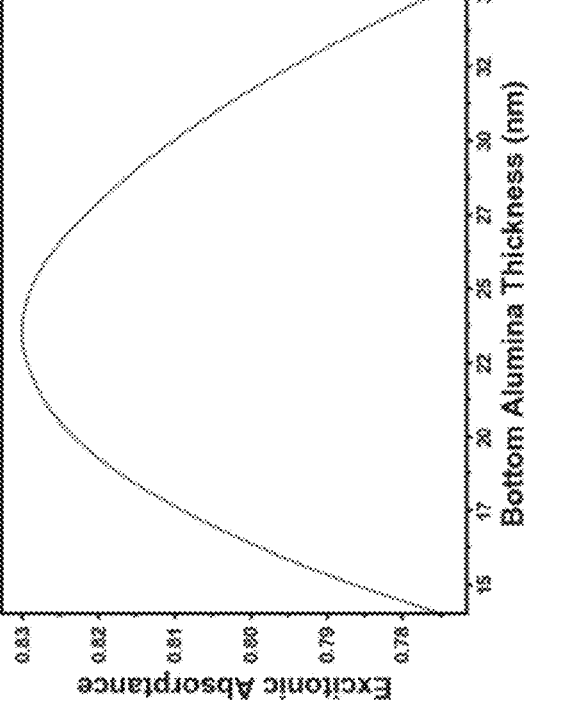
Figures 17A, 17B, 17C, 17D, 17E:
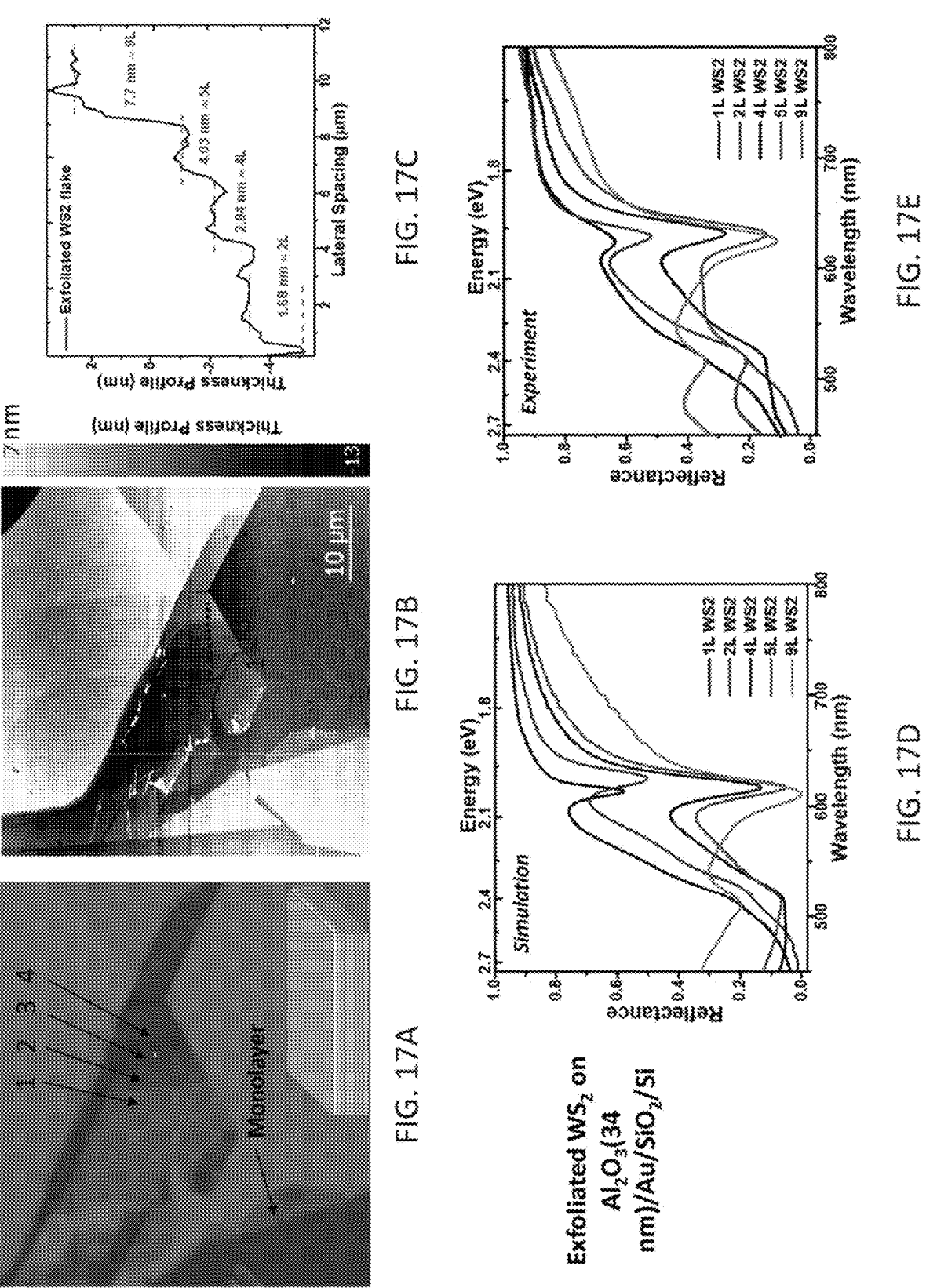
FIG. 17: (a) A microscopic image of the exfoliated $WS_2$ sample on $Al_2O_3$ (34 nm)/Au with the monolayer, bi-layer, 4-layer, 5-layer, and 9-layer regions labelled monolayer, 1, 2, 3, and 4, respectively. (b) AFM image of the same area shown in (a). (c) shows the thickness profile along the dashed line in (b). (d) is the simulated reflectance of the different regions using $WS_2$ complex refractive indices obtained from literature. (d) the experimental reflectance of the regions.

FIG. 15 shows the effects of the bottom alumina thickness on the excitonic absorptance at normal incidence. The $WS_2$/h-BN: N=5 structure is resistant to errors in thickness of the bottom alumina of ~2 nm which is larger than the thickness control achieved in a typical ALD tool. FIG. 15a shows that a drop in absorptance of just 1% occurs with ~2 nm change in bottom alumina thickness. The change in excitonic absorptance in the superlattice of a given N with bottom alumina thickness is caused by a change in the penetration depth of the electric field in the superlattice as shown in FIG. 15b. The electric field is the result of the interference of the incident downward propagating light, and the upward propagating light whose phase change is directly determined by the thickness of the bottom alumina layer. Therefore, for the $WS_2$/h-BN: N=5 device, a bottom alumina thickness of 24 nm maximizes the constructive interference evident from maximal E-field enhancement in $WS_2$ layers in FIG. 15b which maximizing the excitonic absorptance.

The Poynting vector distribution of the cavity modes in $WS_2$ and $MoS_2$ superlattices are shown in FIG. 27. The Poynting vector distribution was calculated using transfer matrix method simulations. Since both of the superlattices have similar refractive index profiles owing to them have the same geometries. $WS_2$ and $MoS_2$ having similar refractive indices at λ=721 nm (n=4.04 for $WS_2$ and n=4.09 for $MoS_2$), both superlattices have the same cavity mode energy (1.72 eV). The Poynting vector of both superlattices was found to concentrate in the TMDC layers indicating that the increased absorption is due to waveguide modes in the TMDCs.

Rabi Splitting Calculations and Material Characterization:

Various examples modelled the exciton-polaritons in $WS_2$-based superlattices using a coupled oscillator model which is based on the Jaynes-Cummings Model Hamiltonian. In this model, the Rabi splitting is found to depend on both the cavity and excitonic absorption properties as given by the equation:

$$\hbar\Omega_{Rabi} \propto \sqrt{\frac{Nf}{V_m}} \qquad (1)^{4-6}$$

where the total excitonic absorption is characterized by the product of the number of oscillators (N) and the oscillator strength (f), and the cavity is characterized by the mode volume. In Eq. 1 the addition of TMDC layers in the superlattice increase the Rabi splitting by the total absorptance which is directly proportional to N*f. The permittivity (ε) of TMDC samples is typically modelled as a series of Lorentzian oscillators:

$$\epsilon(E) = \epsilon_\infty + \sum_j \frac{f_j}{E_j^2 - E^2 - iE\gamma_j} \qquad (2)$$

Where $\varepsilon_\infty$ is the permittivity at infinite wavelength, the sum is over all the Lorentzian oscillators, and γ is the damping factor of the oscillator. When the energy of the incident light is on resonance with one of the Lorentz oscillators, the contribution to the permittivity of the resonant oscillator dominates compared to the other oscillators and $\varepsilon_\infty$:

$$\epsilon(E_x) \approx \frac{f}{E_x^2 - E_x^2 - iE_x\gamma_x} = -\frac{f}{iE_x\gamma_x} \qquad (3)$$

The imaginary part of the refractive index can be calculated from the permittivity by:

$$k(E) = \frac{|\epsilon(E)| - Re(\epsilon(E))}{2} \qquad (4)^{8,9}$$

Plugging Eq. 3 into Eq. 4 allows us to relate the oscillator strength to the imaginary part of the refractive index:

$$k = \sqrt{\frac{f}{2E_x \gamma_x}} \qquad (5)$$

Solving Eq. 5 for f yields:

$$f = 2E_x \gamma_x k^2 \qquad (6)$$

By plugging Eq. 6 into Eq. 1, and ignoring the dependence on $E_x$ and $\gamma_x$:

$$\hbar\Omega_{Rabi} \propto k\sqrt{\frac{N}{V_m}} \qquad (7)$$

The linear relation between the Rabi splitting and k has been observed previously.

The mode volume of a cavity quantifies the spatial confinement of the light, and therefore, it decreases with increasing refractive index. So, the ideal material would have a large refractive index (both real and imaginary) and a large carrier density. Table 6 shows these values for various semiconductors with band gaps in the visible and near infrared range that can be used to fabricate similar superlattice architectures to the present examples.

TABLE 6

The material parameters of various thin film semiconductors. The refractive index values at the primary excitonic wavelength

| Material | Primary Exciton Wavelength (nm) | n | k |
|---|---|---|---|
| Monolayer MoS$_2$ (Bulk) | 654 (670)[ref 12] | 4.85 (5.9)[ref 12] | 1 (1.4)[ref 12] |
| Monolayer WS$_2$ (Bulk) | 613 (640)[ref 13] | 5.2 (5.2)[ref 13] | 1.83 (1.3)[ref 13] |
| Monolayer MoSe$_2$ (Bulk) | 780 (795)[ref13] | 5.8 (5.25)[ref 13] | 0.85 (1.4)[ref 13] |
| Monolayer WSe$_2$ (Bulk) | 735 (770)[ref 13] | 5.1 (4.9)[ref 13] | 2.8 (1.3)[ref 13] |
| Ultrathin Film PtSe$_2$ (7.8 nm) | 805[ref 14] | 4.55[ref 14] | 1.87[ref 14] |
| CdSe | 570[ref 15] | 2.96[ref 15] | 0.42[ref 15] |

The other material consideration in various devices is the choice of insulating layers. The ideal insulating layer would have a low refractive index to maximize the light trapping within the TMDC layers, and a large band gap to minimize the coupling between adjacent TMDC layers. These values can be found in Table 7.

TABLE 7

The material parameters of various insulators.

| Material | n (700 nm) | Bandgap (eV) |
|---|---|---|
| Al$_2$O$_3$ | 1.68 | 7.0[ref 16] |
| h-BN | 2.19 | 4.02[ref 17] |
| TiO$_2$ | 2.11[ref 18] | 3.2[ref 19] |
| HfO$_2$ | 1.9[ref 20] | 5.3 |
| Si$_3$N$_4$ | 2.03[ref 21] | 5[ref 22] |
| SiO$_2$ | 1.45 | 10.5[ref 23] |

In the strong coupling regime, the Hamiltonian of the Jaynes-Cumming model can be represented as a 2×2 matrix:

$$H = \begin{pmatrix} E_x & g \\ g & E_c(t_{Al2O3}) \end{pmatrix} \qquad (7)$$

Where $E_x$ and $E_c$ are the uncoupled energies of the exciton and cavity modes, respectively, and g is the coupling parameter which is related to the Rabi splitting as $$g = \frac{\hbar\Omega_{Rabi}}{2}.$$

$E_c$ was determined to be linearly dependent on the thickness of the bottom alumina layer, $t_{Al2O3}$. Assuming the damping factor of the cavity mode is much larger than the damping factor of the exciton the splitting of the exciton-polaritons is in the strong coupling regime when $$g > \frac{\gamma_C}{4} \qquad 5$$

where $\gamma_C$ is the damping factor of the cavity mode which is related to the Q factor of the mode by $$Q = \frac{E_c}{\gamma_c}.$$

Figures 30A, 30B:
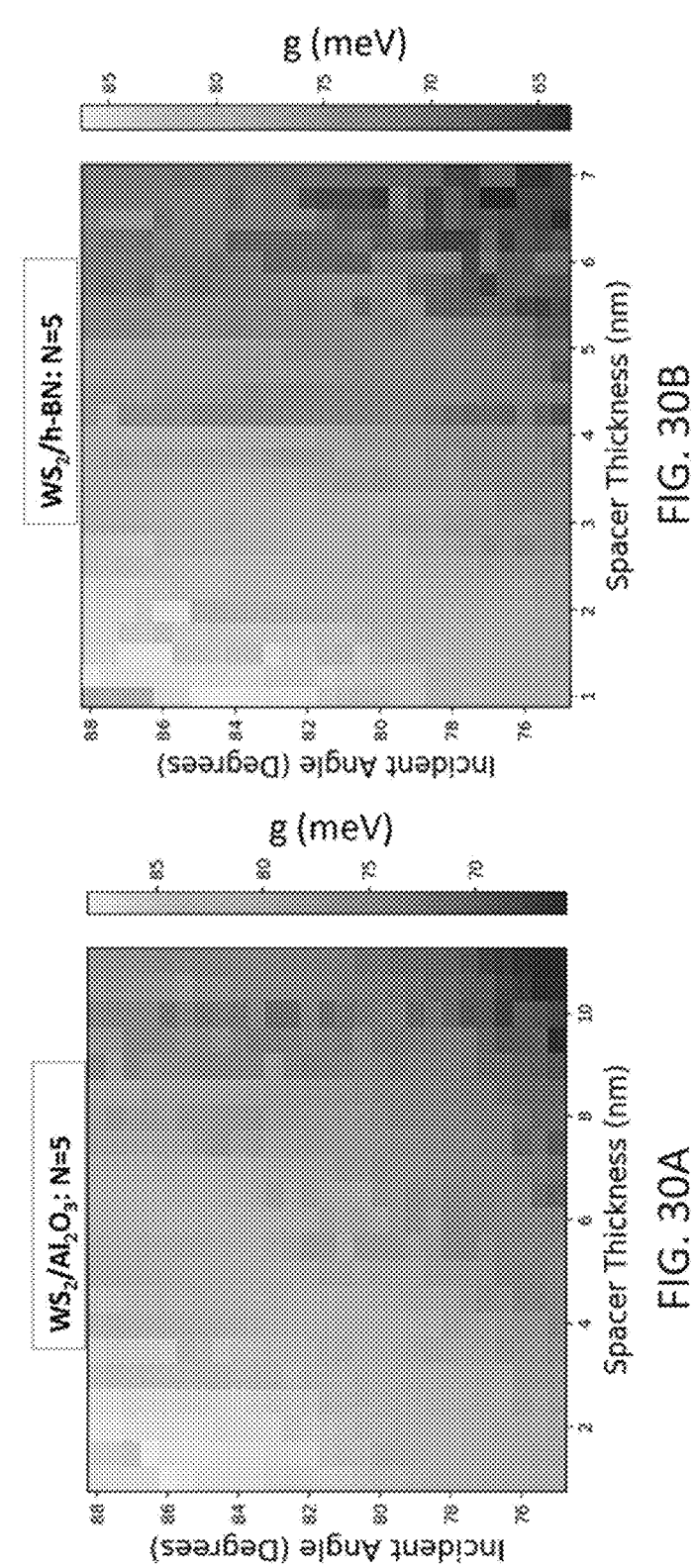
FIG. 30: The angle and spacer thickness dependence on the coupling coefficient $$\left( \frac{\hbar \Omega_{Rabi}}{2} = g \right)$$

It found that the superlattices were all in the strong coupling regime as the incident angle approached 90°, and strong coupling occurred at lower incident angles as N increased (see FIG. 30A).

The model was fitted to the simulated values using g and the linear dependence of the cavity mode on the bottom alumina thickness ($E_c = mt_{Al2O3} + b$) as the fit parameters and by using a least squares optimization method. FIG. 24A shows that the model and the simulated energies of the UEP and LEP agree.

The energy difference between the A and B excitons in MoS$_2$ is smaller than in WS$_2$ allowing the cavity mode to interact with the A and B excitons simultaneously in MoS$_2$. This is reflected in the model, using a three-coupled oscillator for MoS$_2$ where two of the oscillators are excitons while the third is the cavity. The Hamiltonian of this system can be written as $$H = \begin{pmatrix} E_A & 0 & g_A \\ 0 & E_B & g_B \\ g_A & g_B & E_C(t_{Al2O3}) \end{pmatrix} \tag{8}$$

Similar to the coupled oscillator model, the diagonal terms ($E_A$, $E_B$, and $E_c$) are the uncoupled energies of the A exciton, B exciton, and cavity mode, respectively, while the off-diagonal terms determine the coupling strength between oscillators. $g_A$ is the coupling parameter between the A exciton and the cavity mode while $g_B$ is the coupling parameter between the B exciton and the cavity mode. The 0 terms are due to the assumption that the A and B excitons do not couple with one another. This assumption was checked by allowing the terms to vary when fitting the model, but this approached gave the coupling between the excitons to be 5 orders of magnitude smaller than $g_A$ and $g_B$. The model was fitted to the simulated values using $g_A$, $g_B$, and the linear dependence of the cavity mode on the bottom alumina thickness as the fit parameters and a least square optimization approach.

FIG. 47 illustrates an example superlattice structure and corresponding phase versus wavelength data. As discussed herein, a superlattice structure can include a plurality of layers, e.g., N=2, 3, 4, etc. In an example configuration, a base layer can include Silicon. A second material, e.g., $SiO_2$, can be provided on the base layer, and provide a substrate for a superlattice structure in accordance with various aspects discussed herein. In some examples the second material, such as $SiO_2$, can range up to about 100 nm in thickness. One or more repeating units can be provided on the second material, and a top layer of about 20 nm in thickness can be provided on the superlattice section.

Compact electro-optic (EO) modulators with large extinction ratios, low-switching energies, and high operation speeds are desirable for integrated photonic and linear optical computing. Traditional 3D semiconductors and dielectrics are unsuitable for achieving such modulators due to the small magnitude of EO effects in them. Excitonic 2D semiconductors present a unique opportunity in this regard given their large and tunable optical constants near the excitonic resonances. However, strategies for confining and electrically tuning the excitons into compact EO modulators haven't been realized thus far. Here, examples provide an ultra-compact, plexcitonic (strongly-coupled exciton-plasmon) electro-absorption modulator (EAM) with a sub-micron linear footprint operating close to the excitonic peak of the $WS_2$ monolayer (641 nm) hybridized with the plasmon mode of a silver slot waveguide. Electrostatically injected free carriers in $WS_2$ modulate the light-matter interaction via Coulomb screening of the excitons as well as promoting the formation of charged excitons (trions). For various optimized designs, the EAM is expected to achieve a 9.1 dB extinction ratio, concurrently with a 7.6 dB insertion loss in a 400 nm lateral footprint operating with a predicted <3 fJ/bit switching energy at 15 GHz for 3-dB bandwidth modulation. Accordingly, such examples show the potential of plexcitonic quasi-particles for integrated optical modulators.

In the field of optical communications, electro-absorption modulators (EAMs) are a type of device used to transmit digital data in the non-return-to-zero on-off keying format. An ideal EAM for on-chip integration should have a large extinction ratio, low insertion loss, low switching energy, and a small footprint. While it is possible to adjust the extinction ratio (ER) and insertion loss (IL) by adjusting the length of the EAM, the ratio of attenuation coefficients between the "Off-state" and the "On-state" should be greater than 2 for high tunability and low-loss [1]. In order to be energy-efficient compared to electric interconnects, the switching energy of an EAM should be less than 1 pJ/bit [2]. However, traditional silicon-based EAMs have relatively large footprints due to weak electro-optical effects [3], resulting in high energy consumption and limiting their potential for integration. Researchers have focused on hybrid silicon or SiNx optical modulators with different active layers, such as quantum wells, quantum dots, graphene, indium tin oxide (ITO), and transition metal dichalcogenides (TMDs) [4], in an effort to shrink the devices to submicron lengths [5-12]. However, this approach still has resulted in micron modulation lengths since silicon waveguides do not support modes with extremely small cross-sections.

Therefore, in order to miniaturize EAMs, two things are critical: the adoption of novel, low-dimensional materials that support the submicron confinement of light [13-17] and the development of strategies for tuning these light-matter interactions [18]. TMDs such as tungsten disulfide, have highly tunable excitons and support the formation of polaritons that confine light on the nanometers scale, making them suitable for use in EAMs. Plasmonic waveguides, which utilize metals, can confine light at the interface between a metal and a dielectric [19], allowing for strong coupling between photons and free carriers in the metal and breaking the diffraction limit for light confinement. When plasmonic waveguides are coupled to an exciton, a plexciton is formed with the characteristically small mode volume of the plasmon and the tunability of the exciton. Various aspects simulate an ultra-compact, plexcitonic EAM utilizing the excitonic properties of a $WS_2$ monolayer structured into a multi-layer superlattice structure with alternating layers of $Al_2O_3$ dielectric [20] and the plasmon mode of an Ag slot waveguide to form and control a plexciton. By injecting free carriers into the $WS_2$ and modulating the coupling through dielectric screening of the excitons, charged excitons (trions) formation and enhanced Coulomb scattering [21,22], optimized designs can achieve a 9.1 dB extinction ratio, a 7.6 dB insertion loss, and a <2 fJ/bit switching energy at 15 GHz for 3-dB bandwidth modulation, all in a 400 nm linear footprint. Present embodiments demonstrate the potential of plexcitons for integrated optical modulators.

FIG. 48A shows the mechanism of a submicron-scale EAM. In an example design, a silver substrate is used to support surface plasmon polariton propagation mode in the visible range that are then coupled to excitons in the $WS_2$/$Al_2O_3$ superlattice placed top [23]. When the plasmons are engineered to have a similar energy to the exciton, the two states strongly couple to one another to create two distinct energy states where one state has an energy higher than the undisturbed exciton and plasmon and the other state has a lower energy. These two hybridized states are part-exciton and part-plasmon called plexcitons. Strong coupling occurs when energy is exchanged between the excitonic and plasmonic states faster than either quasiparticle decays which is expressed as [24,25]

$$g^2 \geq \frac{(\gamma_C - \gamma_X)^2}{16} \tag{9}$$

where g is the coupling parameter which describes the rate at which energy is exchanged between the exciton and plasmon and $\gamma C$ ($\gamma X$) is the linewidth of the plasmon (exciton). When the loss mechanisms become significant, equation (9) implies no energy splitting and the device goes into the weak coupling regime. The coupling parameter is proportional to the square root of the number of excitons and the oscillator strength over the mode volume, which is given by [24,25]

$$g \propto \sqrt{\frac{Nf}{V_m}} \tag{10}$$

where N is the number of excitons, f is the oscillator strength of the excitons, and Vm is the mode volume of the waveguide. When no bias voltage is applied, strongly coupled-plexcitons form and photons with energy near the exciton are forbidden from propagating, defining the "Off-state" of an EAM. When carriers are injected into the $WS_2/Al_2O_3$ superlattice, the carriers Coulomb screen the electrons and holes reducing the oscillator strength of the exciton. The injected carriers can also interact with the excitons to form trions that are red shifted from the exciton, and the trions are also coupled to the plasmon. Therefore, by injecting carriers into the $WS_2$, the system goes from a two-coupled oscillator system between the exciton and plasmon to a three-coupled oscillator system where the plasmon is coupled to both the exciton and trion, but the exciton and trion do not interact [26,27]. The plasmon can still hybridize with both the exciton and trion so long as it exchanges energy with these states faster than any of the states decay. However, the exciton and trion both have smaller oscillator strengths in number density than the exciton in the "Off-state" which reduces the coupling parameter in accordance with equation (10). Because of the reduced coupling parameter, the system enters the weak coupling regime, and the hybrid plexciton states no longer form. In this case, photons with energies close to the exciton energy can propagate through the waveguide, with some absorptive loss by the exciton and trion, defining the "On-state" of the EAM. The tuning of plexcitons creates an ultra-compact EAM operating near the excitonic wavelength of the $WS_2$ monolayer with high extinction ratio and low switching energy while maintaining a durable insertion loss. As the simplest single-interface plasmonic structure only supports TM mode, the slot-shaped structure shown in FIG. 48(c) increases the in-plane electric field component and thus increases the efficiency of the coupling between excitons and surface plasmon polaritons.

Figures 49A, 49B, 49C, 49D, 49E:
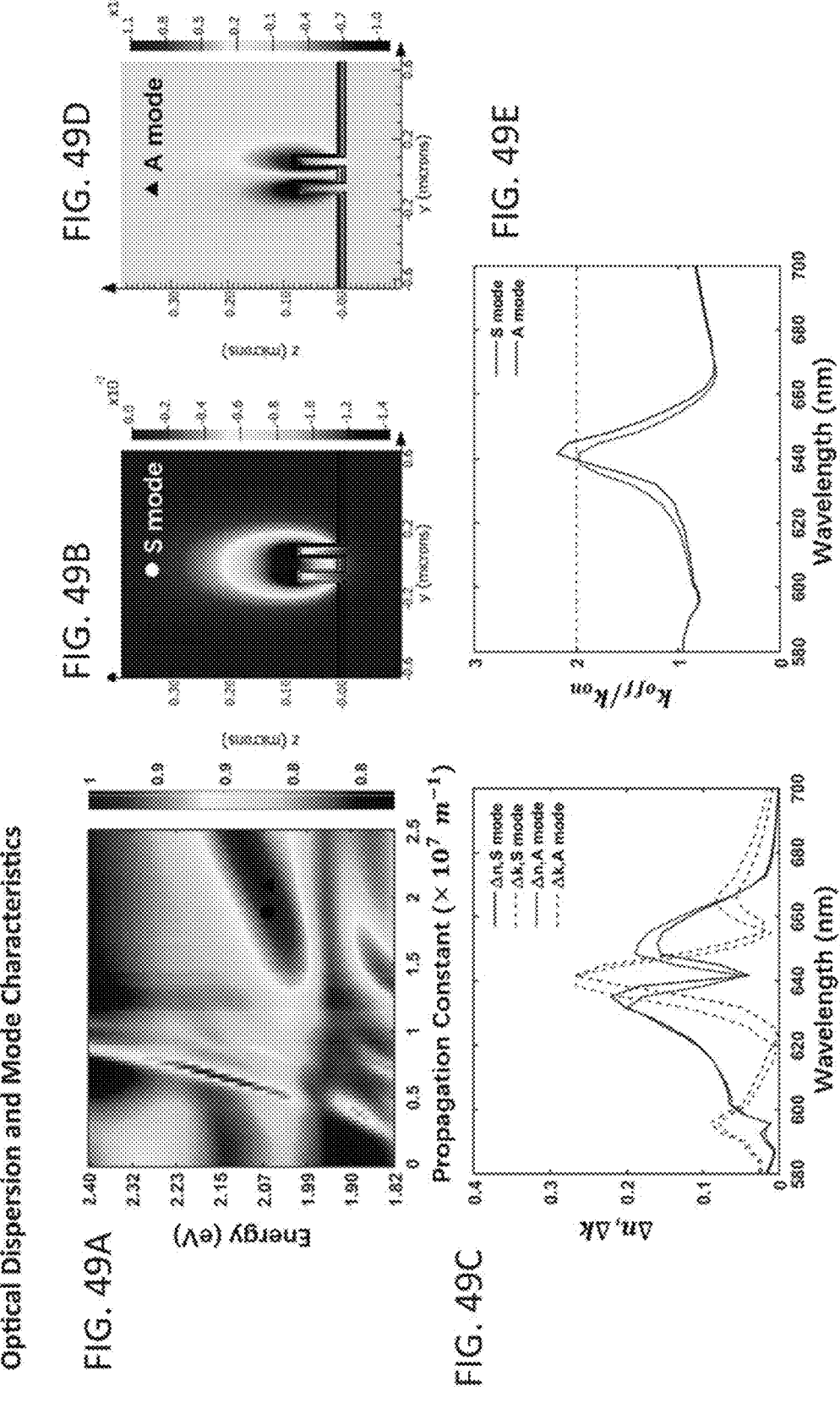

Lumerical MODE and Lumerical Finite-Difference Time-Domain (FDTD) simulations are used to analyze and optimize the optical characteristics of the EAM with a length of 400 nm, using the gate-tunable refractive index data from Ref. [21]. FIG. 2 compares two dominant SPP modes and their differences. FIG. 49(a) is generated by calculating spectrums for each propagation constant, representing the dispersion relations where a plasmonic mode (parabolic curve) can be seen with small propagation constants (<0.7) and a clear anti-crossing phenomenon around the excitonic peak at larger propagation constants (1.5 to 2) due to strong light-matter coupling. The broadening curve in the upper branch compared to the lower branch is due to background absorption of the WS2 monolayer above its bandgap, and the broadening curve of the SPP mode compared to the plasmonic mode is due to the overlap between two neighboring modes, as shown in FIG. 49(b). FIG. 2(b) shows the magnitude of the Ex electric field distribution (Ex points in the direction of SPP propagation). These modes are called the symmetric mode (S mode) and antisymmetric mode (A mode) due to their electric field distributions. Both modes show similar modulation when the refractive index is tuned as shown in FIG. 49(c). The maximum change in absorption occurs at 641 nm for both modes, which is defined as the operation wavelength of the modulator. FIG. 49(d), calculates the figure of merit proposed by Ref. [1], stating that a high-performance EAM should satisfy $$\frac{k_{off}}{k_{on}} > 2 \tag{11}$$

This criterion guarantees significant modulation while maintaining low insertion loss. In such devices, the figure of merit at the operation wavelength (641 nm) for the S mode meets the requirement of a qualified EAM. The S mode and A mode are independent with each other as they are the direct solutions of the eigenmode expansion method (EME). Therefore, the S mode is more suitable for operating the EAM than the A mode, and it should be individually excited in practice to maximize performance.

FIG. 50 continues to study the tunability of the S mode. When no voltage is applied to the structure, the plexciton dispersion relation calculated by the eigenmode expansion method (FIG. 50(a)) is consistent with the results obtained using the finite-difference time-domain method (FIG. 49(a)). FIG. 50(a) shows that the propagation constant reaches its minimum value exactly at the excitonic peak (636 nm), indicating that light cannot propagate through the EAM at this wavelength due the strong light-matter interactions. The system is in a weak coupling region with an applied voltage and will not cause an energy splitting since light can propagate more easily. As a result, the dispersion relation should resemble that of a pure surface plasmon polariton, shown as the red curve in FIG. 50(a). FIG. 50(b) also observes that the absorption peak (641 nm) of plexcitons is red-shifted compared to the excitonic peak of excitons in the $WS_2$ monolayer, which is the operating wavelength of the EAM for the best performance. The EAM operating at 641 nm has an insertion loss of 7.6 dB and an extinction ratio of 9.1 dB. Analyzing the electro-absorption properties of the EAM, can use formula [29]:

$$P_{abs} = -0.5\omega|E|^2 imag(\varepsilon) \tag{12}$$

where E is the electric field and e is the permittivity of the material. The results show that the majority of the optical absorption power comes from the $WS_2$ monolayers, with the remaining power absorbed by silver. This demonstrates the importance of strong coupling mechanisms in boosting the tunability of transition metal dichalcogenides (TMDs). Additionally, light is strongly confined at the four top corners of the slot-shaped waveguide at 641 nm and the intensity exponentially decreases along the propagation direction. These findings suggest that monolayers of other TMDs or ultrathin excitonic semiconductors could also lead to significant tunability due to the strong coupling between excitons and polaritons.

Electrical Switching Characteristics

Figures 51A, 51B, 51C, 51D:
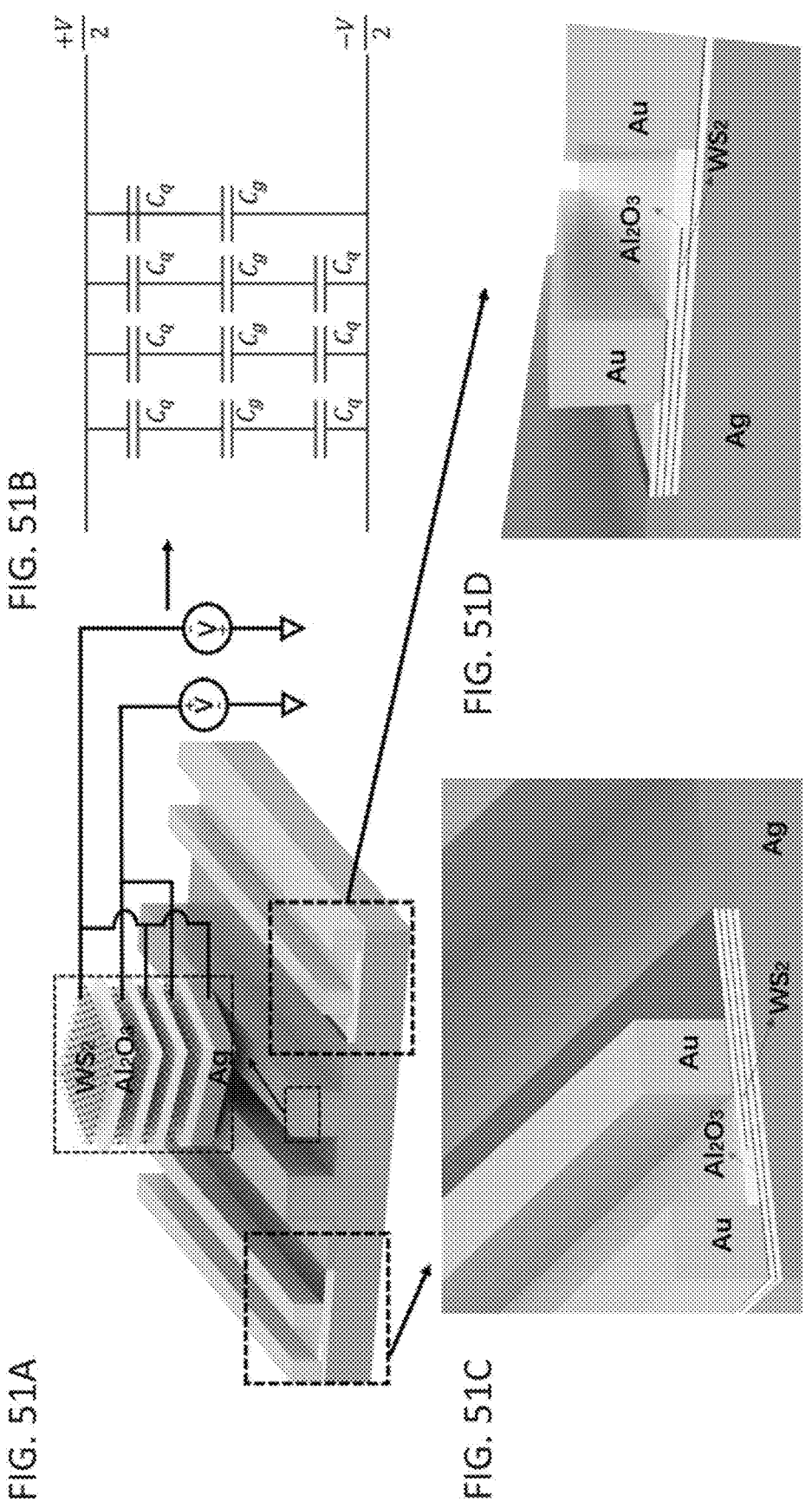

In order to evaluate the energy efficiency and bandwidth of the EAMs, two theoretical models were developed. FIG. 51(a) presents an interdigitated capacitor model for injecting carriers into $WS_2$ monolayers. The superlattice structure can be modeled as interdigitated capacitors with $Al_2O_3$ as the dielectric. Because each plate of the capacitor is made of the semiconductor rather than metal, the finite density of state in a $WS_2$ monolayer leads to an additional equivalent capacitor in series with a geometric capacitor, known as a quantum capacitor. The quantum capacitance of the $WS_2$ monolayer plate can be calculated using the following formula [30-32]

$$C_q = Se^2 \frac{g_v m^*}{\pi \hbar^2} \tag{13}$$

where S is the average surface area of the $WS_2$ monolayer, e is the elementary charge, $g_r$ is the valley degeneracy factor (equal to 2 for the $WS_2$ monolayer), and $m^*$ is the effective mass (chosen to be 0.4 $m_0$, the electron mass in free space). FIG. 51($b$) shows the circuit-level equivalent schematic. The lowest capacitor has one side made of silver and the other side made of a $WS_2$ monolayer, while the other three capacitors are made of a $WS_2$ monolayer on each side, resulting in two quantum capacitors in series. The total capacitance is $$C_{tot} = \frac{3C_g C_q}{C_q + 2C_g} + \frac{C_g C_q}{C_g + C_q} \tag{14}$$

where $C_g$ is the geometric capacitance. The quantum capacitance is estimated to be 0.196 pF and the geometric capacitance is estimated to be 3.38 fF in an EAM with optimized dimensions. In order to calculate the switching energy of the electro-absorption modulator (EAM), the following formula can be used:

$$E = \frac{1}{2} C_{tot} V^2 \tag{15}$$

where $C_{tot}$ is the total capacitance, and V is the voltage applied between the capacitors. According to a previous study by Ref. [8], a 67 V voltage was applied to a similar structure with a $WS_2$ monolayer on a silicon-on-insulator (SOI) wafer with a 300 nm $SiO_2$ insulator. In order to achieve the same electric field in a super-lattice structure with a 3 nm $Al_2O_3$ insulator, the equivalent voltage between capacitors can be 0.67 V. This resulted in a switching energy of 2.96 fJ/bit, which is small due to the ultra-compact size of the EAM. In comparison, other low-dimensional material-based EAMs such as graphene-based EAMs have their total switching energy limited by the quantum capacitance, which puts a physical constraint on energy efficiency improvements.

Contacts can be created on both sides of the EAM for electrical connections. The right side is designed for contacting the first and third $WS_2$ monolayers, while the left side is for contacting the second and fourth monolayers with a gold electrode. In FIG. 51($c$), the process involves depositing a 3 nm $Al_2O_3$ film, followed by a 0.7 nm $WS_2$ layer. The gold electrode is then patterned on the monolayer. When depositing the second $WS_2$ monolayer, the width should be smaller to avoid contact with the electrode, and the $Al_2O_3$ thin film should cover the entire second $WS_2$ monolayer. Similar processes can be used for the third and fourth monolayers and the contacts on the other side of the EAM (FIG. 51($d$)). A 4-unit superlattice is sufficient for modulation, as more units would require a more complex fabrication process.

The calculation of bandwidth is complex and the simple RC delay model is not effective in estimating materials with relatively high resistivity and significant resistance changes when injecting free carriers, such as $WS_2$ monolayers. Therefore, the rising time to set up the external voltage depends on the minimum time required for free carriers in a $WS_2$ monolayer to be uniformly distributed, as well as the capacitance effect. Various examples demonstrate a velocity saturation model to simulate the transient performance of an exemplary electro-absorption modulator (EAM) (see FIGS. 59-60 for details of the analyses, and the relevant data used in the model is from Ref. [34]). FIG. 52 illustrates the quality of $WS_2$ monolayers and the influence of external voltage sources on transient performance. FIGS. 52 ($a$), ($b$), and ($c$) show different factors that affect the response time of $WS_2$ monolayers to external voltages. For high quality $WS_2$ monolayers, larger mobility leads to faster responses. As carriers are injected from one side to the other, larger mobility means that carriers can quickly occupy all areas of a $WS_2$ monolayer and do not degrade tunability under high frequency. Similarly, decreasing the contour width or decreasing the contact area limits the path that carriers must move through and shortens the rising time. When the external voltage increases, the large electric field accelerates carriers to the saturation velocity within a shorter interval. These results show ways of improving transient performance through careful monolayer growth, higher energy consumption, and a smaller contact area. Among these, the most efficient way is to increase the external voltage, as it is easy to manipulate and paying extra energy also improves optical characteristics such as extinction ratio and insertion loss. FIGS. 52 ($d$), ($e$), and ($f$) are more intuitive plots showing the 3-dB bandwidth. The EAM can easily achieve at least 10 GHz, which has potential for use in fast optical communication systems. However, under a large electric field, carriers maintain the saturation velocity, which physically limits the maximum bandwidth of the EAM. For a device with optimized dimensions, the maximum achievable bandwidth is limited to 32.6 GHz (see FIGS. 59-60).

Benchmarking and Comparison

TABLE 8

| Specs comparisons for some recent EAM reports of different active layers[a] | | | | | | | |
|---|---|---|---|---|---|---|---|
| Active Layer | Structure | ER (dB) | IL (dB) | Switching Energy (fJ/bit) | Linear Footprint (um) | Bandwidth (GHz) | Ref. Number |
| ITO | Au/SiO$_2$/ITO MOS cap | 5 | 1 | 60 | 5 | \ | 5 |
| ITO | Cu/ITO/HfO$_2$/TiN MOS cap | 19.9 | 2.9 | 400 | 1 | 11 | 6 |

TABLE 8-continued

| | | | | Switching | Linear | | |
|---|---|---|---|---|---|---|---|
| Active Layer | Structure | ER (dB) | IL (dB) | Energy (fJ/bit) | Footprint (um) | Bandwidth (GHz) | Ref. Number |
| ITO | Coupling-enhanced dual-gate | 2 | 2 | 770 | 4 | 0.45-5.4 | 7 |
| Graphene | Graphene/hBN on top | 28 | 1.28 | 212 | 120 | 46.4 | 8 |
| Graphene | Graphene with bulk silver on top | 3.6 | 2.7 | 0.4 | 3 | >100 | 9 |
| MQWs | Ge/SiGe MQWs, p-i-n diode | 10 | 5 | 108 | 90 | 23 | 10 |
| QDs | In/As QDs, p-i-n diode | 5 | 8 | \ | 10 | \ | 11 |
| TMDs | TMD monolayers on silicon | 9 | \ | \ | 1 | \ | 12 |
| This Work | WS$_2$/Al$_2$O$_3$ on slot-shaped silver | 9.1 | 7.6 | 2.96 | 0.4 | 15 | \ |

Extinction ratio (ER) describes the ratio between the on-state transmission and off-state transmission. Insertion loss (IL) describes the loss of the light for on-state transmission. Switching energy describes the energy consumption for each 0-to-1 transition in the on-off keying modulation. 3-dB bandwidth describes the maximum switching frequency allowed. The corresponding reference numbers are listed in the last column for convenience.

In order to compare the advantages and disadvantages with recent reports of other electro-absorption modulators (EAMs) with different active layers [5-12], the extinction ratio, insertion loss, linear footprint, switching energy, and the 3-dB bandwidth were analyzed. EAMs with ITO active layers require MOS capacitor structures to control the injection of carriers. However, ITO-based EAMs have a large switching energy in order to achieve significant tunability due to the low light confinement of Silicon-based waveguides and a large geometric capacitance. Graphene-based EAMs are often used in super-fast interconnects, but come with a larger area. The fast speed is due to the effects of quantum capacitance, with the geometric capacitance contributing little to the energy. Multiple quantum wells (MQWs) and quantum dots (QDs) structures are difficult to predict the performance of due to different mechanisms. EAMs that adopt quantum stark-effect mechanisms can operate at higher frequencies, even in the visible frequency domain. The proposed EAM shows a good extinction ratio, low energy consumption, an extremely small linear footprint, and a comparable bandwidth. However, due to the strong coupling phenomenon, the insertion loss of the EAM is inevitably higher than many other structures because of the lossy nature of plasmonic structures.

Accordingly, such ultra-compact, plexcitonic EAM can provide comparable performance metrics to other plasmonic, quantum well and 2D materials based EAMs. The discussed EAM has the smallest lateral footprint along with <3 fJ/bit switching energy, making it a promising candidate for compact electro-optical modulator. The model suggests that in order to further improve the performance of this plexcitonic EAM, higher electric fields are necessary which may be obtained via a higher external voltage applied to the superlattice and also reducing the area of the contact region of metal to WS$_2$. Finally improving the electronic quality of the monolayer WS$_2$ and reducing metal/WS$_2$ contact resistance will also help improve the performance of this plexcitonic EAM design. Given that the EO effect in WS$_2$ is well established and superlattices used in this study have already been demonstrated, future work will focus on experimental demonstration of this concept. The approach of using strong light-matter coupling and hybrid states for EAMs is promising for submicron-scale modulator design concurrently with high extinction ratio, speed, and low-power operation. Ultra-Compact Plexcitonic Electro-Absorption Modulator Bandwidth Evaluations To calculate the bandwidth of our electro-absorption modulator (EAM), we use the following parameters to derive the formulas.

TABLE 9

Parameters for bandwidth calculation of our optimized EAM.

| Parameter Symbol | Meaning | Value |
|---|---|---|
| W$_S$ | Contour Width of the device from electrode contact to the other side | 920 nm |
| L | Length of the device. | 400 nm |
| S | The total surface area of the device. (W$_S$L) | \ |
| U$_1$ | The steady voltage across the capacitor. | 0.67 V |
| E$_{eff}$ | The effective electric field driving the carriers to flow from the contact to the other side. | \ |
| U | The transient voltage across the capacitor. | \ |
| t$_{setup}$ | The minimum time that is needed for uniform distribution after injecting free carriers into the WS$_2$ monolayer. | \ |
| n$_{2D}$ | 2D carrier concentration, which has the unit of m$^{-2}$. | \ |
| v$_{sat}$ | Saturation velocity of electrons in WS$_2$ monolayer. | $3 \times 10^4$ m/s |
| E$_{sat}$ | Saturation electric field of electrons in WS$_2$ monolayer. | $6 \times 10^5$ V/m |
| μ | Mobility, which is defined by v$_{sat}$/E$_{sat}$ (SI unit). | \ |

The carriers are injected from the electrode contact and flow to the other side of the device. In semiconductors, especially in TMD monolayers, electrons have low mobility and thus have low saturation velocity. Recent study [82] experimentally gives the saturation velocity of monolayer WS$_2$, which can be used to estimate the minimum switching time for carriers to be fully injected.

$$t_{setup} = \frac{W_s}{v_{sat}} = 3.07 \times 10^{-11} s \tag{16}$$

This shows that the upper limit of modulation speed is 32.6 GHz in our work. To balance the accuracy and complexity when we evaluate the bandwidth, we simplify the electrical properties of electrons by a linear model in FIG. 16.

The relationship between the velocity and the electric field is:

$$v = \begin{cases} \mu E, & E < E_{sat} \\ v_{sat}, & E > E_{sat} \end{cases} \tag{17}$$

When a carrier moves from the electrode to the other side, it is driven by the voltage source. At the end of the setup time, the charge is moved $W_s$ away from the electrode and the $WS_2$ plate has the potential U.

$$W = q \int_l E \, dl = q E_{eff} W_s = q(U_1 - U) \tag{18}$$

In equation (18), we assume an effective electric field that is constantly applied to the carrier to avoid difficult integral. For monolayer $WS_2$, the current is given by $$I(t) = n_{2D}(t) q v(t) L \tag{19}$$

From equation (17), (18), and (19), we get $$I(t) = n_{2D}(t) q L \begin{cases} \mu \dfrac{U_1 - U(t)}{W_s}, & U(t) > U_1 - W_s E_{sat} \\ v_{sat}, & U(t) \le U_1 - W_s E_{sat} \end{cases} \tag{20}$$

The surface carrier concentration can be calculated by $$n_{2D}(t) = \frac{C U(t)}{q S} \tag{21}$$

where C is the total capacitance induced by two $WS_2$ monolayers separated by $Al_2O_3$ dielectric. The capacitance effect also leads to the transient current by $$C \frac{dU(t)}{dt} = I(t) \tag{22}$$

Equations (20), (21), and (22) form a first-order differential equation $$\begin{cases} \dfrac{dU(t)}{dt} = \dfrac{L\mu}{S W_s} U(t)[U_1 - U(t)], & U(t) > U_1 - W_s E_{sat} \\ \dfrac{dU(t)}{dt} = \dfrac{L v_{sat}}{S} U(t), & U(t) \le U_1 - W_s E_{sat} \end{cases} \tag{23}$$

General solutions of equation 23 are $$\begin{cases} U(t) = \dfrac{C_1 U_1 e^{\frac{L\mu U_1}{S W_s} t}}{C_1 e^{\frac{L\mu U_1}{S W_s} t} - 1}, & U(t) > U_1 - W_s E_{sat} \\ U(t) = e^{\frac{L v_{sat}}{S} t} + C_2, & U(t) \le U_1 - W_s E_{sat} \end{cases} \tag{24}$$

where $C_1$ and $C_2$ are arbitrary numbers. With the initial condition and continuity of U(t) through the entire charging process $$\begin{cases} U(t_0) = U_1 - W_s E_{sat}, \; \lim\limits_{t \to t_0^-} U(t) = \lim\limits_{t \to t_0^+} U(t) \\ \qquad\qquad U(0) = 0 \end{cases} \tag{25}$$

The solutions to describe the transient performance are $$\begin{cases} U(t) = \dfrac{C_1 U_1 e^{\frac{L\mu U_1}{S W_s} t}}{C_1 e^{\frac{L\mu U_1}{S W_s} t} - 1}, \; C_1 = \dfrac{W_s E_{sat} - U_1}{W_s E_{sat}} (U_1 - W_s E_{sat} + 1)^{\frac{-\mu U_1}{W_s v_{sat}}}, \; t > \dfrac{s}{L v_{sat}} \ln(U_1 - W_s E_{sat} + \\ U(t) = e^{\frac{L v_{sat}}{s} t} - 1, \; t \le \dfrac{s}{L v_{sat}} \ln(U_1 - W_s E_{sat} + 1) \end{cases}$$

Based on equation 26, we get the simulation results in FIG. 5.

Geometric Optimization

The optimization process demonstrates the impact of geometric parameters on the coupling parameter g and the corresponding optical response. Theoretically, we can manipulate the number of excitons by increasing the number of units in a superlattice and adjust the mode volume by changing the sizes according to equation (2). FIGS. 60 (a), (b), and (c) illustrate the tunability at different number of excitons. The more excitons present in the system, the larger the coupling parameter will be, leading to a higher off-state absorption. However, it should be noted that the fabrication process becomes more complex as the number of units in the superlattice increases, so a design with 4 units is appropriate. FIGS. 60(d), (e), and (f) show the effect of changing the sizes of the EAM and adjusting the mode volume. The width of the device has a significant impact on the tunability, but it also increases the insertion loss, which is a characteristic of the SPP mode. The height and gap designs are limited by electrical properties, such as the requirement for a small geometric capacitance for energy efficiency and a short contour width for high bandwidth. In conclusion, the number of units is a trade-off between fabrication complexity, insertion loss, and tunability, while both electrical and optical characteristics must be considered in the geometric design. Our optimized EAM demonstrates a balance of these requirements. It is important to note that the tunable refractive index data may vary for different $WS_2$ monolayer samples, so optimization should always follow the principles outlined in the primary manuscript.

Photovoltaic Applications

Excitonic semiconductors have been a subject of research for photovoltaic applications for many decades. Among them, the organic polymers and small molecules based solar cells have now exceeded 19% power conversion efficiency (PCE). While organic photovoltaics (OPVs) are approaching maturity, the advent of strongly excitonic inorganic semiconductors such as two-dimensional transition metal dichalcogenides (TMDCs) has renewed interest in excitonic solar cells due to their high-optical constants, stable inorganic structure and sub-nm film thicknesses. While several reports have been published on TMDC based PVs, achieving power conversion efficiencies higher than 6% under one-sun AM1.5G illumination has remained challenging. Here, a full optical and electronic analysis is performed for design, structure and performance of monolayer TMDC based, single-junction excitonic PVs. A computational model with optimized properties predicts a PCE of 9.22% in a superlattice device structure. Analyses suggests that, while the PCE for 2D excitonic solar cells may be limited to <10%, a specific power >100 W g–1 may be achieved with proposed designs, making them attractive in aerospace, distributed remote sensing, and wearable electronics.

Thin-film photovoltaics, such as those based on III-V semiconductors, CdTe, and 3D perovskites, have been a source of sustained research and commercial interest. However, they occupy a small share of the large-scale, grid-tied market since their production has not been scaled. Hence, their price of electricity remains high compared to silicon photovoltaics (PVs) which is the dominant PV technology1. However, thin-film photovoltaics have long been considered as a potential solution for lightweight applications, such as aerospace, powering distributed remote sensors, and wearable electronics2, 3. In this application, new and emerging materials such as organic semiconductors4, II-chalcogenides5 and two-dimensional hybrid organic-inorganic perovskites6 are also being heavily investigated. Among novel, thin-film photovoltaic materials, excitonic semiconductors have attracted a lot of attention due to their large absorption coefficients which permit a sharp reduction in active layer thickness of the PV devices. However, 2D transition metal dichalcogenides (TMDCs) of MX2 (M=Mo, W and X=S, Se, Te) have recently gained traction for lightweight PV applications. In particular, their large optical constants result in large loss-tangent values across the visible region combined with their availability in high optical and electronic quality over wafer scales makes then increasingly viable candidates for thin-film, ultralight-weight PVs7, 8.

Further, a notable feature of 2D TMDC semiconductors is a transition from an indirect bandgap in bulk to the direct bandgap in monolayers that enables a high photoluminescence quantum yield, and thus, a high radiative efficiency9. Finally, the wide range of bandgaps (1.0-2.5 eV10) and van der Waals bonding for facile hetero-integration make TMDCs attractive candidates for single-junction, tandem, and multi-junction solar cells11.

Consequently, several studies reporting microscale PV devices from bulk and monolayer TMDCs are available. However, the PCE values of these experimentally reported TMDC solar cells are typically lower than 2%12-14, whereas the highest PCEs were reported as 9.03% in MoS215 and 6.3% in WS216. Per the detailed balance model11, thin-film, single-junction TMDC solar cells can have maximum PCEs of up to 27%, comparable to crystalline Silicon. This vast disparity between theoretical maximum and experimentally observed values therefore merits further investigation. To investigate the practically limiting parameters of current TMDC PVs, various examples developed a combined optical and electronic model to simulate the photovoltaic characteristics of four TMDC materials (MoS2, WS2, MoSe2, and WSe2) based on an experimentally reported, large area, scalable superlattice structure17.

34

Based on the model, the parameters and performance of monolayer MoS2 superlattice based PV devices were optimized, attaining a PCE as high as 9.22% under one-sun (AM1.5) illumination with specific power exceeding 50 W/g. Finally, various examples benchmarked results against other 2D PV devices on the metrics of PCE vs specific power and find that 2D TMDC based PVs when optimized for both optical and electronic design can outperform all available technologies in high specific power applications.

Figures 53A, 53B, 53C, 53D:
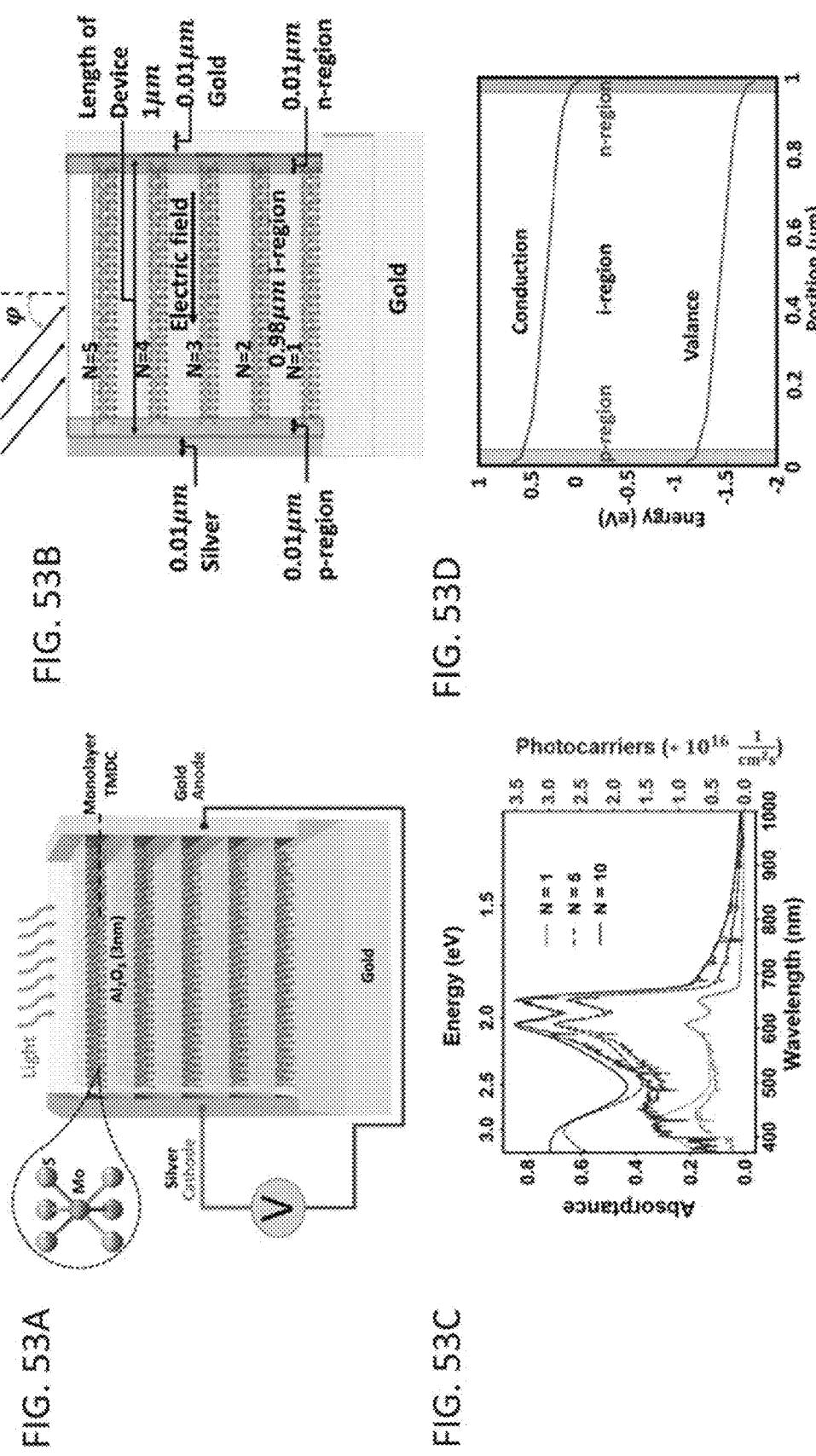

Device Structure and Optimization of Photon Absorption:

The proposed 2D TMDC-based photovoltaic superlattice device is shown in FIG. 53a. The device consists of a repeating unit cell of a monolayer MoS2 absorber (0.65 nm) and an Al2O3 insulator (3 nm), and is placed on top of an Al2O3/Au substrate with the Au serving as a reflector. The thickness of the Al2O3 layer has been optimized to enhance photocarrier generation. The active layer of the device is intrinsic (no doping) which is 1 μm long, with silver and gold cathode and anode electrodes measuring 0.01 μm in length each. The heavily doped p-region (1019 cm–3) near the cathode and the heavily doped n-region (1019 cm–3) near the anode are also 0.01 μm in length. The incident angle of the light is zero, meaning it is normal to the surface. Additional details regarding the device structure and parameters used for simulation are provided in methods and in supporting information (See Table 12).

By using the Transfer Matrix Method (TMM) to calculate the absorbed photon density of each layer, it was found that increasing the number of layers significantly increases the absorbed photon density in the 400-700 nm wavelength range as seen in FIG. 53c. This increase is particularly significant when going from N=1 to N=5. However, further increasing the number of layers from N=5 to N=10 does not lead to as dramatic an increase in broadband absorptance and actually decreases the absorbed energy per unit weight. Therefore, the electrical simulations for example devices discussed herein were based on an N=5 superlattice design. The energy band diagram for the active layer, which has a 1.80 eV bandgap for monolayer MoS218, is shown in FIG. 53d. The band diagram is that of a p-i-n lateral homojunction takes into account the built-in field created by degenerate p-doping and n-doping near the contacts which promotes charge carrier selectivity and improves device performance19.

Role of Excitons and their Radiative Efficiency

It is well known that excitons dominate the optical response of semiconducting 2D TMDCs, not only in the monolayer limit but also in the bulk. However, thus far, all attempts in literature to quantify and estimate theoretical PV potential for TMDCs have failed to treat excitons seriously in their models20-22. Not only do excitons dominate the optical properties in low dimensional semiconductors but it is also well-known through both theory and experiment that they limit the performance of other well-known excitonic semiconductors-based PVs, namely OPVs23-28. Therefore, any attempt to seriously quantify the performance limits of semiconducting 2D TMDC based PVs must include a detailed treatment of excitons. This work has thus examined the effects of exciton binding energy (BE), exciton radiative lifetime (τex-r), exciton nonradiative lifetime (τex-nr), and exciton diffusion length (EDL) in a model for determining performance limits of semiconducting 2D TMDC based PVs. The binding energy of excitons, which describes the ease with which an electron and hole can be separated, is important for solar cell performance. In MoS2, the exciton binding energy increases from 0.08 eV29 in the bulk to 0.44 eV30 in monolayers due to quantum confinement effects31.

However, the binding energy in monolayer TMDCs can be modified by molecular coverage32, doping33, and engineering of the dielectric environment34. By simulating the PCE as a function of exciton binding energy and diffusion length (FIG. 54a and Table S2), it was found that higher PCE was observed at lower binding energies. This is because excitons are more likely to dissociate at the interface with the aid of thermal energy as the binding energy decreases (See, e.g., FIGS. 61a, b).

EDL is another crucial parameter that influences the transportation of excitons in monolayer TMDCs and therefore affects solar cell performance. Since excitons are neutral, they are not significantly affected by electric field drift. In organic solar cells, the diffusion length is on the nanometer scale, making it unlikely for an exciton to reach an electrode35. In contrast, the diffusion length of TMDCs is in the micron range, allowing the electrodes to be further apart and reducing the amount of reflected light. The simulated range of 0.015-6 μm encompasses previously measured diffusion lengths in MoS236. Assuming that excitons follow a Gaussian distribution centered around the diffusion length and are excited evenly throughout the MoS2, photocurrent is still produced even when the diffusion length is less than the distance between electrodes (1 μm). However, some excitons will still recombine before being converted into photocurrent. In silicon PVs, the recombination process releases heat due to the indirect band gap, but in the solar cell design with a direct band gap, a photon is emitted during recombination instead of heat, which does not reduce overall efficiency. The emitted photon may either be radiated out of the solar cell or reabsorbed. The effects of reabsorption37 were not considered, due to the expectation that they would be low. In the blue curve of FIG. 54b (0.4 eV binding energy), the PCE increases with diffusion length from 0.015 μm to 2 μm as a longer diffusion length increases the probability of an exciton reaching one of the interfaces of the junction. However, when the diffusion length becomes larger than twice the device length, nearly all the excitons reach the interfaces and begin to concentrate at the electrodes, blocking other excitons from disassociating at the interface and decreasing the PCE. For large binding energies (BE >0.3 eV), the results for PCE, short-circuit current (ISC), and open-circuit voltage (VOC) were similar to the blue curve as shown in FIGS. 61c-e. For the red curve with a relatively low binding energy of 0.2 eV, the higher number of dissociated charges almost fully occupy the space between electrodes, resulting in a decrease in PCE as the diffusion length increases. Further increase of diffusion length results in a purely declining trend of PCE for all binding energies <0.3 eV.

Figures 54A, 54B, 54C, 54D:
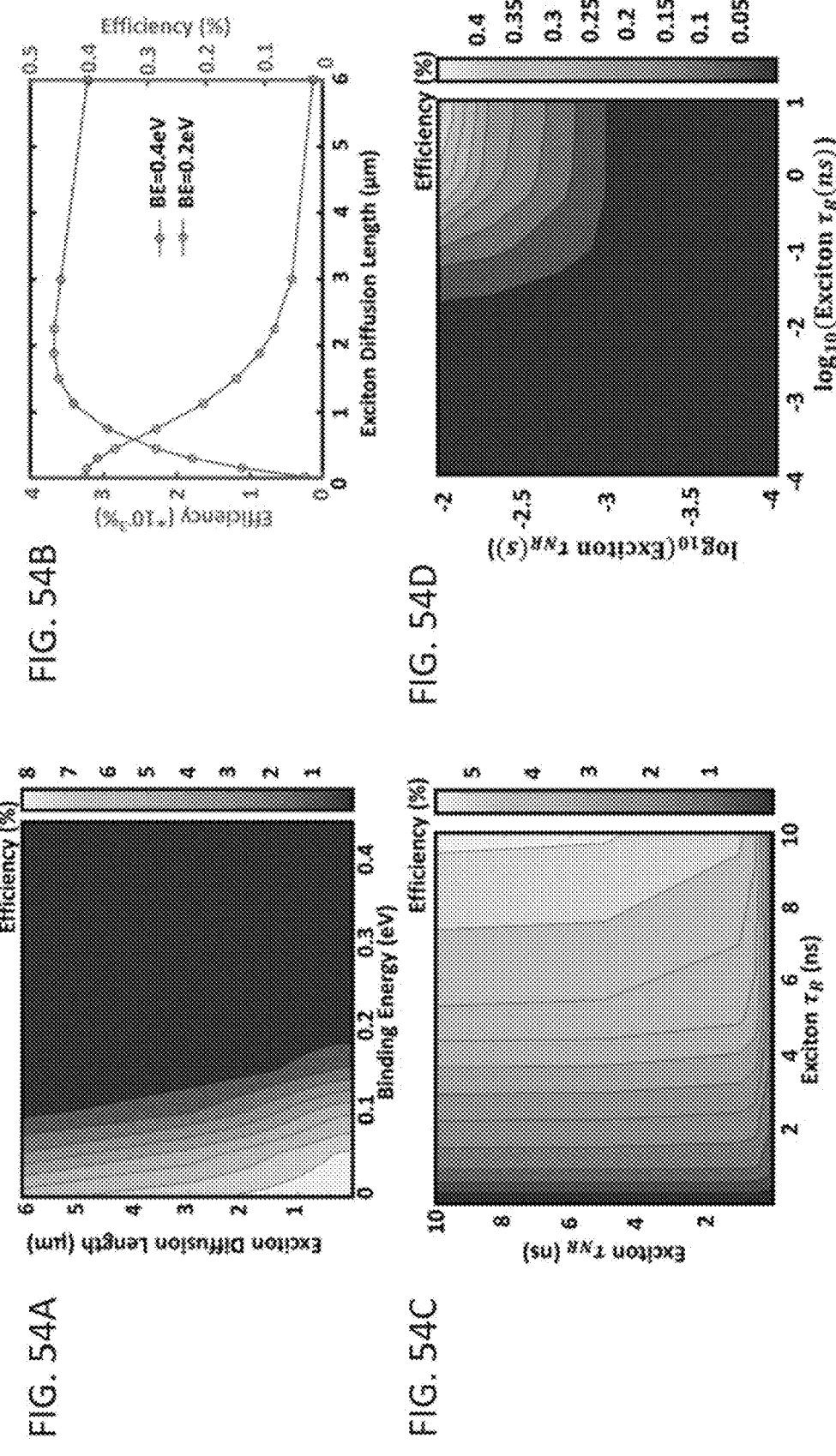

To understand the factors influencing exciton diffusion, the radiative lifetime and nonradiative lifetime of the excitons were examined based on a binding energy of 0.24 eV38 and a diffusion length of 1.5 μm. The quantum yield of monolayer MoS2 can range from less than 1% to nearly 100%, and the effective lifetime can be as long as 10 ns39. Simulations were first conducted by varying the exciton radiative lifetime from 0.0001-10 ns and the exciton nonradiative lifetime from 0.0001-10 ns, which modified the quantum yield from less than 1% to greater than 99% (FIG. 54c and Figure S2a,b). Previous reports have also found radiative lifetimes ranging from 0.2 ps40 to 15 ns41 and nonradiative lifetimes from 1 ps to 10 ps42 in MoS2. In order to more closely examine the effect of these lifetimes on PCE, the range with logarithmic axes in FIG. 54d and FIG. 62c,d were studied. As the simulations did not take into account the reabsorption of photons from recombination, the quantum yield had no impact on PCE. The total lifetime, which is the combination of radiative and nonradiative lifetimes, determines the photocurrent and PCE. A longer lifetime means excitons exist longer before recombining and have a higher chance of diffusing and dissociating, leading to higher photocurrent from an increase in charges. In FIG. 54d, improving the nonradiative lifetime is more important than improving the radiative lifetime as defects significantly trap the excitons and reduce the total lifetime, and therefore the efficiency of the photovoltaic device. In the optimization process, 10 ns was selected for both radiative and nonradiative lifetimes, resulting in a PCE of 5.62%.

Role of Free Carriers and their Mobilities

Figures 55A, 55B, 55C, 55D:
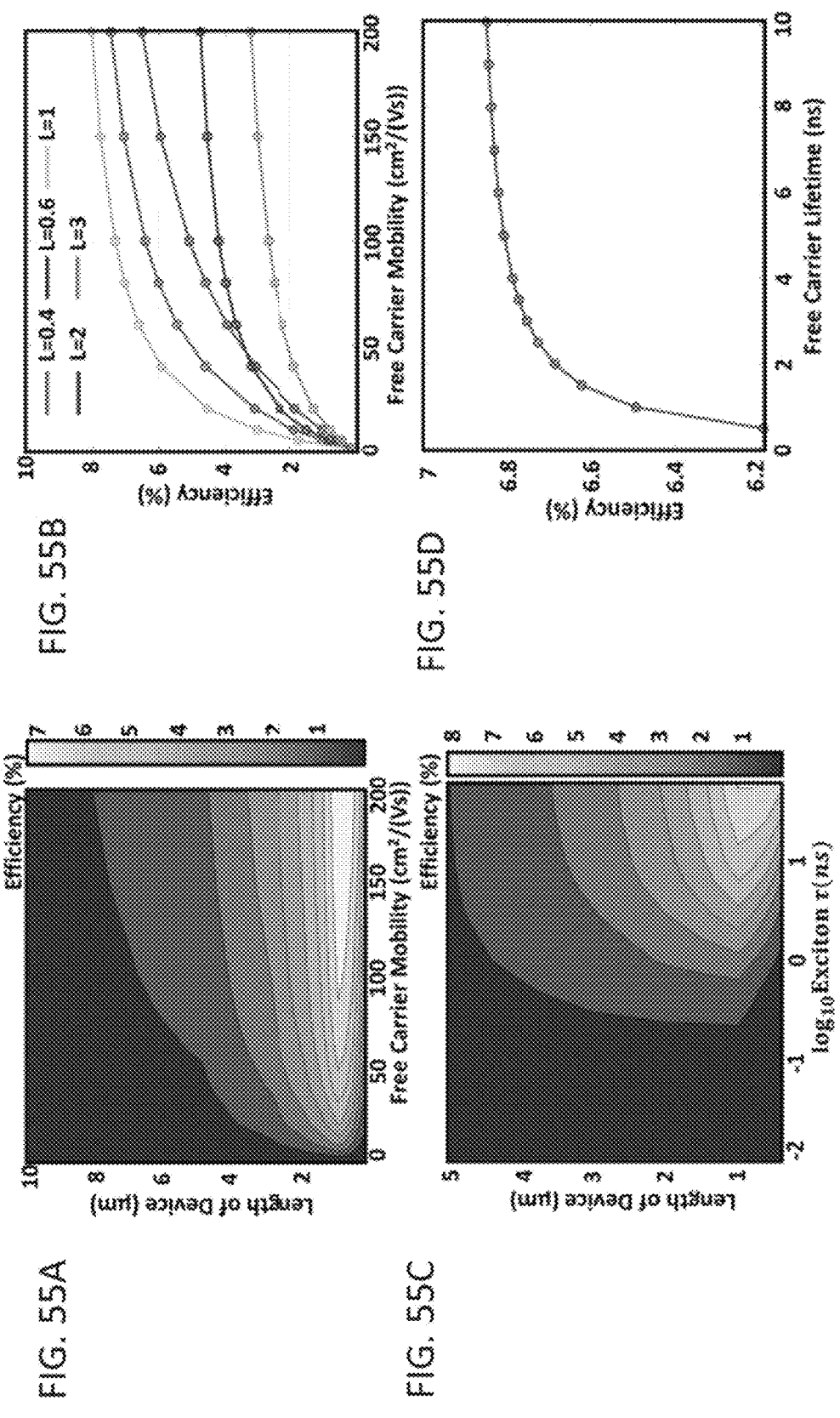

After optimizing the parameters of exciton binding energy and exciton lifetimes, the effect of free carrier properties under an electric field on photocurrent were examined. The electron mobility of monolayer MoS2 has been reported to be in the range of 0.1-10 cm2V–1s–1 43, 44. However, the carrier mobility can be improved using the dielectric screening effect45, allowing for values greater than 100 cm2V–1s–1 46, 47. Therefore the range of free carrier mobilities from 0.1 to 200 cm2V–1s–1 were studied, as well as the device lengths from 0.4 to 10 μm (FIG. 55a and FIG. 63). As the electron mobility increases, the PCE is enhanced as more photocarriers are collected by the electrodes. In FIG. 55b, the PCE increases significantly in the mobility range of 0.1-60 cm2V–1s–1 for several selected device lengths (0.4, 0.6, 1, 2, and 3 μm). The largest enhancement in PCE is seen when the free carrier mobility is increased to 100 cm2V–1s–1 and the radiative lifetime to 6 ns, values that can be achieved in MoS2 without additional treatments or dielectric engineering.

Figure 63A:
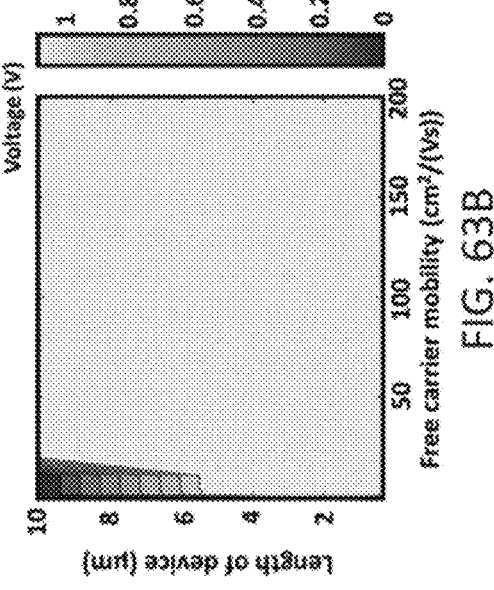
Figure 63B:
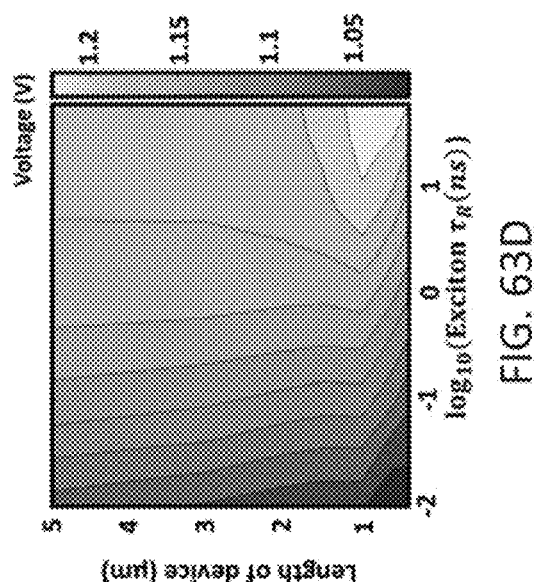
Figure 63C:
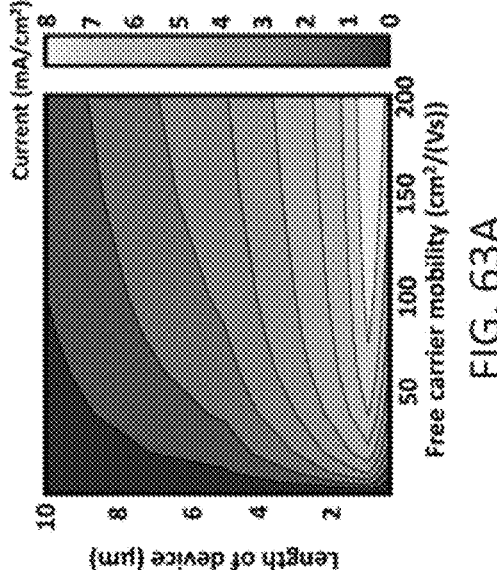

To understand the impact of electron mobility, experiments analyzed the effect of device length. In FIG. 55a and FIG. 63a,b, the peak PCE occurs at a device length around 1 μm. A similar result is also seen in FIG. 55c and FIG. 63c,d, where the exciton total lifetime is varied from 0.01 to 6 ns. As these simulations are based on a constant exciton diffusion length of 1.5 μm (other parameters are in Table 14), the optimized device length is comparable to the exciton diffusion length. For lengths greater than 1 μm, the portion of excitons in the i-region diffusing to the dissociation region decreases, leading to a decrease in PCE. For lengths shorter than 1 μm, the exciton diffusion length of 1.5 μm exceeds the dissociation region, also leading to a decrease in PCE. FIG. 55c demonstrates that increasing the exciton total lifetime significantly increases photocurrent and PCE. In addition to carrier mobility, carrier lifetime was studied over the range of 0.5 to 10 ns, where the dominant recombination process at low carrier concentrations is Shockley-Read-Hall (SRH) recombination48. In FIG. 55d, the PCE increases nonlinearly with carrier lifetime. For SRH lifetimes shorter than 3 ns, the significant increase in PCE shows that the carrier lifetime is a limiting factor for final efficiency. However, for SRH lifetimes longer than 3 ns, the slow increase in PCE indicates that the SRH lifetime is no longer a limiting factor.

Angle Sensitivity and Comparison Between Different TMDCs

Figures 56A, 56B, 56C, 56D:
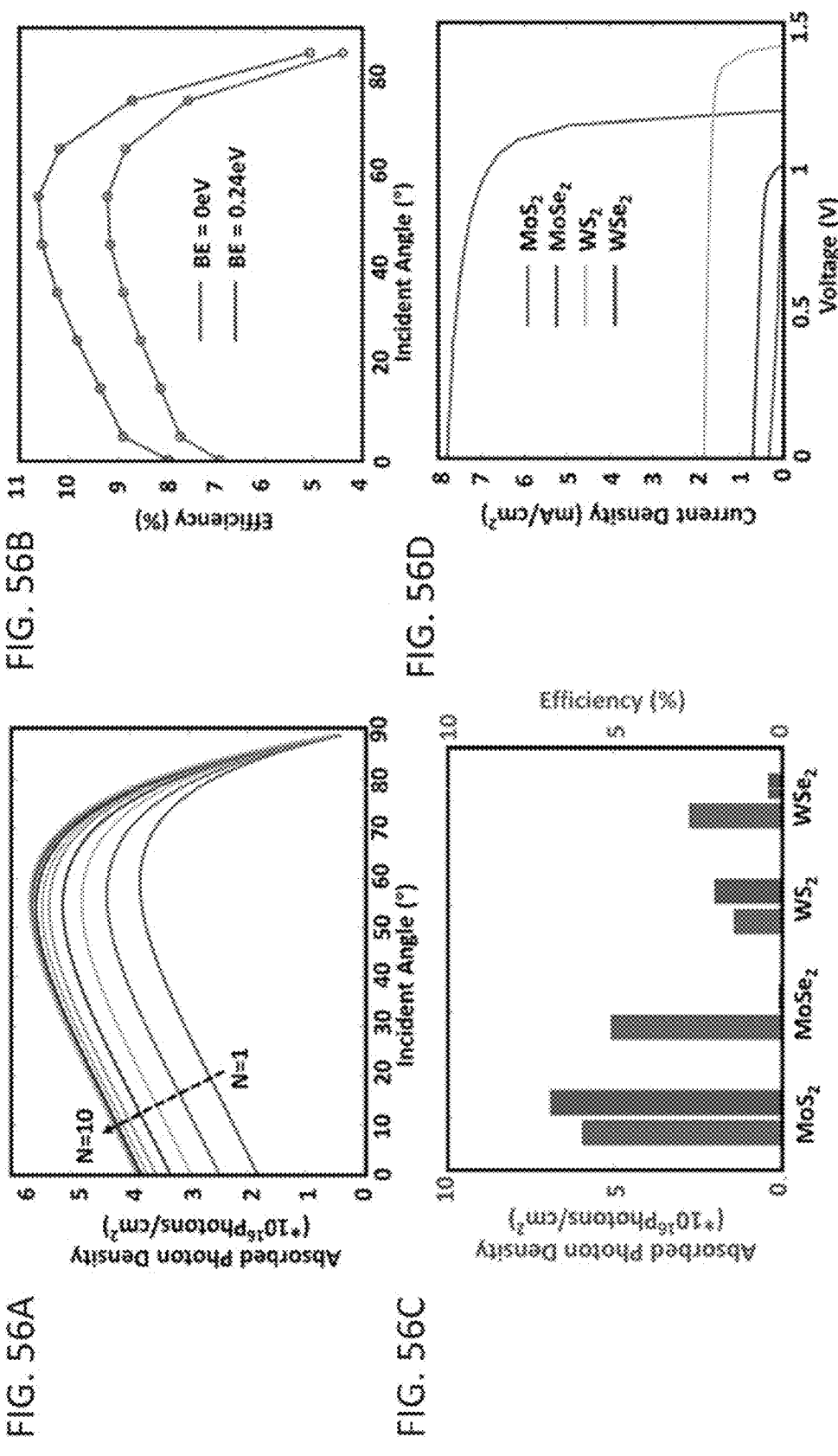

The photocarrier generation of the superlattice for N=1 to 10 with optimized bottom alumina thicknesses was investigated at different incident angles. The photocarrier generation rate was found to have a maximum in the range of 500 to 650 for all values of N. This increased rate is due to the formation of exciton-polaritons, which allows for near unity absorption of transverse electric polarized light near the photon density maximum of the AM1.5 solar spectrum. However, the absorption at other wavelengths decreases as the incident angle increases due to the initial interface becoming more reflective. The maximum occurs at lower incident angles as N increases because the increased Rabi splitting allows for the formation of exciton-polaritons at lower incident angles. Simulations of the absorbed photons at different incident angles were used to calculate the PCE as shown in FIG. 56b. The peak PCE of 0.24 eV binding energy was 9.22% at an incident angle of 50°. After optimization, the internal quantum efficiency (IQE) reached a maximum of 69.5%. The IQE did not change when the incident angle was varied in the simulation using the angle dependent photon absorption spectra, which explained the same curvature seen in FIG. 56a (N=5) and 4b. The final PCE is proportional to absorbed photons for a constant IQE.

The performance of superlattices made from four different TMDCs, MoS2, MoSe2, WS2, and WSe2, was also simulated using the model. The absorbed photon density was calculated using TMM simulations, as shown in Table 10. FIG. 56c shows the absorbed photon density and the PCEs of different material. MoS2 had the largest photon absorption density and the highest PCE due to its two lowest energy excitons being near the maximum of the solar photon spectrum and its relatively low binding energy of 0.24 eV, which resulted in an IQE of 56.72%. MoSe2 had a higher binding energy of 0.57 eV, leading to a significantly lower IQE of 3.79% and a PCE of 0.06%. WS2 had a relatively high free carrier mobility of 1000 cm2V−1s−1 and a low binding energy of 0.32 eV, resulting in the highest IQE of 81.24%. However, its relatively lower photon absorption rate led to a final PCE of 1.98%. WSe2 had a relatively low photon absorption rate and a high binding energy of 0.37 eV, resulting in a PCE of 0.36%. These results show that reducing the exciton binding energy is crucial for producing high-efficiency solar cells using this geometry. The actual binding energy of excitons in the superlattice is expected to be lower by a factor of approximately 2 due to the use of binding energy values for freestanding samples. The binding energy can be further reduced by using high refractive index spacer layers such as hBN, TiO2, and Ta2O5. FIG. 56d shows the current-voltage (I-V) curves of the four materials. In this comparison, MoS2 had the best short-circuit current density of the four TMDCs studied, while WS2 had the largest open-circuit voltage and fill factor (FF).

TABLE 10

The key parameters of TMDC materials
($MoS_2$, $MoSe_2$, $WS_2$, $WSe_2$).

| | $MoS_2$ | $MoSe_2$ | $WS_2$ | $WSe_2$ |
|---|---|---|---|---|
| Absorbed photons ($*10^{16}$ photons/cm²) | 5.94404 | 5.07596 | 1.39183 | 2.72686 |
| Bandgap (eV) | 1.8[18] | 1.60[49] | 2.04[50] | 1.65[49] |
| Binding Energy (eV) | 0.24[38] | 0.57[51] | 0.32[30] | 0.37[49] |
| Mobility (cm²/V/s) | 60[52] | 480[53] | 1060[54] | 250[55] |
| Short Circuit Current (mA/cm²) | 5.40 | 0.31 | 1.81 | 0.68 |
| Open Circuit Voltage (V) | 1.20 | 0.82 | 1.42 | 1.01 |
| Fill Factor | 70.15 | 22.36 | 76.58 | 53.21 |
| Internal Quantum Efficiency (%) | 56.72 | 3.79 | 81.24 | 15.54 |

TABLE 10-continued

The key parameters of TMDC materials
($MoS_2$, $MoSe_2$, $WS_2$, $WSe_2$).

| | $MoS_2$ | $MoSe_2$ | $WS_2$ | $WSe_2$ |
|---|---|---|---|---|
| Power Conversion Efficiency (%) | 4.54 | 0.06 | 1.98 | 0.36 |

At a PCE of 9.22% and a specific weight of 0.58 g m$^{-2}$, excluding a supporting substrate, the device has a specific power (power/weight ratio) of 157 W g$^{-1}$, which is the highest value among TMDC-based cells. The PCE performance and power/weight ratio of the modelled device were compared to other TMDC containing photovoltaic devices from recent literature under AM1.5 illumination (FIG. 57)[12-14, 56-70]. Further details on the calculation of specific power for each cell are provided in the Methods section. It was found that the solar cell had the largest specific power of all TMDC-based solar cells. This is because previous TMDC-based solar cells have either used monolayer samples for their ideal electronic properties at the expense of lower absorption, or they have used thin films, typically >100 nm, which has large absorption while increasing the weight. However, the present design achieves large absorption while also having the advantage of the lightweight, high electrical quality of monolayer TMDCs.

Further examples compared the present solar cell to the highest specific power that has been achieved in other materials71-75 (FIG. 58). Although the present solar cell has the lowest PCE of all the materials at 9.2% where the rest of the materials range from 11.2% to 22.35%, the exceptionally small active layer thickness of 3.5 nm results in TMDCs having the highest potential specific powers of all of the materials. Since the TMDC-based solar cell has the largest PCE, along with its simplicity and ease of large-scale fabrication, it can be a great candidate for lightweight solar cells in fields such as space, aerospace as well as wearable electronics and remote sensors.

In summary, examples demonstrate a device structure and model for 2D TMDC based excitonic solar cells and provided a thorough investigation of the physical factors limiting their performance. The principal innovation of the work lies in the optimization of both the optical and electronic properties and accounting for excitonic effects to estimate the highest possible PCE values using practical materials and device parameters. Findings suggest that the large exciton binding energies limit the overall efficiencies of 2D TMDC based PV devices to about a third of those predicted by the detailed balance model. None the less, even with large exciton binding energies upon optimizing various geometric and materials quality parameters, a PCE of 9.22% was achieved for MoS2. Even with these PCE values, the total active layer thickness of the proposed optimized device structures is <4 nm making them some of the highest specific power cells (>100 W g−1) of any thin-film PV technology available today. Overall, the present work lays a firm theoretical foundation and computational model on the performance limits of 2D TMDC based excitonic solar cells.

Photocarrier Generation Calculations

The transfer matrix method76 was implemented in python to simulate the photocarrier generation rate of the superlattice due to its ability to accurately model the absorption spectra of 1D systems. The refractive index of monolayer TMDCs, Al2O3, and Au were all taken from literature77, 78. The photocarrier generation rate was then calculated by multiplying the absorption spectrum of the superlattice by the AM1.5 solar spectrum79. For non-normal incidence, the absorption spectra for TE and TM light were averaged to calculate the absorption spectrum of unpolarized light.

Sentaurus Simulation

The two-dimensional solid-state p-i-n superlattice structure was numerically simulated using Sentaurus. This tool is beneficial to elucidate the solar cell behavior considering many physical mechanisms in the device (such as different recombination, different photon absorption calculation). Due to the limitation of vertices number and the long simulation time of the 3D model, a 2D simulation was adopted after converging on parameters from the 3D model. The 2D simulation has a default thickness of 1 μm in the third dimension where the variation of thickness will not affect the result, details can be found in FIG. 63. The structure consists of the monolayer active materials (MoS2, MoSe2, WS2, WSe2), insulators ($Al_2O_3$), cathode (Ag), and anode (Au). The think bottom insulator and gold bottom were not included in the Sentaurus simulation as their effects were fully considered in the photon generation simulation. The investigation of the impact of binding energy, exciton diffusion length, exciton radiative lifetime, exciton nonradiative lifetime, free carrier mobility, free carrier SRH lifetime, and device length on VOC, JSC, FF and PCE have been performed by utilizing this model.

The initial input parameters were obtained from the experimental data and other theoretical results to define the structure and materials as shown in Tables 11-16. In this model, the electron and hole densities were computed from the electron and hole quasi-Fermi potentials. The bandgap was based on reported values and the Bandgap narrowing effect was not considered. This model allowed discontinuous interfaces for a superlattice structure. By defining the heterointerface, the datasets of two materials were treated properly by introducing double points. The optical generation was based on outer TMM results and was defined manually for each layer. The carrier recombination considered three forms, SRH, auger and radiative. Sentaurus solved the Poisson and continuity equations to account for optical properties. The equation modeled the dynamic of the generation, diffusion, recombination, and radiative decay of singlet excitons80, 81, is given by:

$$\frac{\partial n_{se}}{\partial t} = R_{bimolec} + \nabla * D_{se} \nabla n_{se} - \frac{n_{se} - n_{se}^{eq}}{\tau} - \frac{n_{se} - n_{se}^{eq}}{\tau_{trap}} - R_{se} \qquad \text{Eq. 27}$$

Where n_se is the singlet exciton density, R_biomolec is the carrier bimolecular recombination rate acting as a singlet exciton generation term, D_se is the singlet exciton diffusion constant, $\tau$, $\tau\_trap$ are the singlet exciton lifetimes. R_se is the net singlet exciton recombination rate.

Specific Power Estimations

In determining the power/weight ratio for the devices compared in FIG. 57 and FIG. 58, the specific power (W m−2) and specific weight (g m−2) are individually calculated. All devices evaluated presented power conversion efficiencies with the AM1.5 spectrum (integrated power=1000 W m−2), thus yielding a specific power that is the PCE fraction of the integrated spectrum power. As there lacks a unified way of calculating specific weight in TMDC photovoltaics, this work views the minimum specific weight sufficient to achieve the given PCE as the comparing metric, positioning this approach specifically as a method for comparing thin film solar cells from a practical optimization perspective. Every layer of a device that actively contributes to power conversion is included in the specific weight, including electrodes which are included based on areal coverage. For layers that do not directly contribute to power conversion but play a role in the optics of the device, such as dielectrics, metal reflectors, and oxide-coated substrates, an effective thickness is used, when smaller than the actual layer thickness, equal to light's penetration depth into the material at the peak of the AM1.5 spectrum (500 nm). Substrates that do not play a role in either the electronic or optical behavior of the device, such as polymer films added for device flexibility, are not included in specific weight calculations given that thicknesses vary across devices without uniform logic. The specific weight is found by multiplying the effective thickness of each included layer in the device by the material density, which was found in literature. Note that the full substrate thickness is used in specific device configurations, such as p-n junction cells where the substrate serves as the p/n side. Dividing specific power by specific weight thus yields the power/weight ratio (W g−1).

2D Excitonic Solar Cells

TABLE 11

| Detailed Model of simulations | |
|---|---|
| Default $MoS_2$ active layer | value |
| Accepter Concentration | 1E−19 cm$^{-3}$ |
| Donor Concentration | 1E−19 cm$^{-3}$ |
| Effective Intrinsic Density | 1.3E4 cm$^{-3}$ |
| Electron Affinity | 4.723 eV |
| Temperature | 300 K |
| Radiative Recombination (highest) | 1.841 cm$^{-3}$s$^{-1}$ |
| Auger Recombination (highest) | 7.489E24 cm$^{-3}$s$^{-1}$ |
| SRH Recombination (highest) | 6.986E22 cm$^{-3}$s$^{-1}$ |
| Total Recombination (highest) | 7.674E24 cm$^{-3}$s$^{-1}$ |
| Electron Lifetime | 1.5E−9 s |
| Hole Lifetime | 1.5E−9 s |

TABLE 12

| Tables of parameters in simulations of FIG. 54a-b & FIG. 61a-e | |
|---|---|
| Material | value $MoS_2$ |
| Bandgap (eV) | 1.8[1] |
| Binding energy (eV) | 0-0.8 |
| Diffusion length (microns) | 0.015-6 |
| Exciton_tau_rad (ns) | 0.022[2,3] |
| Excitom_Tau_nonrad (ns) | 0.002[3,4] |
| Free carrier SRH lifetime (s) | 1.50E−09[5] |
| Free carrier mobility(cm2/Vs) | 60[6] |
| Device length (microns) | 1 |

TABLE 13

| Tables of parameters in simulations of FIG. 54c-d & FIG. 62a-d | |
|---|---|
| Material | value $MoS_2$ |
| Bandgap (eV) | 1.8[1] |
| Binding energy (eV) | 0.24 |
| Diffusion length (microns) | 1.5 |
| Exciton_tau_rad (ns) | 0.0001-10 |
| Excitom_Tau_nonrad (ns) | 0.0001-10 |

TABLE 13-continued

Tables of parameters in simulations of
FIG. 54c-d & FIG. 62a-d

| Material | value MoS$_2$ |
|---|---|
| Free carrier SRH lifetime (s) | 1.50E$-09^5$ |
| Free carrier mobility(cm2/Vs) | $60^6$ |
| Device length (microns) | 1 |

TABLE 14

Tables of parameters in simulations of
FIG. 55a-b & FIG. 63a-b

| Material | value MoS$_2$ |
|---|---|
| Bandgap (eV) | $1.8^1$ |
| Binding energy (eV) | 0.24 |
| Diffusion length (microns) | 1.5 |
| Exciton_tau_rad (ns) | 0.0001-10 |
| Excitom_Tau_nonrad (ns) | 0.0001-10 |
| Free carrier SRH lifetime (s) | 1.50E$-09^5$ |
| Free carrier mobility(cm2/Vs) | $60^6$ |
| Device length (microns) | 1 |

TABLE 15

Figure 63D:
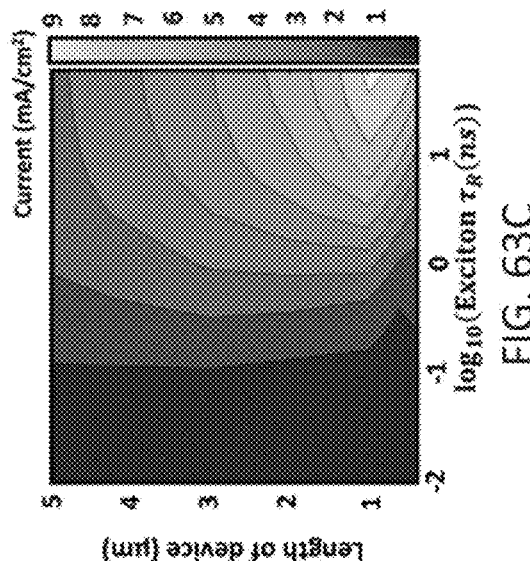

Tables of parameters in simulations
of FIG. 55c & FIG. 63c-d

| Material | value MoS$_2$ |
|---|---|
| Bandgap (eV) | $1.8^1$ |
| Binding energy (eV) | 0.24 |
| Diffusion length (microns) | 1.5 |
| Exciton_tau_rad (ns) | 0.02-12 |
| Excitom_Tau_nonrad (ns) | 0.02-12 |
| Free carrier SRH lifetime (s) | 1.50E$-09^5$ |
| Free carrier mobility(cm2/Vs) | $60^6$ |
| Device length (microns | 0.4-5 |

TABLE 16

Tables of parameters in simulations of FIG. 55d

| Material | value MoS$^2$ |
|---|---|
| Bandgap (eV) | $1.8^1$ |
| Binding energy (eV) | 0.24 |
| Diffusion length (microns) | 1.5 |
| Exciton_tau_rad (ns) | 20 |
| Excitom_Tau_nonrad (ns) | 20 |
| Free carrier SRH lifetime (s) | 1.50E$-09^5$ |
| Free carrier mobility(cm2/Vs) | $60^6$ |
| Device length (microns) | 1 |

TABLE 17

Tables of detailed input of different materials

| Material | MoS$_2$ | MoSe$_2$ | WS$_2$ | WSe$_2$ |
|---|---|---|---|---|
| Bandgap (eV) | $1.8^1$ | $1.6^7$ | $2.04^8$ | $1.65^7$ |
| Binding Energy (eV) | $0.24^9$ | $0.57^{10}$ | $0.32^{11}$ | $0.37^7$ |
| Excitons Diffusion length (microns) | $1.5^{12}$ | $0.4^{13}$ | $0.35^{14}$ | $0.16^{15}$ |
| Exciton_tau_rad (ns) | $8^{12}$ | $0.8^{16}$ | $4.4^{16}$ | $3.5^{16}$ |
| Free carrier mobility(cm2/Vs) | $60^6$ | $480^{13}$ | $1060^{17}$ | $250^{15}$ |
| Free Carrier Lifetime (ns) | $10^{18}$ | $130^{13}$ | $22^{14}$ | $18^{15}$ |

Detailed 3D to 2D Convergence Simulation.

The simulation was based on a 2D model converged from the 3D model, shown in FIG. 64. Initially, a 3D model with larger mesh size was built. Since the third direction duplicates the same structure for times without variation, it has no influence on final results. As shown in FIG. 65, different depths tested by the same 3D model show a same PCE. In this case, the 2D simulation with a default depth of 1 micron can correctly represent the 3D model for any depths.

The 3D model with a larger mesh size can run a single simulation in an hour. However, as further investigation in FIG. 66 shows the results of large mesh size are not reliable. If a smaller mesh size can affect the final results, the current mesh size cannot correctly accurately represent the case. To find a suitable mesh size of the 3D model, a number of simulations was used with smaller mesh sizes. The small mesh size means longer simulation time and heavier computation demand. As we proved the results were not affected by the depth, for some of the small mesh volume, we had to decrease the depth from 1p m to 0.1p m. Still, the simulation of the smallest mesh volume of 2.5E$-12$ $\mu m^3$ took more than 24 hours to finish and reached the software tolerance of maximum vertices.

TABLE 18

Tables of 3D simulation

| Length (μm) | Depth (μm) | Thickness (μm) | Length mesh (μm) | Depth mesh (μm) | Thickness mesh (μm) | mesh volume (μm³) | PCE |
|---|---|---|---|---|---|---|---|
| 1 | 1 | 0.0185 | 0.002 | 0.002 | 0.0005 | 2.00E$-09$ | 1.28% |
| 1 | 1 | 0.0185 | 0.001 | 0.001 | 0.0005 | 5E$-10$ | 1.88% |
| 1 | 1 | 0.0185 | 0.0005 | 0.0005 | 0.00025 | 6.25E$-11$ | 3.79% |
| 1 | 0.1 | 0.0185 | 0.0002 | 0.0002 | 0.00005 | 2E$-12$ | 6.22% |
| 1 | 0.1 | 0.0185 | 0.001 | 0.0001 | 2.5E$-05$ | 2.5E$-12$ | 6.27% |

As the 3D model was not effective to achieve the simulation task, a 2D simulation model was built in Sentaurus. In this software, the default 2D simulation worked as a 3D model with a constant depth of 1 μm, where the depth was not shown on the output. The mesh size of 2D model was optimized to 0.001 μm in length and 0.000025 μm in thickness. As the 0.0185 μm of active layers and insulators was small comparing to the length, a refined mesh size was applied in the direction of thickness. When comparing the 3D simulation and the 2D simulation under the same condition, the 3D simulation with relatively larger mesh lose PCE of 0.2% due to its mesh in the direction of length, shown in Table 19. Even though we did not have exactly same results for both 2D and 3D simulations, the 2D simulation model converged from 3D simulation was valid.

TABLE 19

| Comparison of 2D simulation and 3D simulation with smallest mesh size | | | |
|---|---|---|---|
| | Length mesh (μm) | Depth mesh (μm) | Thickness mesh (μm) | PCE |
| 3D simulation | 0.01 | 0.001 | 0.000025 | 6.38% |
| 2D simulation | 0.001 | | 0.000025 | 6.58% |

Aspects

The following Aspects are illustrative only and do not limit the scope of the present disclosure or the appended claims.

Aspect 1. A component, comprising: a first region that has a thickness and comprises one or more repeat units, a repeat unit comprising a portion of a van der Waals material (vdW) superposed on a portion of dielectric spacer, the vdW being a monolayer or being few-layer (e.g. from 2 to 10 layers) in nature, the vdW and dielectric spacer of a repeat unit being arranged to define a superlattice.

Aspect 2. The component of Aspect 1, further comprising N repeat units superposed on one another, N optionally ranging from 1 to 10, or from 1 to 8, or from 1 to 5, or from 1 to 3, the component optionally configured such the vdW and/or the dielectric spacer of the N-th repeat unit differs from the vdW and/or the dielectric spacer of the (N+1)-th repeat unit.

Aspect 3. The component of any one of Aspects 1-2, wherein the transition metal dichalcogenide comprises one or more of $WS_2$, $MoS_2$, $MoSe_2$, $MoTe_2$, $ReS_2$, $SnS$, $InSe$, $In_2Se_3$, $WTe_2$,$PtSe_2$, $NbSe_2$ or any combination thereof.

Aspect 4. The component of any one of Aspects 1-3, wherein the vdW portion has a thickness of from about 1.5 to about 40 nm.

Aspect 5. The component of any one of Aspects 1-4, wherein the dielectric spacer comprises one or more of h-BN, $Al_2O_3$, $TiO_2$, $HfO_2$, or any combination thereof.

Aspect 6. The component of any one of Aspects 1-5, wherein dielectric spacer has a thickness of from about 1 to about 5 nm.

Aspect 7. The component of any one of Aspects 1-6, wherein the one or more repeat units are superposed over a bottom support, the bottom support optionally comprising $Al_2O_3$, hBN, $HfO_2$, $SiO_2$, or $TiO_2$ and the bottom support optionally having a thickness in the range of from about 5 to about 100 nm.

Aspect 8. The component of any one of Aspects 1-7, further comprising a reflector over which the one or more repeat units are superposed.

Aspect 9. The component of Aspect 8, wherein the reflector comprises gold, silver, platinum, or titanium. A reflector is not a requirement, however, as a transparent substrate such as $SiO_2$, Si, or sapphire can be used instead of a reflector. The disclosed structures can be fabricated on flexible substrates.

Aspect 10. The component of any one of Aspects 1-9, wherein the component comprises a second region, (i) the second region comprising at least two repeat units, and (ii) the second region being laterally separated from the first region.

Aspect 11. The component of Aspect 10, wherein the component comprises a plurality of regions of repeat units, the regions being arranged in a lateral pattern, and each region having a thickness that comprises one or more repeat units. A pattern can include, squares, rectangles, or other polygons. A pattern can also include circles, ovals, and other non-polygonal shapes. A pattern can include repeating shapes or sets of shapes. A unit (e.g., a square) within a pattern can be separated from adjacent units by from about 1 nm to about 1 cm, from about 10 nm to about 0.1 cm, from about 100 nm to about 1 mm, from about 1 μm to about 0.5 mm, or even from about 10 μm to about 0.1 mm. A unit (e.g., a square) within a pattern can have a cross-sectional dimension (e.g., width) of from about 1 nm to about 1 cm, from about 10 nm to about 0.1 cm, from about 100 nm to about 1 mm, from about 1 μm to about 0.5 mm, or even from about 10 μm to about 0.1 mm.

Aspect 12. The component of any one of Aspects 1-11, further comprising a voltage source in electrical communication with the one or more repeat units, the voltage source optionally being variable.

Aspect 13. The component of any one of Aspects 1-12, wherein the component is operable to achieve greater than 270° phase modulation of illumination directed normal to the component.

Aspect 14. The component of Aspect 13, wherein the component is operable to achieve about 360° phase modulation of illumination directed normal to the component.

Aspect 15. The component of any one of Aspects 1-14, wherein the component is operable to exhibit a peak absorptance of a wavelength in the visible range (from 400 nm to 700 nm), in the near infrared (up to 2000 nm), and/or in the ultraviolet (from 200 to 400 nm) of from about 0.7 to about 0.95. A component can be figured (e.g., by material selection) so as to extend the wavelength into the near infrared and into the UV to cover the full UV-vis-IR range Aspect 16. The component of any one of Aspects 1-15, wherein the component is operable to exhibit a peak absorbance of from about 0.25 to about 0.92 absorbance units per nm thickness of the first region. The component can be operable to exhibit a peak absorbance of about 10 dB/nm. Without being bound to any particular theory or embodiment, this effectiveness (in terms of absorbance per nm thickness) is unexpectedly superior to existing approaches and materials.

Aspect 17. The component of any one of Aspects 1-16, wherein the component is operable to modulate the power of an illumination directed normal to the component by up to about 35 dB, e.g., from about 5 to about 35 dB, from about 10 to about 30 dB, from about 15 to about 25 dB, or even about 20 dB.

Aspect 18. The component of any one of Aspects 1-17, wherein the component is operable to deflect incident illumination by up to about 90°.

Aspect 19. The component of any of Aspects 1-18, wherein the component forms an electro-optic modulator or a photovoltaic device.

Aspect 20. A method, comprising operating and/or assembling a component according to any one of Aspects 1-18.

Aspect 21. The method of Aspect 20, wherein the method is performed so as to modulate transmission of a signal.

Aspect 22. The method of any one of Aspects 20-21, wherein the method comprises applying a voltage to the component.

Aspect 23. The method of any one of Aspects 20-22, wherein the method is performed so as to modulate a phase of an illumination applied to the component.

Aspect 24. The method of any one of Aspects 20-23, wherein the method is performed so as to at least: modulate an amplitude of an illumination applied to the component and/or deflect an illumination applied to the component.

Aspect 25. An electro-absorption modulator, comprising: a substrate forming at least one well; a superlattice layer provided on the substrate, the superlattice layer comprising a plurality of monolayers, wherein each monolayer further comprises excitons coupled to surface plasmons; and a set of electrical contacts establishing electrical communication between a first monolayer of the plurality, and a second monolayer of the plurality. A superlattice layer can be as described elsewhere herein, e.g., comprising a portion of a van der Waals material (vdW) superposed on a portion of dielectric spacer.

Aspect 26. The electro-absorption modulator of Aspect 24, wherein the substrate is at least one of: Ag or $SiO_2$.

Aspect 27. The electro-absorption modulator of any of Aspects 25-26, having a linear footprint of less than about 1 micrometer, e.g., less than about 900 nm, less than about 800 nm, less than about 700 nm, less than about 600 nm, less than about 500 nm, or even less than about 400 nm or less.

Aspect 28. A photovoltaic structure comprising: a reflective substrate; and a stack of repeating monolayers provided on the reflective substrate, and laterally positioned between an anode and a cathode, wherein each monolayer comprises an absorber and an insulator. A monolayer can comprise, e.g., a superlattice layer can be as described elsewhere herein, e.g., comprising a portion of a van der Waals material (vdW) superposed on a portion of dielectric spacer.

Aspect 29. The photovoltaic structure of Aspect 28, wherein each monolayer comprises a two-dimensional metal dichalcogenide (TMDC) material.

Aspect 30. The photovoltaic device of any of Aspects 28-29, having a power conversion efficiency greater than 9%.

REFERENCES (FIGS. 48-52)

1. D. A. B. Miller, "Attojoule Optoelectronics for Low-Energy Information Processing and Communications," J. Light. Technol. 35(3), 346-396 (2017).
2. D. A. B. Miller, "Device Requirements for Optical Interconnects to Silicon Chips," Proc. IEEE 97(7), 1166-1185 (2009).
3. U. Jeong, K. Kim, K. Lee, and J. H. Park, "A compact and low-driving-voltage silicon electro-absorption modulator utilizing a Schottky diode operating up to 13.2 GHz in C-band," Jpn. J. Appl. Phys. 59(12), 122001 (2020).
4. M. Alaloul, J. B. Khurgin, I. Al-Ani, K. As'ham, L. Huang, H. T. Hattori, and A. E. Miroshnichenko, "On-chip low-loss all-optical MoSe2 modulator," Opt. Lett. 47(15), 3640-3643 (2022).
5. R. Amin, J. K. George, S. Sun, T. Ferreira de Lima, A. N. Tait, J. B. Khurgin, M. Miscuglio, B. J. Shastri, P. R. Prucnal, T. El-Ghazawi, and V. J. Sorger, "ITO-based electro-absorption modulator for photonic neural activation function," APL Mater. 7(8), 081112 (2019).
6. S. Zhu, G. Q. Lo, and D. L. Kwong, "Design of an ultra-compact electro-absorption modulator comprised of a deposited TiN/HfO2/ITO/Cu stack for CMOS backend integration," Opt. Express 22(15), 17930-17947 (2014).
7. M. H. Tahersima, Z. Ma, Y. Gui, S. Sun, H. Wang, R. Amin, H. Dalir, R. Chen, M. Miscuglio, and V. J. Sorger, "Coupling-enhanced dual ITO layer electro-absorption modulator in silicon photonics," Nanophotonics 8(9), 1559-1566 (2019).
8. Y. Kim and M.-S. Kwon, "Electroabsorption modulator based on inverted-rib-type silicon waveguide including double graphene layers," J. Opt. 19(4), 045804 (2017).
9. Z. Ma, M. H. Tahersima, S. Khan, and V. J. Sorger, "Two-Dimensional Material-Based Mode Confinement Engineering in Electro-Optic Modulators," IEEE J. Sel. Top. Quantum Electron. 23(1), 81-88 (2017).
10. P. Chaisakul, D. Marris-Morini, M.-S. Rouifed, G. Isella, D. Chrastina, J. Frigerio, X. L. Roux, S. Edmond, J.-R. Coudevylle, and L. Vivien, "23 GHz Ge/SiGe multiple quantum well electro-absorption modulator," Opt. Express 20(3), 3219-3224 (2012).
11. C. Y. Ngo, S. F. Yoon, W. K. Loke, Q. Cao, D. R. Lim, V. Wong, Y. K. Sim, and S. J. Chua, "Investigation of Semiconductor Quantum Dots for Waveguide Electroabsorption Modulator," Nanoscale Res. Lett. 3(12), 486-490 (2008).
12. S. Joshi and B. K. Kaushik, "Transition metal dichalcogenides integrated waveguide modulator and attenuator in silicon nitride platform," Nanotechnology 31(43), 435202 (2020).
13. C. F. Doiron, J. B. Khurgin, and G. V. Naik, "Super-Mossian Dielectrics for Nanophotonics," Adv. Opt. Mater. 10(22), 2201084 (2022).
14. J. B. Khurgin, "Expanding the Photonic Palette: Exploring High Index Materials," ACS Photonics 9(3), 743-751 (2022).
15. H. Ling, J. B. Khurgin, and A. R. Davoyan, "Atomic-Void van der Waals Channel Waveguides," Nano Lett. 22(15), 6254-6261 (2022).
16. H. Ling, R. Li, and A. R. Davoyan, "All van der Waals Integrated Nanophotonics with Bulk Transition Metal Dichalcogenides," ACS Photonics 8(3), 721-730 (2021).
17. H. Zhang, B. Abhiraman, Q. Zhang, J. Miao, K. Jo, S. Roccasecca, M. W. Knight, A. R. Davoyan, and D. Jariwala, "Hybrid exciton-plasmon-polaritons in van der Waals semiconductor gratings," Nat. Commun. 11(1), 3552 (2020).
18. L. Lackner, M. Dusel, O. A. Egorov, B. Han, H. Knopf, F. Eilenberger, S. Schroder, K. Watanabe, T. Taniguchi, S. Tongay, C. Anton-Solanas, S. Hofling, and C. Schneider, "Tunable exciton-polaritons emerging from $WS_2$ monolayer excitons in a photonic lattice at room temperature," Nat. Commun. 12(1), 4933 (2021).
19. S. A. Maier, Plasmonics: Fundamentals and Applications (Springer US, 2007).
20. P. Kumar, J. Lynch, B. Song, H. Ling, F. Barrera, K. Kisslinger, H. Zhang, S. B. Anantharaman, J. Digani, H. Zhu, T. H. Choudhury, C. McAleese, X. Wang, B. R.

47

Conran, O. Whear, M. J. Motala, M. Snure, C. Muratore, J. M. Redwing, N. R. Glavin, E. A. Stach, A. R. Davoyan, and D. Jariwala, "Light-matter coupling in large-area van der Waals superlattices," Nat. Nanotechnol. 17(2), 182-189 (2022).

21. Y. Yu, Y. Yu, L. Huang, H. Peng, L. Xiong, L. Cao, "Giant Gating Tunability of Optical Refractive Index in Transition Metal Dichalcogenide Monolayers," Nano Lett. 17(6), 3613-3618 (2017).

22. A. Chernikov, A. M. van der Zande, H. M. Hill, A. F. Rigosi, A. Velauthapillai, J. Hone, and T. F. Heinz, "Electrical Tuning of Exciton Binding Energies in Monolayer WS 2," Phys. Rev. Lett. 115(12), 126802 (2015).

23. M. Fox, Quantum Optics: An Introduction, Oxford Master Series in Physics No. 15 (Oxford University Press, 2006).

24. L. C. Andreani, G. Panzarini, and J.-M. Gerard, "Strong-coupling regime for quantum boxes in pillar microcavities: Theory," Phys. Rev. B 60(19), 13276-13279 (1999).

25. J. P. Reithmaier, G. Sek, A. Loffler, C. Hofmann, S. Kuhn, S. Reitzenstein, L. V. Keldysh, V. D. Kulakovskii, T. L. Reinecke, and A. Forchel, "Strong coupling in a single quantum dot-semiconductor microcavity system," Nature 432(7014), 197-200 (2004).

26. A. Armitage, M. S. Skolnick, A. V. Kavokin, D. M. Whittaker, V. N. Astratov, G. A. Gehring, and J. S. Roberts, "Polariton-induced optical asymmetry in semiconductor microcavities," Phys. Rev. B 58(23), 15367-15370 (1998).

27. S. Dufferwiel, S. Schwarz, F. Withers, A. a. P. Trichet, F. Li, M. Sich, O. Del Pozo-Zamudio, C. Clark, A. Nalitov, D. D. Solnyshkov, G. Malpuech, K. S. Novoselov, J. M. Smith, M. S. Skolnick, D. N. Krizhanovskii, and A. I. Tartakovskii, "Exciton-polaritons in van der Waals heterostructures embedded in tunable microcavities," Nat. Commun. 6(1), 8579 (2015).

28. "Surface plasmon resonance in a glass/silver/air slab," https://optics.ansys.com/hc/en-us/articles/360042160673-Surface-plasmon-resonance-in-a-glass-silver-air-slab.

29. "Calculating absorbed optical power—Simple method," https://optics.ansys.com/hc/en-us/articles/360034915673-Calculating-absorbed-optical-power-Simple-method.

30. Y. Meng, T. Wang, C. Jin, Z. Li, S. Miao, Z. Lian, T. Taniguchi, K. Watanabe, F. Song, and S.-F. Shi, "Electrical switching between exciton dissociation to exciton funneling in MoSe2/WS2 heterostructure," Nat. Commun. 11(1), 2640 (2020).

31. D. Ovchinnikov, A. Allain, Y.-S. Huang, D. Dumcenco, and A. Kis, "Electrical Transport Properties of Single-Layer WS2," ACS Nano 8(8), 8174-8181 (2014).

32. S. Luryi, "Quantum capacitance devices," Appl. Phys. Lett. 52(6), 501-503 (1988).

33. R. Hao, W. Du, H. Chen, X. Jin, L. Yang, and E. Li, "Ultra-compact optical modulator by graphene induced electro-refraction effect," Appl. Phys. Lett. 103(6), 061116 (2013).

34. C. Zhang, L. Cheng, and Y. Liu, "Understanding high-field electron transport properties and strain effects of monolayer transition metal dichalcogenides," Phys. Rev. B 102(11), 115405 (2020).

REFERENCES (FIGS. 53-60)

(1) Efaz, E. T.; Rhaman, M. M.; Imam, S. A.; Bashar, K. L.; Kabir, F.; Mourtaza, M. D. E.; Sakib, S. N.; Mozahid, F.

48

A. A review of primary technologies of thin-film solar cells. Engineering Research Express 2021, 3 (3), 032001. DOI: 10.1088/2631-8695/ac2353.

(2) Reese, M. O.; Glynn, S.; Kempe, M. D.; McGott, D. L.; Dabney, M. S.; Barnes, T. M.; Booth, S.; Feldman, D.; Haegel, N. M. Increasing markets and decreasing package weight for high-specific-power photovoltaics. Nature Energy 2018, 3 (11), 1002-1012. DOI: 10.1038/s41560-018-0258-1.

(3) Mathews, I.; Kantareddy, S. N.; Buonassisi, T.; Peters, I. M. Technology and Market Perspective for Indoor Photovoltaic Cells. Joule 2019, 3 (6), 1415-1426. DOI: https://doi.org/10.1016/j.joule.2019.03.026.

(4) Sampaio, P. G. V.; Gonzilez, M. O. A. A review on organic photovoltaic cell. International Journal of Energy Research 2022, 46 (13), 17813-17828. DOI: https://doi.org/10.1002/er.8456.

(5) Li, Y.; Wang, L.; Qiao, Y.; Gan, Y.; Singh, D. J. Prediction of ternary alkaline-earth metal Sn(II) and Pb(II) chalcogenide semiconductors. Physical Review Materials 2020, 4 (5), 055004. DOI: 10.1103/PhysRevMaterials.4.055004.

(6) Hou, Y.; Wu, C.; Yang, D.; Ye, T.; Honavar, V. G.; Duin, A. C. T. v.; Wang, K.; Priya, S. Two-dimensional hybrid organic-inorganic perovskites as emergent ferroelectric materials. Journal of Applied Physics 2020, 128 (6), 060906. DOI: 10.1063/5.0016010.

(7) Kang, K.; Lee, K.-H.; Han, Y.; Gao, H.; Xie, S.; Muller, D. A.; Park, J. Layer-by-layer assembly of two-dimensional materials into wafer-scale heterostructures. Nature 2017, 550 (7675), 229-233. DOI: 10.1038/nature23905.

(8) Laturia, A.; Van de Put, M. L.; Vandenberghe, W. G. Dielectric properties of hexagonal boron nitride and transition metal dichalcogenides: from monolayer to bulk. npj 2D Materials and Applications 2018, 2 (1), 6. DOI: 10.1038/s41699-018-0050-x.

(9) Amani, M.; Lien, D.-H.; Kiriya, D.; Xiao, J.; Azcatl, A.; Noh, J.; Madhvapathy, S. R.; Addou, R.; Kc, S.; Dubey, M.; et al. Near-unity photoluminescence quantum yield in MoS$_2$. Science 2015, 350 (6264), 1065-1068. DOI: 10.1126/science.aad2114 PubMed.

(10) Wang, L.; Huang, L.; Tan, W. C.; Feng, X.; Chen, L.; Huang, X.; Ang, K.-W. 2D Photovoltaic Devices: Progress and Prospects. Small Methods 2018, 2 (3), 1700294. DOI: https://doi.org/10.1002/smtd.201700294.

(11) Jariwala, D.; Davoyan, A. R.; Wong, J.; Atwater, H. A. Van der Waals Materials for Atomically-Thin Photovoltaics: Promise and Outlook. ACS Photonics 2017, 4 (12), 2962-2970. DOI: 10.1021/acsphotonics.7b01103.

(12) Akama, T.; Okita, W.; Nagai, R.; Li, C.; Kaneko, T.; Kato, T. Schottky solar cell using few-layered transition metal dichalcogenides toward large-scale fabrication of semitransparent and flexible power generator. Sci Rep 2017, 7 (1), 11967. DOI: 10.1038/s41598-017-12287-6 From NLM PubMed-not-MEDLINE.

(13) Li, H. M.; Lee, D.; Qu, D.; Liu, X.; Ryu, J.; Seabaugh, A.; Yoo, W. J. Ultimate thin vertical p-n junction composed of two-dimensional layered molybdenum disulfide. Nat Commun 2015, 6, 6564. DOI: 10.1038/ncomms7564 From NLM PubMed-not-MEDLINE.

(14) Nassiri Nazif, K.; Kumar, A.; Hong, J.; Lee, N.; Islam, R.; McClellan, C. J.; Karni, O.; van de Groep, J.; Heinz, T. F.; Pop, E.; et al. High-Performance p-n Junction Transition Metal Dichalcogenide Photovoltaic Cells Enabled by MoOx Doping and Passivation. Nano Lett 2021, 21 (8), 3443-3450. DOI: 10.1021/acs.nanolett.1c00015 From NLM PubMed-not-MEDLINE.

(15) Lin, S.; Li, X.; Wang, P.; Xu, Z.; Zhang, S.; Zhong, H.; Wu, Z.; Xu, W.; Chen, H. Interface designed MoS2/GaAs heterostructure solar cell with sandwich stacked hexagonal boron nitride. Scientific Reports 2015, 5 (1), 15103. DOI: 10.1038/srep15103.

(16) Hussain, S.; Shaikh, S. F.; Vikraman, D.; Mane, R. S.; Joo, O.-S.; Naushad, M.; Jung, J. Sputtering and sulfurization-combined synthesis of a transparent WS2 counter electrode and its application to dye-sensitized solar cells. RSC Advances 2015, 5 (125), 103567-103572, 10.1039/C5RA18613G. DOI: 10.1039/C5RA18613G.

(17) Kumar, P.; Lynch, J.; Song, B.; Ling, H.; Barrera, F.; Kisslinger, K.; Zhang, H.; Anantharaman, S. B.; Digani, J.; Zhu, H.; et al. Light-matter coupling in large-area van der Waals superlattices. Nat Nanotechnol 2022, 17 (2), 182-189. DOI: 10.1038/s41565-021-01023-x From NLM PubMed-not-MEDLINE.

(18) Castellanos-Gomez, A.; Barkelid, M.; Goossens, A. M.; Calado, V. E.; van der Zant, H. S.; Steele, G. A. Laser-thinning of MoS(2): on demand generation of a single-layer semiconductor. Nano Lett 2012, 12 (6), 3187-3192. DOI: 10.1021/nl301164v From NLM Medline.

(19) Cai, L.; McClellan, C. J.; Koh, A. L.; Li, H.; Yalon, E.; Pop, E.; Zheng, X. Rapid Flame Synthesis of Atomically Thin MoO3 down to Monolayer Thickness for Effective Hole Doping of WSe2. Nano Letters 2017, 17 (6), 3854-3861. DOI: 10.1021/acs.nanolett.7b01322.

(20) Roy, S.; Bermel, P. Tungsten-Disulfide-Based Ultrathin Solar Cells for Space Applications. IEEE Journal of Photovoltaics 2022, 12 (5), 1184-1191. DOI: 10.1109/JPHOTOV.2022.3179986.

(21) Roy, S.; Hu, Z.; Kais, S.; Bermel, P. Enhancement of Photovoltaic Current through Dark States in Donor-Acceptor Pairs of Tungsten-Based Transition Metal Di-Chalcogenides. Advanced Functional Materials 2021, 31 (23), 2100387. DOI: https://doi.org/10.1002/adfm.202100387.

(22) Khan, M. A. U.; Adesina, N. O.; Xu, J. Near Unity Absorbance and Photovoltaic Properties of TMDC/Gold Heterojunction for Solar Cell Application. Key Engineering Materials 2022, 918, 97-105. DOI: 10.4028/p-uz62m4.

(23) Classen, A.; Chochos, C. L.; Luer, L.; Gregoriou, V. G.; Wortmann, J.; Osvet, A.; Forberich, K.; McCulloch, I.; Heumtiller, T.; Brabec, C. J. The role of exciton lifetime for charge generation in organic solar cells at negligible energy-level offsets. Nature Energy 2020, 5 (9), 711-719. DOI: 10.1038/s41560-020-00684-7.

(24) Kirchartz, T.; Rau, U. Charge separation in excitonic and bipolar solar cells—A detailed balance approach. Thin Solid Films 2008, 516 (20), 7144-7148. DOI: https://doi.org/10.1016/j.tsf.2007.12.084.

(25) Kirchartz, T.; Mattheis, J.; Rau, U. Detailed balance theory of excitonic and bulk heterojunction solar cells. Physical Review B 2008, 78 (23), 235320. DOI: 10.1103/PhysRevB.78.235320.

(26) Bisquert, J.; Garcia-Belmonte, G. On Voltage, Photovoltage, and Photocurrent in Bulk Heterojunction Organic Solar Cells. The Journal of Physical Chemistry Letters 2011, 2 (15), 1950-1964. DOI: 10.1021/jz2004864.

(27) Bisquert, J. The physics of solar cells: perovskites, organics, and photovoltaic fundamentals; CRC press, 2017.

(28) Savoie, B. M.; Rao, A.; Bakulin, A. A.; Gelinas, S.; Movaghar, B.; Friend, R. H.; Marks, T. J.; Ratner, M. A. Unequal Partnership: Asymmetric Roles of Polymeric Donor and Fullerene Acceptor in Generating Free Charge. Journal of the American Chemical Society 2014, 136 (7), 2876-2884. DOI: 10.1021/ja411859m.

(29) Saigal, N.; Sugunakar, V.; Ghosh, S. Exciton binding energy in bulk MoS2: A reassessment. Applied Physics Letters 2016, 108 (13), 132105. DOI: 10.1063/1.4945047.

(30) Hill, H. M.; Rigosi, A. F.; Roquelet, C.; Chernikov, A.; Berkelbach, T. C.; Reichman, D. R.; Hybertsen, M. S.; Brus, L. E.; Heinz, T. F. Observation of Excitonic Rydberg States in Monolayer MoS2 and WS2 by Photoluminescence Excitation Spectroscopy. Nano Letters 2015, 15 (5), 2992-2997. DOI: 10.1021/nl504868p.

(31) Bryant, G. W. Excitons in quantum boxes: Correlation effects and quantum confinement. Physical Review B 1988, 37 (15), 8763-8772. DOI: 10.1103/PhysRevB.37.8763.

(32) Wang, K.; Paulus, B. Tuning the binding energy of excitons in the MoS2 monolayer by molecular functionalization and defective engineering. Phys Chem Chem Phys 2020, 22 (21), 11936-11942. DOI: 10.1039/dOcp01239d From NLM PubMed-not-MEDLINE.

(33) Li, Z.; Xiao, Y.; Gong, Y.; Wang, Z.; Kang, Y.; Zu, S.; Ajayan, P. M.; Nordlander, P.; Fang, Z. Active Light Control of the MoS2 Monolayer Exciton Binding Energy. ACS Nano 2015, 9 (10), 10158-10164. DOI: 10.1021/acsnano.5b03764.

(34) Raja, A.; Chaves, A.; Yu, J.; Arefe, G.; Hill, H. M.; Rigosi, A. F.; Berkelbach, T. C.; Nagler, P.; Schuller, C.; Kom, T.; et al. Coulomb engineering of the bandgap and excitons in two-dimensional materials. Nature Communications 2017, 8 (1), 15251. DOI: 10.1038/ncomms15251.

(35) Luhman, W. A.; Holmes, R. J. Investigation of Energy Transfer in Organic Photovoltaic Cells and Impact on Exciton Diffusion Length Measurements. Advanced Functional Materials 2011, 21 (4), 764-771. DOI: https://doi.org/10.1002/adfm.201001928.

(36) Uddin, S. Z.; Kim, H.; Lorenzon, M.; Yeh, M.; Lien, D. H.; Barnard, E. S.; Htoon, H.; Weber-Bargioni, A.; Javey, A. Neutral Exciton Diffusion in Monolayer MoS2. ACS Nano 2020, 14 (10), 13433-13440. DOI: 10.1021/acsnano.0c05305 From NLM PubMed-not-MEDLINE.

(37) Yamada, T.; Yamada, Y.; Nakaike, Y.; Wakamiya, A.; Kanemitsu, Y. Photon Emission and Reabsorption Processes in ${\mathrm{CH}}_{3}$ ${\mathrm{NH}}_{3}$ ${\mathrm{PbBr}}$ _{3}$ Single Crystals Revealed by Time-Resolved Two-Photon-Excitation Photoluminescence Microscopy. Physical Review Applied 2017, 7 (1), 014001. DOI: 10.1103/PhysRevApplied.7.014001.

(38) Park, S.; Mutz, N.; Schultz, T.; Blumstengel, S.; Han, A.; Aljarb, A.; Li, L.-J.; List-Kratochvil, E. J. W.; Amsalem, P.; Koch, N. Direct determination of monolayer MoS2 and WSe2 exciton binding energies on insulating and metallic substrates. 2D Materials 2018, 5 (2), 025003. DOI: 10.1088/2053-1583/aaa4ca.

(39) Lien, D.-H.; Uddin, S. Z.; Yeh, M.; Amani, M.; Kim, H.; Ager, J. W.; Yablonovitch, E.; Javey, A. Electrical suppression of all nonradiative recombination pathways in monolayer semiconductors. Science 2019, 364 (6439), 468-471. DOI: doi:10.1126/science.aaw8053.

(40) Wang, H.; Zhang, C.; Chan, W.; Manolatou, C.; Tiwari, S.; Rana, F. Radiative lifetimes of excitons and trions in monolayers of the metal dichalcogenideMoS2. Physical Review B 2016, 93 (4). DOI: 10.1103/Phys-RevB.93.045407.

(41) Kim, H.; Lien, D.-H.; Amani, M.; Ager, J. W.; Javey, A. Highly Stable Near-Unity Photoluminescence Yield in Monolayer MoS2 by Fluoropolymer Encapsulation and Superacid Treatment. ACS Nano 2017, 11 (5), 5179-5185. DOI: 10.1021/acsnano.7b02521.

(42) Palummo, M.; Bernardi, M.; Grossman, J. C. Exciton radiative lifetimes in two-dimensional transition metal dichalcogenides. Nano Lett 2015, 15 (5), 2794-2800. DOI: 10.1021/nl503799t From NLM Medline.

(43) Kim, T.; Fan, S.; Lee, S.; Joo, M. K.; Lee, Y. H. High-mobility junction field-effect transistor via graphene/MoS2 heterointerface. Sci Rep 2020, 10 (1), 13101. DOI: 10.1038/s41598-020-70038-6 From NLM PubMed-not-MEDLINE.

(44) Liu, H.; Neal, A. T.; Ye, P. D. Channel Length Scaling of MoS2 MOSFETs. ACS Nano 2012, 6 (10), 8563-8569. DOI: 10.1021/nn303513c.

(45) Rai, A.; Valsaraj, A.; Movva, H. C. P.; Roy, A.; Tutuc, E.; Register, L. F.; Banerjee, S. K. Interfacial-oxygen-vacancy mediated doping of MoS2 by high-κ dielectrics. In 2015 73rd Annual Device Research Conference (DRC), 21-24 Jun. 2015, 2015; pp 189-190. DOI: 10.1109/DRC.2015.7175626.

(46) Choi, Y.; Kim, H.; Yang, J.; Shin, S. W.; Um, S. H.; Lee, S.; Kang, M. S.; Cho, J. H. Proton-Conductor-Gated MoS2 Transistors with Room Temperature Electron Mobility of >100 cm2 V−1 s−1. Chemistry of Materials 2018, 30 (14), 4527-4535. DOI: 10.1021/acs.chemmater.8b00568.

(47) Ratan, A.; Kunchakara, S.; Dutt, M.; Tripathi, A.; Singh, V. 100 MeV Silicon9+ swift heavy ion irradiation—Strategic defect annealing approach to enhance the electrical conductivity of few-layered MoS2 sheets—PVA nanocomposite film. Vacuum 2019, 169, 108939. DOI: https://doi.org/10.1016/j.vacuum.2019.108939.

(48) Salehzadeh, O.; Tran, N. H.; Liu, X.; Shih, I.; Mi, Z. Exciton kinetics, quantum efficiency, and efficiency droop of monolayer MoS(2) light-emitting devices. Nano Lett 2014, 14 (7), 4125-4130. DOI: 10.1021/nl5017283 From NLM PubMed-not-MEDLINE.

(49) He, K.; Kumar, N.; Zhao, L.; Wang, Z.; Mak, K. F.; Zhao, H.; Shan, J. Tightly Bound Excitons in Monolayer ${\mathrm{WSe}}_{2}$. Physical Review Letters 2014, 113 (2), 026803. DOI: 10.1103/PhysRevLett.113.026803.

(50) Cheng, G.; Li, B.; Zhao, C.; Jin, Z.; Li, H.; Lau, K. M.; Wang, J. Exciton aggregation induced photoluminescence enhancement of monolayer WS2. Applied Physics Letters 2019, 114 (23), 232101. DOI: 10.1063/1.5096206.

(51) Ugeda, M. M.; Bradley, A. J.; Shi, S.-F.; da Jornada, F. H.; Zhang, Y.; Qiu, D. Y.; Ruan, W.; Mo, S.-K.; Hussain, Z.; Shen, Z.-X.; et al. Giant bandgap renormalization and excitonic effects in a monolayer transition metal dichalcogenide semiconductor. Nature Materials 2014, 13 (12), 1091-1095. DOI: 10.1038/nmat4061.

(52) Huo, N.; Yang, Y.; Wu, Y. N.; Zhang, X. G.; Pantelides, S. T.; Konstantatos, G. High carrier mobility in monolayer CVD-grown MoS2 through phonon suppression. Nanoscale 2018, 10 (31), 15071-15077. DOI: 10.1039/c8nr04416c From NLM PubMed-not-MEDLINE.

(53) Kumar, N.; Cui, Q.; Ceballos, F.; He, D.; Wang, Y.; Zhao, H. Exciton diffusion in monolayer and bulk MoSe2. Nanoscale 2014, 6 (9), 4915-4919, 10.1039/C3NR06863C. DOI: 10.1039/C3NR06863C.

(54) Rawat, A.; Jena, N.; Dimple; De Sarkar, A. A comprehensive study on carrier mobility and artificial photosynthetic properties in group VI B transition metal dichalcogenide monolayers. Journal of Materials Chemistry A 2018, 6 (18), 8693-8704, 10.1039/C8TA01943F. DOI: 10.1039/C8TA01943F.

(55) Cui, Q.; Ceballos, F.; Kumar, N.; Zhao, H. Transient Absorption Microscopy of Monolayer and Bulk WSe2. ACS Nano 2014, 8 (3), 2970-2976. DOI: 10.1021/nn500277y.

(56) Wong, J.; Jariwala, D.; Tagliabue, G.; Tat, K.; Davoyan, A. R.; Sherrott, M. C.; Atwater, H. A. High Photovoltaic Quantum Efficiency in Ultrathin van der Waals Heterostructures. ACS Nano 2017, 11 (7), 7230-7240. DOI: 10.1021/acsnano.7b03148.

(57) Yang, S.; Cha, J.; Kim, J. C.; Lee, D.; Huh, W.; Kim, Y.; Lee, S. W.; Park, H.-G.; Jeong, H. Y.; Hong, S.; et al. Monolithic Interface Contact Engineering to Boost Optoelectronic Performances of 2D Semiconductor Photovoltaic Heterojunctions. Nano Letters 2020, 20 (4), 2443-2451. DOI: 10.1021/acs.nanolett.9b05162.

(58) Shanmugam, M.; Durcan, C. A.; Yu, B. Layered semiconductor molybdenum disulfide nanomembrane based Schottky-barrier solar cells. Nanoscale 2012, 4 (23), 7399-7405, 10.1039/C2NR32394J. DOI: 10.1039/C2NR32394J.

(59) Wi, S.; Kim, H.; Chen, M.; Nam, H.; Guo, L. J.; Meyhofer, E.; Liang, X. Enhancement of Photovoltaic Response in Multilayer MoS2 Induced by Plasma Doping. ACS Nano 2014, 8 (5), 5270-5281. DOI: 10.1021/nn5013429.

(60) Lin, S Nazif, K.; Daus, A.; Hong, J.; Lee, N.; Vaziri, S.; Kumar, A.; Nitta, F.; Chen, M. E.; Kananian, S.; Islam, R.; et al. High-specific-power flexible transition metal dichalcogenide solar cells. Nat Commun 2021, 12 (1), 7034. DOI: 10.1038/s41467-021-27195-7 From NLM PubMed-not-MEDLINE.

(61) Ulaganathan, R. K.; Yadav, K.; Sankar, R.; Chou, F. C.; Chen, Y.-T. Hybrid InSe Nanosheets and MoS2 Quantum Dots for High-Performance Broadband Photodetectors and Photovoltaic Cells. Advanced Materials Interfaces 2019, 6 (2), 1801336. DOI: https://doi.org/10.1002/admi.201801336.

(62) Chen, Z.; Liu, H.; Chen, X.; Chu, G.; Chu, S.; Zhang, H. Wafer-Size and Single-Crystal MoSe2 Atomically Thin Films Grown on GaN Substrate for Light Emission and Harvesting. ACS Applied Materials & Interfaces 2016, 8 (31), 20267-20273. DOI: 10.1021/acsami.6b04768.

(63) Tsai, M.-L.; Li, M.-Y.; Retamal, J. R. D.; Lam, K.-T.; Lin, Y.-C.; Suenaga, K.; Chen, L.-J.; Liang, G.; Li, L.-J.; He, J.-H. Single Atomically Sharp Lateral Monolayer p-n Heterojunction Solar Cells with Extraordinarily High Power Conversion Efficiency. Advanced Materials 2017, 29 (32), 1701168. DOI: https://doi.org/10.1002/adma.201701168.

(64) Kwak, D.-H.; Ra, H.-S.; Jeong, M.-H.; Lee, A.-Y.; Lee, J.-S. High-Performance Photovoltaic Effect with Electrically Balanced Charge Carriers in Black Phosphorus and WS2 Heterojunction. Advanced Materials Interfaces 2018, 5 (18), 1800671. DOI: https://doi.org/10.1002/admi.201800671.

(65) Went, C. M.; Wong, J.; Jahelka, P. R.; Kelzenberg, M.; Biswas, S.; Hunt, M. S.; Carbone, A.; Atwater, H. A. A new metal transfer process for van der Waals contacts to vertical Schottky-junction transition metal dichalcogenide photovoltaics. Science Advances 2019, 5 (12), eaax6061. DOI: doi:10.1126/sciadv.aax6061.

(66) Fontana, M.; Deppe, T.; Boyd, A. K.; Rinzan, M.; Liu, A. Y.; Paranjape, M.; Barbara, P. Electron-hole transport and photovoltaic effect in gated MoS2 Schottky junctions. Scientific Reports 2013, 3 (1), 1634. DOI: 10.1038/srep01634.

(67) Svatek, S. A.; Bueno-Blanco, C.; Lin, D.-Y.; Kerfoot, J.; Macias, C.; Zehender, M. H.; Tobias, I.; Garcia-Linares, P.; Taniguchi, T.; Watanabe, K.; et al. High open-circuit voltage in transition metal dichalcogenide solar cells. Nano Energy 2021, 79, 105427. DOI: https://doi.org/10.1016/j.nanoen.2020.105427.

(68) Villegas, C. E. P.; Rocha, A. R. Elucidating the Optical Properties of Novel Heterolayered Materials Based on MoTe2-InN for Photovoltaic Applications. The Journal of Physical Chemistry C 2015, 119 (21), 11886-11895. DOI: 10.1021/jp5122596.

(69) Kim, K. H.; Andreev, M.; Choi, S.; Shim, J.; Ahn, H.; Lynch, J.; Lee, T.; Lee, J.; Nazif, K. N.; Kumar, A.; et al. High-Efficiency WSe2 Photovoltaic Devices with Electron-Selective Contacts. ACS Nano 2022. DOI: 10.1021/acsnano.1c10054 From NLM Publisher.

(70) Wang, H.; Wang, W.; Zhong, Y.; Li, D.; Li, Z.; Xu, X.; Song, X.; Chen, Y.; Huang, P.; Mei, A.; et al. Approaching the External Quantum Efficiency Limit in 2D Photovoltaic Devices. Advanced Materials 2022, 34 (39), 2206122. DOI: https://doi.org/10.1002/adma.202206122.

(71) Gupta, A.; Parikh, V.; Compaan, A. D. High efficiency ultra-thin sputtered CdTe solar cells. Solar Energy Materials and Solar Cells 2006, 90 (15), 2263-2271. DOI: https://doi.org/10.1016/j.solmat.2006.02.029.

(72) Chen, H.-L.; Cattoni, A.; De Lepinau, R.; Walker, A. W.; Höhn, O.; Lackner, D.; Siefer, G.; Faustini, M.; Vandamme, N.; Goffard, J.; et al. A 19.9%-efficient ultrathin solar cell based on a 205-nm-thick GaAs absorber and a silver nanostructured back mirror. Nature Energy 2019, 4 (9), 761-767. DOI: 10.1038/s41560-019-0434-y.

(73) Kaltenbrunner, M.; Adam, G.; Glowacki, E. D.; Drack, M.; Schwodiauer, R.; Leonat, L.; Apaydin, D. H.; Groiss, H.; Scharber, M. C.; White, M. S.; et al. Flexible high power-per-weight perovskite solar cells with chromium oxide-metal contacts for improved stability in air. Nature Materials 2015, 14 (10), 1032-1039. DOI: 10.1038/nmat4388.

(74) Xue, M.; Nazif, K. N.; Lyu, Z.; Jiang, J.; Lu, C.-Y.; Lee, N.; Zang, K.; Chen, Y.; Zheng, T.; Kamins, T. I.; et al. Free-standing 2.7 μm thick ultrathin crystalline silicon solar cell with efficiency above 12.0%. Nano Energy 2020, 70, 104466. DOI: https://doi.org/10.1016/j.nanoen.2020.104466.

(75) Xiong, S.; Fukuda, K.; Lee, S.; Nakano, K.; Dong, X.; Yokota, T.; Tajima, K.; Zhou, Y.; Someya, T. Ultrathin and Efficient Organic Photovoltaics with Enhanced Air Stability by Suppression of Zinc Element Diffusion. Advanced Science 2022, 9 (8), 2105288. DOI: https://doi.org/10.1002/advs.202105288.

(76) Pettersson, L. A. A.; Roman, L. S.; Ingands, O. Modeling photocurrent action spectra of photovoltaic devices based on organic thin films. Journal of Applied Physics 1999, 86 (1), 487-496. DOI: 10.1063/1.370757.

(77) Hsu, C.; Frisenda, R.; Schmidt, R.; Arora, A.; de Vasconcellos, S. M.; Bratschitsch, R.; van der Zant, H. S. J.; Castellanos-Gomez, A. Thickness-Dependent Refractive Index of 1 L, 2 L, and 3 L MoS2, MoSe2, WS2, and WSe2. Advanced Optical Materials 2019, 7 (13), 1900239. DOI: https://doi.org/10.1002/adom.201900239.

(78) McPeak, K. M.; Jayanti, S. V.; Kress, S. J. P.; Meyer, S.; Iotti, S.; Rossinelli, A.; Norris, D. J. Plasmonic Films Can Easily Be Better: Rules and Recipes. ACS Photonics 2015, 2 (3), 326-333. DOI: 10.1021/ph5004237.

(79) National Renewable Energy Laboratory. Reference Air Mass 1.5 Spectra. 1962. https://www.nrel.gov/grid/solar-resource/spectra-aml.5.html (accessed Dec. 2, 2022).

(80) Ruhstaller, B.; Beierlein, T.; Riel, H.; Karg, S.; Scott, J. C.; Riess, W. Simulating electronic and optical processes in multilayer organic light-emitting devices. IEEE Journal of Selected Topics in Quantum Electronics 2003, 9 (3), 723-731. DOI: 10.1109/JSTQE.2003.818852.

(81) Ruhstaller, B.; Carter, S. A.; Barth, S.; Riel, H.; Riess, W.; Scott, J. C. Transient and steady-state behavior of space charges in multilayer organic light-emitting diodes. Journal of Applied Physics 2001, 89 (8), 4575-4586. DOI: 10.1063/1.1352027.

(82) C. Zhang, L. Cheng, and Y. Liu, "Understanding high-field electron transport properties and strain effects of monolayer transition metal dichalcogenides," Phys. Rev. B 102(11), 115405 (2020).

REFERENCES (FIGS. 61-66)

(1) Castellanos-Gomez, A.; Barkelid, M.; Goossens, A. M.; Calado, V. E.; van der Zant, H. S.; Steele, G. A. Laser-thinning of MoS(2): on demand generation of a single-layer semiconductor. Nano Lett 2012, 12 (6), 3187-3192. DOI: 10.1021/nl301164v From NLM Medline.

(2) Hong, H.; Cheng, Y.; Wu, C.; Huang, C.; Liu, C.; Yu, W.; Zhou, X.; Ma, C.; Wang, J.; Zhang, Z.; et al. Modulation of carrier lifetime in MoS2 monolayer by uniaxial strain*. Chinese Physics B 2020, 29 (7). DOI: 10.1088/1674-1056/ab99ba.

(3) Wang, H.; Zhang, C.; Chan, W.; Manolatou, C.; Tiwari, S.; Rana, F. Radiative lifetimes of excitons and trions in monolayers of the metal dichalcogenideMoS2. Physical Review B 2016, 93 (4). DOI: 10.1103/PhysRevB.93.045407.

(4) Palummo, M.; Bernardi, M.; Grossman, J. C. Exciton radiative lifetimes in two-dimensional transition metal dichalcogenides. Nano Lett 2015, 15 (5), 2794-2800. DOI: 10.1021/nl503799t From NLM Medline.

(5) He, J.; Fang, W. H.; Long, R.; Prezhdo, O. V. Superoxide/Peroxide Chemistry Extends Charge Carriers' Lifetime but Undermines Chemical Stability of CH3NH3PbI3 Exposed to Oxygen: Time-Domain ab Initio Analysis. J Am Chem Soc 2019, 141 (14), 5798-5807. DOI: 10.1021/jacs.8b13392 From NLM PubMed-not-MEDLINE.

(6) Huo, N.; Yang, Y.; Wu, Y. N.; Zhang, X. G.; Pantelides, S. T.; Konstantatos, G. High carrier mobility in monolayer CVD-grown MoS2 through phonon suppression. Nanoscale 2018, 10 (31), 15071-15077. DOI: 10.1039/c8nr04416c From NLM PubMed-not-MEDLINE.

(7) He, K.; Kumar, N.; Zhao, L.; Wang, Z.; Mak, K. F.; Zhao, H.; Shan, J. Tightly Bound Excitons in Monolayer ${\mathrm{WSe}}_{2}$. Physical Review Letters 2014, 113 (2), 026803. DOI: 10.1103/PhysRevLett.113.026803.

(8) Cheng, G.; Li, B.; Zhao, C.; Jin, Z.; Li, H.; Lau, K. M.; Wang, J. Exciton aggregation induced photoluminescence enhancement of monolayer WS2. Applied Physics Letters 2019, 114 (23), 232101. DOI: 10.1063/1.5096206.

(9) Park, S.; Mutz, N.; Schultz, T.; Blumstengel, S.; Han, A.; Aljarb, A.; Li, L.-J.; List-Kratochvil, E. J. W.; Amsalem, P.; Koch, N. Direct determination of monolayer MoS2 and WSe2 exciton binding energies on insulating and

US 12,648,257 B2

55 metallic substrates. 2D Materials 2018, 5 (2), 025003. DOI: 10.1088/2053-1583/aaa4ca.

(10) Ugeda, M. M.; Bradley, A. J.; Shi, S.-F.; da Jomada, F. H.; Zhang, Y.; Qiu, D. Y.; Ruan, W.; Mo, S.-K.; Hussain, Z.; Shen, Z.-X.; et al. Giant bandgap renormalization and excitonic effects in a monolayer transition metal dichalcogenide semiconductor. Nature Materials 2014, 13 (12), 1091-1095. DOI: 10.1038/nmat4061.

(11) Hill, H. M.; Rigosi, A. F.; Roquelet, C.; Chernikov, A.; Berkelbach, T. C.; Reichman, D. R.; Hybertsen, M. S.; Brus, L. E.; Heinz, T. F. Observation of Excitonic Rydberg States in Monolayer MoS2 and WS2 by Photoluminescence Excitation Spectroscopy. Nano Letters 2015, 15 (5), 2992-2997. DOI: 10.1021/nl504868p.

(12) Uddin, S. Z.; Kim, H.; Lorenzon, M.; Yeh, M.; Lien, D.-H.; Barnard, E. S.; Htoon, H.; Weber-Bargioni, A.; Javey, A. Neutral Exciton Diffusion in Monolayer MoS2. ACS Nano 2020, 14 (10), 13433-13440. DOI: 10.1021/acsnano.0c05305.

(13) Kumar, N.; Cui, Q.; Ceballos, F.; He, D.; Wang, Y.; Zhao, H. Exciton diffusion in monolayer and bulk MoSe2. Nanoscale 2014, 6 (9), 4915-4919, 10.1039/C3NR06863C. DOI: 10.1039/C3NR06863C.

(14) He, J.; He, D.; Wang, Y.; Cui, Q.; Ceballos, F.; Zhao, H. Spatiotemporal dynamics of excitons in monolayer and bulk WS2. Nanoscale 2015, 7 (21), 9526-9531, 10.1039/C5NR00188A. DOI: 10.1039/C5NR00188A.

(15) Cui, Q.; Ceballos, F.; Kumar, N.; Zhao, H. Transient Absorption Microscopy of Monolayer and Bulk WSe2. ACS Nano 2014, 8 (3), 2970-2976. DOI: 10.1021/nn500277y.

(16) Palummo, M.; Bernardi, M.; Grossman, J. C. Exciton Radiative Lifetimes in Two-Dimensional Transition Metal Dichalcogenides. Nano Letters 2015, 15 (5), 2794-2800. DOI: 10.1021/nl503799t.

(17) Rawat, A.; Jena, N.; Dimple; De Sarkar, A. A comprehensive study on carrier mobility and artificial photosynthetic properties in group VI B transition metal dichalcogenide monolayers. Journal of Materials Chemistry A 2018, 6 (18), 8693-8704, 10.1039/C8TA01943F. DOI: 10.1039/C8TA01943F.

(18) Uddin, S. Z.; Kim, H.; Lorenzon, M.; Yeh, M.; Lien, D. H.; Barnard, E. S.; Htoon, H.; Weber-Bargioni, A.; Javey, A. Neutral Exciton Diffusion in Monolayer MoS2. ACS Nano 2020, 14 (10), 13433-13440. DOI: 10.1021/acsnano.0c05305 From NLM PubMed-not-MEDLINE.

What is claimed:

1. A component, comprising:
a first region that has a thickness and comprises two or more repeat units, a repeat unit comprising a portion of a van der Waals material (vdW) superposed on a portion of dielectric spacer,
the two or more repeat units are superposed over a bottom support, the bottom support comprising $Al_2O_3$, $HfO_2$, $SiO_2$, or $TiO_2$,
the vdW being a monolayer or being few-layers in nature,
the two or more repeat units being arranged to define a superlattice; and
a voltage source in electrical communication with the two or more repeat units, the voltage source optionally being variable, and the voltage source being operable to modulate at least one optical property of the component.

2. The component of claim 1, further comprising N repeat units superposed on one another, N optionally ranging from 2 to 10, or from 2 to 8, or from 2 to 5, or from 2 to 3, the component optionally configured such the vdW and/or the dielectric spacer of the N-th repeat unit differs from the vdW and/or the dielectric spacer of the (N+1)-th repeat unit.

3. The component of claim 1, wherein the vdW comprises a transition metal dichalcogenide, the transition metal chalcogenide optionally comprising any one or more of $WS_2$, $MoS_2$, $MoSe_2$, $MoTe_2$, $ReS_2$, SnS, InSe, $In_2Se_3$, $WTe_2$, $PtSe_2$ and $NbSe_2$.

4. The component of claim 1, wherein the vdW portion has a thickness of from about 1.5 to about 40 nm.

5. The component of claim 1, wherein the dielectric spacer comprises one or more of h-BN, $Al_2O_3$, $TiO_2$, $HfO_2$, or any combination thereof.

6. The component of claim 1, wherein dielectric spacer has a thickness of from about 1 to about 5 nm.

7. The component of claim 1, wherein the bottom support optionally has a thickness in the range of from about 5 to about 100 nm.

8. The component of claim 1, further comprising a reflector over which the two or more repeat units are superposed.

9. The component of claim 8, wherein the reflector comprises gold, silver, platinum, or titanium.

10. The component of claim 1, wherein the component comprises a second region, (i) the second region comprising at least two repeat units, and (ii) the second region being laterally separated from the first region.

11. The component of claim 10, wherein the component comprises a plurality of regions of repeat units, the regions being arranged in a lateral pattern, and each region having a thickness that comprises one or more repeat units.

12. The component of claim 1, wherein the component is operable to achieve greater than 270° phase modulation of illumination directed normal to the component.

13. The component of claim 12, wherein the component is operable to achieve about 360° phase modulation of illumination directed normal to the component.

14. The component of claim 1, wherein the component is operable to exhibit a peak absorptance of a wavelength in the visible range (400 nm to 700 nm), the near infrared (up to 2000 nm), and in the ultraviolet (200 to 400 nm) of from about 0.7 to about 0.95.

15. The component of claim 1, wherein the component is operable to exhibit a peak absorbance of from about 0.25 to about 0.95 absorbance units per nm thickness of the first region.

16. The component of claim 1, wherein the component is operable to modulate the power of an illumination directed normal to the component by up to about 35 dB.

17. The component of claim 1, wherein the component is operable to deflect incident illumination by up to about 90°.

18. The component of claim 1, wherein the component forms an electro-optic modulator or a photovoltaic device.

19. A method, comprising operating a component according to claim 1.

20. The method of claim 19, wherein the method is performed so as to modulate transmission of a signal.

21. The method of claim 19, wherein the method comprises applying a voltage to the component.

22. The method of claim 19, wherein the method is performed so as to modulate a phase of an illumination applied to the component.

23. The method of claim 19, wherein the method is performed so as to modulate and/or deflect an amplitude of an illumination applied to the component.

24. An electro-absorption modulator, comprising:
a substrate forming at least one quantum well;
a superlattice layer provided on the substrate, the superlattice layer comprising a plurality of monolayers comprising a vdW material, wherein each monolayer further comprises excitons coupled to surface plasmons; and a set of electrical contacts establishing electrical communication between a first monolayer of the plurality, and a second monolayer of the plurality.

25. The electro-absorption modulator of claim 24, wherein the substrate is at least one of: Ag or $SiO_2$.

26. The electro-absorption modulator of claim 24, having a linear footprint of less than about 1 micrometer.

27. A photovoltaic structure comprising:

a reflective substrate; and a stack of repeating monolayers provided on the reflective substrate, and laterally positioned between an anode and a cathode, wherein each monolayer comprises one of a vdW material, an absorber and an insulator.

28. The photovoltaic structure of claim 27, wherein each monolayer comprises a two-dimensional transition metal dichalcogenide (TMDC) material.

29. The photovoltaic device of claim 27, having a power conversion efficiency greater than 9%.

* * * * *